(12) United States Patent
Yamazaki et al.

(10) Patent No.: US 11,335,812 B2
(45) Date of Patent: May 17, 2022

(54) SEMICONDUCTOR DEVICE AND ELECTRONIC DEVICE

(71) Applicant: SEMICONDUCTOR ENERGY LABORATORY CO., LTD., Atsugi (JP)

(72) Inventors: Shunpei Yamazaki, Tokyo (JP); Hajime Kimura, Kanagawa (JP); Hitoshi Kunitake, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 43 days.

(21) Appl. No.: 17/011,385

(22) Filed: Sep. 3, 2020

(65) Prior Publication Data
US 2021/0135010 A1     May 6, 2021

(30) Foreign Application Priority Data

Oct. 31, 2019  (JP) .............................. JP2019-199005
Nov. 11, 2019  (JP) .............................. JP2019-203738
(Continued)

(51) Int. Cl.
*H01L 27/00* (2006.01)
*H01L 29/00* (2006.01)
(Continued)

(52) U.S. Cl.
CPC .... *H01L 29/7869* (2013.01); *H01L 27/10805* (2013.01)

(58) Field of Classification Search
CPC ......... H01L 27/11556; H01L 27/11582; H01L 27/10805; H01L 29/78642; H01L 29/7869;
(Continued)

(56) References Cited

U.S. PATENT DOCUMENTS 9,406,694 B1 *  8/2016 Ikeno .................... H01L 29/512
9,634,097 B2 *  4/2017 Rabkin ............. H01L 29/40117
(Continued)

FOREIGN PATENT DOCUMENTS

JP     2018-207038 A     12/2018
WO    2019/003060 A1     1/2019

OTHER PUBLICATIONS

Akasawa.F et al., "An Energy Efficient Normally-Off CPU with 2.4 pW Negative Voltage Generator featuring 60-nm Crystalline Indium-Gallium-Zinc Oxide FETs in BEOL", SSDM 2019 (Extended Abstracts of the 2019 International Conference on Solid State Devices and Materials), Sep. 2, 2019, pp. 519-520.

*Primary Examiner* — Nikolay K Yushin
(74) *Attorney, Agent, or Firm* — Fish & Richardson P.C.

(57) ABSTRACT

A novel semiconductor device is provided. A component extending in a first direction, and a first conductor and a second conductor extending in a second direction are provided. The component includes a third conductor, a first insulator, a first semiconductor, and a second insulator. In a first intersection portion of the component and the first conductor, the first insulator, the first semiconductor, the second insulator, a second semiconductor, and a third insulator are provided concentrically. In a second intersection portion of the component and the second conductor, the first insulator, the first semiconductor, the second insulator, a fourth conductor, and a fourth insulator are provided concentrically around the third conductor.

9 Claims, 58 Drawing Sheets

(30) Foreign Application Priority Data

Nov. 18, 2019 (JP) .............................. JP2019-208041
Nov. 29, 2019 (JP) .............................. JP2019-216249
Dec. 20, 2019 (JP) .............................. JP2019-230250

(51) Int. Cl.
*H01L 29/786* (2006.01)
*H01L 27/108* (2006.01)

(58) Field of Classification Search
CPC ............... H01L 29/872; H01L 29/4238; H01L 29/1608
See application file for complete search history.

(56) References Cited

U.S. PATENT DOCUMENTS

| | | | |
|---|---|---|---|
| 2016/0247927 A1* | 8/2016 | Nomura | H01L 29/78618 |
| 2017/0040416 A1* | 2/2017 | Ota | H01L 27/11575 |
| 2018/0033799 A1* | 2/2018 | Kanamori | H01L 27/11565 |
| 2018/0374529 A1* | 12/2018 | Kimura | H01L 27/1207 |
| 2019/0006386 A1* | 1/2019 | Yamazaki | H01L 45/10 |
| 2020/0203339 A1 | 6/2020 | Yamazaki et al. | |

* cited by examiner

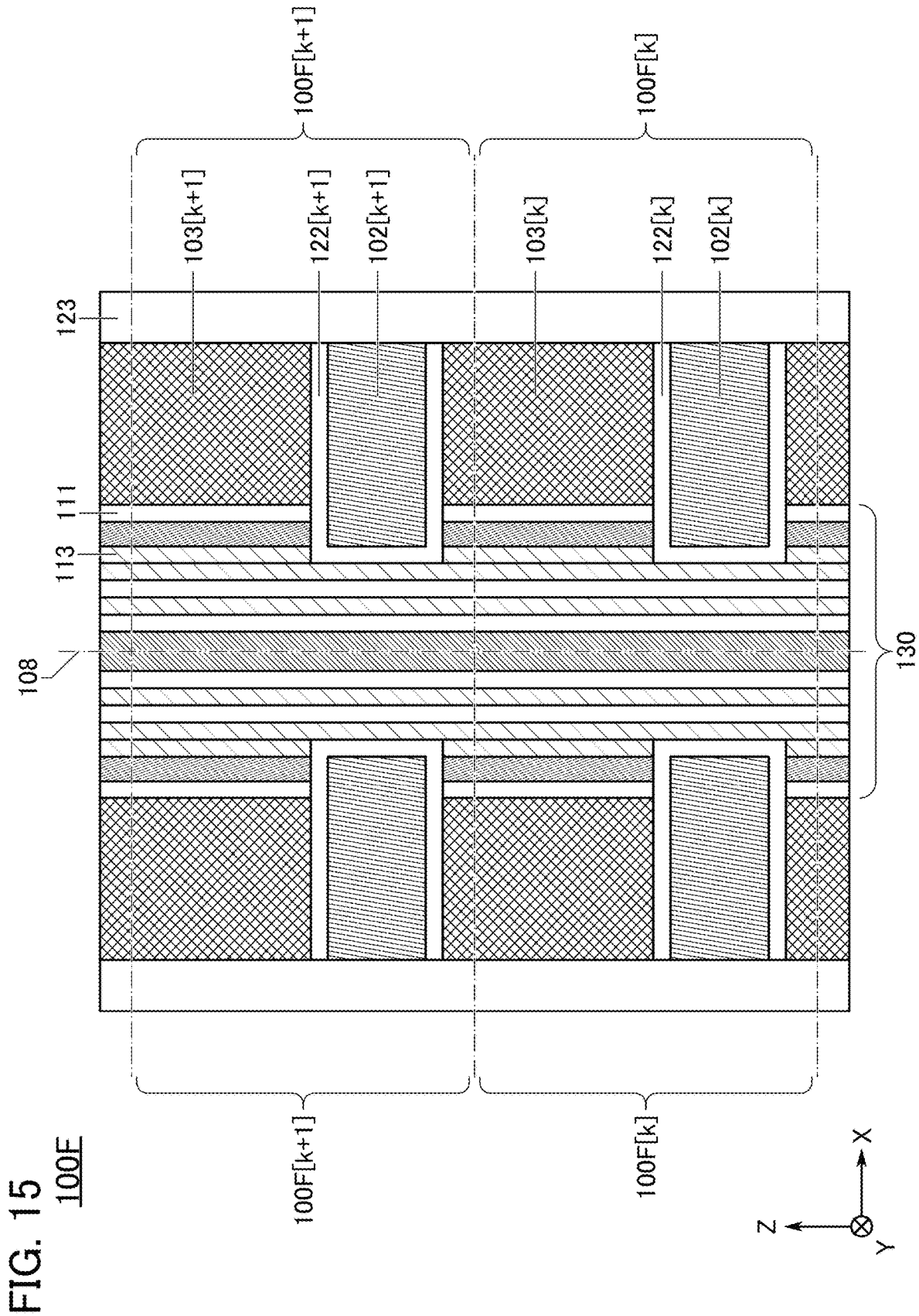

100K

100K

FIG. 27A
Intermediate state
New crystalline phase
| Amorphous | Crystalline | Crystal |
|---|---|---|
| •completely amorphous | •CAAC<br>•nc<br>•CAC<br><br>excluding single crystal and poly crystal | •single crystal<br>•poly crystal |
FIG. 27B
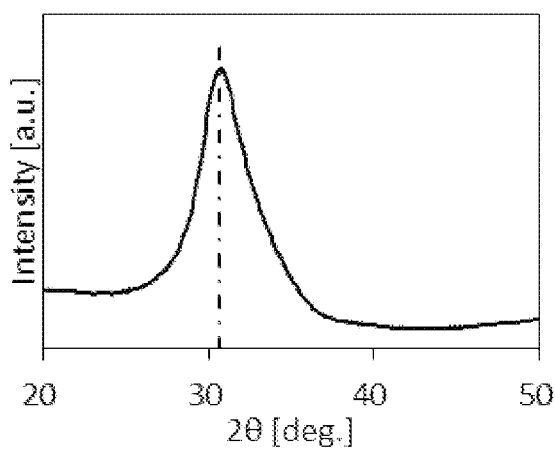
FIG. 27C
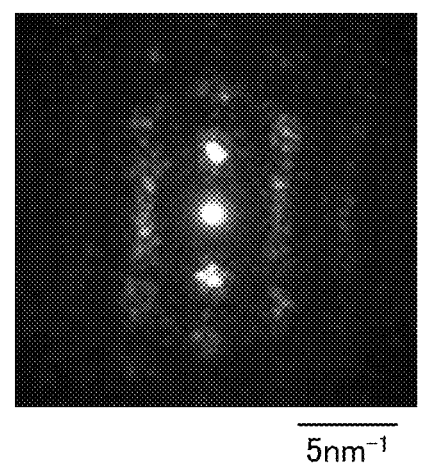

SEMICONDUCTOR DEVICE AND ELECTRONIC DEVICE

BACKGROUND OF THE INVENTION

1. Field of the Invention

One embodiment of the present invention relates to a semiconductor device and an electronic device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a method for driving any of them, a method for manufacturing any of them, and a method for inspecting any of them.

2. Description of the Related Art

In recent years, electronic components such as central processing units (CPUs), graphics processing units (GPUs), memory devices, and sensors have been used in various electronic devices such as personal computers, smartphones, and digital cameras. The electronic components have been improved to achieve miniaturization, lower power consumption, and other various objectives.

Memory devices with large memory capacity are required because the amount of data handled in the aforementioned electronic devices and the like has increased. As an example of a way to increase the memory capacity, Patent Documents 1 and 2 disclose a three-dimensional NAND memory element using a metal oxide in a channel formation region.

REFERENCE

Patent Document

[Patent Document 1] PCT International Publication No. 2019/003060
[Patent Document 2] Japanese Published Patent Application No. 2018-207038

SUMMARY OF THE INVENTION

One object of one embodiment of the present invention is to provide a highly reliable memory device. Another object of one embodiment of the present invention is to provide a memory device having large memory capacity. Another object of one embodiment of the present invention is to provide a novel memory device. Another object of one embodiment of the present invention is to provide a highly reliable semiconductor device. Another object of one embodiment of the present invention is to provide a semiconductor device having large memory capacity. Another object of one embodiment of the present invention is to provide a novel semiconductor device.

Note that the objects of one embodiment of the present invention are not limited to the objects mentioned above. The objects listed above do not preclude the existence of other objects. The other objects are the ones that are not described above and will be described below. The other objects will be apparent from and can be derived from the description of the specification, the drawings, and the like by those skilled in the art. One embodiment of the present invention achieves at least one of the above objects and the other objects. One embodiment of the present invention does not necessarily achieve all the above objects and the other objects.

One embodiment of the present invention is a semiconductor device that includes an arithmetic processing device and a memory device. The arithmetic processing device and the memory device have an overlap region. The memory device includes a plurality of memory cells. Each of the memory cells contains an oxide semiconductor. The memory device is of NAND type and operates as a RAM.

One embodiment of the present invention is a semiconductor device including a component extending in a first direction, and a first conductor and a second conductor extending in a second direction. The component includes a third conductor extending in the first direction, a first insulator adjacent to the third conductor, a first semiconductor adjacent to the first insulator, and a second insulator adjacent to the first semiconductor. In a first intersection portion where the component and the first conductor cross each other, a second semiconductor adjacent to the second insulator and a third insulator adjacent to the second semiconductor are provided between the component and the first conductor. In a second intersection portion where the component and the second conductor cross each other, the component includes a fourth conductor adjacent to the second insulator and a fourth insulator adjacent to the fourth conductor. In the first intersection portion, the first insulator, the first semiconductor, the second insulator, the second semiconductor, and the third insulator are provided concentrically around the third conductor. In the second intersection portion, the first insulator, the first semiconductor, the second insulator, the fourth conductor, and the fourth insulator are provided concentrically around the third conductor.

The first direction is orthogonal to the second direction. Note that the first intersection portion functions as a transistor for data writing, and the second intersection portion functions as a transistor for data reading and a capacitor.

The first intersection portion can function as a first transistor. The second intersection portion can function as a second transistor and a capacitor. The semiconductor device can function as a NAND memory device, for example.

At least one of the first semiconductor and the second semiconductor is preferably an oxide semiconductor. The oxide semiconductor preferably contains at least one of indium and zinc.

Another embodiment of the present invention is an electronic device including at least one of an operation switch, a battery, and a display portion, and a plurality of the above semiconductor devices.

According to one embodiment of the present invention, a highly reliable memory device can be provided. Alternatively, a memory device having large memory capacity can be provided. A novel memory device can be provided. A highly reliable semiconductor device can be provided. A semiconductor device having large memory capacity can be provided. A novel semiconductor device can be provided.

Note that the effects of one embodiment of the present invention are not limited to the effects mentioned above. The effects described above do not preclude the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the above effects in some cases.

BRIEF DESCRIPTION OF THE DRAWINGS

In the accompanying drawings:

FIG. 15 is a cross-sectional view of a memory cell;

FIG. 27A shows classification of crystal structures of an oxide semiconductor, FIG. 27B shows an XRD spectrum of a CAAC-IGZO film, and FIG. 27C shows a nanobeam electron diffraction pattern of the CAAC-IGZO film;

DETAILED DESCRIPTION OF THE INVENTION

Figure 1A:
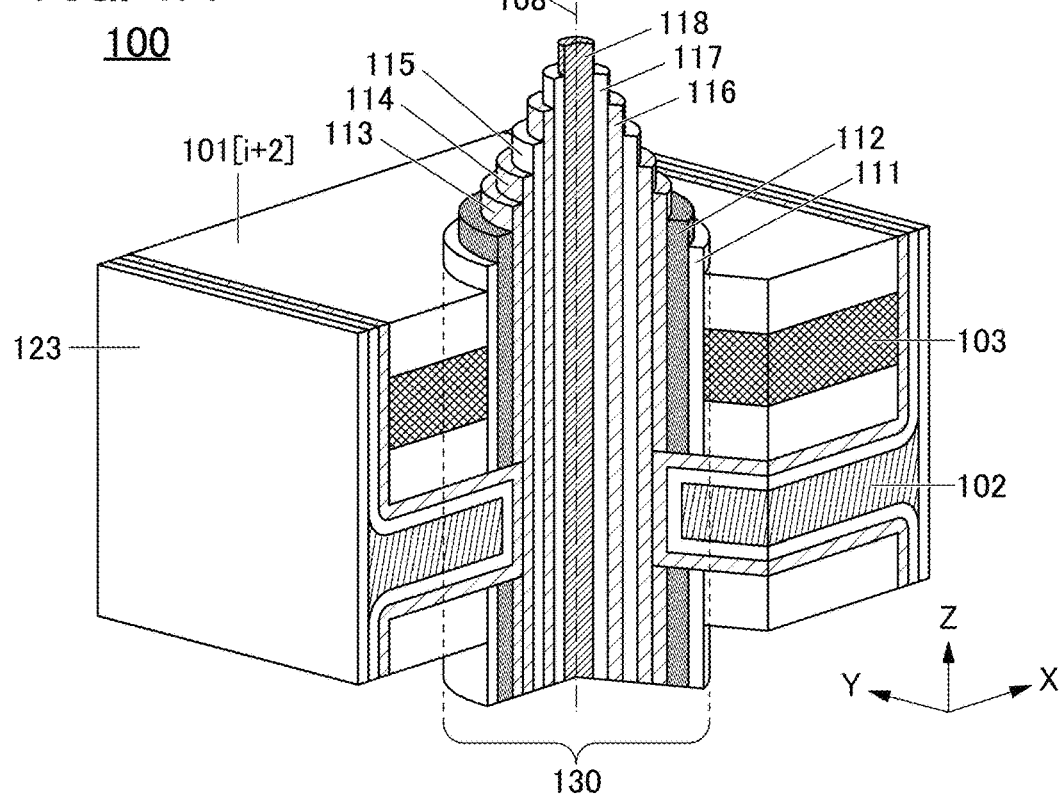
FIG. 1A is a perspective view of a memory cell.

In this specification and the like, a semiconductor device refers to a device that utilizes semiconductor characteristics, and means a circuit including a semiconductor element (e.g., a transistor, a diode, or a photodiode), a device including the circuit, and the like. The semiconductor device also means devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves may be semiconductor devices or may each include a semiconductor device.

When this specification and the like states that X and Y are connected, the case where X and Y are electrically connected, the case where X and Y are functionally connected, and the case where X and Y are directly connected are regarded as being disclosed in this specification and the like. Accordingly, without limitation to a predetermined connection relation, for example, a connection relation shown in drawings or text, another connection relation is regarded as being disclosed in the drawings or the text. Each of X and Y denotes an object (e.g., a device, an element, a circuit, a wiring, an electrode, a terminal, a conductive film, or a layer).

For example, in the case where X and Y are electrically connected, at least one element that enables electrical connection between X and Y (e.g., a switch, a transistor, a capacitor, an inductor, a resistor, a diode, a display device, a light-emitting device, or a load) can be connected between X and Y. Note that a switch is controlled to be on or off. That is, a switch is turned on or off to determine whether current flows therethrough or not.

For example, in the case where X and Y are functionally connected, one or more circuits that enable functional connection between X and Y (e.g., a logic circuit such as an inverter, a NAND circuit, or a NOR circuit; a signal converter circuit such as a digital-to-analog converter circuit, an analog-to-digital converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase the signal amplitude, the amount of current, or the like, an operational amplifier, a differential amplifier circuit, a source follower circuit, or a buffer circuit; a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description "X and Y are electrically connected" includes the case where X and Y are electrically connected (i.e., X and Y are connected with another element or circuit provided therebetween) and the case where X and Y are directly connected (i.e., X and Y are connected without another element or circuit provided therebetween).

Examples of the expressions include "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order"; "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order"; and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that the above expressions are examples, and there is no limitation on the expressions. Note that these expressions are examples and there is no limitation on the expressions. Here, X and Y each denote an object (e.g., a device, an element, a circuit, a wiring, an electrode, a terminal, a conductive film, or a layer).

Even when a circuit diagram shows that independent components are electrically connected to each other, one component sometimes has functions of a plurality of components. For example, when part of a wiring also functions as an electrode, one conductive film functions as the wiring and the electrode. Thus, the term "electrical connection" in this specification also means such a case where one conductive film has functions of a plurality of components.

In this specification and the like, a "resistor" can be, for example, a circuit element or a wiring having a resistance higher than 0Ω. Therefore, in this specification and the like, a "resistor" includes a wiring having a resistance, a transistor in which current flows between its source and drain, a diode, and a coil. Thus, the term "resistor" can be replaced with the terms "resistance", "load", and "a region having a resistance", for example, and vice versa. The resistance can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. As another example, the resistance may be greater than or equal to 1Ω and less than or equal to 1×10$^9$Ω.

In this specification and the like, a "capacitor" can be, for example, a circuit element having an electrostatic capacitance higher than 0 F, a region of a wiring having an electrostatic capacitance, parasitic capacitance, or gate capacitance of a transistor. Therefore, in this specification and the like, a "capacitor" includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", and "gate capacitance" can be replaced with the term "capacitance", for example, and vice versa. The term "a pair of electrodes" of a capacitor can be replaced with the terms "a pair of conductors", "a pair of conductive regions", and "a pair of regions", for example. Note that the electrostatic capacitance can be greater than or equal to 0.05 fF and less than or equal to 10 pF, for example. As another example, the electrostatic capacitance may be greater than or equal to 1 pF and less than or equal to 10 μF.

In this specification and the like, a transistor includes three terminals called a gate, a source, and a drain. The gate is a control terminal for controlling the on/off state of the transistor. Two terminals functioning as the source and the drain are input/output terminals of the transistor. Functions of the two input/output terminals of the transistor depend on the conductivity type (n-channel type or p-channel type) of the transistor and the levels of potentials applied to the three terminals of the transistor, and one of the two terminals serves as a source and the other serves as a drain. Therefore, the terms "source" and "drain" can be used interchangeably in this specification and the like. In this specification and the like, the terms "one of a source and a drain" (or a first electrode or a first terminal) and "the other of the source and the drain" (or a second electrode or a second terminal) are used to describe the connection relation of a transistor. Depending on the structure, a transistor may include a back gate in addition to the above three terminals. In that case, in this specification and the like, one of the gate and the back gate of the transistor may be referred to as a first gate and the other of the gate and the back gate of the transistor may be referred to as a second gate. In some cases, the terms "gate" and "back gate" can be replaced with each other in one transistor. In the case where a transistor includes three or more gates, the gates may be referred to as a first gate, a second gate, and a third gate, for example, in this specification and the like.

In this specification and the like, a node can be referred to as a terminal, a wiring, an electrode, a conductive layer, a conductor, an impurity region, and the like depending on the circuit configuration, the device structure, and the like. Furthermore, a terminal, a wiring, and the like can be referred to as a node.

In this specification and the like, "voltage" and "potential" can be replaced with each other as appropriate. The term "voltage" refers to a potential difference from a reference potential. When the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, a potential output from a circuit and the like, for example, are changed with a change of the reference potential.

In this specification and the like, the terms "high-level potential" (also referred to as H potential or H) and "low-level potential" (also referred to as L potential or L) do not represent a particular potential. For example, in the case where two wirings are both described as "functioning as a wiring for supplying a high-level potential", the levels of the high-level potentials that these wirings supply are not necessarily equal to each other. Similarly, in the case where two wirings are both described as "functioning as a wiring for supplying a low-level potential", the levels of the low-level potentials that these wirings supply are not necessarily equal to each other.

Current means a charge transfer (electrical conduction); for example, the description "electrical conduction of positively charged particles is caused" can be rephrased as "electrical conduction of negatively charged particles is caused in the opposite direction". Therefore, unless otherwise specified, current in this specification and the like refers to a charge transfer (electrical conduction) caused by carrier movement. Examples of a carrier here include an electron, a hole, an anion, a cation, and a complex ion, and the type of carrier differs between current flow systems (e.g., a semiconductor, a metal, an electrolyte solution, and a vacuum). The direction of current in a wiring or the like refers to the direction in which positive carriers move, and the amount of current is described with a positive value. In other words, the direction in which negative carriers move is opposite to the direction of current, and the amount of current is described with a negative value. Thus, in the case where the polarity of current (or the direction of current) is not specified in this specification and the like, the description "current flows from element A to element B" can be rephrased as "current flows from element B to element A", for example. As another example, the description "current is input to element A" can be rephrased as "current is output from element A".

Ordinal numbers such as "first", "second", and "third" in this specification and the like are used in order to avoid confusion among components. Thus, the terms do not limit the number or order of components. For example, a "first" component in one embodiment in this specification and the like can be referred to as a "second" component in other embodiments or claims. As another example, a "first" component in one embodiment in this specification and the like can be omitted in other embodiments or claims.

The term "over" or "below" does not necessarily mean that a component is placed directly on or directly under and directly in contact with another component. For example, the expression "electrode B over insulating layer A" does not necessarily mean that the electrode B is on and in direct contact with the insulating layer A, and can mean the case where another component is provided between the insulating layer A and the electrode B.

The positional relationship between components changes as appropriate in accordance with the direction in which each component is described. Thus, the positional relation is not limited to that described with a term used in this specification and the like and can be explained with another term as appropriate depending on the situation. For example, in this specification and the like, terms for describing arrangement, such as "over" and "under", are sometimes used for convenience to describe the positional relation between components with reference to drawings. Accordingly, the expression "an insulator over (on) a top surface of a conductor" can be replaced with the expression "an insulator on a bottom surface of a conductor" when the direction of a diagram showing these components is rotated by 180°. Moreover, the expression "an insulator over (on) a top surface of a conductor" can be replaced with the expression "an insulator on a left surface (or a right surface) of a conductor" when the direction of a diagram showing these components is rotated by 90°.

Similarly, the term "overlap", for example, in this specification and the like does not limit a state such as the stacking order of components. For example, the expression "electrode B overlapping with insulating layer A" does not necessarily mean the state where the electrode B is formed over the insulating layer A, and includes the case where the electrode B is formed under the insulating layer A and the case where the electrode B is formed on the right (or left) side of the insulating layer A.

The term "adjacent" in this specification and the like does not necessarily mean that a component is directly in contact with another component. For example, the expression "electrode B adjacent to insulating layer A" does not necessarily mean that the electrode B is formed in direct contact with the insulating layer A and can mean the case where another component is provided between the insulating layer A and the electrode B.

In this specification and the like, the terms "film" and "layer" can be interchanged with each other depending on circumstances. For example, in some cases, the term "conductive film" can be used instead of "conductive layer", and the term "insulating layer" can be used instead of "insulating film". Moreover, such terms can be replaced with a word not including the term "film" or "layer" depending on the case or circumstances. For example, in some cases, the term "conductor" can be used instead of "conductive layer" and "conductive film", and the term "insulator" can be used instead of "insulating layer" and "insulating film".

In this specification and the like, the terms "electrode", "wiring", "terminal", and the like do not limit the functions of components. For example, an "electrode" is used as part of a wiring in some cases, and vice versa. Furthermore, the term "electrode" or "wiring" can also mean a combination of a plurality of electrodes or wirings provided in an integrated manner, for example. As another example, a "terminal" can be used as part of a wiring or an electrode, and a "wiring" and an "electrode" can be used as part of a terminal. Furthermore, the term "terminal" includes the case where a plurality of electrodes, wirings, terminals, and the like are formed in an integrated manner. Therefore, for example, an "electrode" can be part of a wiring or a terminal, and a "terminal" can be part of a wiring or an electrode. Moreover, the terms "electrode", "wiring", and "terminal" are sometimes replaced with the term "region", for example.

In this specification and the like, the terms "wiring", "signal line", "power supply line", and the like can be interchanged with each other depending on the case or circumstances. For example, in some cases, the term "signal line" or "power supply line" can be used instead of the term "wiring", and vice versa. In some cases, the term "signal line" can be used instead of "power supply line", and vice versa. As another example, the term "signal" can be used instead of "potential" that is supplied to a wiring, depending on the case or circumstances. Inversely, the term "potential" can sometimes be used instead of "signal" or the like.

In this specification and the like, an impurity in a semiconductor refers to, for example, elements other than the main components of a semiconductor layer. For instance, an element with a concentration of lower than 0.1 atomic % is an impurity. When an impurity is contained, the density of defect states in the semiconductor may be increased, the carrier mobility may be decreased, or the crystallinity may be decreased, for example. When the semiconductor is an oxide semiconductor, examples of impurities that change the characteristics of the semiconductor include Group 1 elements, Group 2 elements, Group 13 elements, Group 14 elements, Group 15 elements, and transition metals other than the main components of the oxide semiconductor. Specific examples are hydrogen (included also in water), lithium, sodium, silicon, boron, phosphorus, carbon, and nitrogen. Specifically, when the semiconductor is a silicon layer, examples of impurities that change the characteristics of the semiconductor include oxygen, Group 1 elements except hydrogen, Group 2 elements, Group 13 elements, and Group 15 elements.

In this specification and the like, a switch is in a conductive state (on state) or in a non-conductive state (off state) to determine whether current flows therethrough or not. Alternatively, a switch has a function of selecting and changing a current path. For example, an electrical switch or a mechanical switch can be used. That is, a switch is not limited to a certain element and can be any element capable of controlling current.

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit in which such elements are combined. In the case of using a transistor as a switch, the on state of the transistor refers to a state in which a source electrode and a drain electrode of the transistor are regarded as being electrically short-circuited. The off state of the transistor refers to a state in which the source electrode and the drain electrode of the transistor are regarded as being electrically disconnected. In the case where a transistor operates just as a switch, there is no particular limitation on the polarity (conductivity type) of the transistor.

An example of a mechanical switch is a switch using a microelectromechanical systems (MEMS) technology. Such a switch includes an electrode that can be moved mechanically, and its conduction and non-conduction is controlled with movement of the electrode.

In this specification and the like, "on-state current" sometimes means a current that flows between a source and a drain when a transistor is on. In addition, "off-state current" sometimes means a current that flows between a source and a drain when a transistor is off.

In this specification and the like, "parallel" indicates that the angle formed between two straight lines is greater than or equal to −10° and less than or equal to 10°. Thus, the case where the angle is greater than or equal to −5° and less than or equal to 5° is also included. The terms "approximately parallel" and "substantially parallel" indicate that the angle formed between two straight lines is greater than or equal to −30° and less than or equal to 30°. The term "perpendicular" indicates that the angle formed between two straight lines is greater than or equal to 80° and less than or equal to 100°. Thus, the case where the angle is greater than or equal to 85° and less than or equal to 95° is also included. The terms "approximately perpendicular" and "substantially perpendicular" indicate that the angle formed between two straight lines is greater than or equal to 60° and less than or equal to 120°. The term "orthogonal" indicates that the angle formed between two straight lines is greater than or equal to 80° and less than or equal to 100°. Thus, the case where the angle is greater than or equal to 85° and less than or equal to 95° is also included.

In this specification and the like, the terms "identical", "the same", "equal", "uniform", and the like used in describing calculation values and measurement values or in describing objects, methods, events, and the like that can be converted into calculation values or measurement values allow for a margin of error of ±20% unless otherwise specified.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is referred to as an oxide semiconductor in some cases. That is, a metal oxide included in a channel formation region of a transistor that has at least one of an amplifying function, a rectifying function, and a switching function can be referred to as a metal oxide semiconductor. An OS transistor refers to a transistor including a metal oxide or an oxide semiconductor.

In this specification and the like, a metal oxide containing nitrogen is also referred to as a metal oxide in some cases. A metal oxide containing nitrogen may be referred to as a metal oxynitride.

In this specification and the like, one embodiment of the present invention can be constituted with an appropriate combination of a structure shown in one embodiment and any of the structures shown in the other embodiments. In the case where a plurality of structure examples are described in one embodiment, some of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment, a content described in the embodiment is a content described with reference to a variety of diagrams or a content described with text disclosed in this specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

Embodiments disclosed in this specification will be described with reference to the drawings. It will be readily appreciated by those skilled in the art that modes and details can be changed in various ways without departing from the spirit and scope of the present invention. Therefore, the present invention should not be construed as being limited to the description of the embodiments. Note that in the structures of the invention described in the embodiments, the same portions or portions having similar functions are denoted by the same reference numerals in different drawings and the description of such portions is not repeated in some cases. Moreover, some components may be omitted in a perspective view, a top view, and the like for easy understanding of the diagrams.

In the drawings of this specification, the size, the layer thickness, or the region is exaggerated for clarity in some cases. Therefore, embodiments of the present invention are not limited to the size, aspect ratio, and the like shown in the drawings. Note that the drawings schematically show ideal examples, and embodiments of the present invention are not limited to shapes or values shown in the drawings. For example, variation in signal, voltage, or current due to noise or difference in timing can be included.

In this specification and the like, when a plurality of components denoted by the same reference numerals need to be distinguished from each other, "_1", "[n]", "[m, n]", and the like are sometimes added to the reference numerals. For example, one of two wirings GL is referred to as a wiring GL[1] and the other is referred to as a wiring GL[2] in some cases.

Embodiment 1

Figure 1B:
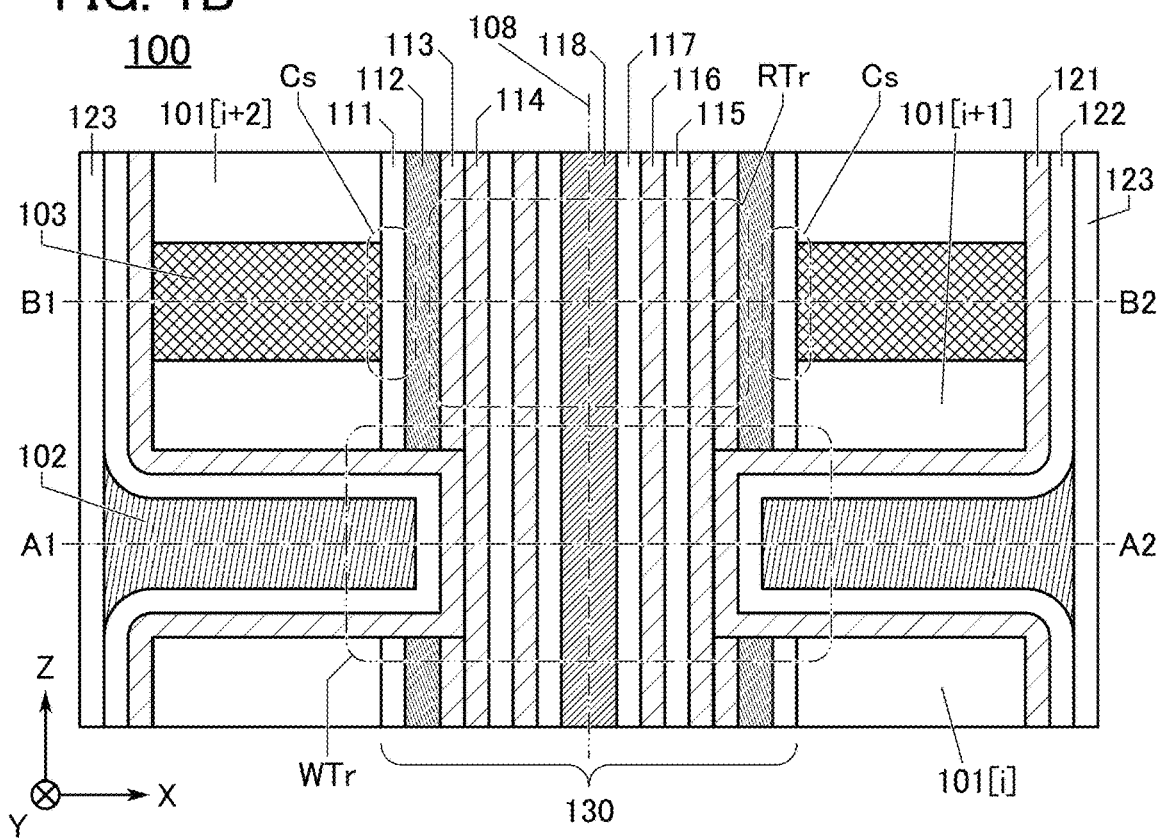
FIG. 1B is a cross-sectional view of the memory cell.

FIG. 1A is a perspective view of a memory cell 100 according to one embodiment of the present invention. The memory cell 100 is a memory device having a three-dimensional stacked-layer structure. Note that in FIG. 1A, part of the memory cell 100 is omitted for easy understanding of the internal structure of the memory cell 100. Note that arrows indicating the X direction, the Y direction, and the Z direction are illustrated in some of the drawings. The X direction, the Y direction, and the Z direction are orthogonal to each other. In this specification and the like, one of the X direction, the Y direction, and the Z direction may be referred to as a first direction, another as a second direction, and the other as a third direction. In FIGS. 1A and 1B and the like, the direction parallel to a central axis 108 is denoted as the Z direction.

<Memory Cell Structure Example>

Figure 3A:
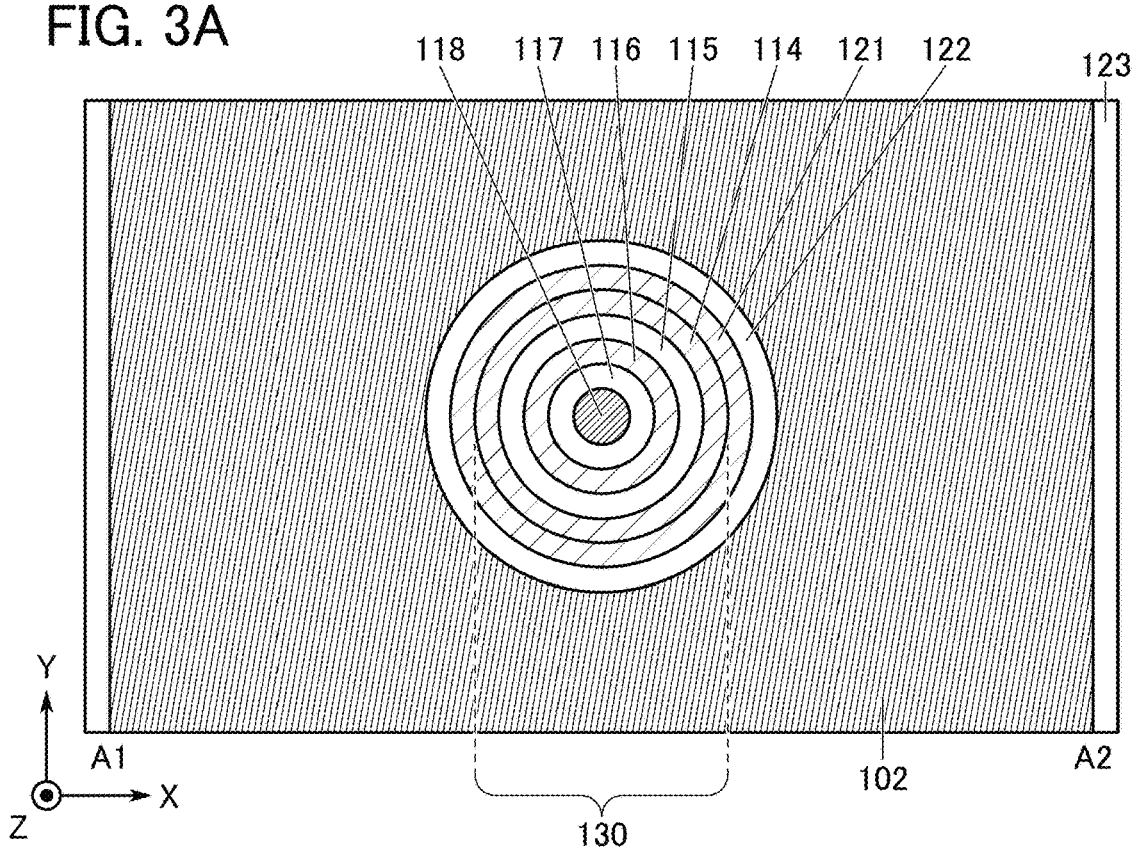
FIGS. 3A and 3B are cross-sectional views of a memory cell.
Figure 3B:
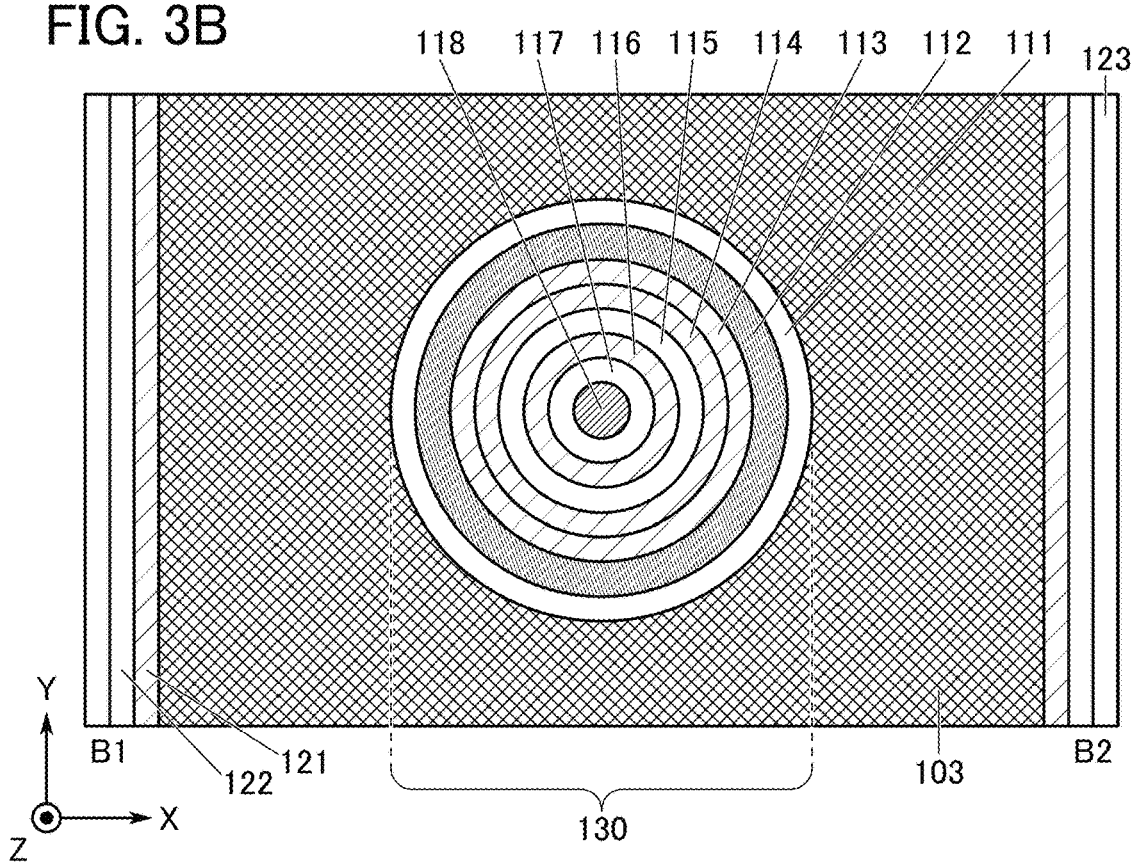

FIG. 1B is a cross-sectional view illustrating part of the memory cell 100 illustrated in FIG. 1A. FIG. 1B shows a cross section of part of the memory cell 100 seen from the Y direction. FIG. 1B is a cross-sectional view along the XZ plane that passes through the central axis 108. FIG. 3A is a cross-sectional view in which a portion A1-A2 represented by a dashed-dotted line in FIG. 1B is seen from the Z direction. FIG. 3B is a cross-sectional view in which a portion B1-B2 represented by a dashed-dotted line in FIG. 1B is seen from the Z direction.

The memory cell 100 includes a plurality of insulators 101 over a substrate (not illustrated). The plurality of insulators 101 are sequentially stacked from the substrate side. In this embodiment and the like, the i-th insulator 101 (i is an integer of 1 or more) is denoted as an insulator 101[i]. FIG. 1B illustrates an insulator 101[i+1] over the insulator 101[i] and an insulator 101[i+2] over the insulator 101[i+1]. A conductor 102 is provided between the insulator 101[i] and the insulator 101[i+1], and a conductor 103 is provided between the insulator 101[i+1] and the insulator 101[i+2]. The insulators 101, the conductor 102, and the conductor 103 extend in the Y direction.

Figure 2A:
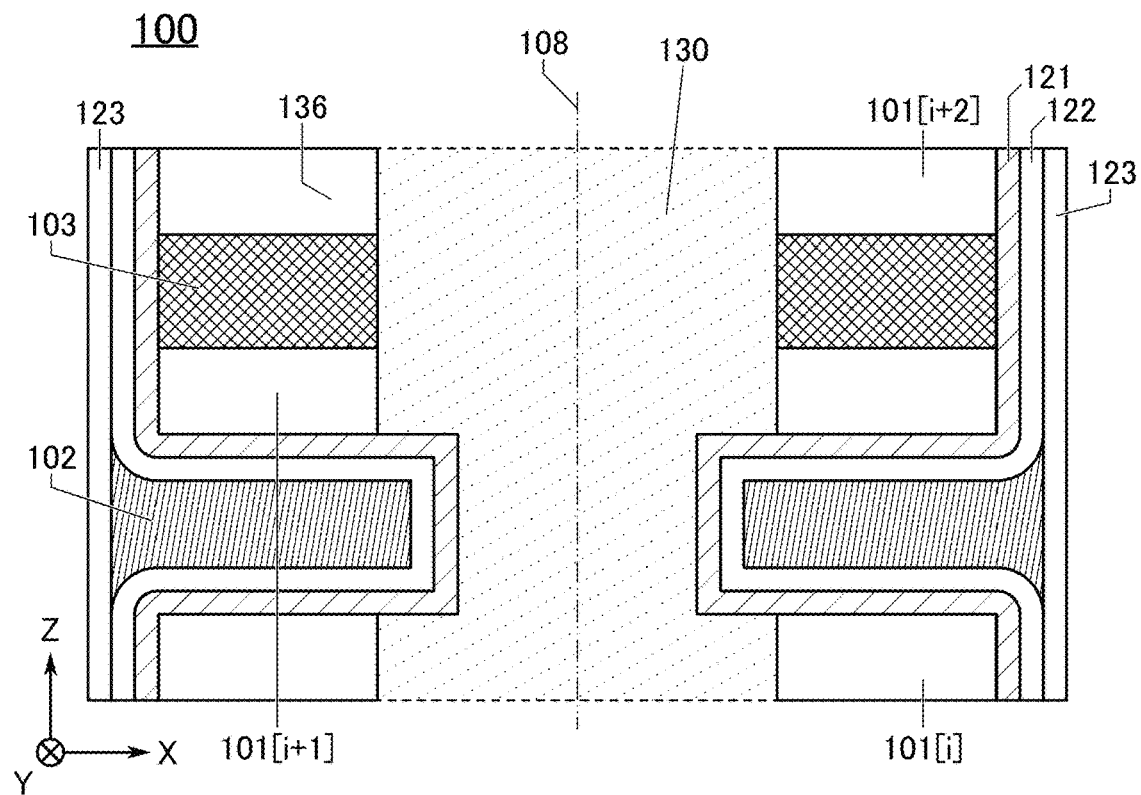
FIGS. 2A and 2B are cross-sectional views of a memory cell.

The memory cell 100 includes a component 130. The component 130 extends in the Z direction along the central axis 108. The component 130 has a columnar shape or a tubular shape. The component 130 illustrated in FIGS. 1A and 1B, FIGS. 2A and 2B, and FIGS. 3A and 3B includes an insulator 111, a conductor 112, a semiconductor 113, a semiconductor 114, an insulator 115, a semiconductor 116, an insulator 117, a conductor 118, and the like. FIG. 2A is a cross-sectional view in which the details of the component 130 are omitted.

Although this embodiment and the like describe the case where the periphery of the component 130 is circular when the component 130 is seen from the Z direction, the peripheral shape of the component 130 is not necessarily a circle and may be a polygon, such as a triangle or a quadrilateral, for example. Moreover, the peripheral shape of the component 130 may consist of curves or a combination of curves and straight lines. As illustrated in FIGS. 1A and 1B and FIGS. 2A and 2B, the component 130 has a projection and a recess on a side surface extending in the Z direction.

Figure 2B:
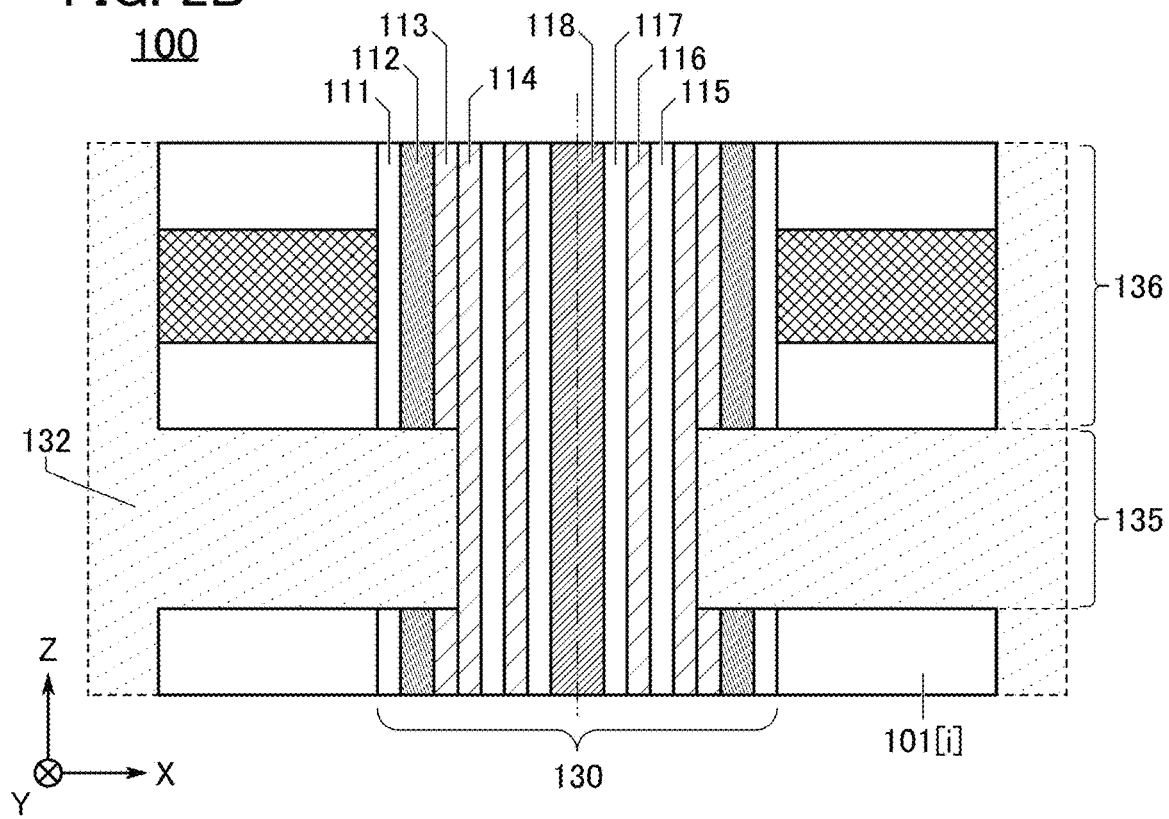

The memory cell 100 includes a region 132. The region 132 is formed by partly removing the insulator 101 and the conductor 103 in the process of manufacturing the memory cell 100. In the region 132, the semiconductor 121, the insulator 122, the insulator 123, the conductor 102, and the like are provided. For easy recognition of the region 132, FIG. 2B shows a cross-sectional view in which the components provided in the region 132 are not illustrated.

The region 132 is provided around the component 130. The region 132 includes a region 135 overlapping with the recess portion of the component 130 and a region 136 overlapping with the projection portion of the component 130 when seen from the direction perpendicular to the Z direction (see FIGS. 2A and 2B). The region 136 includes a region overlapping with the component 130 with the insulator 101 therebetween, and a region overlapping with the component 130 with the conductor 103 therebetween.

As described above, the component 130 has a columnar shape or a tubular shape. Specifically, the conductor 118 extends in the Z direction along the central axis 108, and the insulator 117 is adjacent to the conductor 118. The semiconductor 116 is adjacent to the insulator 117. The insulator 115 is adjacent to the semiconductor 116. The semiconductor 114 is adjacent to the insulator 115. In the projection portion of the component 130, the semiconductor 113 is adjacent to the semiconductor 114, the conductor 112 is adjacent to the semiconductor 113, and the insulator 111 is adjacent to the conductor 112.

As illustrated in FIG. 3A, in the recess portion of the component 130, the insulator 117, the semiconductor 116, the insulator 115, and the semiconductor 114 are provided concentrically around the conductor 118. In the recess portion of the component 130, the semiconductor 121 is adjacent to the semiconductor 114, and the insulator 122 is adjacent to the semiconductor 121. The conductor 102 extending in the Y direction intersects with the recess portion of the component 130.

The conductor 118, the insulator 117, the semiconductor 116, the insulator 115, and the semiconductor 114 that are included in the region of the component 130 intersecting (overlapping) with the conductor 102, the semiconductor 121, the insulator 122, and the conductor 102 function as a transistor WTr. Thus, the transistor WTr can be said to be formed in an intersection portion of the component 130 and the conductor 102.

In the memory cell 100, the conductor 102 functions as a gate electrode of the transistor WTr. Accordingly, the insulator 122 functions as a gate insulator. The semiconductor 121 can also function as a gate insulator. The semiconductor 114 functions as a semiconductor in which a channel is formed. The conductor 118 functions as a back gate electrode in some cases. Accordingly, the insulator 117, the semiconductor 116, and the insulator 115 function as a back gate insulator in some cases. FIG. 3A is also a cross-sectional view of the transistor WTr seen from the Z direction.

As illustrated in FIG. 3B, in the projection portion of the component 130, the insulator 117, the semiconductor 116, the insulator 115, the semiconductor 114, the semiconductor 113, the conductor 112, and the insulator 111 are provided concentrically around the conductor 118. The conductor 103 extending in the Y direction intersects with the projection portion of the component 130.

The conductor 118, the insulator 117, the semiconductor 116, the insulator 115, the semiconductor 114, the semiconductor 113, and the conductor 112 that are included in the region of the component 130 intersecting (overlapping) with the conductor 103 function as a transistor RTr. A region where the conductor 103, the insulator 111, and the conductor 112 overlap with each other functions as a capacitor Cs. That is, it can be said that the transistor RTr and the capacitor Cs are formed in an intersection portion of the component 130 and the conductor 103.

In the transistor RTr, the conductor 112 functions as a gate electrode. The semiconductors 113 and 114 also function as a gate electrode of the transistor RTr in some cases. In the transistor RTr, the insulator 115 functions as a gate insulating layer, and the semiconductor 116 functions as a semiconductor in which a channel is formed. As described above, the conductor 118 functions as a back gate electrode in some cases. Accordingly, the insulator 117 functions as a back gate insulating layer in some cases. FIG. 3B is also a cross-sectional view of the transistor RTr and the capacitor Cs seen from the Z direction.

Figure 4A:
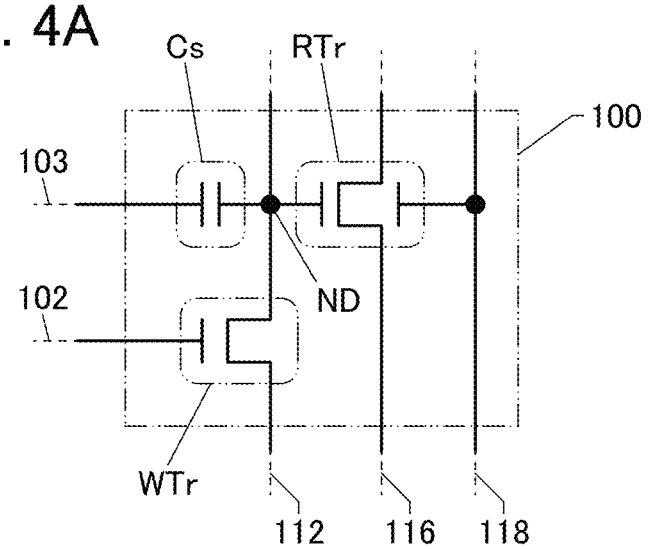
FIGS. 4A to 4C are equivalent circuit diagrams of a memory cell.

FIG. 4A is an equivalent circuit diagram of the memory cell 100. In FIG. 4A, one of a source and a drain of the transistor WTr is electrically connected to the conductor 112, and the other of the source and the drain of the transistor WTr is electrically connected to the gate of the transistor RTr. The gate of the transistor WTr is electrically connected to the conductor 102. One electrode of the capacitor Cs is electrically connected to the gate of the transistor RTr, and the other electrode of the capacitor Cs is electrically connected to the conductor 103.

In this specification and the like, a node where the gate of the transistor RTr, the other of the source and the drain of the transistor WTr, and the one electrode of the capacitor Cs are electrically connected is referred to as a node ND.

Part of the semiconductor 116 functions as a channel formation region of the transistor RTr. Another part of the semiconductor 116 functions as the source or the drain of the transistor RTr. The transistor RTr illustrated in FIG. 4A includes a back gate. In this embodiment, part of the conductor 118 functions as the back gate of the transistor RTr. Part of the conductor 102 functions as the gate of the transistor WTr. Part of the conductor 103 functions as the other electrode of the capacitor Cs. Part of the conductor 112 functions as the one of the source and the drain of the transistor WTr.

Figure 4B:
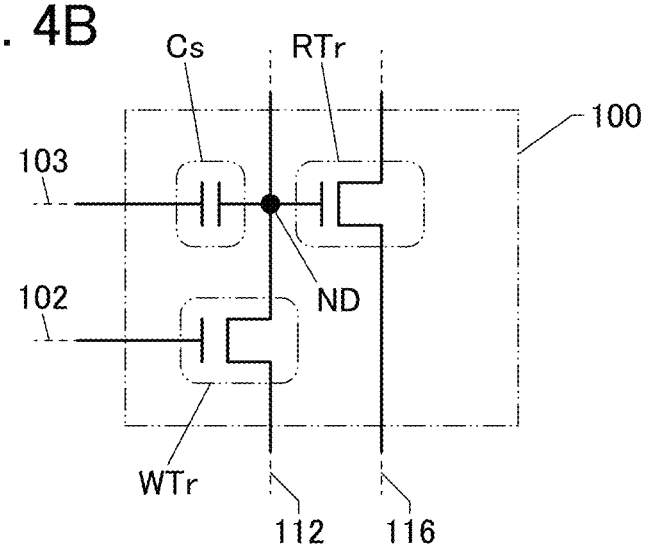
Figure 4C:
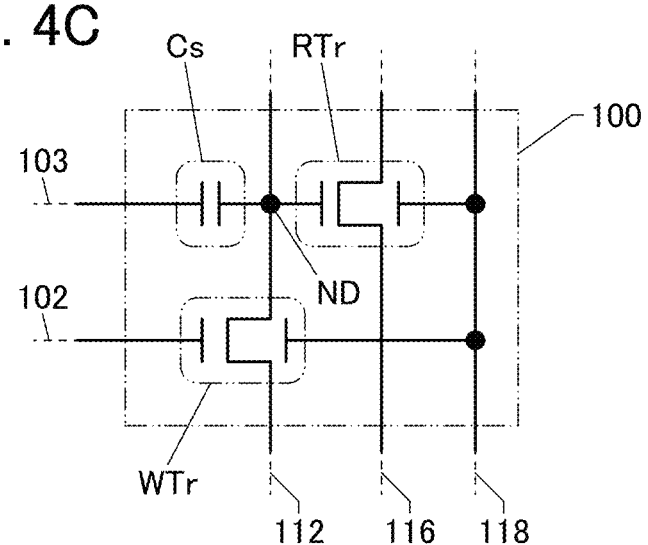
Figure 5A:
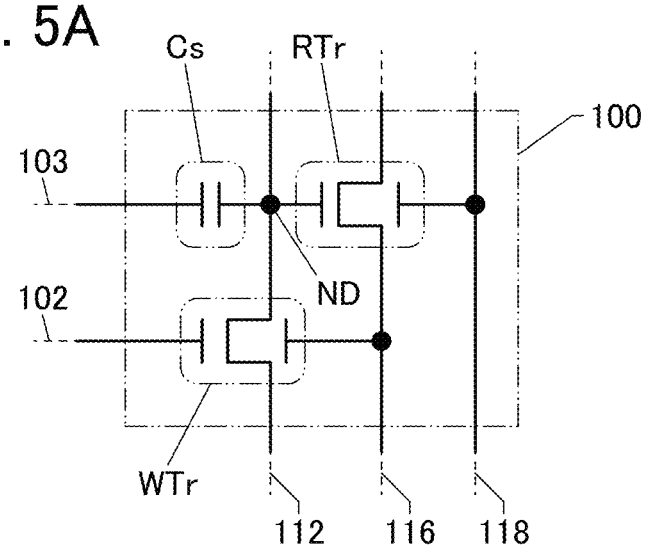
FIGS. 5A and 5B are equivalent circuit diagrams of a memory cell.
Figure 5B:
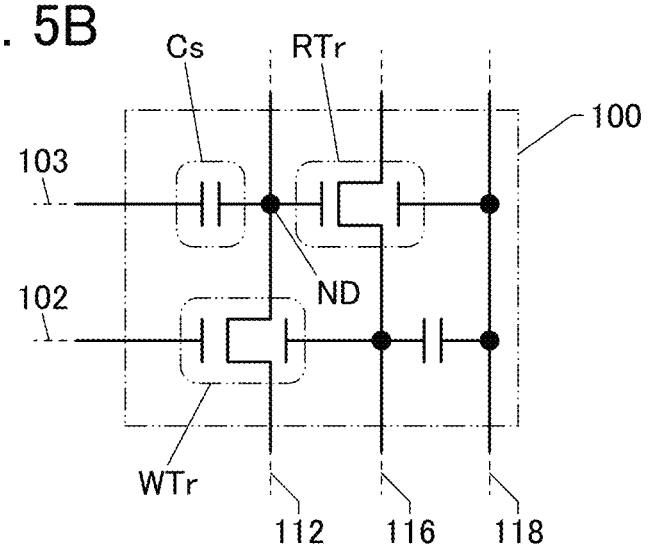

As illustrated in FIG. 4B, the transistor RTr does not necessarily include the back gate. FIG. 4B corresponds to an equivalent circuit diagram of a memory cell 100H described later. As illustrated in FIG. 4C, the transistor WTr may be provided with a back gate. FIG. 4C illustrates a circuit configuration example in which the back gate of the transistor WTr is electrically connected to the conductor 118; however, a conductor electrically connected to the back gate of the transistor WTr may be provided in addition to the conductor 118. Alternatively, a circuit configuration illustrated in FIG. 5A or FIG. 5B may be employed.

Figure 6:
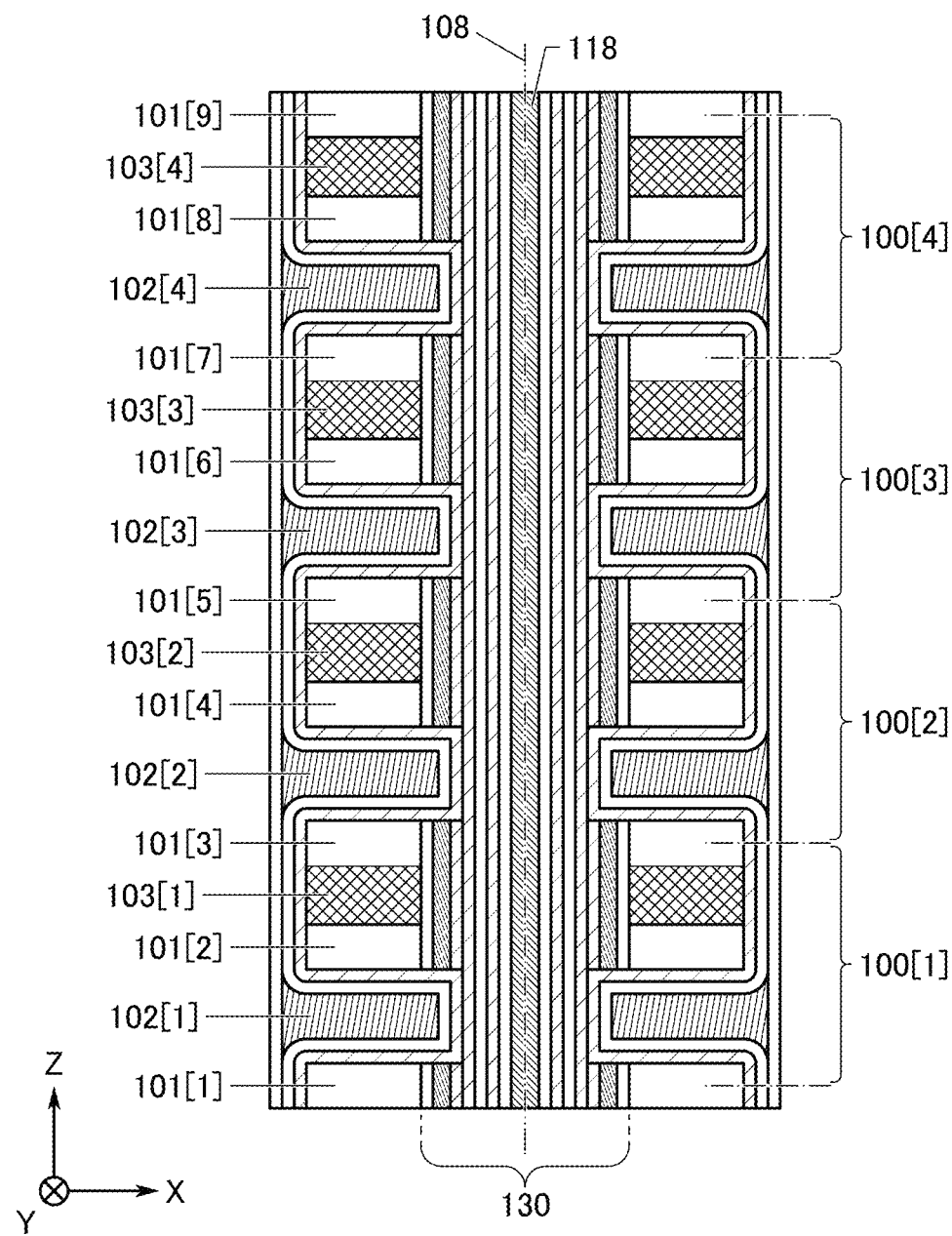
FIG. 6 is a cross-sectional view of a memory string.
Figure 7:
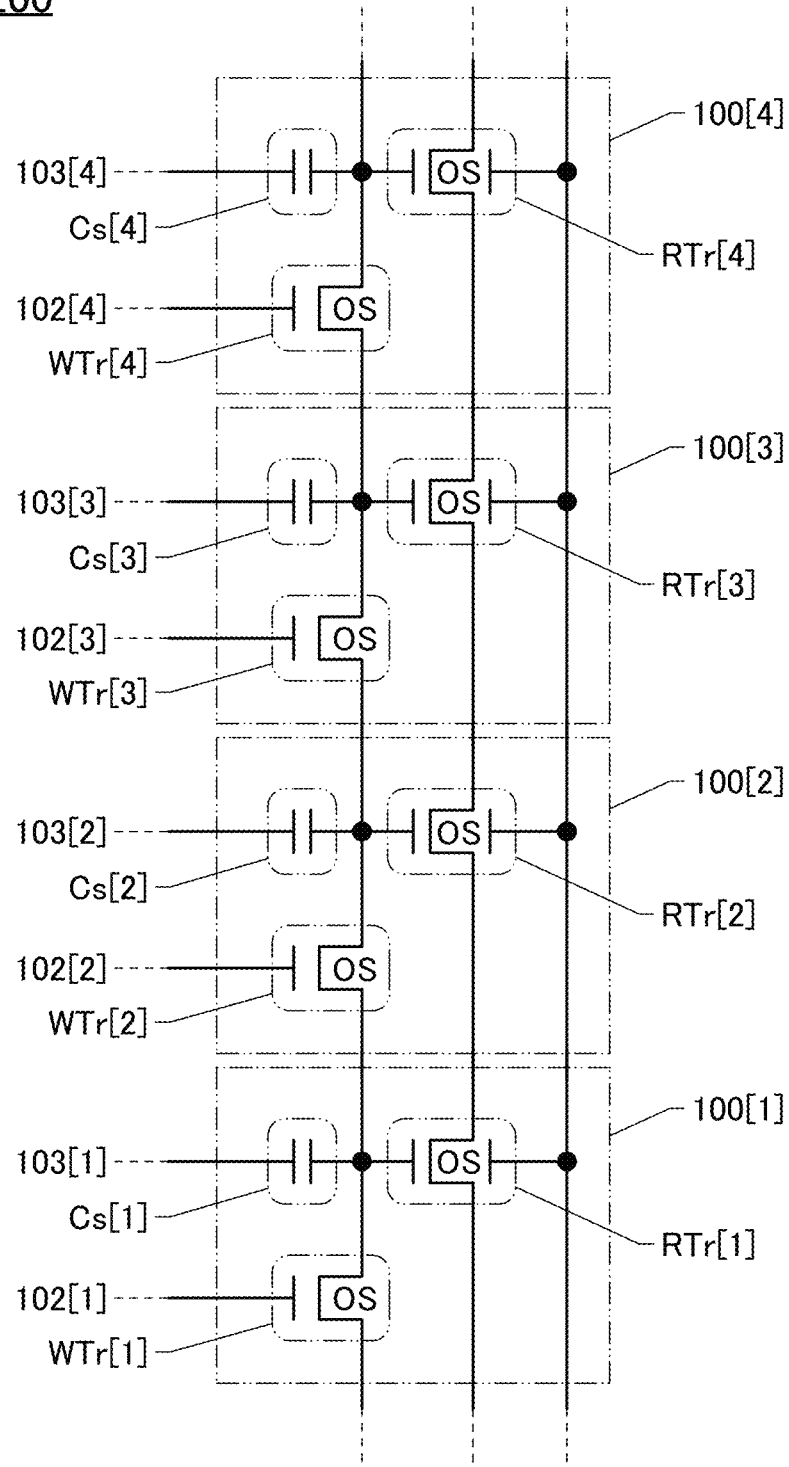
FIG. 7 is an equivalent circuit diagram of a memory string.

FIG. 6 is a cross-sectional view of a memory string 200 including four memory cells 100 (memory cells 100[1] to 100[4]). FIG. 7 is an equivalent circuit diagram of the memory string 200. The memory string 200 has a structure in which the four memory cells 100 are connected in series. That is, the memory string 200 is a NAND-like memory device.

To clarify that a transistor is preferably an OS transistor in an equivalent circuit diagram and the like, "OS" is sometimes written inside a circuit symbol of the transistor. Similarly, to clarify that a transistor is preferably a Si transistor (a transistor using silicon for a semiconductor layer in which a channel is formed), "Si" is sometimes written inside a circuit symbol of the transistor. FIG. 7 shows that the transistor WTr and the transistor RTr are OS transistors.

The memory string 200 illustrated in FIG. 6 includes nine insulators 101 (insulators 101[1] to 101[9]), four conductors 102 (conductors 102[1] to 102[4]), and four conductors 103 (conductors 103[1] to 103[4]).

In FIG. 7, the transistor WTr, the transistor RTr, and the capacitor Cs included in the memory cell 100[1] are denoted as a transistor WTr[1], a transistor RTr[1], and a capacitor Cs[1]. The transistors WTr, the transistors RTr, and the capacitors Cs included in the memory cells 100[2] to 100[4] are denoted in a similar manner.

Note that the number of memory cells 100 included in the memory string 200 is not limited to four. Given that the number of memory cells 100 included in the memory string 200 is n, n is an integer of 2 or more.

The expression "a structure in which a plurality of memory cells 100 are connected in series" means that the drain (or source) of the transistor WTr[k] in the memory cell 100[k] (k is an integer of 1 to n) is electrically connected to the source (or drain) of the transistor WTr[k+1] in the memory cell 100[k+1], and the drain (or source) of the transistor RTr[k] in the memory cell 100[k] is electrically connected to the source (or drain) of the transistor RTr[k+1] in the memory cell 100[k+1].

As the semiconductor in which the channel of the transistor WTr and the transistor RTr is formed, one or a combination of a single crystal semiconductor, a polycrystalline semiconductor, a microcrystalline semiconductor, an amorphous semiconductor, and the like can be used. As a semiconductor material, silicon and germanium can be used, for example. A compound semiconductor such as silicon germanium, silicon carbide, gallium arsenide, an oxide semiconductor, or a nitride semiconductor may be used.

Note that the semiconductor used in the transistor may be a stack of semiconductors. When semiconductor layers are stacked, semiconductors having different crystal states may be used or different semiconductor materials may be used.

In particular, the transistor WTr is preferably a transistor using an oxide semiconductor, which is one type of metal oxide, in a semiconductor layer where a channel is formed (also referred to as OS transistor). An oxide semiconductor has a band gap of 2 eV or more and thus has an extremely low off-state current. When an OS transistor is used as the transistor WTr, charge written to the node ND (also referred to as storage node) can be held for a long time. In the case where OS transistors are used as transistors included in the memory cell 100, the memory cell 100 can be referred to as an OS memory. The memory string 200 including such a memory cell 100 can also be referred to as an OS memory.

A NAND memory device including the OS memory is referred to as an OS NAND type or an OS NAND memory device. An OS NAND memory device in which a plurality of OS memories are stacked in the Z direction is referred to as a 3D OS NAND type or a 3D OS NAND memory device.

Figure 8:
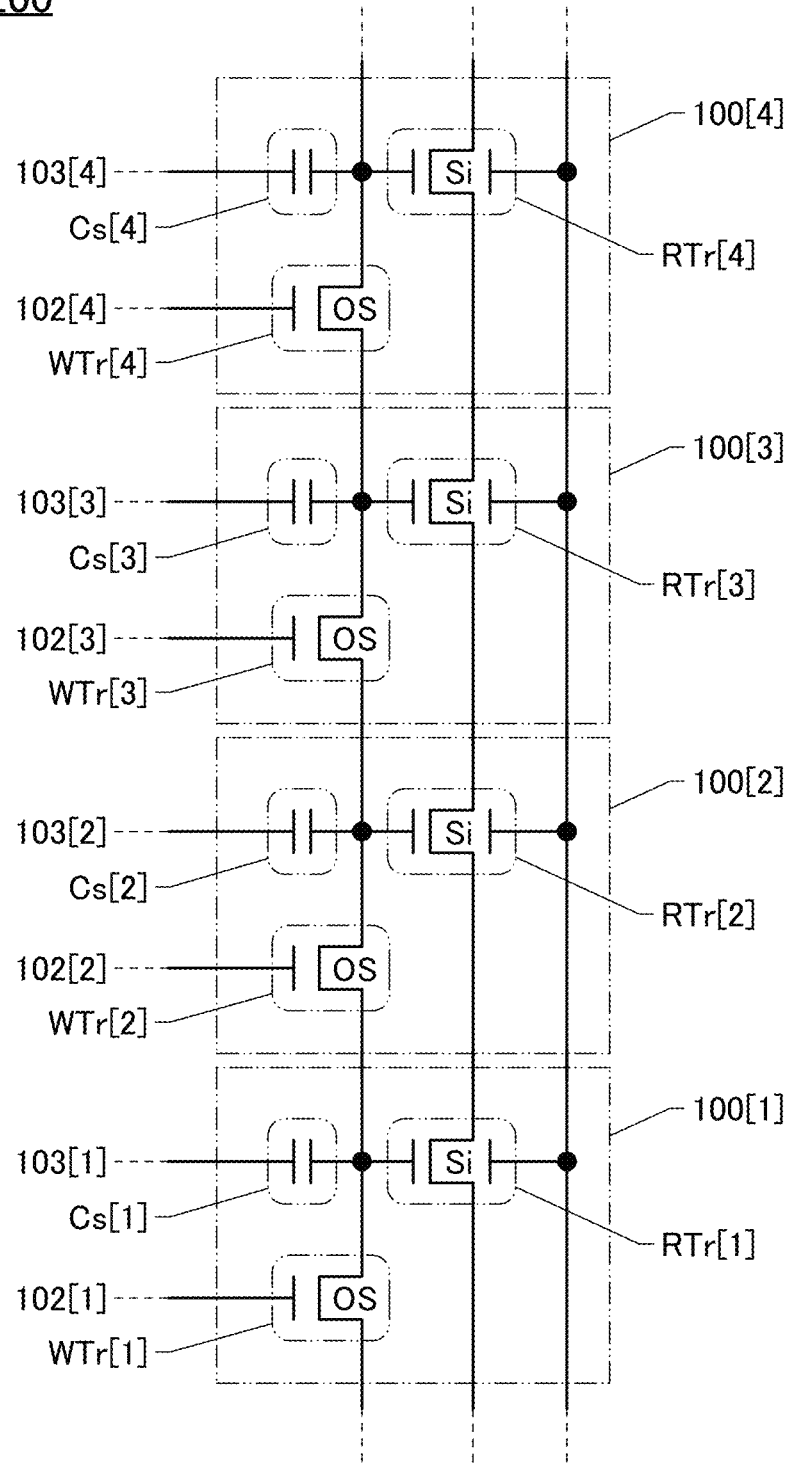
FIG. 8 is an equivalent circuit diagram of a memory string.

The transistor RTr may be a transistor using silicon in a semiconductor layer where a channel is formed (also referred to as Si transistor). The transistor RTr may be a Si transistor and the transistor WTr may be an OS transistor. FIG. 8 is an equivalent circuit diagram of the memory string 200 in which OS transistors are used as the transistors WTr and Si transistors are used as the transistors RTr.

The OS memory can hold written data in a period of one year or longer, or even 10 years or longer after power supply is stopped. Thus, the OS memory can be regarded as a nonvolatile memory.

In the OS memory, the amount of written charge is less likely to change over a long period of time; hence, the OS memory can hold multilevel (multibit) data as well as binary (1-bit) data.

To write data in the OS memory, charge is written to the node through the OS transistor; hence, high voltage, which a conventional flash memory requires, is unnecessary and high-speed write operation is possible. The OS memory does not require erase operation before data rewriting, which is performed in a flash memory. Furthermore, the number of data write and read operations in the OS memory is substantially unlimited because charge injection and extraction into/from a floating gate or a charge trap layer are not performed. The OS memory is less likely to degrade than a conventional flash memory and can have high reliability.

In the OS memory, data rewriting is not accompanied by a structure change at the atomic level, which occurs in magnetoresistive random access memory (MRAM), resistive random access memory (ReRAM), and the like. Thus, the OS memory has higher write endurance than MRAM and ReRAM.

The off-state current of the OS transistor hardly increases even in a high temperature environment, specifically, at temperatures higher than or equal to room temperature and lower than or equal to 200° C. Moreover, the on-state current is less likely to decrease even in a high temperature environment. A memory device including the OS memory achieves stable operation and high reliability even in a high temperature environment. The OS transistor has high withstand voltage between its source and drain. When OS transistors are used as transistors included in a semiconductor device, the semiconductor device achieves stable operation and high reliability even in a high temperature environment.

Figure 9:
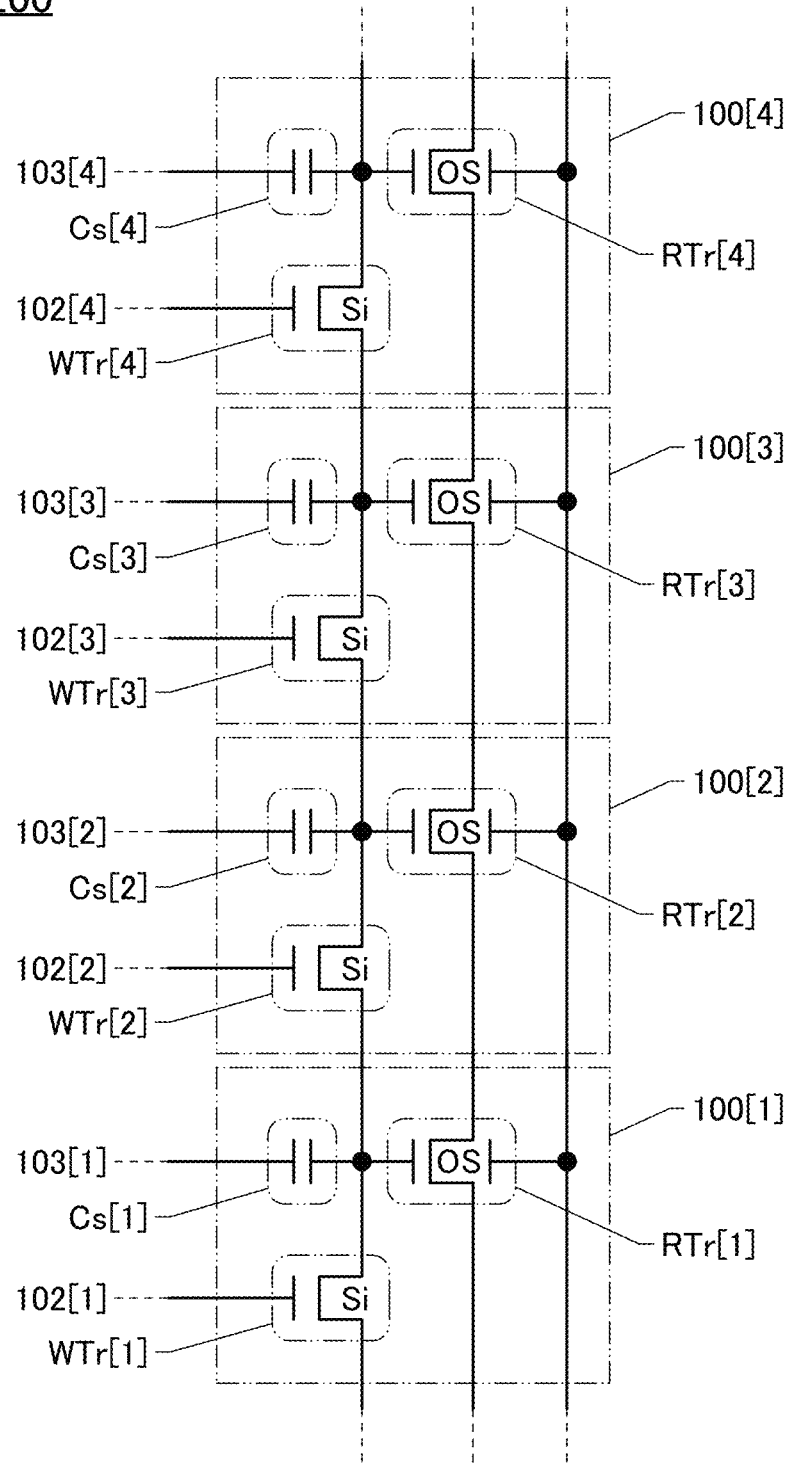
FIG. 9 is an equivalent circuit diagram of a memory string.
Figure 10:
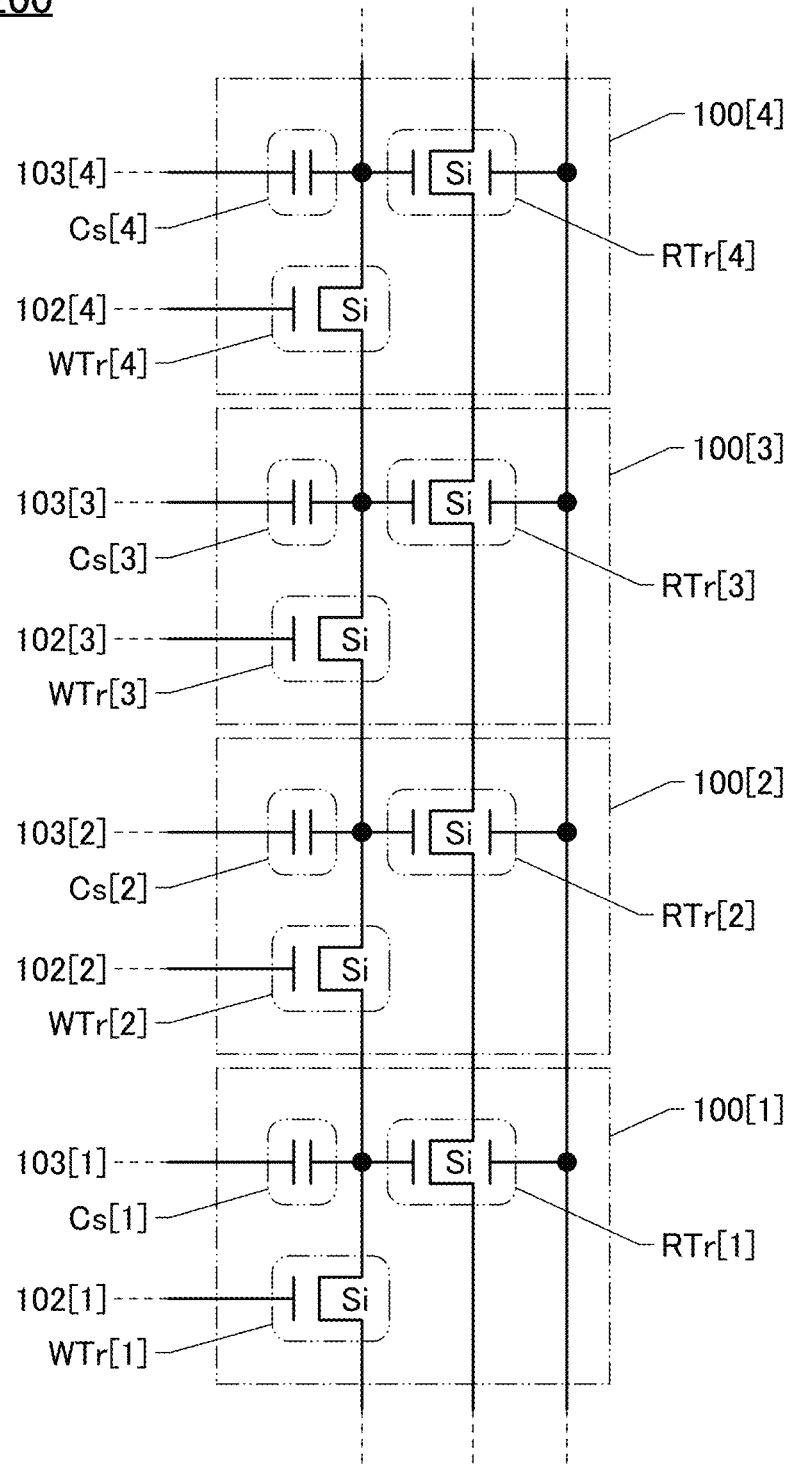
FIG. 10 is an equivalent circuit diagram of a memory string.

As illustrated in FIG. 9, Si transistors may be used as the transistors WTr and OS transistors may be used as the transistors RTr depending on the purpose, application, or the like. As illustrated in FIG. 10, Si transistors may be used as both the transistors WTr and RTr depending on the purpose, application, or the like.

When a plurality of memory cells 100 are provided continuously in the Z direction as in the memory string 200, the memory capacity per unit area can be increased.

Figure 11A:
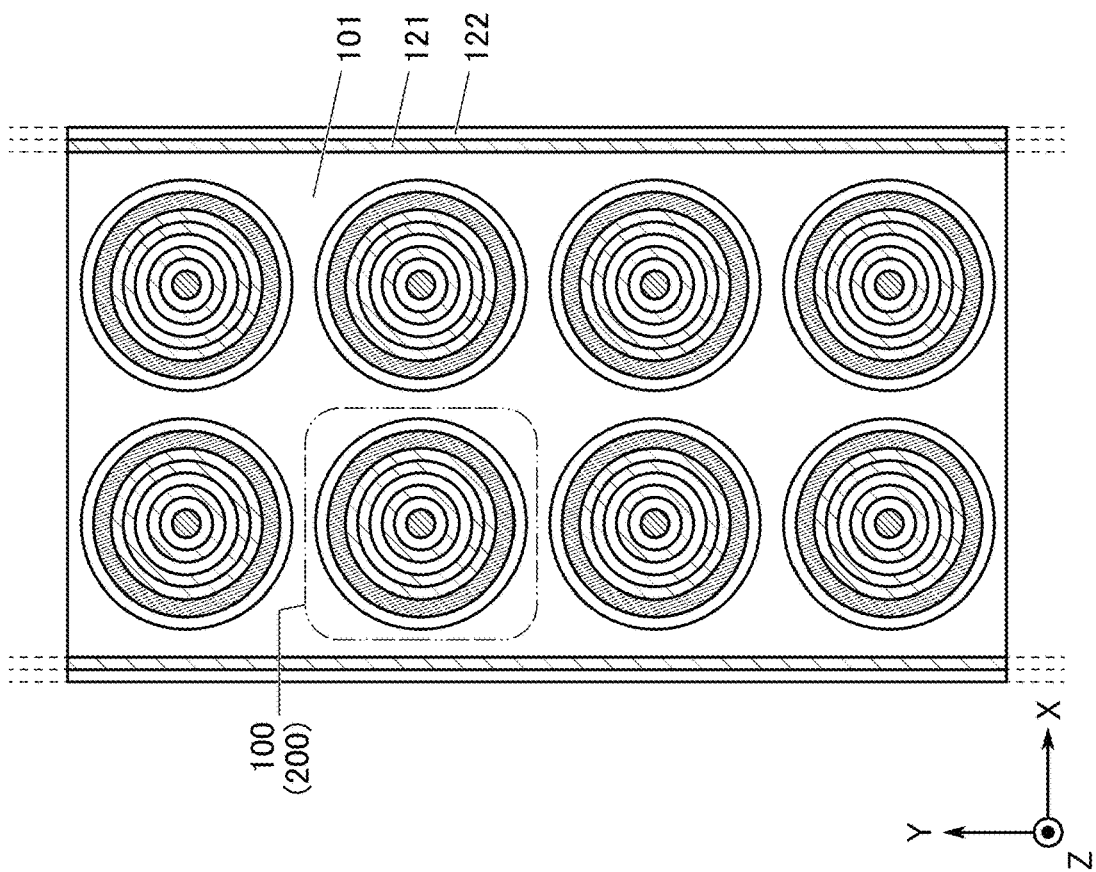
FIGS. 11A and 11B are top views of memory strings.
Figure 11B:
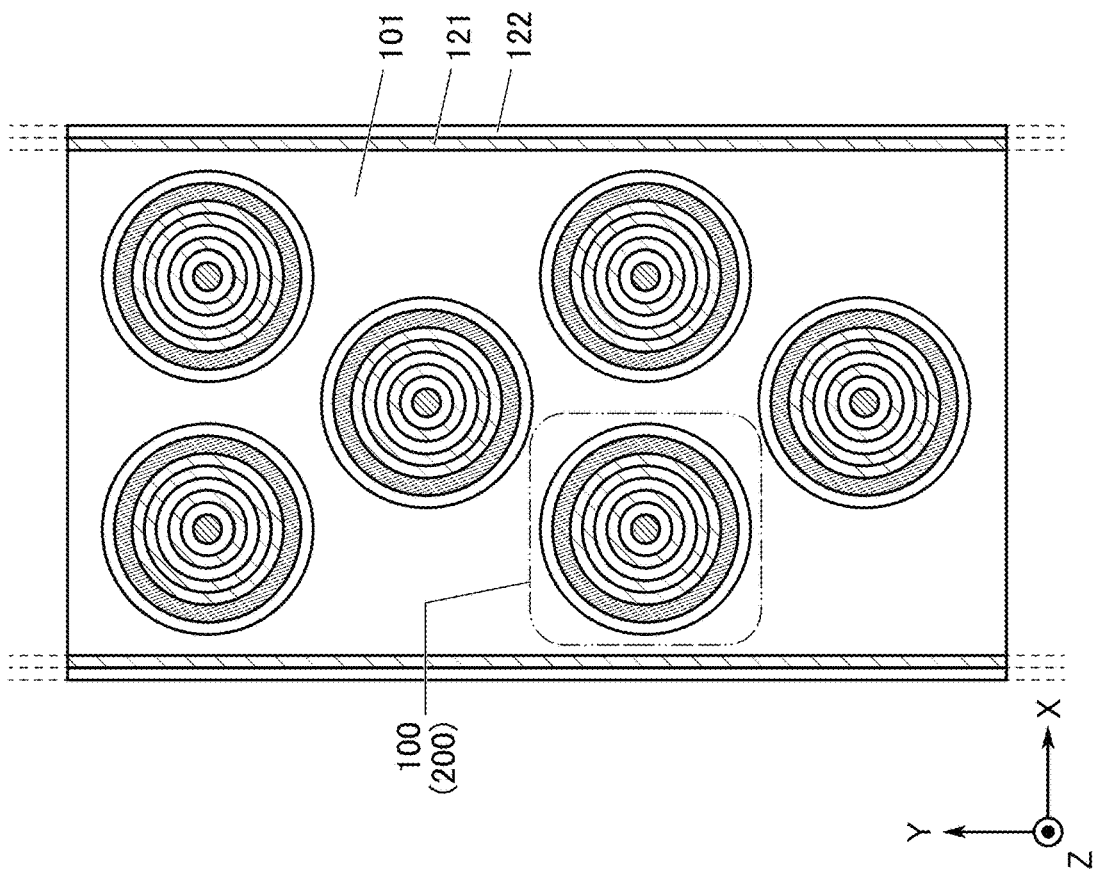

To increase the memory capacity of a semiconductor device using the memory cell 100 or the memory string 200, a plurality of memory cells 100 or a plurality of memory strings 200 are provided in a staggered arrangement (see FIG. 11A) or in a grid pattern (see FIG. 11B). FIGS. 11A and 11B are top views of the memory strings.

Table 1 shows comparison of a 3D NAND memory device fabricated using Si transistors and a 3D OS NAND memory device.

TABLE 1

| Category | Item | 3D NAND | Comparison | 3D OS NAND | |
|---|---|---|---|---|---|
| 1. High-speed write or write/erase | Write speed per page | 300 µs/page | > | 1 to 3 µs/page (assuming 32 layers) | ○ |
| | Write/erase speed per block | 2 ms/block | >> | 2.6 µs/block (assuming 32 layers) | ⊚ |
| 2. High-speed read | Read speed per page | 50 µs/page | = | 50 µs/page (assuming 32 layers) | — |
| 3. No high voltage | Programming voltage Vph | 12 to 20 V | >> | 3 to 5 V | ○ |
| | Programming voltage Vpl | 0 V | ≈ | −3 to 0 V | — |
| | Logic voltage Vc | 1.2 V | = | 1.2 V | — |
| 4. No rewrite degradation | Write endurance | $10^3$ to $10^5$ cycles | << | $10^{12}$ cycles or more | ⊚ |
| 5. Erase operation per block | — | | | Necessary | Not necessary | ○ |
| 6. Multilevel | How much levels are possible? | 4 bits/cell (16 levels) | | ≈4 bits/cell (16 levels) | — |
| 7. Applicable to non-von Neumann architecture | Ease of stacking, Ease of access | Need cache memory | | No need of external cache memory | ○ |

TABLE 1-continued

| Category | Item | 3D NAND | Comparison | 3D OS NAND | |
|---|---|---|---|---|---|
| 8. Power consumption | — | 8 W (for SSD) | >> | Much smaller than 3D NAND | ⊚ |

⊚: excellent,
○: good

VARIATION EXAMPLES

Next, variation examples of the memory cell 100 will be described. Variation examples of the memory cell described below can be combined as appropriate with another memory cell shown in this specification and the like.

Figure 12A:
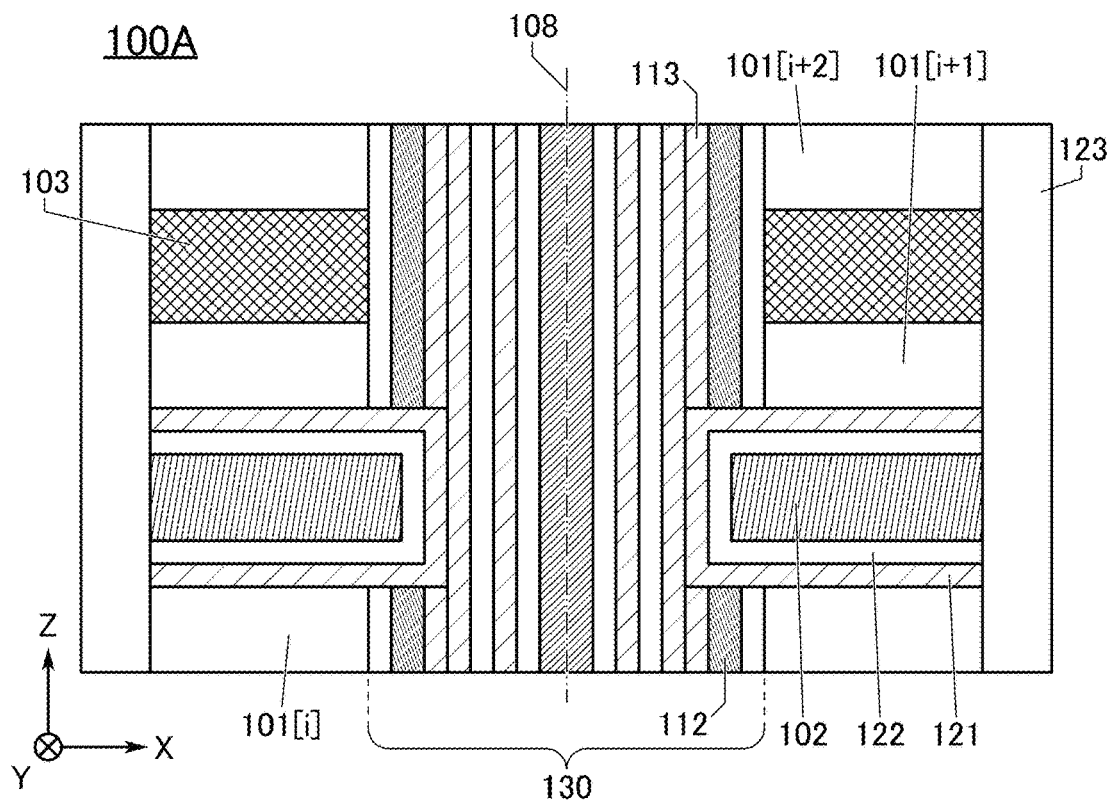
FIGS. 12A and 12B are each a cross-sectional view of a memory cell.

FIG. 12A is a cross-sectional view of a memory cell 100A. The memory cell 100A is a variation example of the memory cell 100. Therefore, the differences between the memory cell 100A and the memory cell 100 are mainly described in this embodiment.

In the memory cell of one embodiment of the present invention, as in the memory cell 100A illustrated in FIG. 12A, the semiconductor 121, the insulator 122, and the conductor 102 in regions that do not overlap with the insulator 101 and/or the conductor 103 when seen from the Z direction may be removed. Accordingly, the insulator 123 in the memory cell 100A may include a region in contact with the insulator 101, a region in contact with the conductor 103, a region in contact with the semiconductor 121, a region in contact with the insulator 122, and a region in contact with the conductor 102.

Figure 12B:
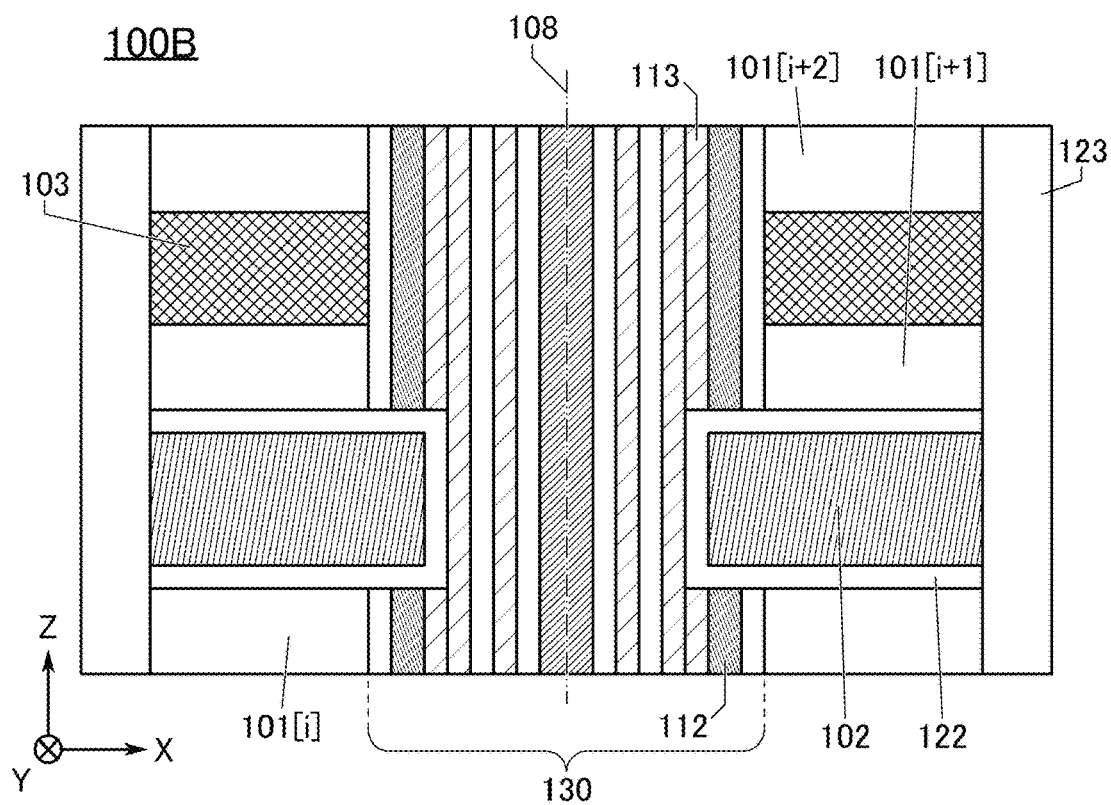

FIG. 12B is a cross-sectional view of a memory cell 100B. The memory cell 100B is a variation example of the memory cell 100A. Formation of the semiconductor 121 may be omitted as in the memory cell 100B. In the memory cell 100B, the conductor 118, the insulator 117, the semiconductor 116, the insulator 115, and the semiconductor 114 that are placed in a region of the component 130 intersecting (overlapping) with the conductor 102, as well as the insulator 122 and the conductor 102 function as the transistor WTr. Not providing the semiconductor 121 can simplify the manufacturing process and increase the productivity of the memory device.

Figure 13A:
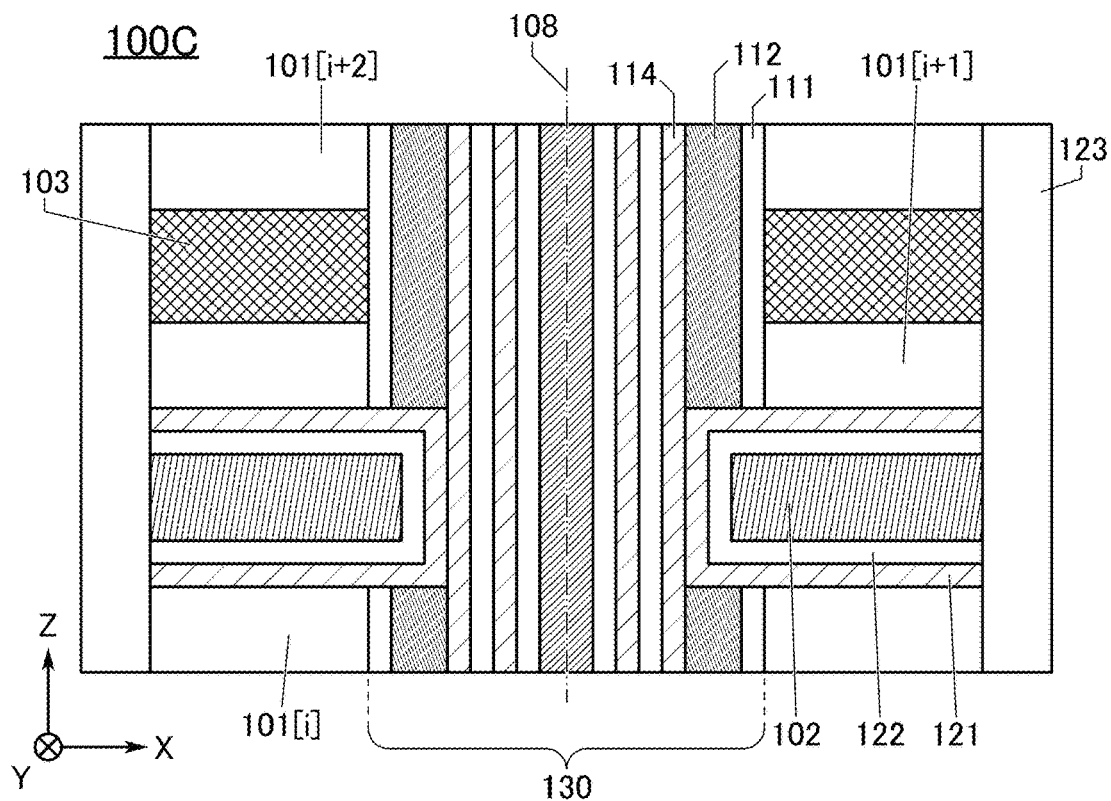
FIGS. 13A and 13B are each a cross-sectional view of a memory cell.

FIG. 13A is a cross-sectional view of a memory cell 100C. The memory cell 100C is a variation example of the memory cell 100A. As in the memory cell 100C, formation of the semiconductor 113 may be omitted so that the conductor 112 and the semiconductor 114 are in contact with each other. In the memory cell 100C, the conductor 118, the insulator 117, the semiconductor 116, the insulator 115, the semiconductor 114, and the conductor 112 that are placed in a region of the component 130 intersecting (overlapping) with the conductor 103 function as the transistor RTr. Not providing the semiconductor 113 can simplify the manufacturing process and increase the productivity of the memory device.

Figure 13B:
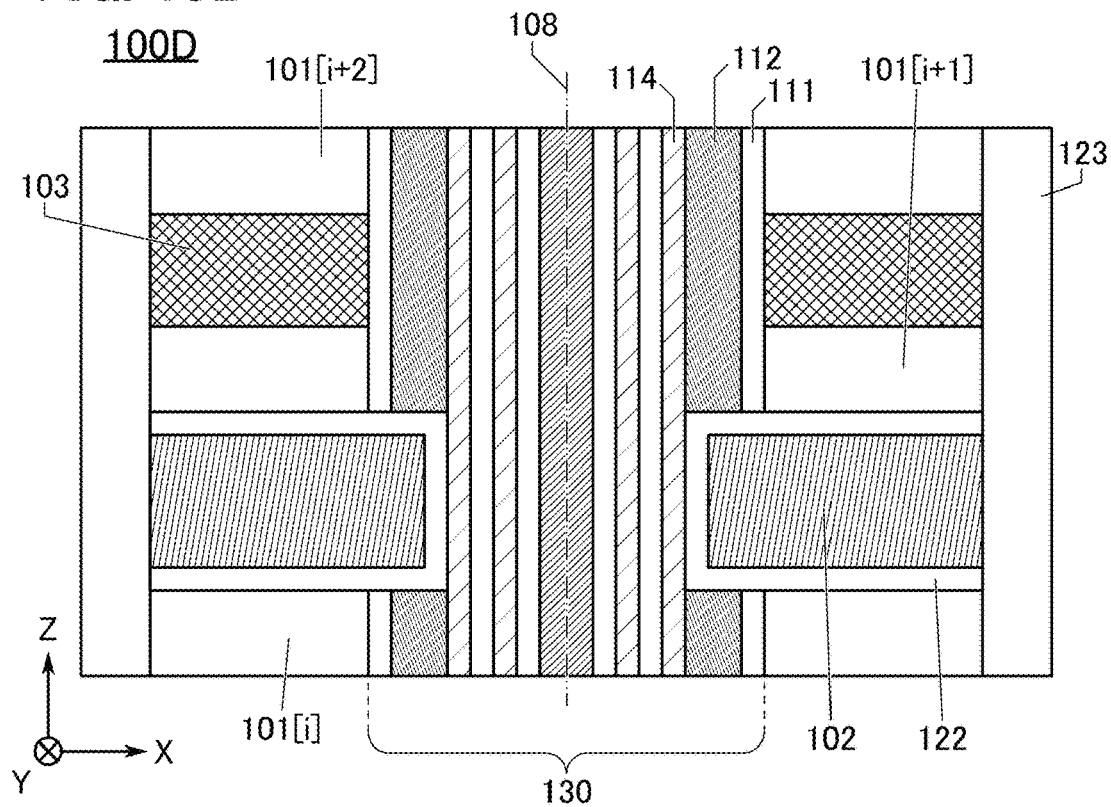

FIG. 13B is a cross-sectional view of a memory cell 100D. The memory cell 100D is a variation example of the memory cell 100B and is also a variation example of the memory cell 100C. As in the memory cell 100D, formation of the semiconductor 113 may be omitted so that the conductor 112 and the semiconductor 114 are in contact with each other. The transistor WTr in the memory cell 100D has the same structure as that in the memory cell 100B. The transistor RTr in the memory cell 100D has the same structure as that in the memory cell 100C. Not providing the semiconductors 113 and 121 can simplify the manufacturing process and increase the productivity of the memory device.

Figure 14:
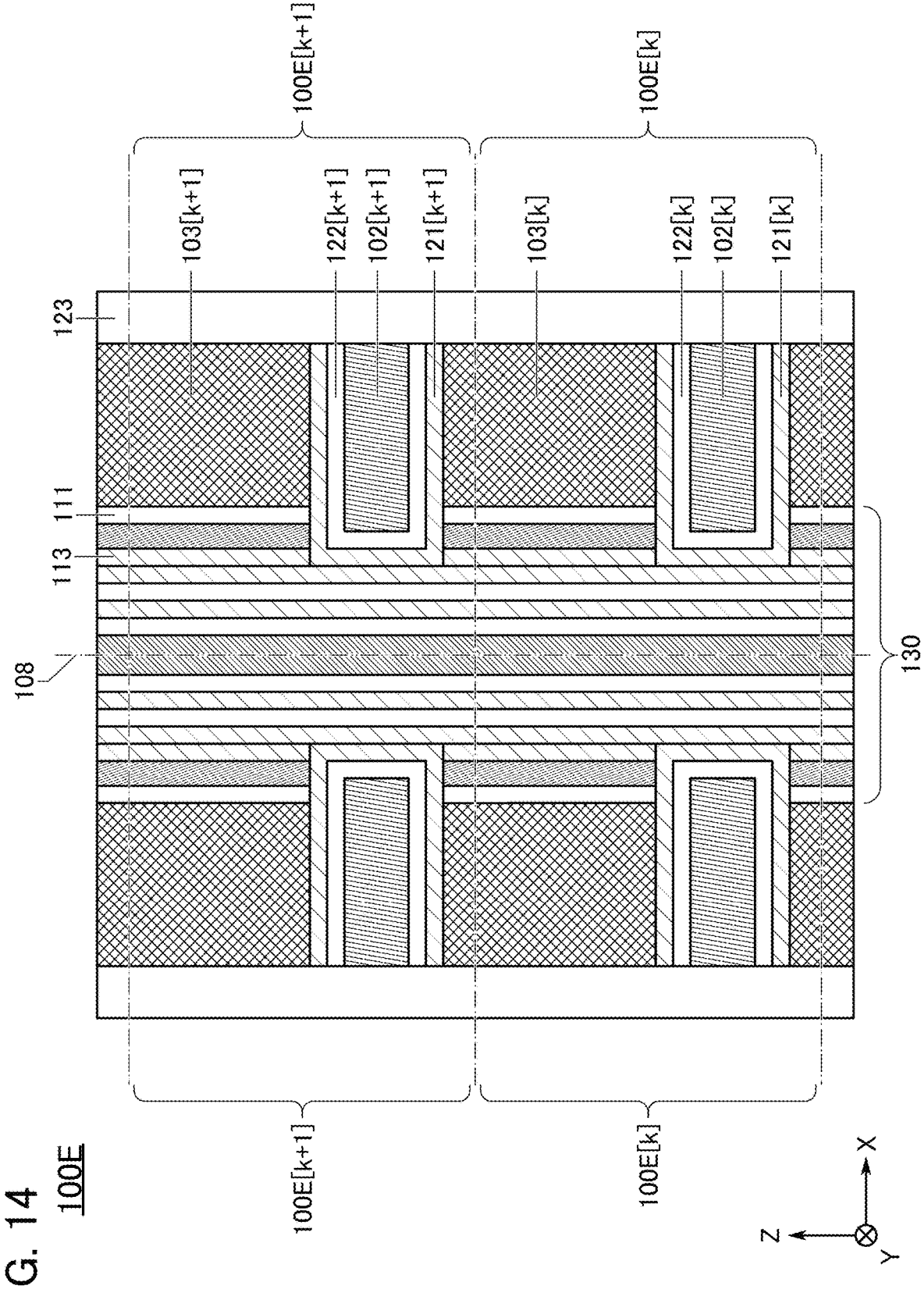
FIG. 14 is a cross-sectional view of a memory cell.

FIG. 14 is a cross-sectional view of a memory cell 100E. FIG. 14 shows a cross section of a memory cell 100E[k] and a memory cell 100E[k+1] adjacent to the memory cell 100E[k]. The memory cell 100E is a variation example of the memory cell 100A. As in the memory cell 100E, formation of the insulator 101 may be omitted so that the conductor 103 and the semiconductor 121 are in contact with each other. Not providing the insulator 101 can simplify the manufacturing process and increase the productivity of the memory device.

FIG. 15 is a cross-sectional view of a memory cell 100F. FIG. 15 shows a cross section of a memory cell 100F[k] and a memory cell 100F[k+1] adjacent to the memory cell 100F[k]. The memory cell 100F is a variation example of the memory cell 100B. As in the memory cell 100F, formation of the insulator 101 may be omitted so that the conductor 103 and the insulator 122 are in contact with each other. Moreover, as in the memory cell 100D, formation of the semiconductor 113 may be omitted. Not providing the insulator 101 and/or the semiconductor 113 can simplify the manufacturing process and increase the productivity of the memory device.

Figure 16A:
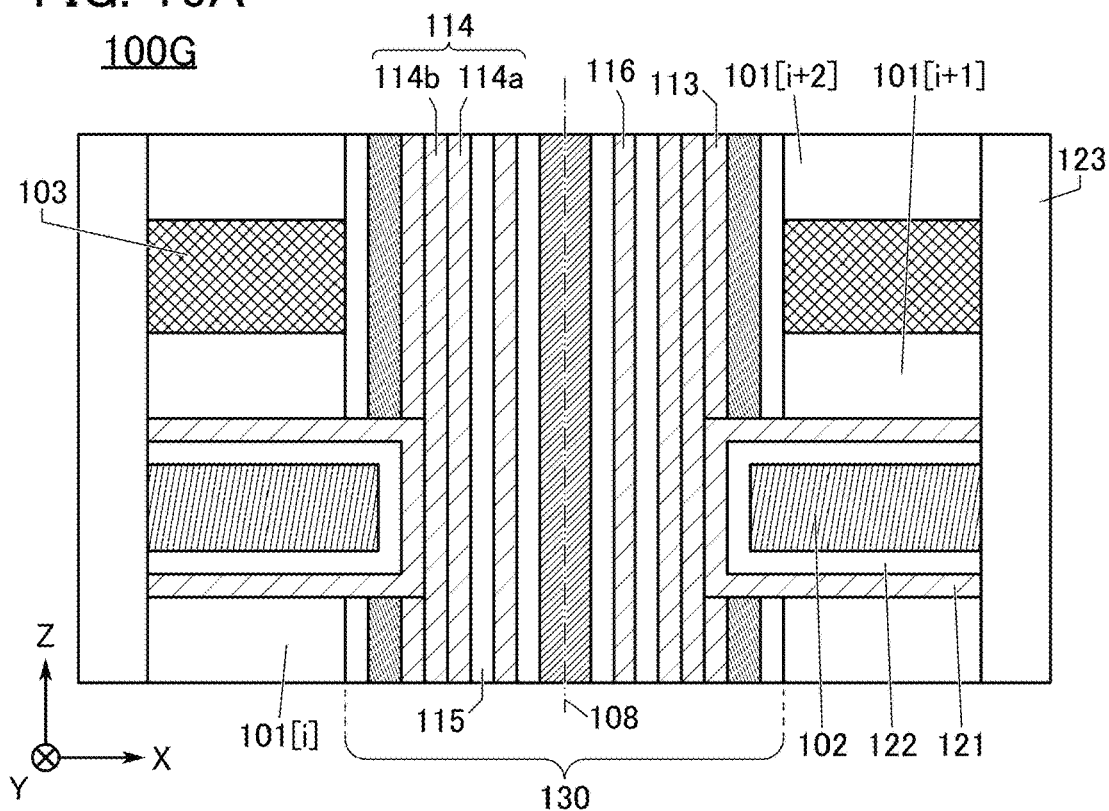
FIGS. 16A and 16B are each a cross-sectional view of a memory cell.

FIG. 16A is a cross-sectional view of a memory cell 100G. The memory cell 100G is a variation example of the memory cell 100A. As in the memory cell 100G, the semiconductor 114 may be a stack of a semiconductor 114a and a semiconductor 114b. FIG. 16A illustrates an example in which the semiconductor 114a is provided in contact with the insulator 115 and the semiconductor 114b is provided in contact with the semiconductor 114a. In the case where the semiconductor 114 has a stacked-layer structure, the number of layers is not limited to two and may be three or more. Moreover, the semiconductor 116 may be a stack including a plurality of semiconductor layers. Note that the composition of the semiconductor 114 in the case of employing a stack of oxide semiconductors will be described later in detail.

Figure 16B:
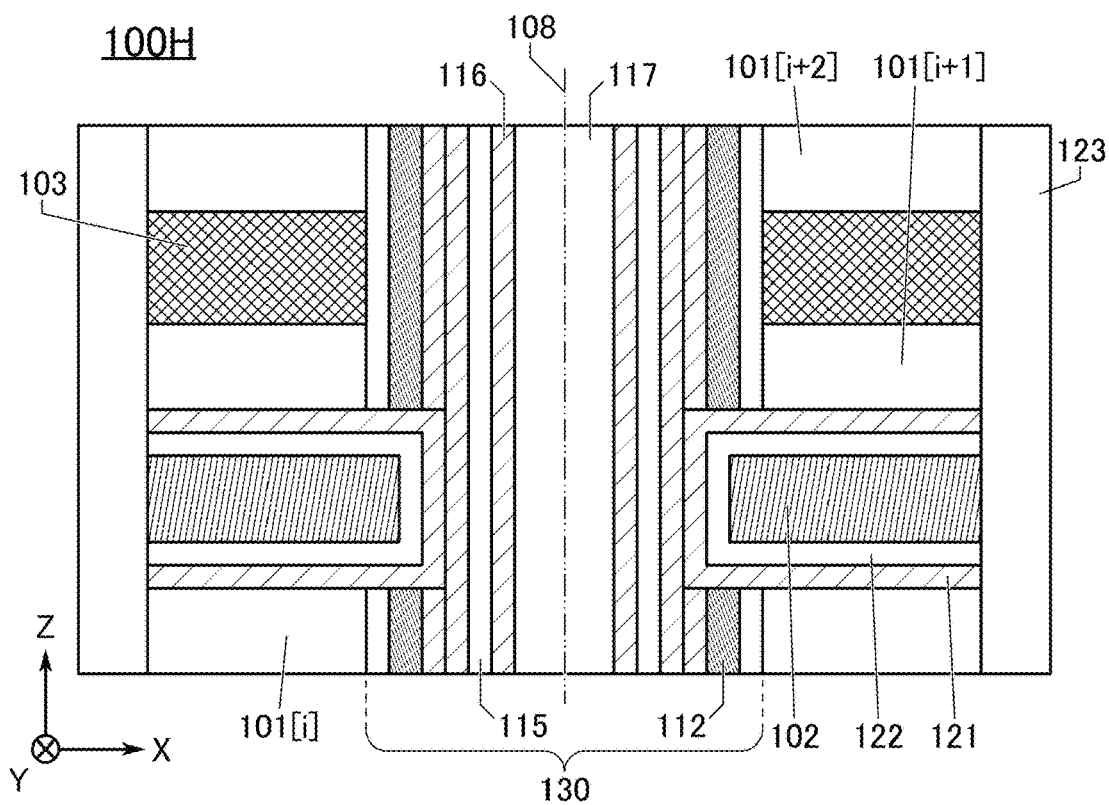

FIG. 16B is a cross-sectional view of the memory cell 100H. The memory cell 100H is a variation example of the memory cell 100A. The conductor 118 can be omitted as in the memory cell 100H. In FIG. 16B, the insulator 117 is used instead of the conductor 118. A hollow may be made without providing the conductor 118. Not providing the conductor 118 can simplify the manufacturing process and increase the productivity of the memory device.

In the memory cell 100H, the semiconductor 116, the insulator 115, and the semiconductor 114 that are placed in a region of the component 130 intersecting (overlapping) with the conductor 102, as well as the semiconductor 121, the insulator 122, and the conductor 102 function as the transistor WTr. Moreover, in the memory cell 100H, the semiconductor 116, the insulator 115, the semiconductor 114, the semiconductor 113, and the conductor 112 that are placed in a region of the component 130 intersecting (overlapping) with the conductor 103 function as the transistor RTr.

Figure 17A:
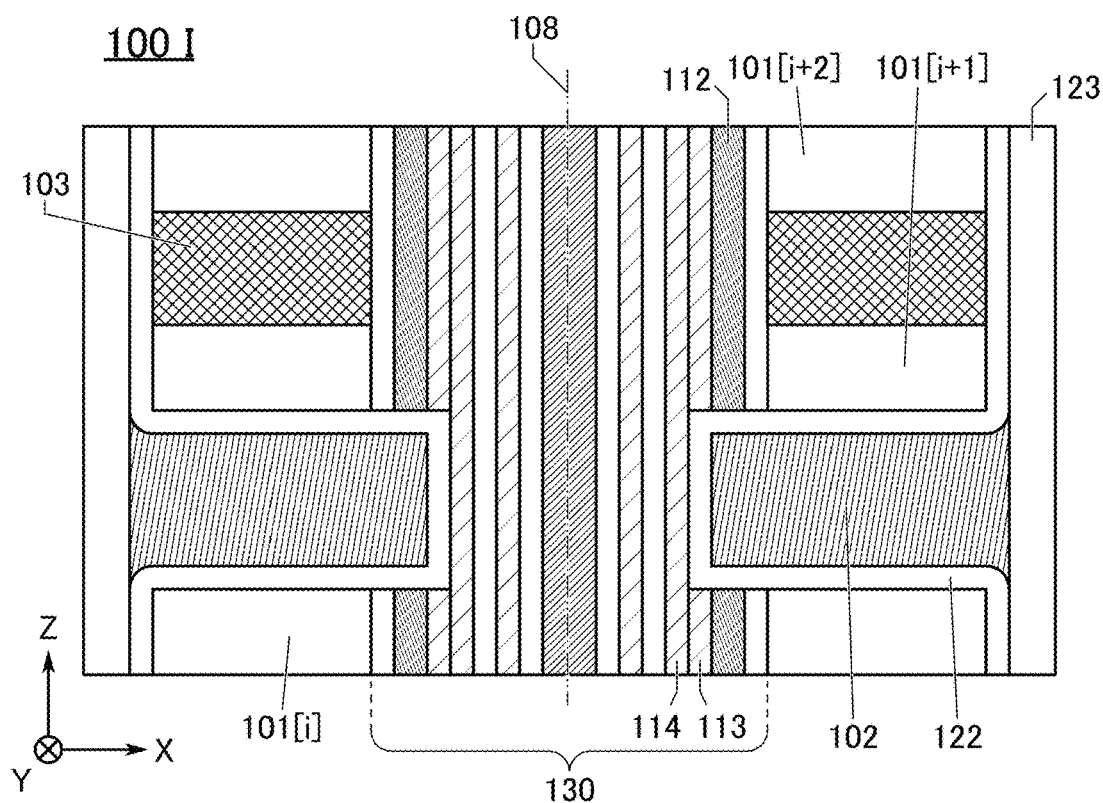
FIGS. 17A and 17B are each a cross-sectional view of a memory cell.

FIG. 17A is a cross-sectional view of a memory cell 100I. The memory cell 100I is a variation example of the memory cell 100. The semiconductor 121 can be omitted as in the memory cell 100I. Not providing the semiconductor 121 can simplify the manufacturing process and increase the productivity of the memory device. The memory cell 100I is also a variation example of the memory cell 100B. The transistor WTr and the transistor RTr in the memory cell 100I have the same structures as those in the memory cell 100B.

Figure 17B:
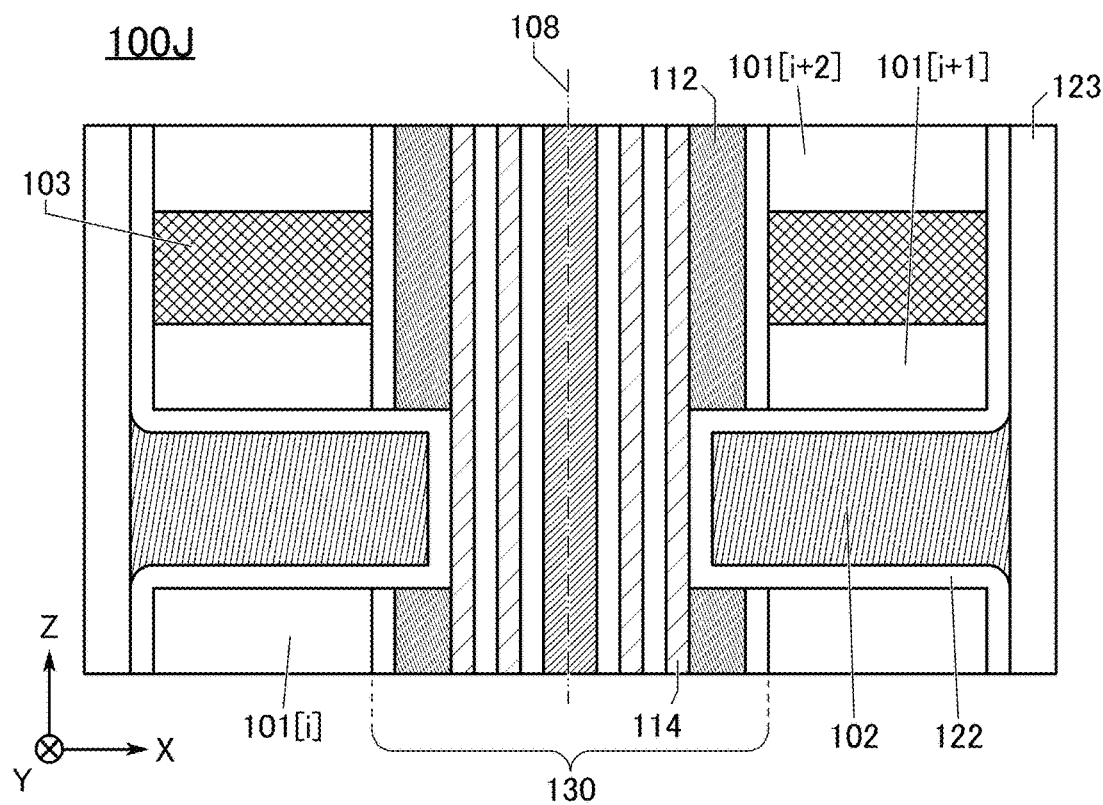

FIG. 17B is a cross-sectional view of a memory cell 100J. The memory cell 100J is a variation example of the memory cell 100 and is also a variation example of the memory cell 100D. The semiconductor 121 and the semiconductor 113 can be omitted as in the memory cell 100J. Not providing the semiconductors 121 and 113 can simplify the manufacturing process and increase the productivity of the memory device. The memory cell 100J is also a variation example of the memory cell 100I. The transistor WTr and the transistor RTr in the memory cell 100J have the same structures as those in the memory cell 100D.

Figure 18A:
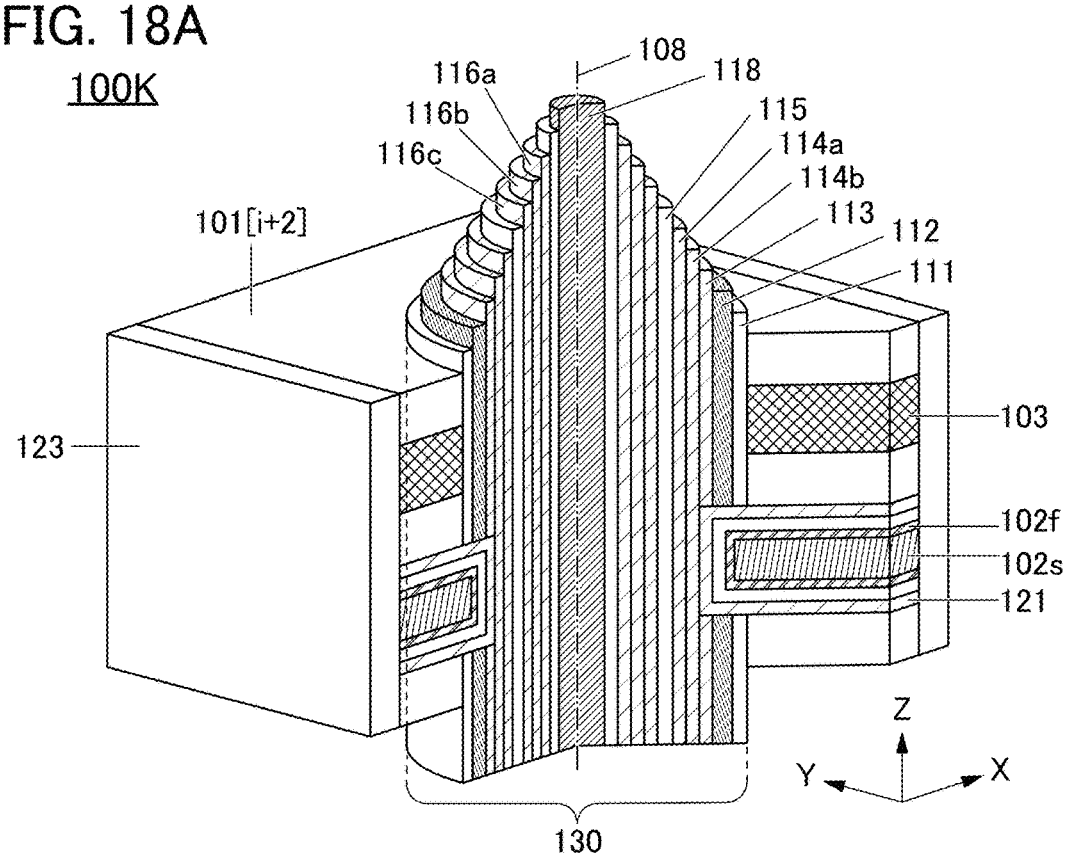
FIG. 18A is a perspective view of a memory cell.
Figure 18B:
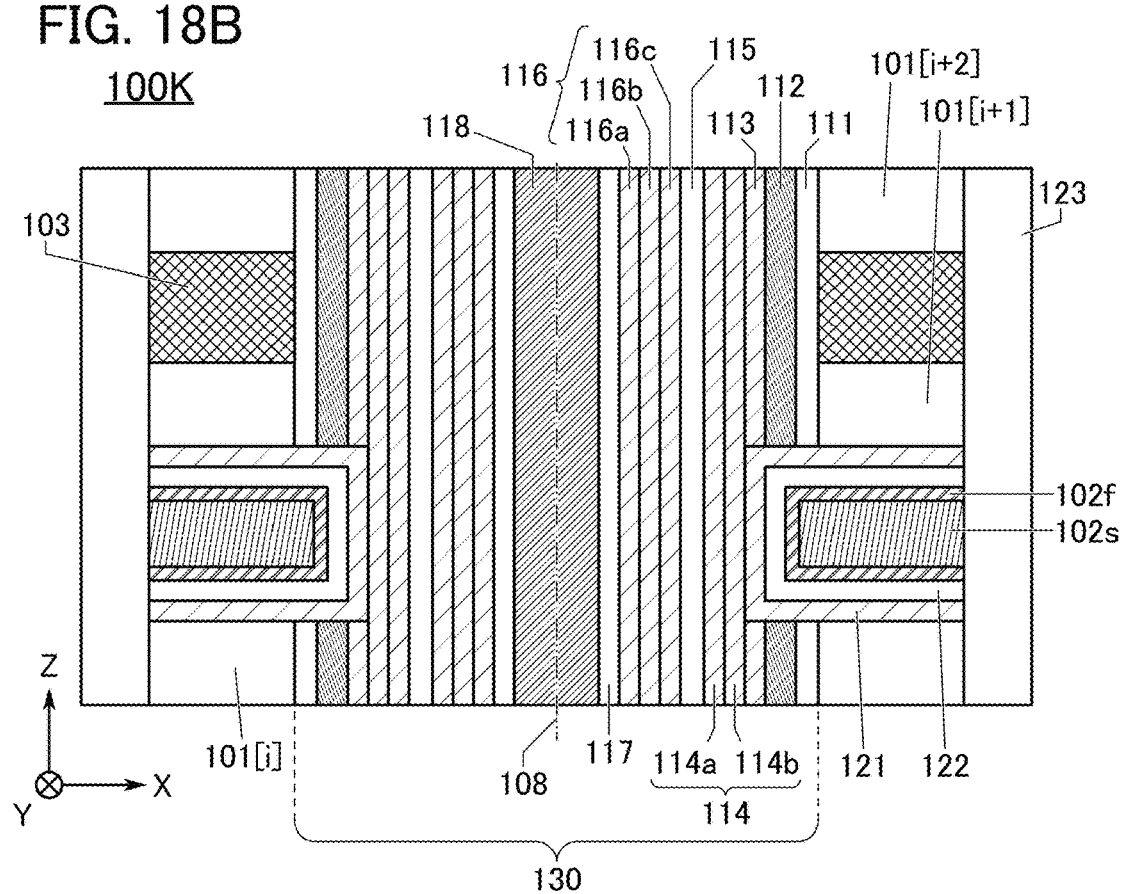
FIG. 18B is a cross-sectional view of the memory cell.

FIG. 18A is a perspective view of a memory cell 100K. FIG. 18B is a cross-sectional view illustrating part of the memory cell 100K. Note that in FIG. 18A, part of the memory cell 100K is omitted for easy understanding of the internal structure of the memory cell 100K.

The memory cell 100K is a variation example of the memory cell 100G. In the memory cell 100G, the semiconductor 114 is a stack of the semiconductor 114a and the semiconductor 114b; whereas in the memory cell 100K, the semiconductor 116 also has a stacked-layer structure of a semiconductor 116a, a semiconductor 116b, and a semiconductor 116c. Note that the composition of the semiconductor 116 in the case of employing a stack of oxide semiconductors will be described later in detail.

FIGS. 18A and 18B illustrate an example in which the semiconductor 116a is provided in contact with the insulator 117, the semiconductor 116b is provided in contact with the semiconductor 116a, the semiconductor 116c is provided in contact with the semiconductor 116b, and the insulator 115 is provided in contact with the semiconductor 116c. The insulator 115 may have a stacked-layer structure including a combination of insulators. Note that the combination of insulators for the stacked-layer structure of the insulator 115 will be described below in detail.

The memory cell 100K has a stacked-layer structure including the semiconductor 116a, the semiconductor 116b, the semiconductor 116c, the insulator 115, the semiconductor 114a, the semiconductor 114b, the semiconductor 121, and the insulator 122. There is a possibility that this region can function like a superlattice. The insulator 122 may have a stacked-layer structure including a combination of insulators. Note that the combination of insulators for the stacked-layer structure of the insulator 122 will be described below in detail.

In the memory cell 100K, the conductor 102 is a stack of a conductor 102f and a conductor 102s. In FIGS. 18A and 18B, the conductor 102f is provided in contact with the insulator 122, and the conductor 102s is provided in contact with the conductor 102f. Note that the stacked-layer structure of the conductor 102 will be described later in detail.

Figure 19A:
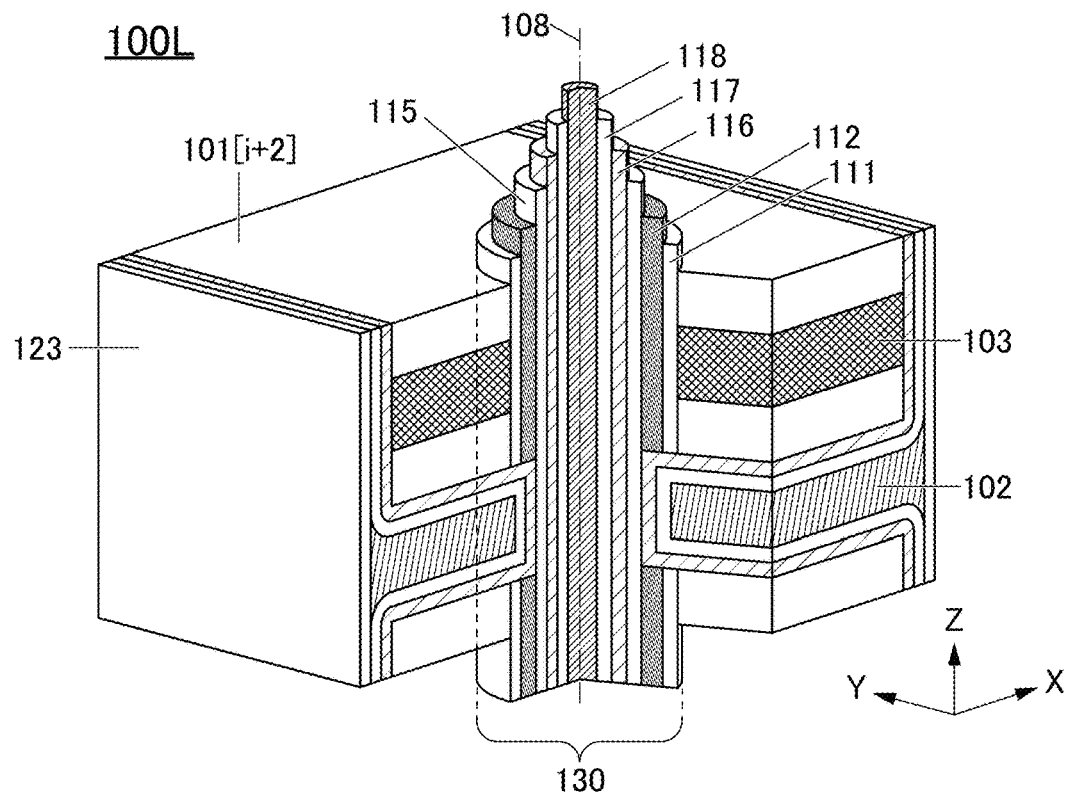
FIG. 19A is a perspective view of a memory cell.
Figure 19B:
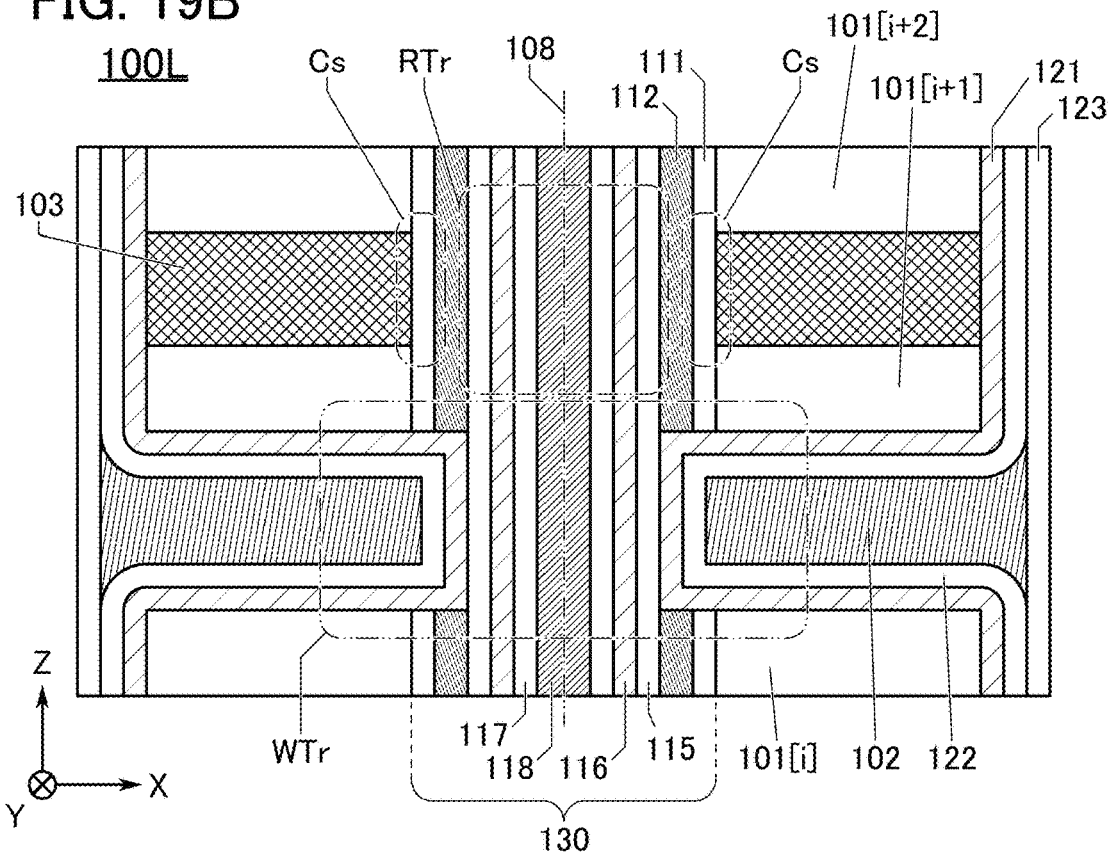
FIG. 19B is a cross-sectional view of the memory cell.

FIG. 19A is a perspective view of a memory cell 100L. FIG. 19B is a cross-sectional view illustrating part of the memory cell 100L. Note that in FIG. 19A, part of the memory cell 100L is omitted for easy understanding of the internal structure of the memory cell 100L.

The memory cell 100L is a variation example of the memory cell 100. Therefore, the differences between the memory cell 100L and the memory cell 100 are mainly described in this embodiment. The memory cell 100L has a structure in which the semiconductor 113 and the semiconductor 114 are omitted from the memory cell 100. Not providing the semiconductors 113 and 114 can simplify the manufacturing process and increase the productivity of the memory device.

In the memory cell 100L, part of the semiconductor 121 functions as a channel formation region of the transistor WTr. For that reason, as the semiconductor 121 used in the memory cell 100L, the same material as the semiconductor 114 in the memory cell 100 or the semiconductor 114b in the memory cell 100G is used.

Figure 20A:
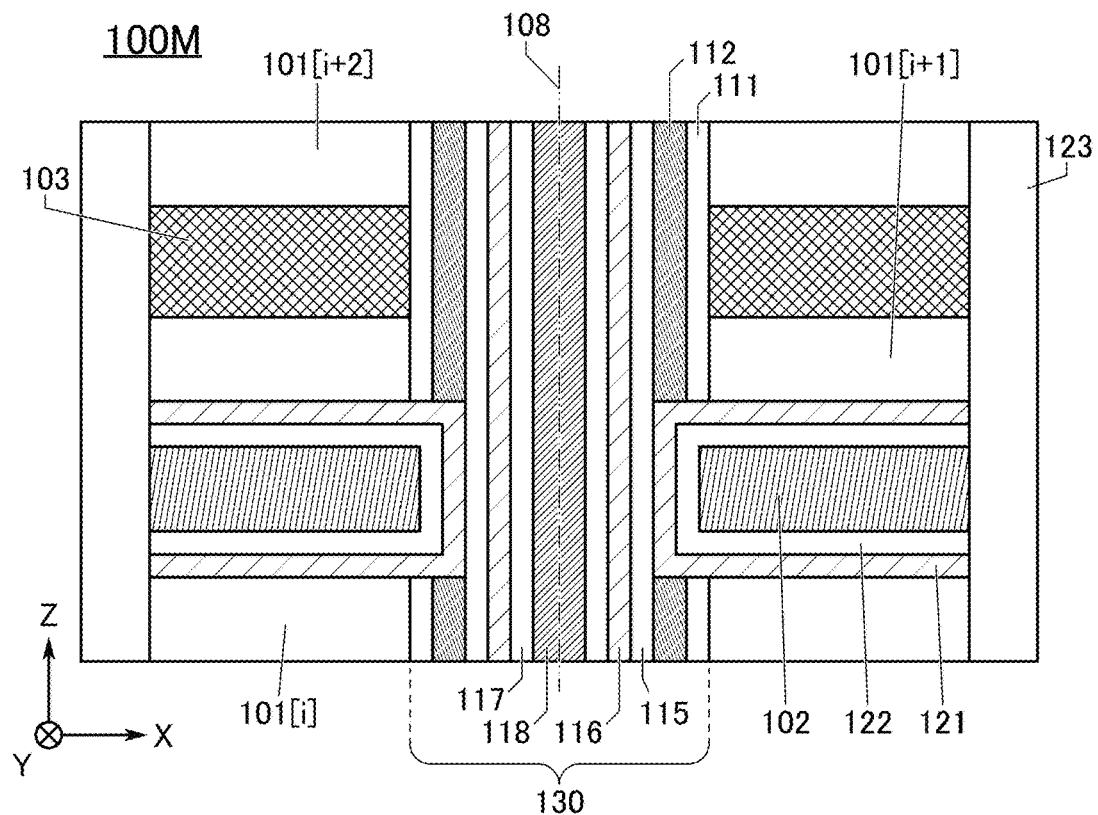
FIGS. 20A and 20B are each a cross-sectional view of a memory cell.
Figure 20B:
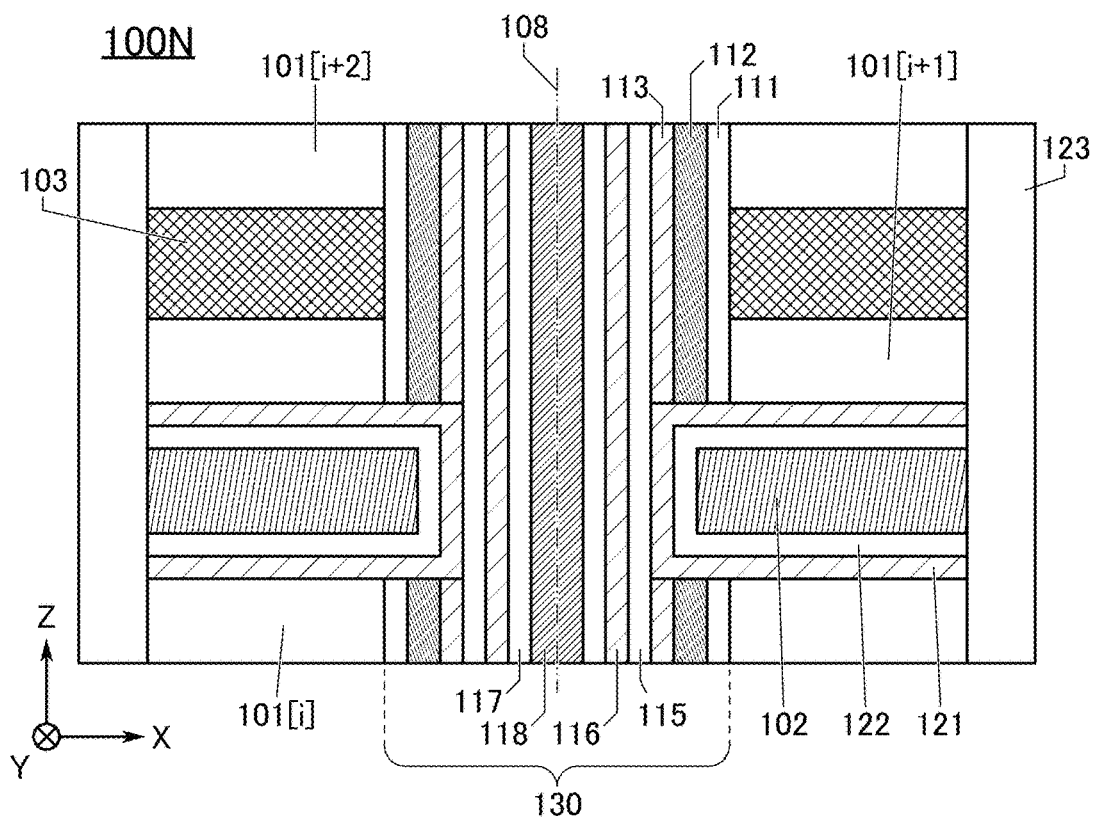

FIG. 20A is a cross-sectional view of a memory cell 100M. FIG. 20B is a cross-sectional view of a memory cell 100N. Both of the memory cells 100M and 100N are variations examples of the memory cell 100A. Therefore, the differences between the memory cells 100M and 100N and the memory cell 100A are mainly described in this embodiment.

The memory cell 100M has a structure in which the semiconductor 113 and the semiconductor 114 are omitted from the memory cell 100A. The memory cell 100N has a structure in which the semiconductor 114 is omitted from the memory cell 100A. Not providing the semiconductor 113 and/or the semiconductor 114 can simplify the manufacturing process and increase the productivity of the memory device.

The memory cell 100M and the memory cell 100N are also variation examples of the memory cell 100L. Accordingly, also in the memory cells 100M and 100N, part of the semiconductor 121 functions as a channel formation region of the transistor WTr. As the semiconductor 121 used in the memory cells 100M and 100N, the same material as the semiconductor 114 in the memory cell 100 or the semiconductor 114b in the memory cell 100G is used.

Figure 21:
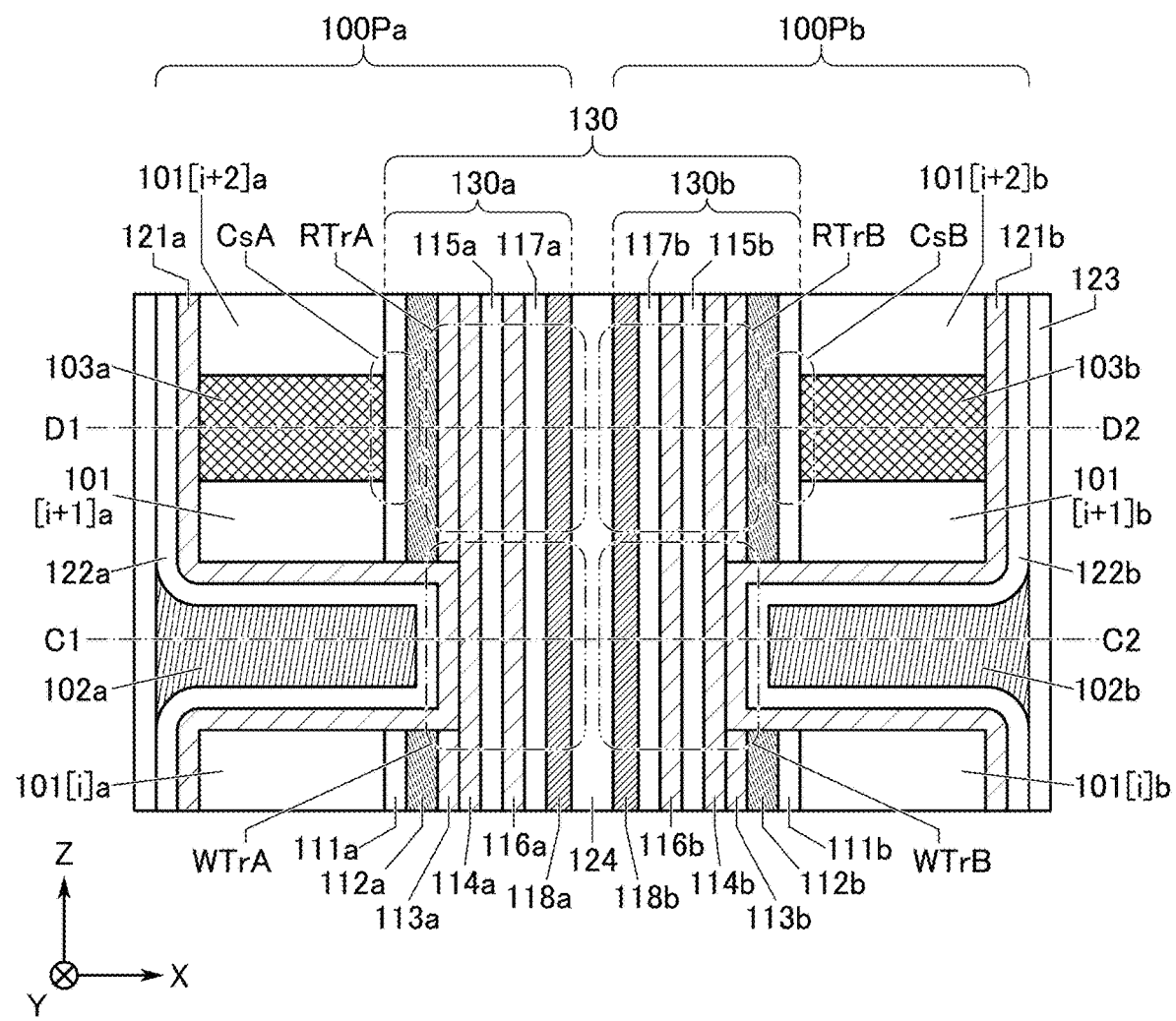
FIG. 21 is a cross-sectional view of a memory cell.
Figure 22A:
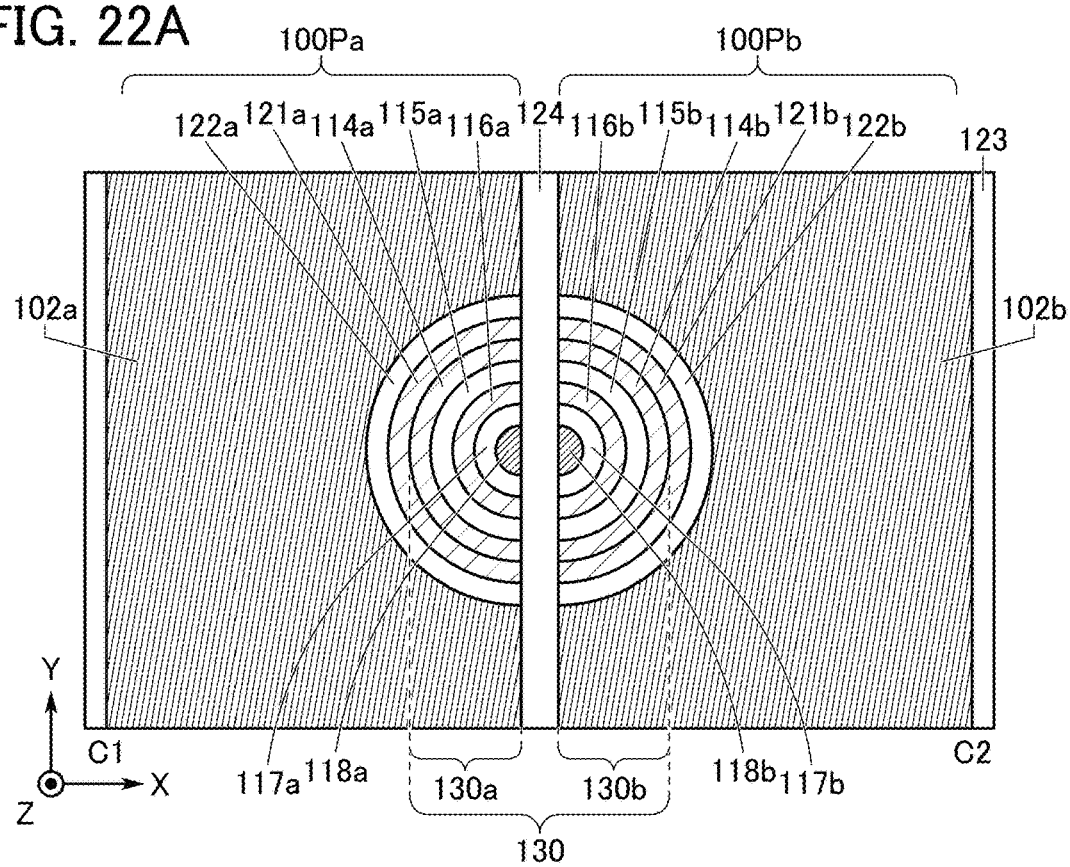
FIGS. 22A and 22B are cross-sectional views of a memory cell.
Figure 22B:
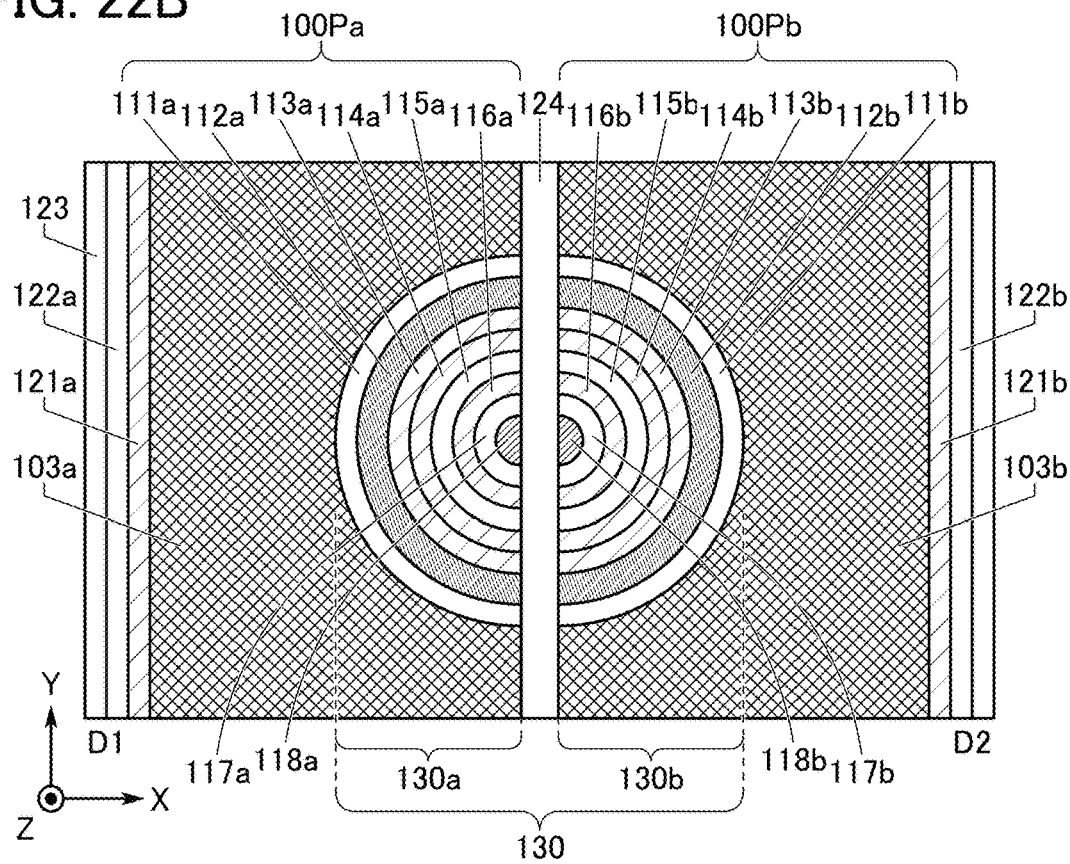

FIG. 21 is a cross-sectional view of a memory cell 100P. FIG. 22A is a cross-sectional view in which a portion C1-C2 represented by a dashed-dotted line in FIG. 21 is seen from the Z direction. FIG. 22B is a cross-sectional view in which a portion D1-D2 represented by a dashed-dotted line in FIG. 21 is seen from the Z direction. The memory cell 100P is a variation example of the memory cell 100. Therefore, the differences between the memory cell 100P and the memory cell 100 are mainly described in this embodiment.

In the memory cell 100P, the memory cell 100, the conductor 102, the conductor 103, and the like are divided through the center of the memory cell 100 along the direction in which the conductors 102 and 103 extend. In this embodiment, an insulator 124 is provided in the region formed by the division; however, the insulator 124 is provided as needed.

The insulator 101, the conductor 102, the conductor 103, the semiconductor 121, the insulator 122, and the component 130 are divided into an insulator 101a (not illustrated) and an insulator 101b (not illustrated), a conductor 102a and a conductor 102b, a conductor 103a and a conductor 103b, a semiconductor 121a and a semiconductor 121b, an insulator 122a and an insulator 122b, and a component 130a and a component 130b.

The insulator 111, the conductor 112, the semiconductor 113, the semiconductor 114, the insulator 115, the semiconductor 116, the insulator 117, and the conductor 118 included in the component 130 are divided into an insulator 111a and an insulator 111b, a conductor 112a and a conductor 112b, a semiconductor 113a and a semiconductor 113b, the semiconductor 114a and the semiconductor 114b, an insulator 115a and an insulator 115b, the semiconductor 116a and the semiconductor 116b, an insulator 117a and an insulator 117b, and a conductor 118a and a conductor 118b.

Accordingly, the component 130a includes the insulator 111a, the conductor 112a, the semiconductor 113a, the semiconductor 114a, the insulator 115a, the semiconductor 116a, the insulator 117a, and the conductor 118a. The component 130b includes the insulator 111b, the conductor 112b, the semiconductor 113b, the semiconductor 114b, the insulator 115b, the semiconductor 116b, the insulator 117b, and the conductor 118b.

The memory cell 100P is divided into a memory cell 100Pa and a memory cell 100Pb. Thus, the memory cell 100P can be said to include a region functioning as the memory cell 100Pa and a region functioning as the memory cell 100Pb. The memory cell 100Pa includes the component 130a and the like, and the memory cell 100Pb includes the component 130b and the like.

Accordingly, the transistor RTr, the transistor WTr, and the capacitor Cs in the memory cell 100P are divided into a transistor RTrA and a transistor RTrB, a transistor WTrA and a transistor WTrB, and a capacitor CsA and a capacitor CsB. The transistor RTrA, the transistor WTrA, and the capacitor CsA are included in the memory cell 100Pa. The transistor RTrB, the transistor WTrB, and the capacitor CsB are included in the memory cell 100Pb.

A region where the conductor 112a, the semiconductor 113a, the semiconductor 114a, the insulator 115a, the semiconductor 116a, the insulator 117a, and the conductor 118a overlap with each other functions as the transistor RTrA. A region where the conductor 112b, the semiconductor 113b, the semiconductor 114b, the insulator 115b, the semiconductor 116b, the insulator 117b, and the conductor 118b overlap with each other functions as the transistor RTrB. A region where the conductor 103a, the insulator 111a, and the conductor 112a overlap with each other functions as the capacitor CsA. A region where the conductor 103b, the insulator 111b, and the conductor 112b overlap with each other functions as the capacitor CsB. A region where the conductor 102a, the conductor 112a, the semiconductor 121a, the semiconductor 114a, the insulator 115a, the semiconductor 116a, the insulator 117a, and the conductor 118a overlap with each other functions as the transistor WTrA. A region where the conductor 102b, the conductor 112b, the semiconductor 121b, the semiconductor 114b, the insulator 115b, the semiconductor 116b, the insulator 117b, and the conductor 118b overlap with each other functions as the transistor WTrB.

When the memory cell 100 is divided like the memory cell 100P, the memory density (memory capacity per unit area) can be increased. Thus, the memory capacity of the semiconductor device including the memory cell 100 can be increased. The memory cells 100A to 100N can be divided like the memory cell 100P.

Figure 23A:
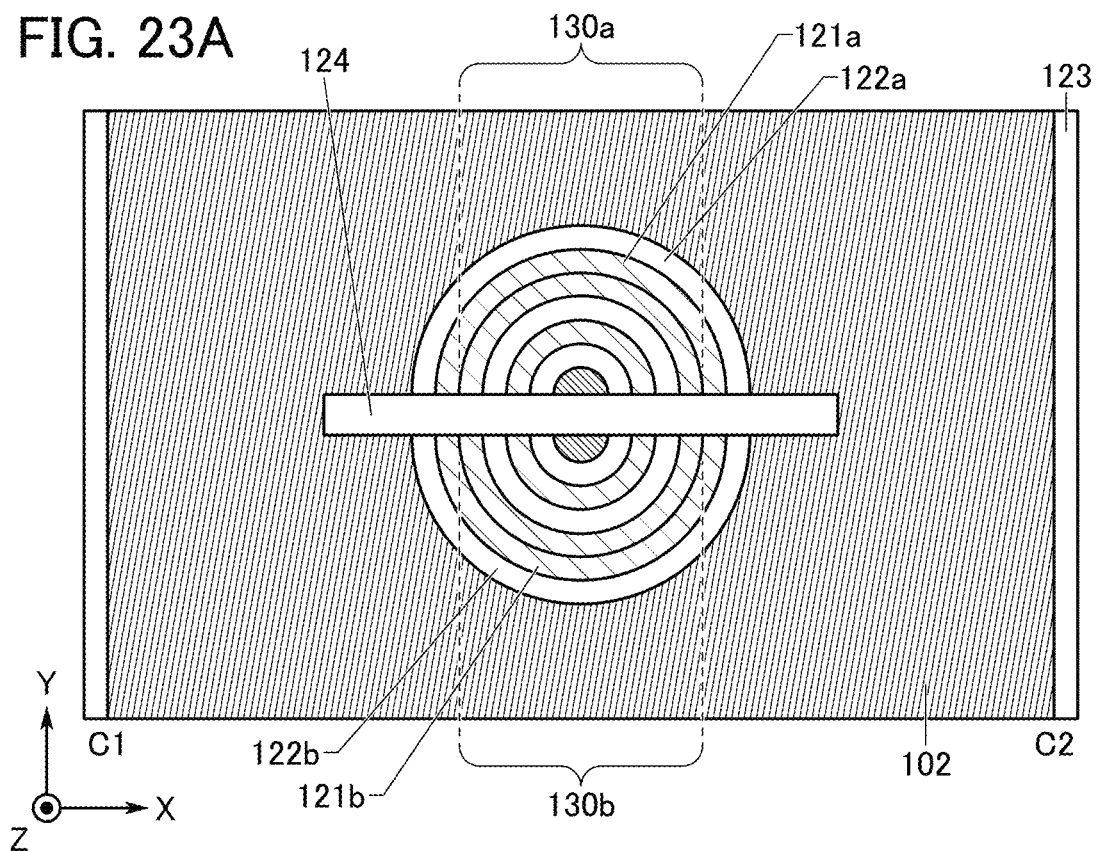
FIGS. 23A and 23B are each a cross-sectional view of a memory cell.

A memory cell may be divided in the X direction (see FIG. 23A). In the case where a memory cell is divided in the X direction, the insulator 124 is provided so as not to cross the conductor 102 and the conductor 103 completely.

Figure 23B:
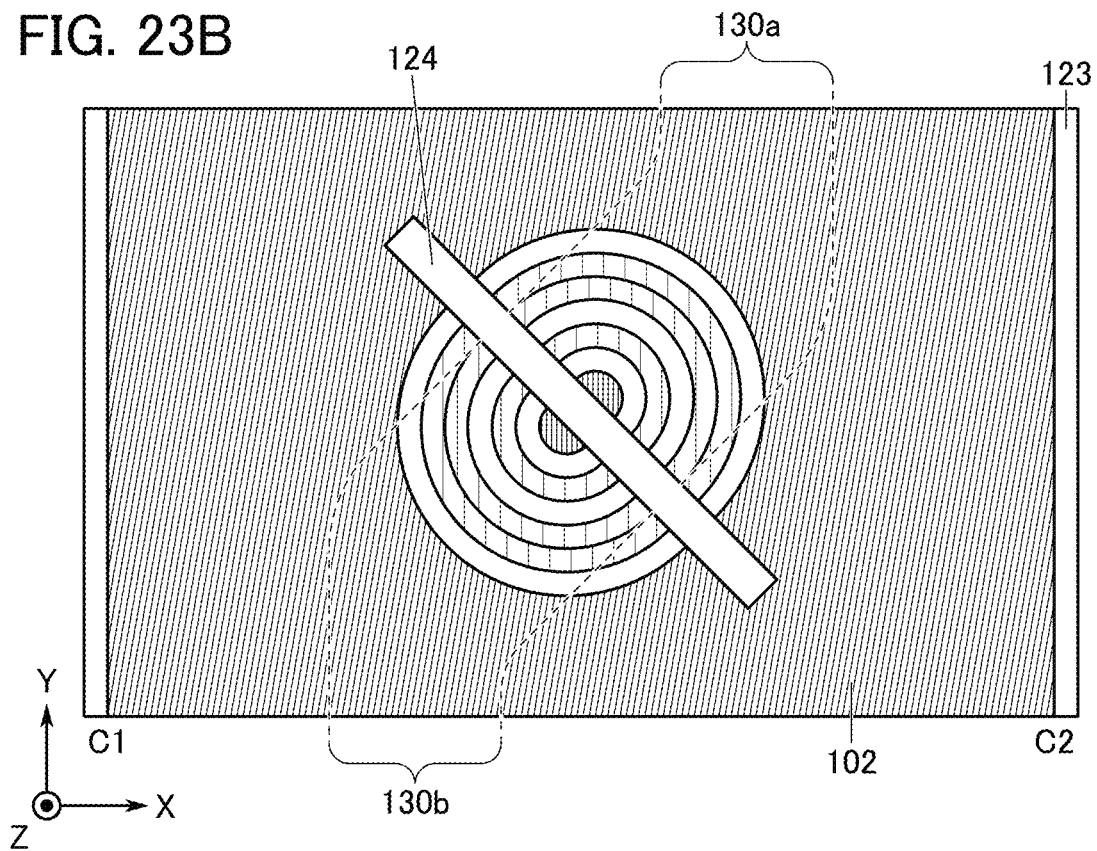

A memory cell may be divided in an oblique direction (a direction intersecting with the X direction and the Y direction) when seen from the Z direction (see FIG. 23B). Also in the case where a memory cell is divided in the oblique direction, the insulator 124 is provided so as not to cross the conductor 102 and the conductor 103 completely.

Figure 24A:
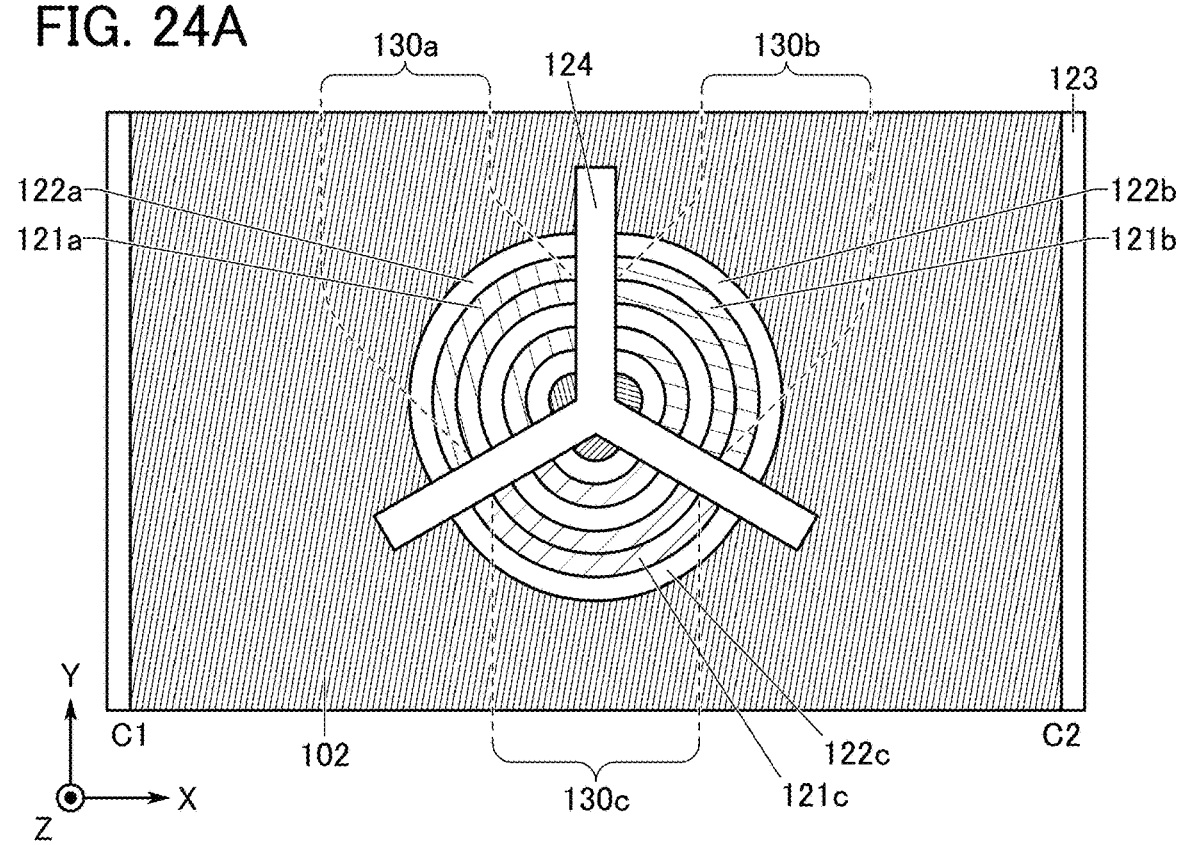
FIGS. 24A and 24B are each a cross-sectional view of a memory cell.

The number of parts into which a memory cell is divided is not limited to two. For example, a memory cell may be divided into three parts as illustrated in FIG. 24A. In FIG. 24A, the component 130, the semiconductor 121, and the insulator 122 are divided into components 130a, 130b, and 130c, semiconductors 121a, 121b, and 121c, and insulators 122a, 122b, and 122c, with a Y-shaped insulator 124 as the boundaries.

Figure 24B:
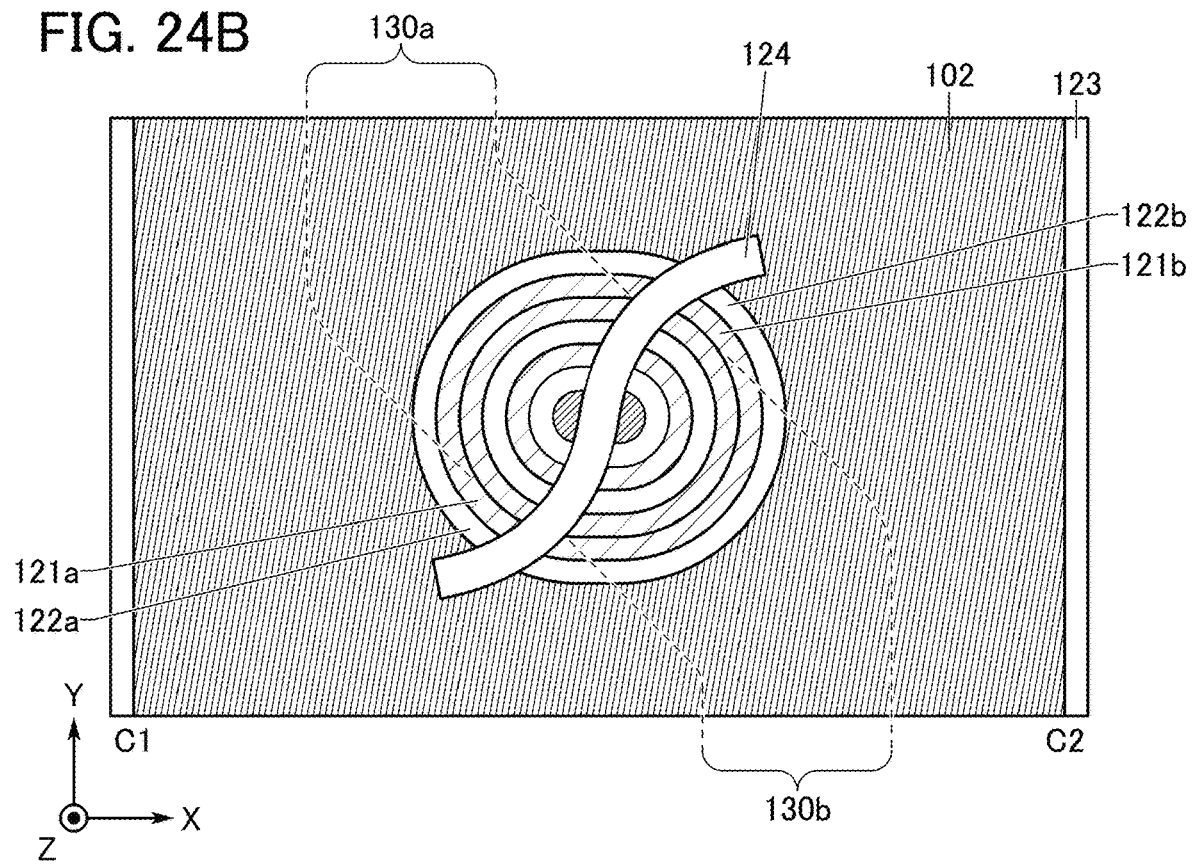

As illustrated in FIG. 24B, the insulator 124 may have a curved portion when seen from the Z direction.

Figure 25A:
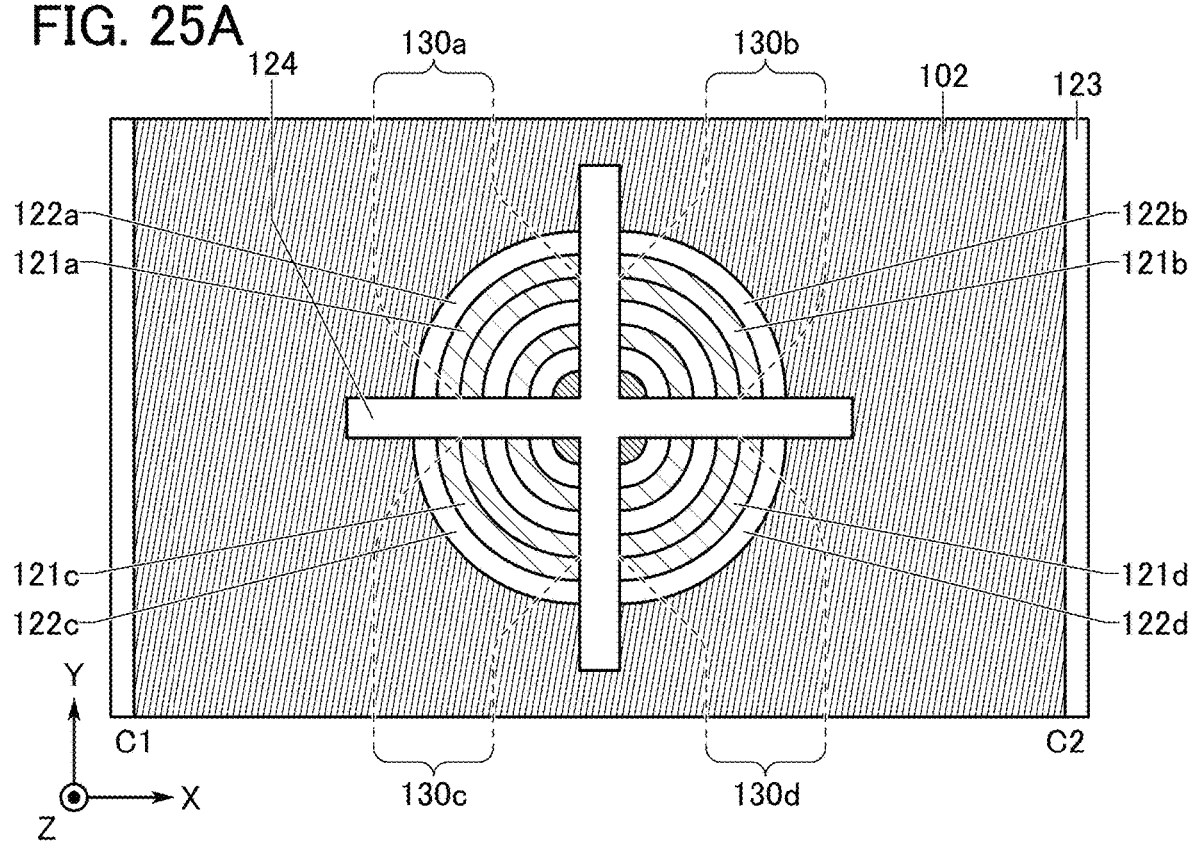
FIGS. 25A and 25B are each a cross-sectional view of a memory cell.

A memory cell may be divided into four parts as illustrated in FIG. 25A. In FIG. 25A, the component 130, the semiconductor 121, and the insulator 122 are divided into components 130a, 130b, 130c, and 130d, semiconductors 121a, 121b, 121c, and 121d, and insulators 122a, 122b, 122c, and 122d, with a cross-shaped insulator 124 as the boundaries.

Figure 25B:
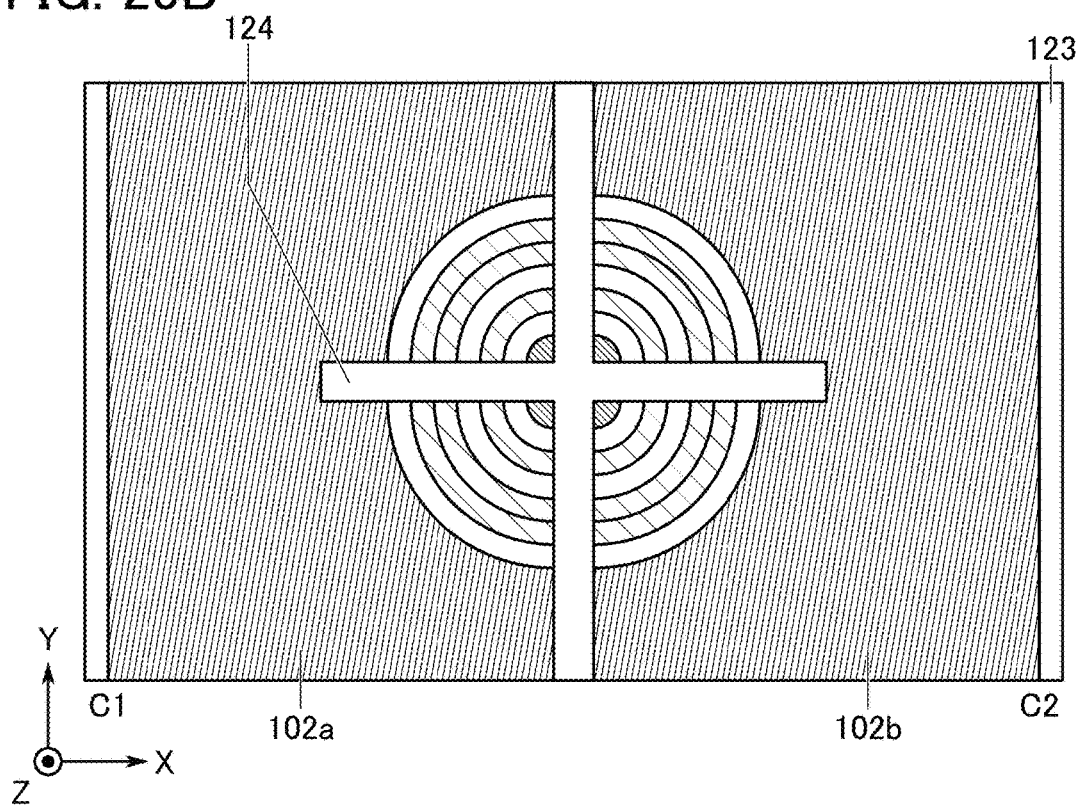

As illustrated in FIG. 25B, the insulator 124 is provided so as not to cross the conductor 102a and the conductor 102b completely. Similarly, the insulator 124 is provided so as not to cross the conductor 103a and the conductor 103b completely.

Figure 26:
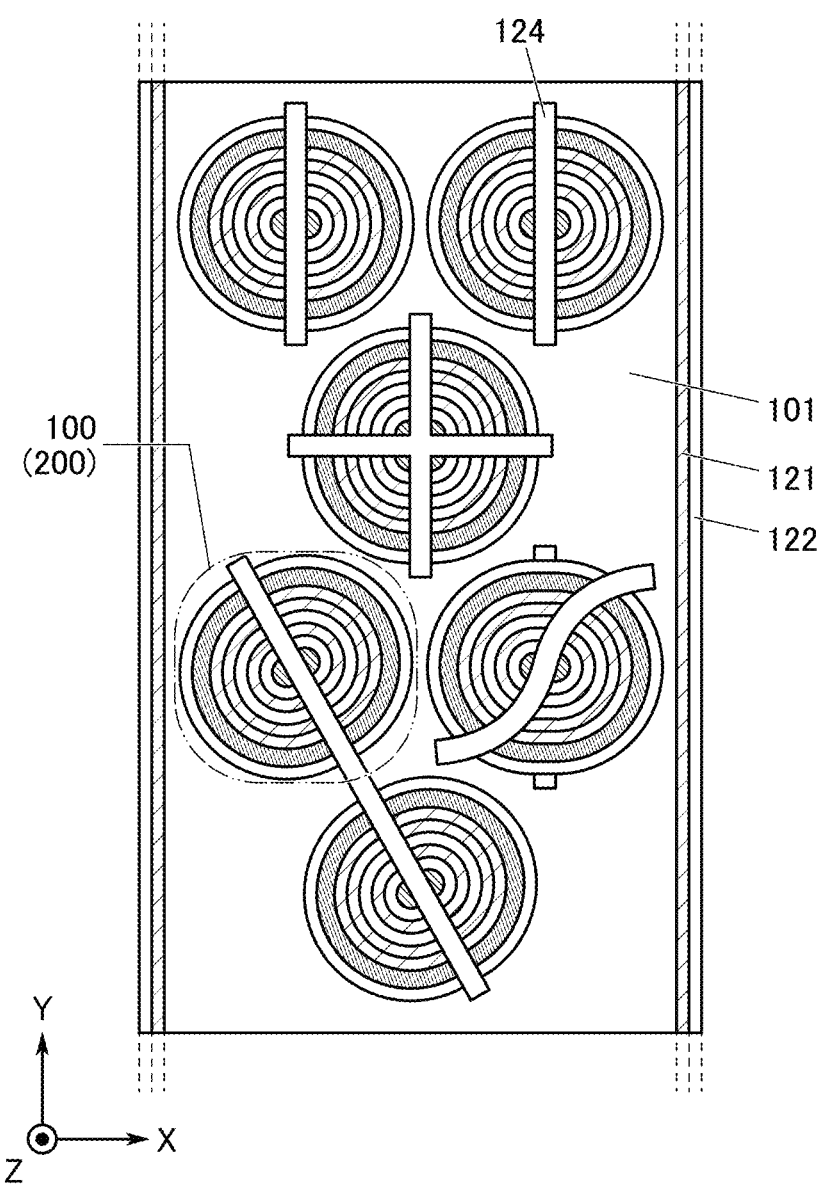
FIG. 26 is a top view of memory strings.

In the case where a plurality of memory cells 100 or a plurality of memory strings 200 are provided as illustrated in FIGS. 11A and 11B, the shapes of the insulators 124 used for dividing the memory cells 100 or the memory strings 200 may vary between the memory cells 100 or the memory strings 200, as illustrated in FIG. 26. Alternatively, two or more memory cells 100 or memory strings 200 may be divided by one insulator 124.

[Materials for Memory Cell]

Next, materials that can be used for the memory cell 100 and the like will be described.

[Substrate]

The memory cell 100 and the memory string 200 can be provided over a substrate. As the substrate, for example, an insulator substrate, a semiconductor substrate, or a conductor substrate can be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon or germanium and a compound semiconductor substrate of silicon carbide, silicon germanium, gallium arsenide, indium phosphide, zinc oxide, gallium oxide, gallium nitride (GaN), or the like. Another example includes a semiconductor substrate in which an insulator region is provided in the above semiconductor substrate, such as a silicon on insulator (SOI) substrate. Examples of the conductor substrate include a graphite substrate, a metal substrate, an alloy substrate, and a conductive resin substrate. Other examples include a substrate containing a nitride of a metal, a substrate containing an oxide of a metal, an insulator substrate provided with a conductor or a semiconductor, a semiconductor substrate provided with a conductor or an insulator, and a conductor substrate provided with a semiconductor or an insulator. Alternatively, any of these substrates provided with an element may be used. Examples of the element provided over the substrate include a capacitor, a resistor, a switching element, a light-emitting element, and a memory element.

[Insulator]

Examples of an insulator include an insulating oxide, an insulating nitride, an insulating oxynitride, an insulating nitride oxide, an insulating metal oxide, an insulating metal oxynitride, and an insulating metal nitride oxide.

Note that in this specification and the like, oxynitride refers to a material that contains more oxygen than nitrogen. For example, silicon oxynitride refers to a silicon material that contains more oxygen than nitrogen. Moreover, in this specification and the like, nitride oxide refers to a material that contains more nitrogen than oxygen, and aluminum nitride oxide refers to an aluminum material that contains more nitrogen than oxygen.

With miniaturization and high integration of a transistor, for example, a problem such as generation of leakage current may arise because of a thin gate insulator. When a high-k material is used for an insulator functioning as a gate insulator, the driving voltage of the transistor can be reduced while the physical thickness of the gate insulator is kept. On the other hand, when a material having a low dielectric constant is used for an insulator functioning as an interlayer film, the parasitic capacitance between wirings can be reduced. A material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When an OS transistor is surrounded by an insulator that has a function of inhibiting transmission of oxygen and impurities such as hydrogen, the transistor can have stable electrical characteristics. The insulator having a function of inhibiting transmission of oxygen and impurities such as hydrogen can have, for example, a single-layer structure or a stacked-layer structure of an insulator including boron, carbon, nitrogen, oxygen, fluorine, magnesium, aluminum, silicon, phosphorus, chlorine, gallium, germanium, yttrium, zirconium, lanthanum, neodymium, hafnium, or tantalum. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, silicon nitride oxide, or silicon nitride can be used.

In the case where an oxide semiconductor is used as the semiconductor 116, the semiconductor 114, the semiconductor 113, and/or the semiconductor 121, the insulator functioning as a gate insulator preferably includes a region containing oxygen that is released by heating. For example, when silicon oxide or silicon oxynitride that includes a region containing oxygen released by heating is in contact with the semiconductor 114 and/or the semiconductor 116, oxygen vacancies in the semiconductor 114 and/or the semiconductor 116 can be compensated for.

As the insulator, a single insulating layer formed using any of the above materials may be used, or a stack of insulating layers formed using any of the above materials may be used.

For example, in the case where an insulator is provided in contact with a conductor, the insulator preferably has a function of inhibiting transmission of oxygen in order to prevent oxidation of the conductor. For example, hafnium oxide, aluminum oxide, or silicon nitride is preferably used as the insulator.

In the case where insulators are stacked adjacent to a conductor, an insulator that has a function of inhibiting transmission of oxygen is preferably used as the insulator in contact with the conductor. For example, the insulator in contact with the conductor may be formed using hafnium oxide, and an insulator containing silicon oxynitride may be formed in contact with the insulator.

[Conductor]

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Alternatively, a semiconductor having high electric conductivity, typified by polycrystalline silicon containing an impurity element such as phosphorus, or silicide such as nickel silicide may be used.

As the conductor, a single conductive layer formed using any of the above materials may be used, or a stack of conductive layers formed using any of the above materials may be used. For example, a stacked-layer structure combining a material containing any of the above metal elements and a conductive material containing oxygen may be used. A stacked-layer structure combining a material containing any of the above metal elements and a conductive material containing nitrogen may be used. A stacked-layer structure combining a material containing any of the above metal elements, a conductive material containing oxygen, and a conductive material containing nitrogen may be used.

When an oxide semiconductor, which is a type of metal oxide, is used for the channel formation region of the transistor, the conductor functioning as the gate electrode preferably employs a stacked-layer structure using a material containing any of the above metal elements and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the oxide semiconductor in which the channel is formed. A conductive material containing any of the above metal elements and nitrogen may also be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the oxide semiconductor in which the channel is formed can be captured in some cases. Hydrogen entering from a surrounding insulator or the like can also be captured in some cases.

[Oxide Semiconductor]

A metal oxide functioning as a semiconductor (i.e., an oxide semiconductor) is preferably used as the semiconductor 116, the semiconductor 114, the semiconductor 113, and/or the semiconductor 121. In particular, an oxide semiconductor is preferably used as the semiconductor 114. An oxide semiconductor that can be used in the memory cell 100 is described below.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, titanium, iron, nickel, germanium, zirconium, molybdenum, lanthanum, cerium, neodymium, hafnium, tantalum, tungsten, magnesium, cobalt, and the like may be contained.

Here, the case where the oxide semiconductor is an In-M-Zn oxide that contains indium, an element M, and zinc is considered. Note that the element M represents one or more elements selected from aluminum, gallium, yttrium, and tin. Other examples that can be used as the element M include boron, titanium, iron, nickel, germanium, zirconium, molybdenum, lanthanum, cerium, neodymium, hafnium, tantalum, tungsten, magnesium, and cobalt. Note that two or more of the above elements can be used in combination as the element Min some cases.

[Classification of Crystal Structures]

First, the classification of the crystal structures of an oxide semiconductor will be described with reference to FIG. 27A. FIG. 27A is a diagram showing the classification of crystal structures of an oxide semiconductor, typically IGZO (a metal oxide containing In, Ga, and Zn).

As shown in FIG. 27A, an oxide semiconductor is roughly classified into "Amorphous", "Crystalline", and "Crystal". The term "Amorphous" includes a completely amorphous structure. The term "Crystalline" includes c-axis-aligned crystalline (CAAC), nanocrystalline (nc), and cloud-aligned composite (CAC) structures. Note that the term "Crystalline" excludes single crystal, poly crystal, and completely amorphous structures. The term "Crystal" includes single crystal and poly crystal structures.

Note that the structures in the thick frame in FIG. 27A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 27B shows an XRD spectrum, which is obtained by grazing-incidence XRD (GIXD) measurement, of a CAAC-IGZO film classified into "Crystalline". Note that a GIXD method is also referred to as a thin film method or a Seemann-Bohlin method. The XRD spectrum that is shown in FIG. 27B and obtained by GIXD measurement is hereinafter simply referred to as an XRD spectrum. The CAAC-IGZO film in FIG. 27B has an atomic ratio of In:Ga:Zn=4:2:3 or a neighborhood thereof. The CAAC-IGZO film in FIG. 27B has a thickness of 500 nm.

As shown in FIG. 27B, a clear peak indicating crystallinity is observed in the XRD spectrum of the CAAC-IGZO film. Specifically, a peak indicating c-axis alignment is observed at around $2\theta=31°$ in the XRD spectrum of the CAAC-IGZO film. As shown in FIG. 27B, the peak at around $2\theta=31°$ is asymmetric with the angle at which the peak intensity is observed as the axis.

A crystal structure of a film or a substrate can also be evaluated with a diffraction pattern obtained by a nanobeam electron diffraction (NBED) method (such a pattern is also referred to as a nanobeam electron diffraction pattern). FIG. 27C shows a diffraction pattern of the CAAC-IGZO film. FIG. 27C shows a diffraction pattern obtained by the NBED method in which an electron beam is incident in the direction parallel to the substrate. The CAAC-IGZO film in FIG. 27C has an atomic ratio of In:Ga:Zn=4:2:3 or a neighborhood thereof. In the nanobeam electron diffraction method, electron diffraction is performed with a probe diameter of 1 nm.

As shown in FIG. 27C, a plurality of spots indicating c-axis alignment are observed in the diffraction pattern of the CAAC-IGZO film.

[Structure of Oxide Semiconductor]

Oxide semiconductors might be classified in a manner different from the one in FIG. 27A when classified in terms of the crystal structure. Oxide semiconductors are classified into a single crystal oxide semiconductor and a non-single-crystal oxide semiconductor, for example. Examples of the non-single-crystal oxide semiconductor include a c-axis-aligned crystalline oxide semiconductor (CAAC-OS) and a nanocrystalline oxide semiconductor (nc-OS). Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide, the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at or around 2θ=31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using θ/2θ scanning, a peak indicating crystallinity is not observed. Furthermore, a halo pattern is shown in a selected-area electron diffraction pattern of the nc-OS film obtained using an electron beam having a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

[Composition of Oxide Semiconductor]

Next, the CAC-OS will be described in detail. Note that the CAC-OS relates to the material composition.

[CAC-OS]

The CAC-OS has, for example, a composition in which elements included in a metal oxide are unevenly distributed. Materials including unevenly distributed elements each have a size greater than or equal to 0.5 nm and less than or equal to 10 nm, preferably greater than or equal to 1 nm and less than or equal to 3 nm, or a similar size. Note that in the following description of a metal oxide, a state in which one or more types of metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 3 nm, or a similar size.

In addition, the CAC-OS has a composition in which materials are separated into a first region and a second region to form a mosaic pattern, and the first regions are distributed in the film. This composition is hereinafter also referred to as a cloud-like composition. That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region in the CAC-OS in the In—Ga—Zn oxide has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a composition in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor can have any of various structures that show various different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

[Transistor Including Oxide Semiconductor]

Next, a transistor including the above oxide semiconductor is described.

When the oxide semiconductor is used for a transistor, the transistor can have high field-effect mobility. In addition, the transistor can have high reliability.

An oxide semiconductor having a low carrier concentration is preferably used for a channel formation region of the transistor. For example, the carrier concentration of the channel formation region using the oxide semiconductor is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^3$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor. A highly purified intrinsic or substantially highly purified intrinsic state may be referred to as an i-type or a substantially i-type.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is preferably reduced. Examples of impurities include hydrogen, nitrogen, alkali metal, alkaline earth metal, iron, nickel, and silicon.

[Impurities]

The influence of impurities in the oxide semiconductor is described.

When silicon or carbon, which is a Group 14 element, is contained in an oxide semiconductor, defect states are formed in the oxide semiconductor. Thus, the concentration of silicon or carbon in the channel formation region using the oxide semiconductor and in the vicinity of an interface with the channel formation region using the oxide semiconductor (the concentration measured by secondary ion mass spectrometry (SIMS)) is lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the channel formation region using the oxide semiconductor, which is measured by SIMS, is lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. A transistor including an oxide semiconductor that contains nitrogen as the semiconductor tends to have normally-on characteristics. When nitrogen is contained in the oxide semiconductor, a trap state is sometimes formed. This might make the electrical characteristics of the transistor unstable. Thus, the concentration of nitrogen in the channel formation region using the oxide semiconductor, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor including an oxide semiconductor that contains hydrogen tends to have normally-on characteristics. For this reason, hydrogen in the channel formation region using the oxide semiconductor is preferably reduced as much as possible. Specifically, the hydrogen concentration in the channel formation region using the oxide semiconductor, which is measured by SIMS, is lower than $1\times10^{20}$ atoms/cm$^3$, preferably lower than $5\times10^{19}$ atoms/cm$^3$, further preferably lower than $1\times10^{19}$ atoms/cm$^3$, still further preferably lower than $5\times10^{18}$ atoms/cm$^3$, yet still further preferably lower than $1\times10^{18}$ atoms/cm$^3$.

When an oxide semiconductor with sufficiently reduced impurities is used for a channel formation region in a transistor, the transistor can have stable electrical characteristics.

[Other Semiconductor Materials]

A semiconductor material that can be used for the semiconductors 116, 114, 113, and 121 is not limited to the above oxide semiconductor. For the semiconductors 116, 114, 113, and 121, a semiconductor material having a band gap (a semiconductor material that is not a zero-gap semiconductor) may be used. For example, a single-element semiconductor such as silicon, a compound semiconductor such as gallium arsenide, or a layered material (also referred to as atomic layer material or two-dimensional material) functioning as a semiconductor may be used as a semiconductor material. In particular, a layered material functioning as a semiconductor is preferably used as a semiconductor material.

In this specification and the like, the layered material is a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

As a semiconductor material used in the semiconductor device of one embodiment of the present invention, transition metal chalcogenide functioning as a semiconductor may be used. Specific examples include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

[Deposition Method]

The conductors, insulators, and semiconductors can be formed by a sputtering method, a CVD method, a molecular beam epitaxy (MBE) method, a pulsed laser deposition (PLD) method, an atomic layer deposition (ALD) method, or the like.

Note that CVD methods can be classified into a plasma-enhanced CVD (PECVD) method using plasma, a thermal CVD (TCVD) method using heat, a photo CVD method using light, and the like. Moreover, CVD methods can be classified into a metal CVD (MCVD) method and a metal organic CVD (MOCVD) method according to a source gas.

A high-quality film can be obtained at a relatively low temperature through a PECVD method. A thermal CVD method does not use plasma and thus causes less plasma damage to an object. For example, a wiring, an electrode, an element (e.g., a transistor or a capacitor), or the like included in a semiconductor device may be charged up by receiving charge from plasma. In that case, accumulated charge may break the wiring, electrode, element, or the like included in the semiconductor device. A thermal CVD method, which does not using plasma, does not cause such plasma damage, and thus can increase the yield of the semiconductor device. A thermal CVD method yields a film with few defects because of no plasma damage during film formation.

An ALD method also causes less plasma damage to an object. Since an ALD method does not cause plasma damage during film formation, a film with few defects can be obtained.

Unlike in the film formation method in which particles ejected from a target or the like are deposited, a film is formed by reaction at a surface of an object in a CVD method and an ALD method. Thus, a CVD method and an ALD method can provide good step coverage, almost regardless of the shape of an object. In particular, an ALD method allows excellent step coverage and excellent thickness uniformity and can be suitably used to cover a surface of an opening portion with a high aspect ratio, for example. Note that an ALD method has a relatively low deposition rate; hence, in some cases, an ALD method is preferably combined with another film formation method with a high deposition rate, such as a CVD method.

When a CVD method or an ALD method is employed, the composition of a film to be formed can be controlled with the flow rate ratio of the source gases. For example, in a CVD method and an ALD method, a film with a certain composition can be formed by adjusting the flow rate ratio of the source gases. As another example, in a CVD method and an ALD method, by changing the flow rate ratio of the source gases during the film formation, a film whose composition is continuously changed can be formed. In the case where a film is formed while the flow rate ratio of the source gases is changed, as compared to the case where a film is formed using a plurality of deposition chambers, the time taken for the film formation can be shortened because the time taken for transfer and pressure adjustment is omitted. Hence, the productivity of the semiconductor device can be improved in some cases.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching of corresponding switching valves (also referred to as high-speed valves) such that the source gases are not mixed. For example, a first source gas is introduced, an inert gas (e.g., argon or nitrogen) or the like is introduced at the same time as or after the introduction of the first source gas, and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on a surface of a substrate to form a first thin layer, and then the second source gas is introduced to react with the first thin layer; thus, a second thin layer is stacked over the first thin layer, and a thin film is formed as a result. The sequence of the gas introduction is controlled and repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to adjust a thickness accurately and thus is suitable for manufacturing a minute FET.

A variety of films such as metal films, semiconductor films, and inorganic insulating films can be formed by a thermal CVD method such as a MOCVD method or an ALD method. For example, trimethylindium (In(CH$_3$)$_3$), trimethylgallium (Ga(CH$_3$)$_3$), and dimethylzinc (Zn(CH$_3$)$_2$) are used to form an In—Ga—Zn—O film. Without limitation to the above combination, triethylgallium (Ga(C$_2$H$_5$)$_3$) can be used instead of trimethylgallium, and diethylzinc (Zn(C$_2$H$_5$)$_2$) can be used instead of dimethylzinc.

For example, when a hafnium oxide film is formed by a deposition apparatus employing ALD, two kinds of gases, i.e., ozone (O$_3$) as an oxidizer and a source gas obtained by vaporization of liquid containing a solvent and a hafnium precursor compound (hafnium alkoxide or hafnium amide such as tetrakis(dimethylamide)hafnium (TDMAH, Hf[N(CH$_3$)$_2$]$_4$)) are used. Alternatively, tetrakis(ethylmethylamide)hafnium may be used, for instance.

For example, when an aluminum oxide film is formed by a deposition apparatus employing ALD, two kinds of gases, i.e., H$_2$O as an oxidizer and a source gas obtained by vaporization of liquid containing a solvent and an aluminum precursor compound (e.g., trimethylaluminum (TMA, Al(CH$_3$)$_3$)) are used. Alternatively, tris(dimethylamide)aluminum, triisobutylaluminum, aluminum tris(2,2,6,6-tetramethyl-3,5-heptanedionate), or the like may be used.

For example, when a silicon oxide film is formed by a deposition apparatus using ALD, hexachlorodisilane is adsorbed on a surface where the film is to be formed, and radicals of an oxidizing gas (e.g., O$_2$ or dinitrogen monoxide) are supplied to react with the adsorbate.

For example, when a tungsten film is formed by a deposition apparatus using ALD, a WF$_6$ gas and a B$_2$H$_6$ gas are sequentially introduced to form an initial tungsten film, and then a WF$_6$ gas and an H$_2$ gas are sequentially introduced to form a tungsten film. Note that a SiH$_4$ gas may be used instead of a B$_2$H$_6$ gas.

For example, when an oxide semiconductor film, e.g., an In—Ga—Zn—O film is formed by a deposition apparatus employing ALD, an In(CH$_3$)$_3$ gas and an O$_3$ gas) are sequentially introduced to form an In—O layer, a Ga(CH$_3$)$_3$ gas and an O$_3$ gas) are sequentially introduced to form a GaO layer, and then a Zn(CH$_3$)$_2$ gas and an O$_3$ gas) are sequentially introduced to form a ZnO layer. Note that the order of these layers is not limited to this example. A mixed oxide layer such as an In—Ga—O layer, an In—Zn—O layer, or a Ga—Zn—O layer may be formed with the use of these gases. Note that although an H$_2$O gas that is obtained by bubbling water with an inert gas such as Ar may be used instead of an O$_3$ gas), it is preferable to use an O$_3$ gas), which does not contain H. An In(C$_2$H$_5$)$_3$ gas may be used instead of an In(CH$_3$)$_3$ gas. A Ga(C$_2$H$_5$)$_3$ gas may be used instead of a Ga(CH$_3$)$_3$ gas. A Zn(C$_2$H$_5$)$_2$ gas may be used instead of a Zn(CH$_3$)$_2$ gas.

<Example of Method for Manufacturing Memory Device>

Next, an example of a method for manufacturing the memory cell 100 will be described.

Figure 28A:
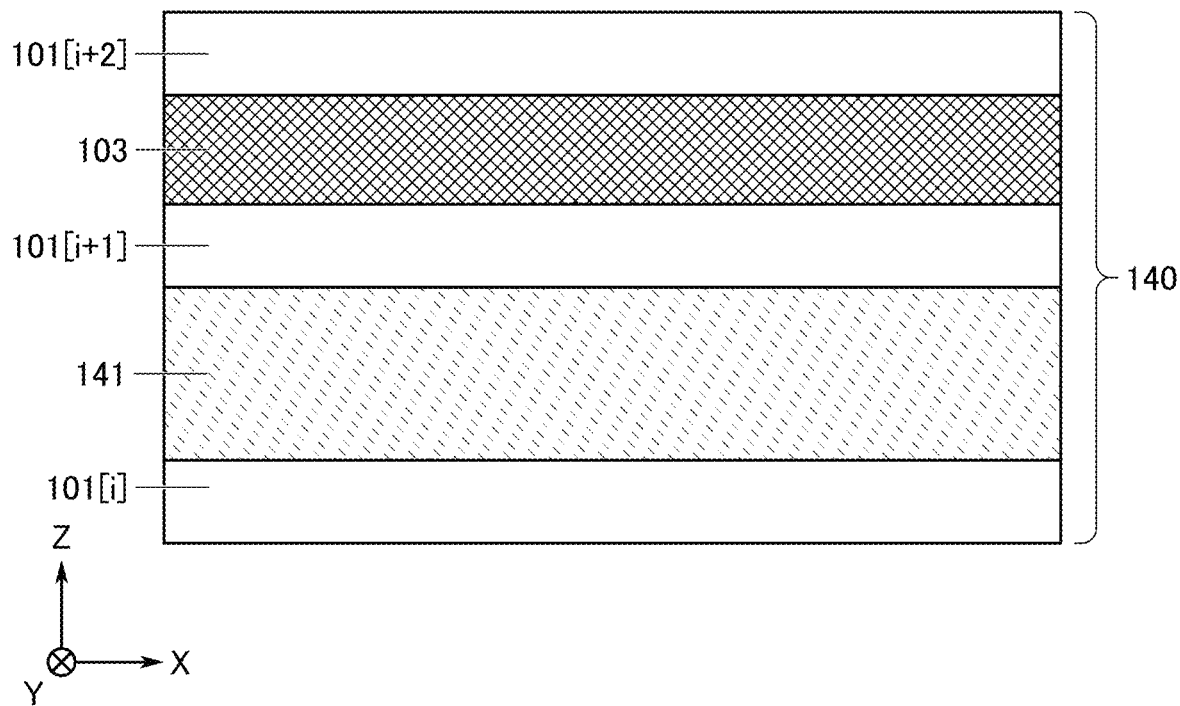
FIGS. 28A and 28B are cross-sectional views illustrating a method for manufacturing a memory cell.

First, a stack 140 illustrated in FIG. 28A is manufactured. The stack 140 includes the insulator 101, a sacrificial layer 141, and the conductor 103. The insulator 101[$i$] is placed over a substrate (not illustrated), the sacrificial layer 141 is placed over the insulator 101[$i$], the insulator 101[$i$+1] is placed over the sacrificial layer 141, the conductor 103 is placed over the insulator 101[$i$+1], and the insulator 101[$i$+2] is placed over the conductor 103.

Any of a variety of materials can be used for the sacrificial layer 141. For example, an insulator such as silicon nitride, silicon oxide, or aluminum oxide may be used. A semiconductor such as silicon, gallium, or germanium may be used. A conductor such as aluminum, copper, titanium, tungsten, or tantalum may be used. An organic material such as an acrylic resin, polyimide, a phenol resin, or an epoxy resin may be used. In other words, the sacrificial layer 141, which is removed later, is formed using a material that has sufficiently high selectivity with respect to materials used for the other portions in etching treatment performed later.

The insulator 101 is preferably a material with a low concentration of impurities such as water and hydrogen. For example, the amount of hydrogen molecules released from the insulator 101 per unit area is less than or equal to $2\times10^{15}$ molecules/cm$^2$, preferably less than or equal to $1\times10^{15}$ molecules/cm$^2$, further preferably less than or equal to $5\times10^{14}$ molecules/cm$^2$ in thermal desorption spectroscopy (TDS) in the range of 50° C. to 500° C. The insulator 101 may be formed using an insulator from which oxygen is released by heating. Note that a material usable for the insulator 101 is not limited to the above description.

Note that the insulator 101 may have a stacked-layer structure of a plurality of insulators. For example, the insulator 101 may be a stack of hafnium oxide and silicon oxynitride. Among the plurality of insulators included in the insulator 101, the aforementioned insulator that has a function of inhibiting transmission of oxygen is preferably used as the insulator in contact with the conductor 103.

Figure 28B:
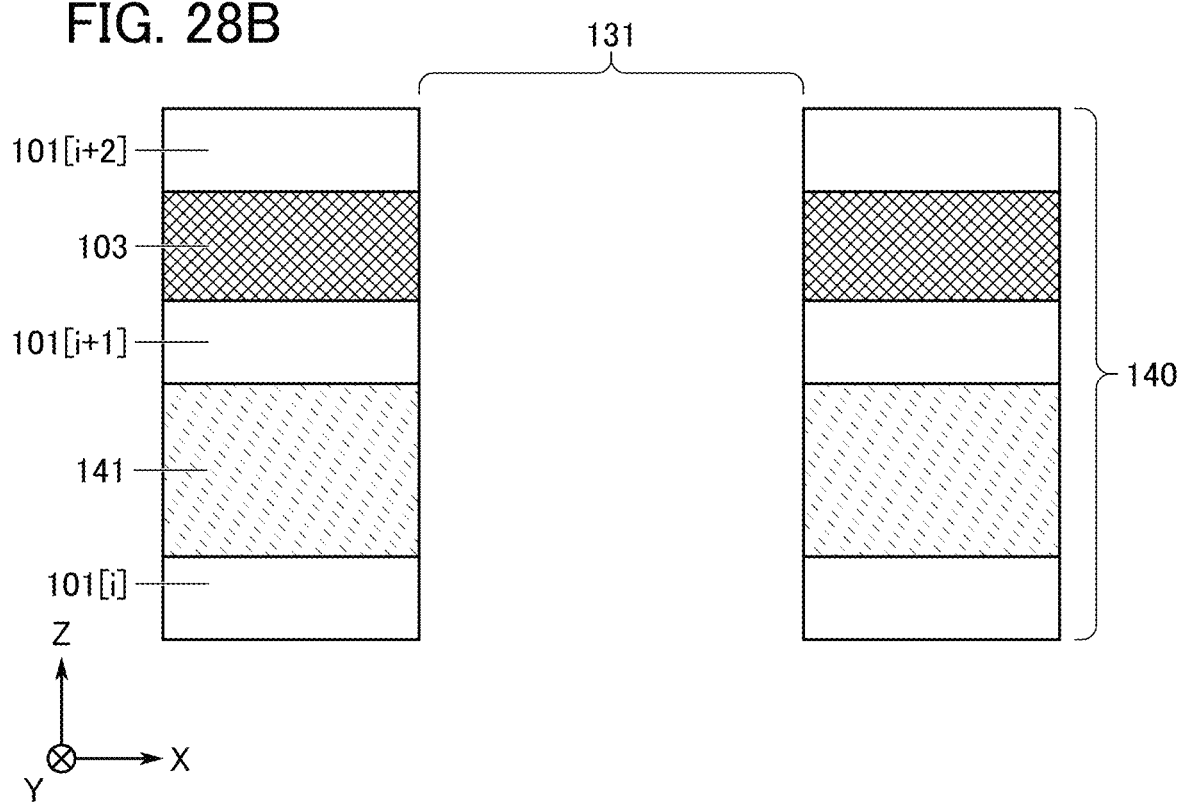

Next, a resist mask is formed over the stack 140, and the insulator 101, the conductor 103, and the sacrificial layer 141 are partly removed by etching treatment using the resist mask as a mask, whereby an opening 131 is formed in the stack 140 (see FIG. 28B).

The resist mask can be formed, for example, by a lithography method, a printing method, or an inkjet method as appropriate. Formation of the resist mask by an inkjet method needs no photomask; thus, manufacturing cost can be reduced in some cases. For the etching treatment, either a dry etching method or a wet etching method or both of them may be used. A dry etching method is suitable for microfabrication.

To form a resist mask by a lithography method, a resist is formed first, and then the resist is exposed to light through a photomask. Next, a region exposed to light is removed or left using a developing solution, so that a resist mask is formed.

Etching through the resist mask is performed to process a conductor, a semiconductor, an insulator, or the like into a desired shape. The resist mask is formed, for example, by exposing the resist to KrF excimer laser light, ArF excimer laser light, or extreme ultraviolet (EUV) light. A liquid immersion technique may be employed in which a portion between a substrate and a projection lens is filled with a liquid (e.g., water) to perform light exposure. An electron beam or an ion beam may be used instead of the above-mentioned light. Note that a photomask is not necessary in the case of using an electron beam or an ion beam. To remove the resist mask, dry etching treatment such as ashing or wet etching treatment can be used. Alternatively, wet etching treatment can be performed after dry etching treatment, or dry etching treatment can be performed after wet etching treatment.

A hard mask formed of an insulator or a conductor may be used instead of the resist mask. In the case where a hard mask is used, a hard mask with a desired shape can be formed in the following manner: an insulating film or a conductive film that is the material of the hard mask is formed over a conductive film, a resist mask is formed thereover, and then the material of the hard mask is etched.

As a dry etching apparatus for performing etching treatment by a dry etching method, a capacitively coupled plasma (CCP) etching apparatus including parallel plate electrodes can be used, for example. The CCP etching apparatus may have a structure in which high-frequency power is applied to one of the parallel plate electrodes. Alternatively, different high-frequency powers may be applied to one of the parallel plate electrodes. Alternatively, high-frequency powers with the same frequency may be applied to the parallel plate electrodes. Alternatively, high-frequency powers with different frequencies may be applied to the parallel plate electrodes. A dry etching apparatus including a high-density plasma source can be used. As the dry etching apparatus including a high-density plasma source, an inductively coupled plasma (ICP) etching apparatus can be used, for example.

Figure 29A:
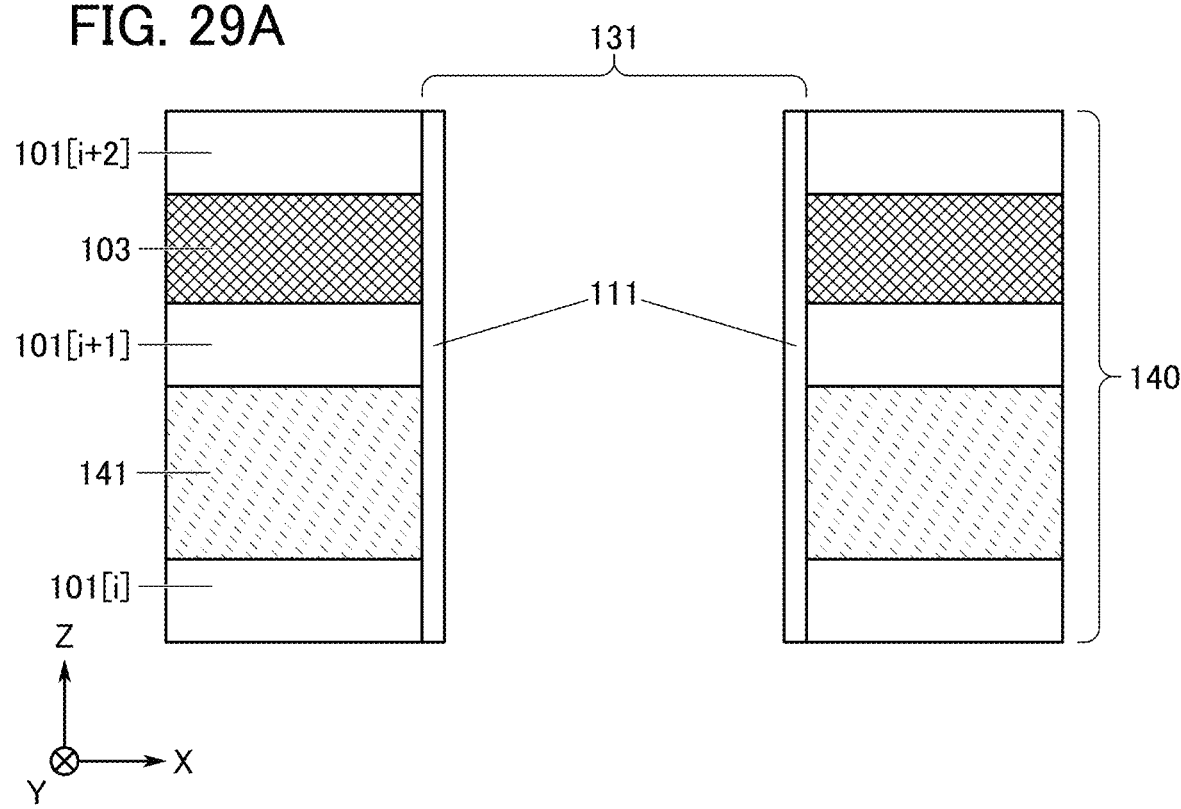
FIGS. 29A and 29B are cross-sectional views illustrating a method for manufacturing a memory cell.

Next, the insulator 111 is formed along the side surface of the opening 131 (see FIG. 29A). Side surfaces of the insulator 101, the conductor 103, and the sacrificial layer 141 that are exposed in the opening 131 are covered with the insulator 111.

Note that the insulator 111 may have a stacked-layer structure of a plurality of insulators. Among the plurality of insulators included in the insulator 111, the aforementioned insulator that has a function of inhibiting transmission of oxygen is preferably used as the insulator in contact with the conductor 103 and/or the conductor 112. For example, the insulator 111 may be a stack of hafnium oxide and silicon oxynitride. As another example, the insulator 111 may have a three-layer structure in which hafnium oxide is sandwiched between two layers of silicon oxynitride. As another example, the insulator 111 may have a three-layer structure in which silicon oxynitride is sandwiched between two layers of hafnium oxide.

Figure 29B:
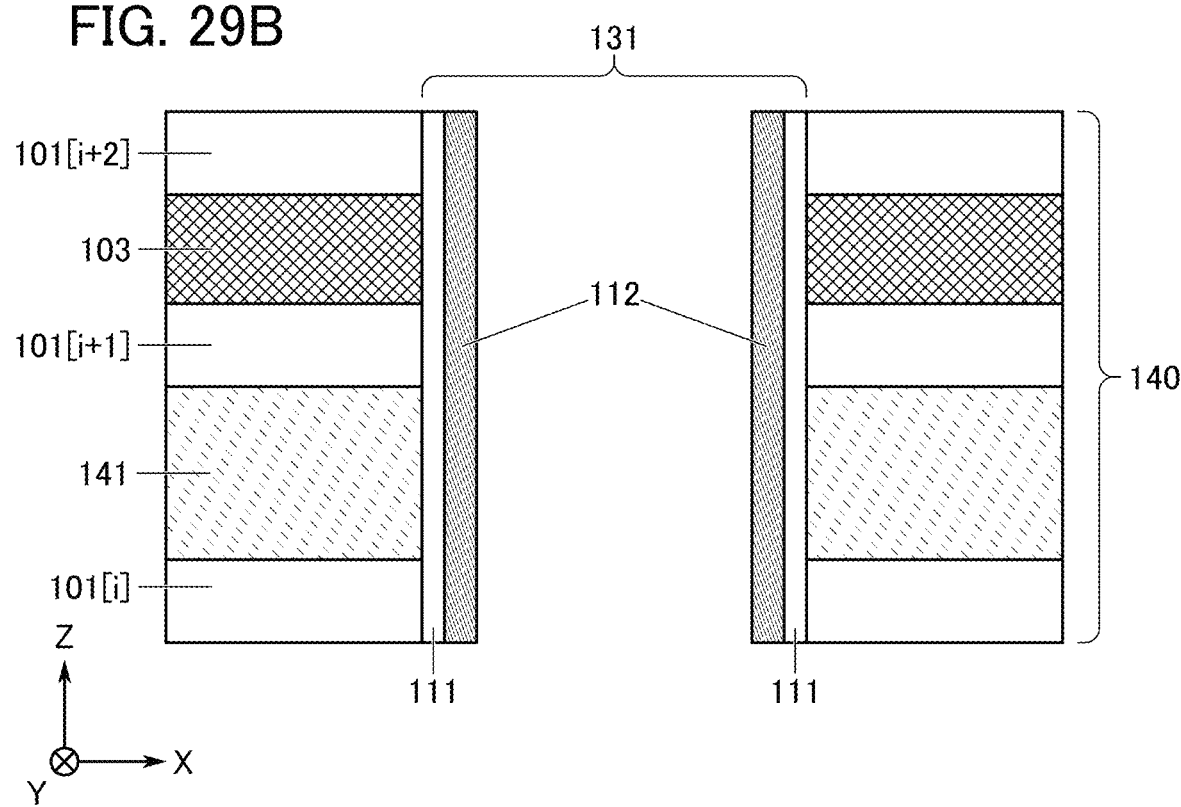

Subsequently, the conductor 112 is formed along the surface of the insulator 111 (see FIG. 29B). The conductor 112 is processed in a later step and functions as the source and/or the drain of the transistor WTr and/or the transistor RTr, the gate of the transistor RTr, and one electrode of the capacitor Cs.

The conductor 112 is preferably a material having high conductivity. For the conductor 112, a nitride containing tantalum, a nitride containing titanium, a nitride containing molybdenum, a nitride containing tungsten, a nitride containing tantalum and aluminum, or a nitride containing titanium and aluminum is preferably used, for example. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are a conductive material that is not easily oxidized or a material that maintains the conductivity even when absorbing oxygen.

In the case where an oxide semiconductor is used as a semiconductor, a conductive material having a function of inhibiting transmission of impurities such as water and hydrogen is preferably used as the conductor 112, for example. In that case, tantalum, tantalum nitride, titanium, titanium nitride, ruthenium, ruthenium oxide, or the like is preferably used as the conductor 112.

For example, when the conductor 112 is a stack of a plurality of layers, a conductive material having a function of inhibiting transmission of impurities such as water and hydrogen may be used for the layer on the insulator 111 side, and a conductive material that is not easily oxidized or a material that maintains the conductivity even after absorbing oxygen may be used for the layer on the semiconductor 113 side.

Figure 30A:
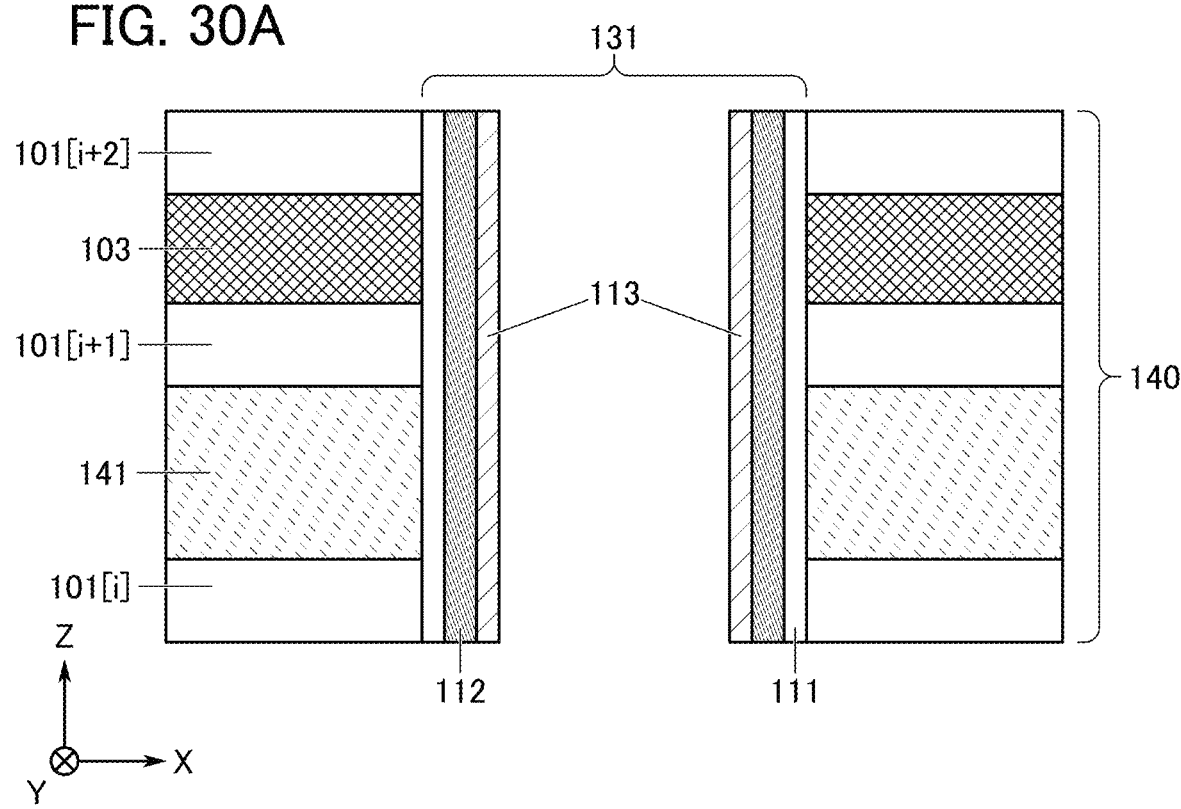
FIGS. 30A and 30B are cross-sectional views illustrating a method for manufacturing a memory cell.

Next, the semiconductor 113 is formed along the surface of the conductor 112 (see FIG. 30A). In this embodiment, an oxide semiconductor having an atomic ratio of In:Ga:Zn=1:3:4 or a neighborhood thereof is used as the semiconductor 113. Note that the terms "neighborhood" and "close to" include ±30% of an intended atomic ratio.

As a semiconductor material used as the semiconductor 113, a metal oxide with a composition of or close to In:Ga:Zn=1:3:4, 1:3:2, or 1:1:1 may be used, for example.

Figure 30B:
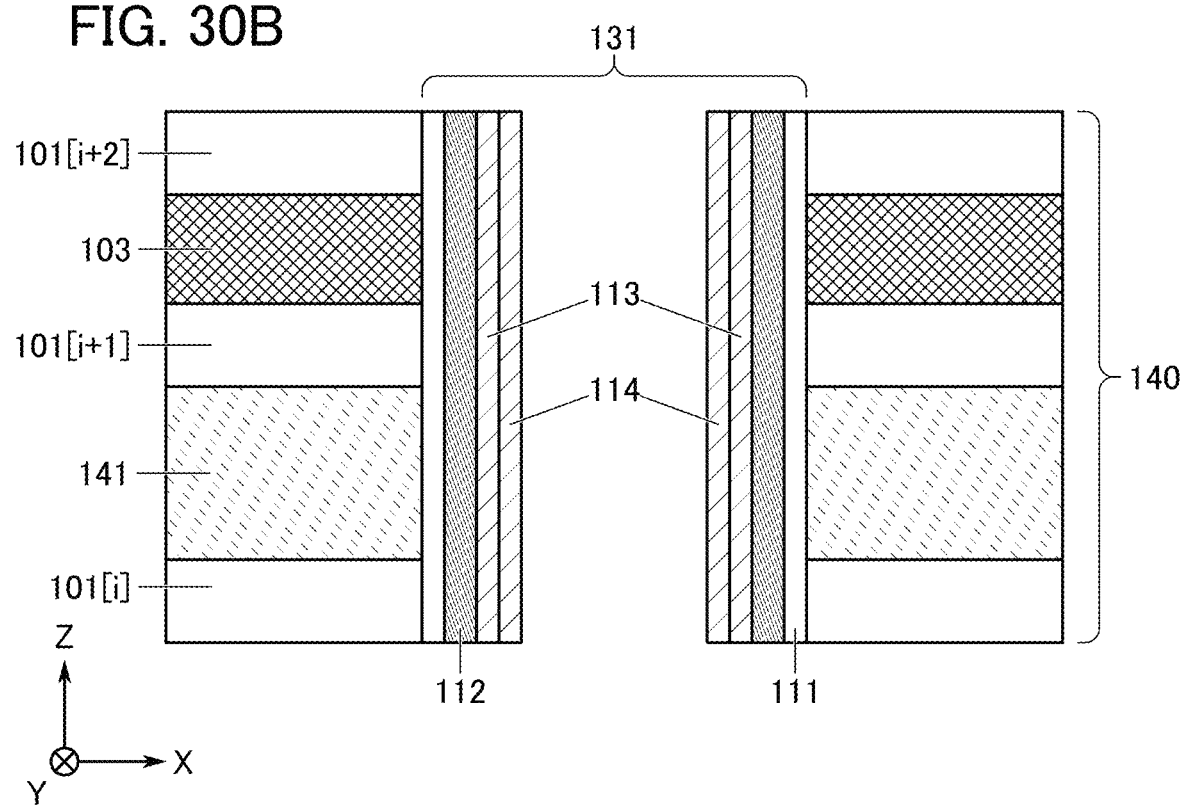

Next, the semiconductor 114 is formed along the surface of the semiconductor 113 (see FIG. 30B). In this embodiment, an oxide semiconductor having an atomic ratio of In:Ga:Zn=4:2:3 or a neighborhood thereof is used as the semiconductor 114.

As a semiconductor material used for the semiconductor 114, a metal oxide having a composition of or close to In:Ga:Zn=4:2:3 to 4:2:4.1, In:Ga:Zn=1:1:1, In:Ga:Zn=5:1:6, In:Ga:Zn=5:1:3, or In:Ga:Zn=10:1:3 may be used, for example. As a semiconductor material used for the semiconductor 114, a metal oxide having a composition of or close to In:Zn=5:1 or In:Zn=10:1 may be used. Indium oxide may be used as the semiconductor 114.

As a semiconductor material used as the semiconductor 111 that is formed later, a metal oxide with a composition of or close to In:Ga:Zn=1:3:4, 1:3:2, or 1:1:1 may be used, for example.

When an oxide semiconductor is used as the semiconductor 121 and the semiconductor 114, the semiconductor 121 and the semiconductor 114 preferably contain a common metal element. It is further preferable that the semiconductor 121 and the semiconductor 114 contain more than one common metal element. In addition, it is preferred that the semiconductor 121 and the semiconductor 114 contain more than one common metal element and that the semiconductor 121 and the semiconductor 114 have different atomic ratios of the common metal elements.

For example, when an In-M-Zn oxide containing indium, an element M, and zinc is used as the semiconductor 121 and the semiconductor 114, the atomic proportion of the element M in the metal elements in the semiconductor 121 is preferably higher than that in the semiconductor 114. The atomic ratio of the element M to In in the semiconductor 121 is preferably higher than that in the semiconductor 114. The atomic ratio of In to the element M in the semiconductor 114 is preferably higher than that in the semiconductor 121.

The energy of the conduction band minimum of the semiconductor 121 is preferably higher than that of the semiconductor 114. That is, the electron affinity of the semiconductor 121 is preferably less than that of the semiconductor 114.

Here, the energy level of the conduction band minimum is gradually varied at a junction portion of the semiconductor 121 and semiconductor 114. In other words, the energy level of the conduction band minimum at a junction portion of the semiconductor 121 and the semiconductor 114 is continuously varied or continuously connected. To vary the energy level gradually, the density of defect states in a mixed layer formed at an interface between the semiconductor 121 and the semiconductor 114 is preferably made low.

Specifically, when the semiconductor 121 and the semiconductor 114 contain the same element (as a main component) in addition to oxygen, a mixed layer with a low density of defect states can be formed. For example, in the case where the semiconductor 114 is an In—Ga—Zn oxide, it is preferable to use an In—Ga—Zn oxide, a Ga—Zn oxide, gallium oxide, or the like as semiconductor 121.

At this time, the semiconductor 114 serves as a main carrier path. When the semiconductor 121 has the above composition, the density of defect states at the interface between the semiconductor 121 and the semiconductor 114 can be made low. Thus, the influence of interface scattering on carrier conduction is small, and the transistor WTr can have a high on-state current.

Providing the semiconductor 121 can inhibit diffusion of impurities into the semiconductor 114 through the semiconductor 121. The thickness of the semiconductor 121 is greater than or equal to 1 nm and less than or equal to 10 nm, or greater than or equal to 1 nm and less than or equal to 5 nm.

In the case where the semiconductor 114 is a stack of the semiconductor 114a and the semiconductor 114b as in the memory cell 100G in FIG. 16A, the semiconductor 114b can have a structure similar to that of the semiconductor 114 and the semiconductor 114a can have a structure similar to that of the semiconductor 121.

For example, an oxide semiconductor having an atomic ratio of In:Ga:Zn=1:3:4 or a neighborhood thereof may be used as the semiconductor 114a. The thickness of the semiconductor 114a is greater than or equal to 1 nm and less than or equal to 10 nm, or greater than or equal to 1 nm and less than or equal to 5 nm. For example, an oxide semiconductor having an atomic ratio of In:Ga:Zn=4:2:3 or a neighborhood thereof may be used as the semiconductor 114b. As described above, an oxide semiconductor having an atomic ratio of In:Ga:Zn=5:1:3 or a neighborhood thereof may be used as the semiconductor 114b. The thickness of the semiconductor 114b is greater than or equal to 5 nm and less than or equal to 20 nm, or greater than or equal to 5 nm and less than or equal to 15 nm.

With such a structure, the energy level of the conduction band minimum at the junction portion of the semiconductor 121 and the semiconductor 114b and at the junction portion of the semiconductor 114b and the semiconductor 114a is gradually varied. Moreover, a mixed layer with a low density of defect states can be formed at the interface between the semiconductor 121 and the semiconductor 114b and at the interface between the semiconductor 114b and the semiconductor 114a.

By providing the semiconductor 121 and the semiconductor 114a with the semiconductor 114b therebetween, the influence of interface scattering on carrier conduction is reduced, and the transistor can have a high on-state current.

Providing the semiconductor 114a can inhibit diffusion of impurities into the semiconductor 114b through the semiconductor 114a.

In the manufacturing process of the memory cell, heat treatment is preferably performed with the surface of the semiconductor 114 exposed. The heat treatment is performed at a temperature higher than or equal to 100° C. and lower than or equal to 600° C., preferably higher than or equal to 350° C. and lower than or equal to 550° C., for example. The heat treatment is performed in a nitrogen gas atmosphere, an inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the semiconductor 114 to reduce oxygen vacancies ($V_O$). The heat treatment may be performed under a reduced pressure. Alternatively, the heat treatment may be performed in such a manner that heat treatment is performed in a nitrogen gas atmosphere or an inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas atmosphere or an inert gas atmosphere.

Note that treatment for supplying oxygen (also referred to as oxygen adding treatment) performed on the semiconductor 114 can promote a reaction in which oxygen vacancies in the semiconductor 114 are filled with supplied oxygen, i.e., a reaction of $V_O + O \rightarrow null$. Furthermore, hydrogen remaining in the semiconductor 114 reacts with supplied oxygen, so that the hydrogen can be removed as $H_2O$ (dehydrogenation). This can inhibit recombination of hydrogen remaining in the semiconductor 114 with oxygen vacancies and formation of $V_OH$.

Oxygen adding treatment can be performed by conducting microwave treatment in an oxygen-containing atmosphere. In that case, high-frequency waves such as microwaves and RF waves, oxygen plasma, oxygen radicals, and the like are applied to the semiconductor 114. The microwave treatment is preferably performed with a microwave treatment apparatus including a power source for generating high-density plasma using microwaves, for example. A power source may be provided to the microwave treatment apparatus to apply RF to the substrate side. Oxygen radicals at a high density can be generated with high-density plasma. Application of RF to the substrate (not illustrated) side allows oxygen ions generated by high-density plasma to be guided into the opening 131 efficiently. The microwave treatment is preferably performed under a reduced pressure, and the pressure is set to 60 Pa or higher, preferably 133 Pa or higher, further preferably 200 Pa or higher, still further preferably 400 Pa or higher. The microwave treatment is performed with an oxygen flow rate ($O_2/(O_2+Ar)$) of 50% or lower, preferably 10% or more and 30% or lower. The treatment temperature is lower than or equal to 750° C., preferably lower than or equal to 500° C., and is approximately 400° C., for example. The microwave treatment can be followed successively by heat treatment without exposure to air.

The effect of plasma, microwaves, and the like enables $V_OH$ included in the semiconductor 114 to be cut off, and hydrogen H to be removed from the semiconductor 114. That is, the reaction "$V_OH \rightarrow H + V_O$" and then the reaction "$V_O + O \rightarrow null$" occur in the semiconductor 114, whereby the hydrogen concentration in the semiconductor 114 can be reduced. As a result, oxygen vacancies and $V_OH$ in the semiconductor 114 can be reduced to lower the carrier concentration.

Figure 31A:
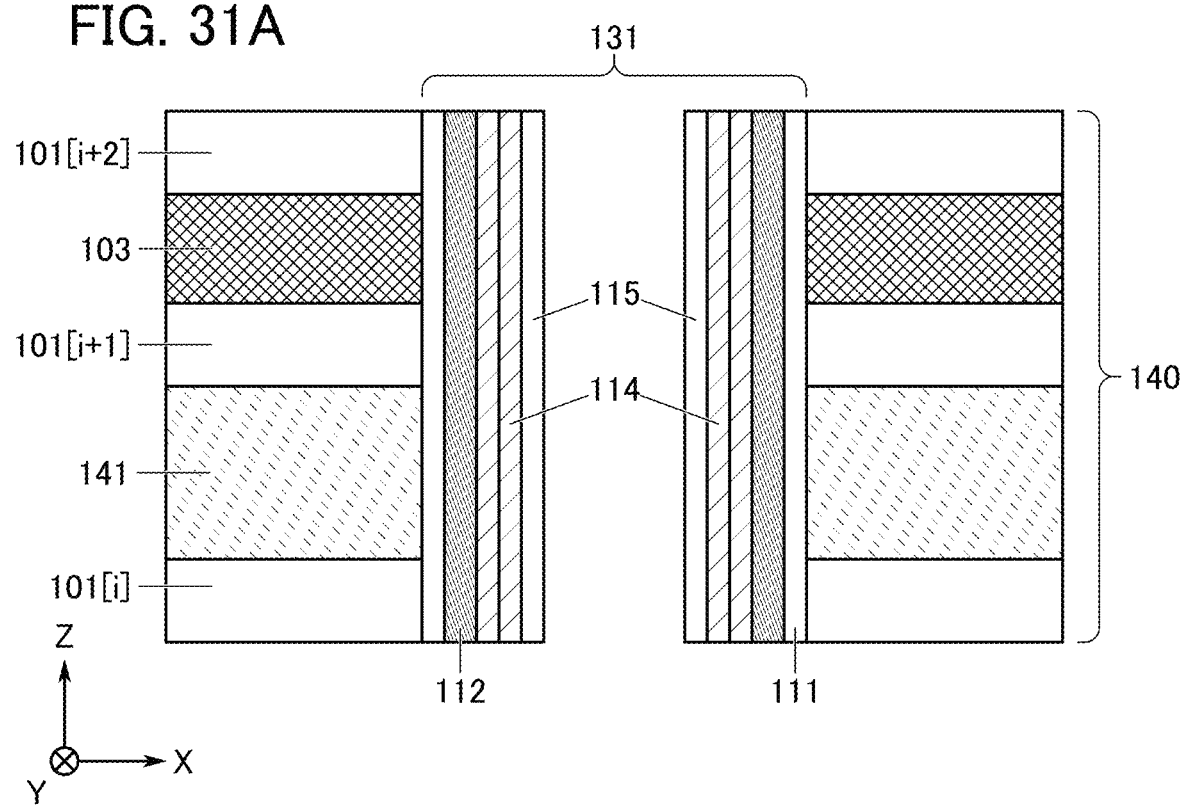
FIGS. 31A and 31B are cross-sectional views illustrating a method for manufacturing a memory cell.

Next, the insulator 115 is formed along the surface of the semiconductor 114 (see FIG. 31A). In the case where an oxide semiconductor is used as the semiconductor 114, silicon oxide or silicon oxynitride, for example, can be used as appropriate as the insulator 115. By providing the insulator containing oxygen in contact with the semiconductor 114, oxygen vacancies in the semiconductor 114 can be reduced, and the reliability of the transistor can be improved.

Specifically, an oxide material that releases part of oxygen by heating, namely, an insulator material including an excess oxygen region is preferably used for the insulator 115. An oxide that releases oxygen by heating is an oxide film in which the amount of released oxygen molecules is greater than or equal to $1.0\times10^{18}$ molecules/cm$^3$, preferably greater than or equal to $1.0\times10^{19}$ molecules/cm$^3$, further preferably greater than or equal to $2.0\times10^{19}$ molecules/cm$^3$ or greater than or equal to $3.0\times10^{20}$ molecules/cm$^3$ in TDS analysis. In the TDS analysis, the film-surface temperature is preferably higher than or equal to 100° C. and lower than or equal to 700° C., or higher than or equal to 100° C. and lower than or equal to 400° C. The thickness of the insulator 115 is greater than or equal to 3 nm and less than or equal to 15 nm, or greater than or equal to 3 nm and less than or equal to 10 nm.

The above-described oxygen adding treatment may be performed after the formation of the insulator 115.

In the case where the semiconductors 116 and 114 are formed using an oxide semiconductor, the insulator 115 is preferably an insulator including a region containing oxygen released by heating. The insulator 115 may have a stacked-layer structure of a plurality of insulators. For example, in the case where an oxide semiconductor is used for the semiconductors 116 and 114, the insulator 115 may have a three-layer structure of silicon oxide or silicon oxynitride, hafnium oxide or aluminum oxide, and silicon oxide or silicon oxynitride. That is, the insulator 115 may have a structure in which one layer of hafnium oxide or aluminum oxide is sandwiched between two layers of silicon oxide or silicon oxynitride. Note that the insulator 115 may have a stacked-layer structure of two layers or a stacked-layer structure including four or more layers.

Figure 31B:
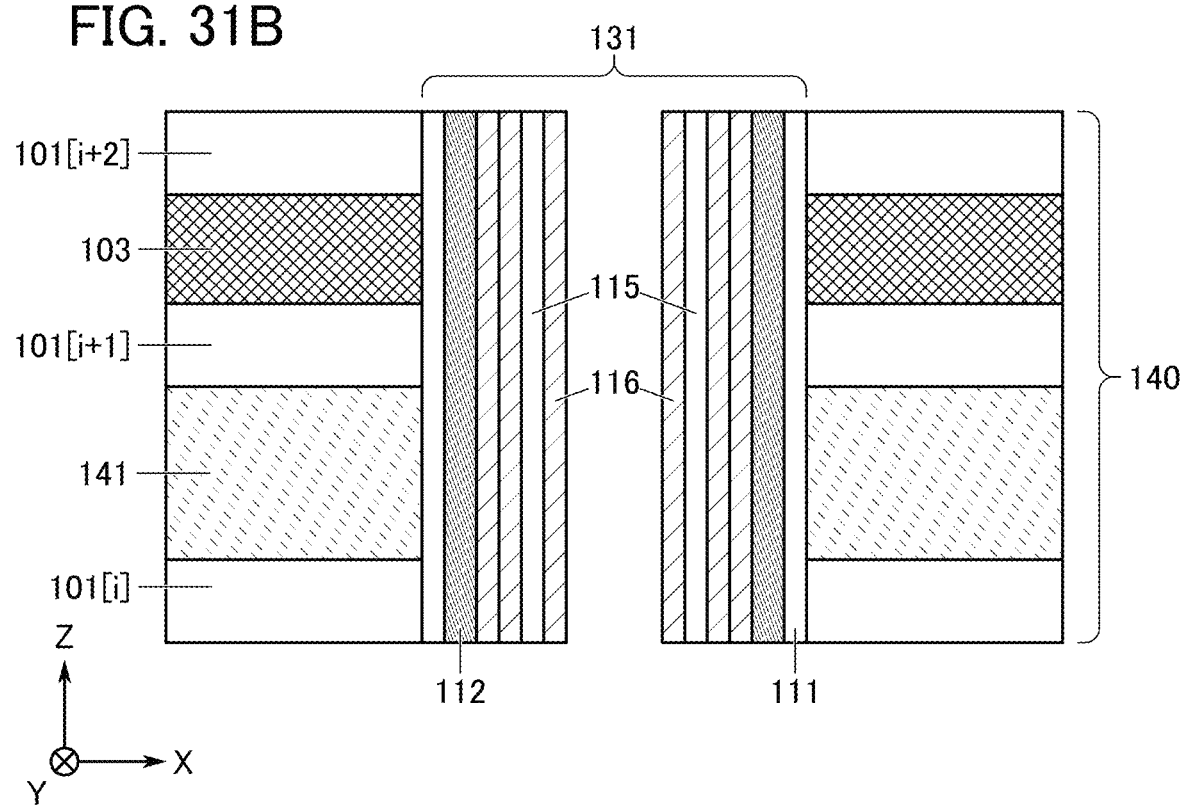

Next, the semiconductor 116 is formed along the surface of the insulator 115 (see FIG. 31B). In this embodiment, an oxide semiconductor having an atomic ratio of In:Ga:Zn=4:2:3 or a neighborhood thereof is used as the semiconductor 116.

As a semiconductor material used for the semiconductor 116, a metal oxide having a composition of or close to In:Ga:Zn=4:2:3 to 4:2:4.1, In:Ga:Zn=1:1:1, In:Ga:Zn=5:1:6, In:Ga:Zn=5:1:3, or In:Ga:Zn=10:1:3 may be used, for example. As a semiconductor material used for the semiconductor 116, a metal oxide having a composition of or close to In:Zn=5:1 or In:Zn=10:1 may be used. Indium oxide may be used as the semiconductor 116.

When an oxide semiconductor is used as the semiconductor 116, oxygen adding treatment may be performed after the formation of the semiconductor 116.

In the case where a Si transistor is used as the transistor RTr, silicon is formed as the semiconductor 116.

In the case where the semiconductor 116 is a stack of the semiconductors 116a, 116b, and 116c as in the memory cell 100K illustrated in FIGS. 18A and 18B, the semiconductor 116a and the semiconductor 116c can have a structure similar to that of the semiconductor 114a, and the semiconductor 116b can have a structure similar to that of the semiconductor 114b.

Figure 32A:
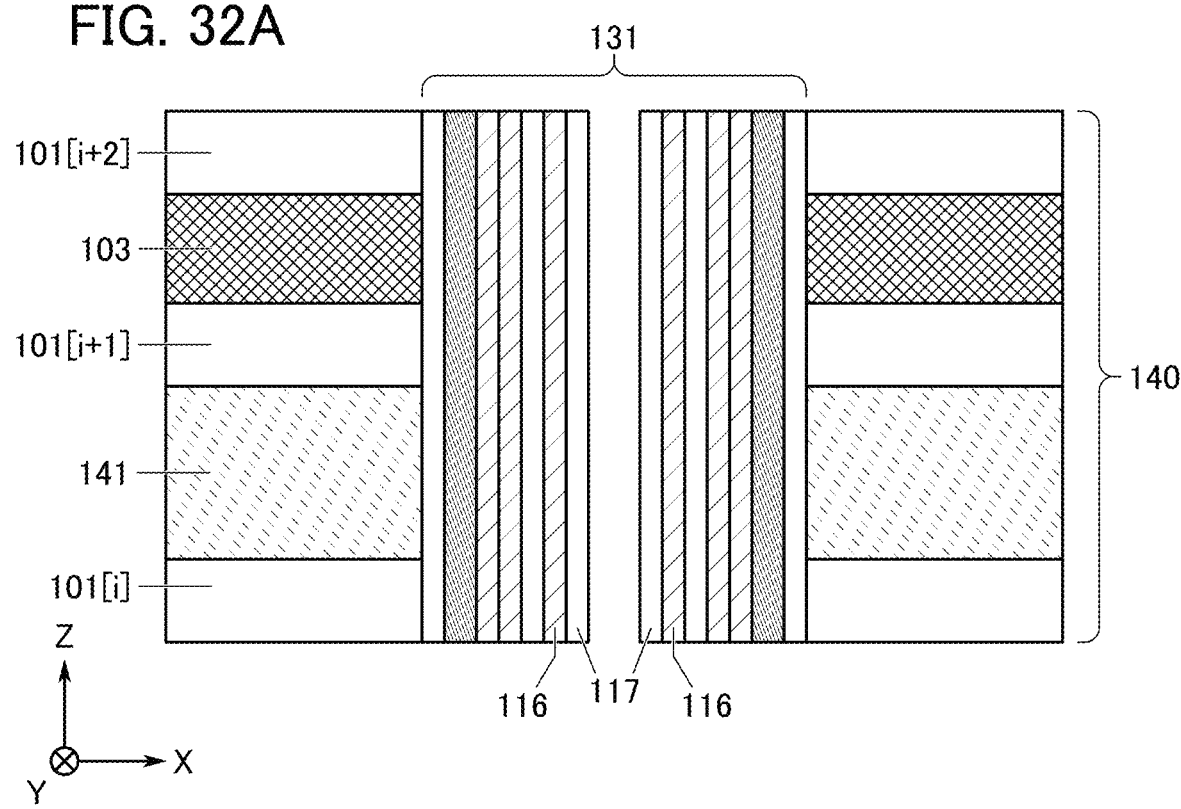
FIGS. 32A and 32B are cross-sectional views illustrating a method for manufacturing a memory cell.

Next, the insulator 117 is formed along the surface of the semiconductor 116 (see FIG. 32A). The insulator 117 is formed using a material and a method similar to those of the insulator 115. Oxygen adding treatment may be performed after the formation of the insulator 117.

The insulator 117 may have a stacked-layer structure including a plurality of insulators. In the case where an oxide semiconductor is used for the semiconductor 116, among the insulators included in the insulator 117, the insulator in contact with the semiconductor 116 is preferably an insulator including a region containing oxygen released by heating. As the insulator in contact with the conductor 118, the aforementioned insulator having a function of inhibiting transmission of oxygen is preferably used. For example, as the insulator in contact with the semiconductor 116 among the insulators in the insulator 117, silicon oxide or silicon oxynitride may be used. As the insulator in contact with the conductor 118 among the insulators in the insulator 117, hafnium oxide or aluminum oxide may be used.

Alternatively, the insulator 117 may be a stack of silicon oxide or silicon oxynitride, aluminum oxide, and silicon nitride, for example. In the case where silicon nitride is used for the insulator 117, silicon nitride that contains a small amount of hydrogen is preferably used.

Figure 32B:
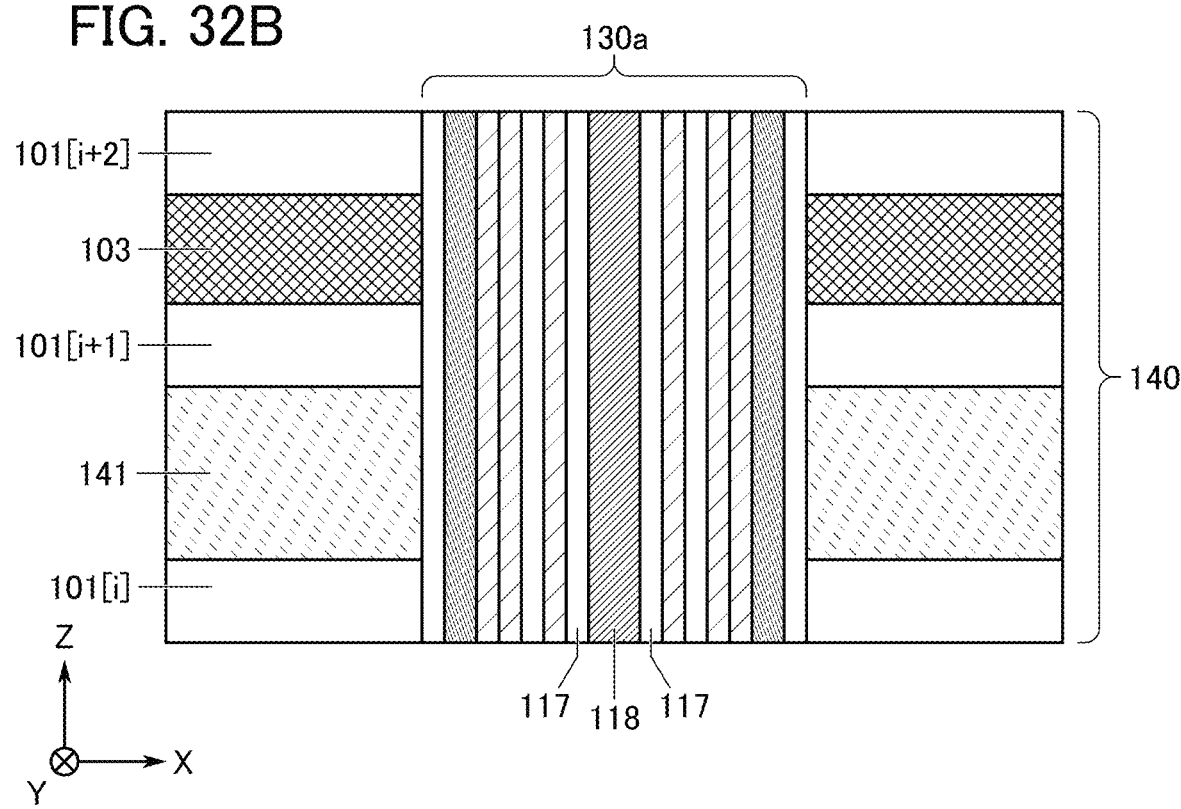

Next, the conductor 118 is formed after the formation of the insulator 117 (FIG. 32B). In this embodiment, tungsten is used as the conductor 118. Note that the conductor 118 may have a stacked-layer structure including a plurality of conductors. Among the conductors included in the conductor 118, the conductor in contact with the insulator 117 is preferably formed using a conductive material that is not easily oxidized. For example, in the conductor 118, the conductor in contact with the insulator 117 may be titanium nitride. For example, the conductor 118 may be a stack of titanium nitride and tungsten.

The insulator 111, the conductor 112, the semiconductor 113, the semiconductor 114 (the semiconductors 114a and 114b), the insulator 115, the semiconductor 116 (the semiconductors 116a, 116b, and 116c), the insulator 117, and the conductor 118 can be successively formed by a CVD method (e.g., an MOCVD method), an ALD method, or the like.

Figure 33A:
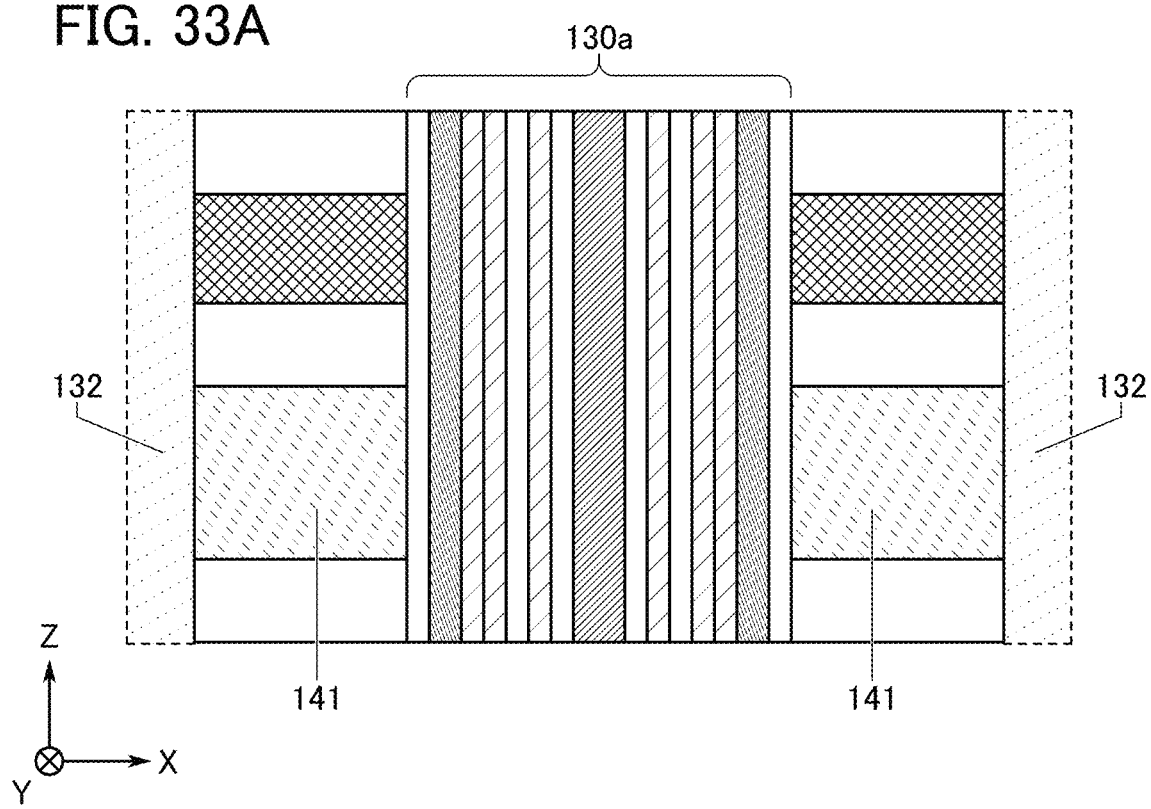
FIGS. 33A and 33B are cross-sectional views illustrating a method for manufacturing a memory cell.

In the above manner, the component 130a is formed in the opening 131. Next, part of the stack 140 in a region that does not overlap with the component 130a when seen from the Z direction is removed, whereby the region 132 is formed (see FIG. 33A). The region 132 can be formed by a method similar to that for the opening 131.

Figure 33B:
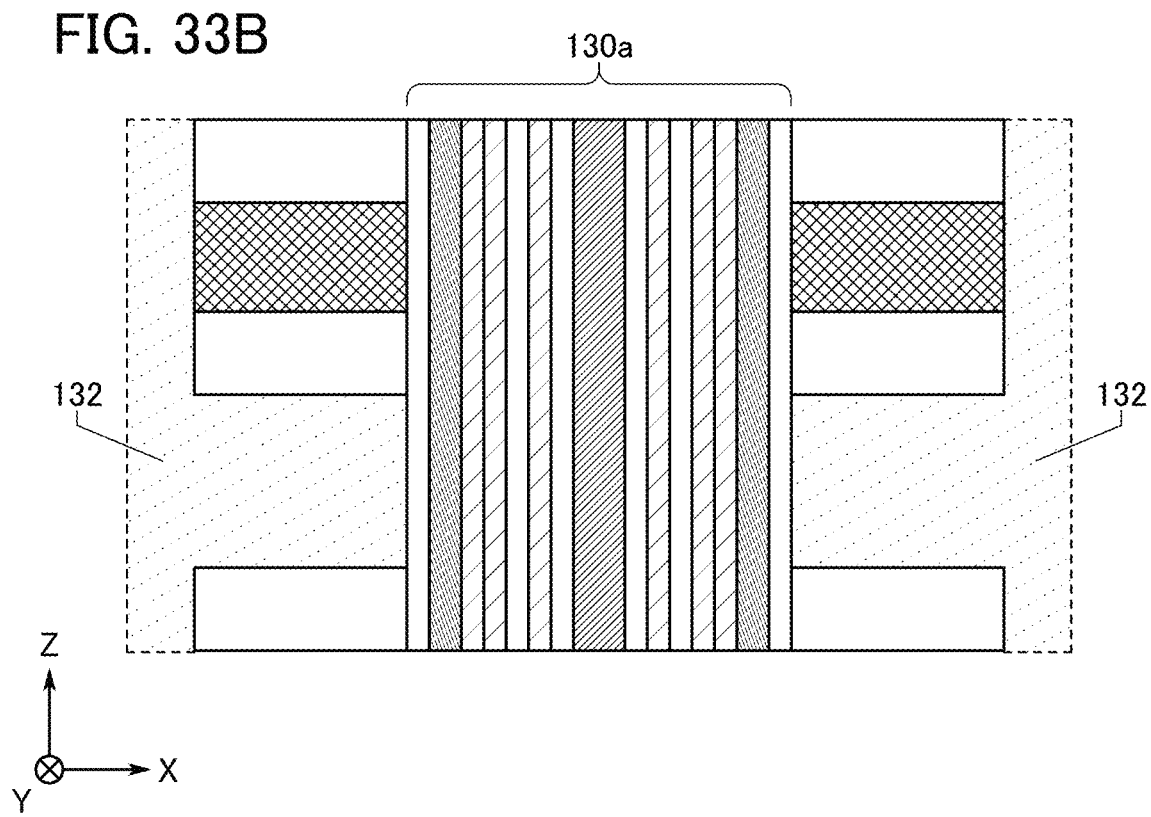

Then, the sacrificial layer 141 is removed (see FIG. 33B). The sacrificial layer 141 may be removed by a dry etching method, a wet etching method, or both of them.

Figure 34A:
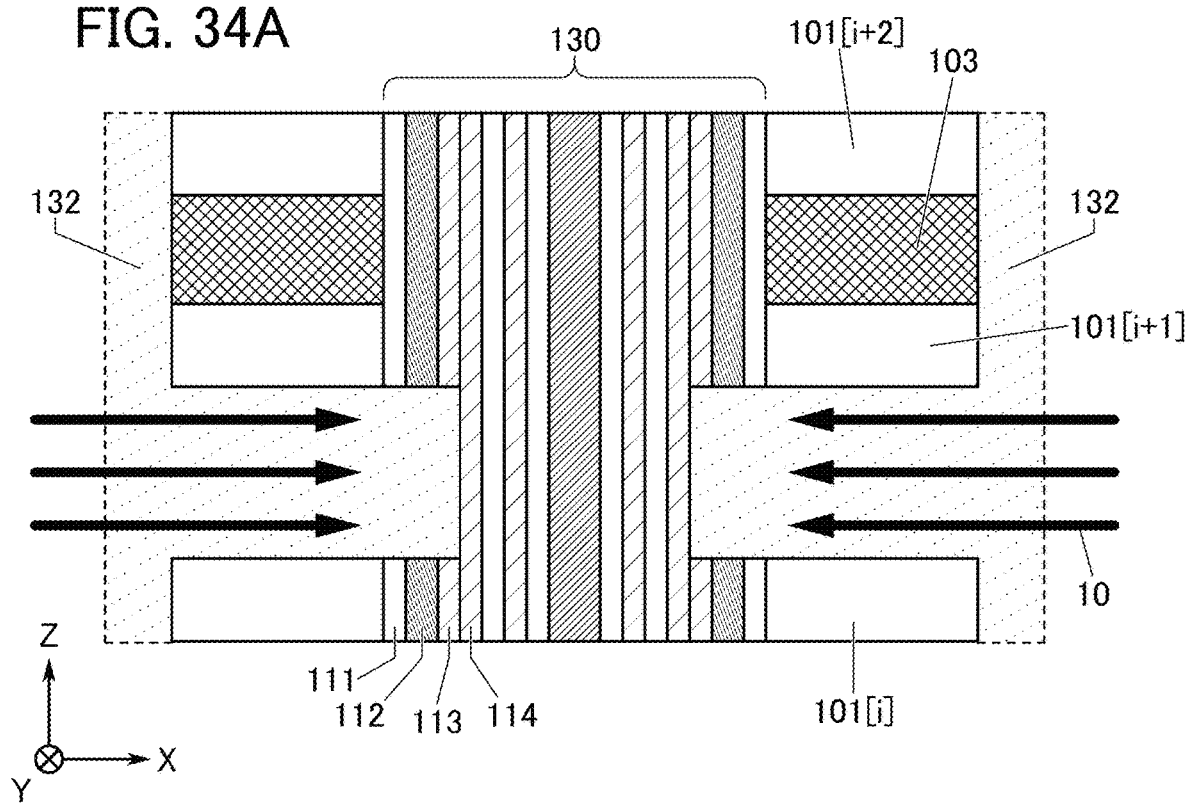
FIG. 34A is a cross-sectional view illustrating a method for manufacturing a memory cell.

Next, the insulator 111, the conductor 112, and the semiconductor 113 that overlap with the region where the sacrificial layer 141 has been removed are removed, whereby part of the semiconductor 114 is exposed (see FIG. 34A). The insulator 111, the conductor 112, and the semiconductor 113 may be removed by a dry etching method, a wet etching method, or both of them. The etching method and the etching conditions may be changed depending on the materials to be removed. The removal of the sacrificial layer 141 and the removal of the insulator 111, the conductor 112, and the semiconductor 113 may be performed successively. Alternatively, the steps from the formation of the region 132 up to the removal of the semiconductor 113 may be performed successively. In such a manner, the component 130 is formed.

Figure 34B:
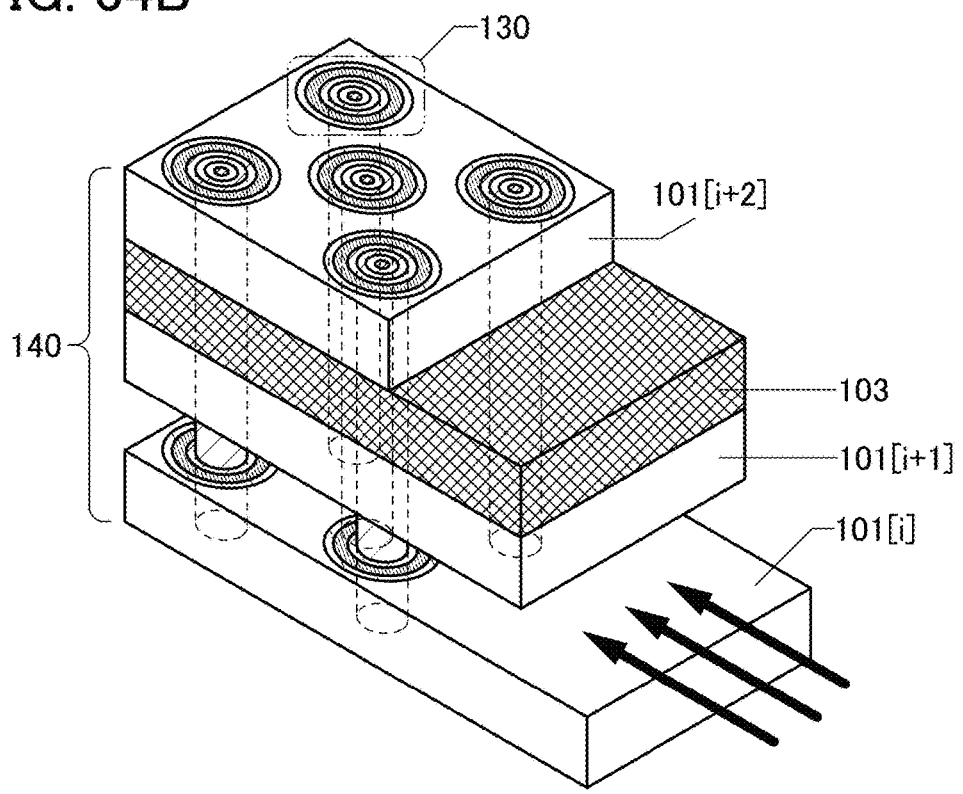
FIG. 34B is a perspective view illustrating a method for manufacturing a memory cell.

After that, oxygen adding treatment may be performed. For example, microwave treatment may be performed in an atmosphere containing oxygen 10. At this time, the oxygen 10 is supplied from the region 132; alternatively, the oxygen 10 may be supplied through a terminal extraction portion illustrated in FIG. 34B. FIG. 34B is a perspective view of the stack 140 near the terminal extraction portion.

Figure 35A:
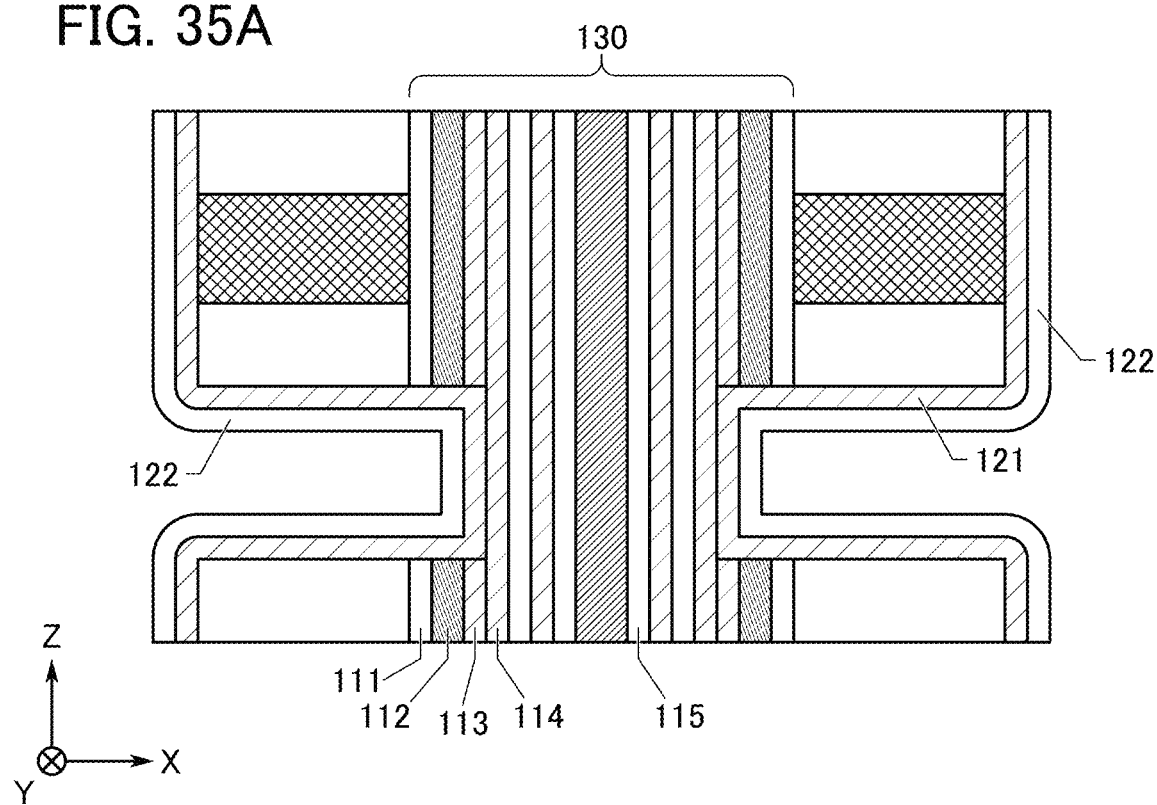
FIGS. 35A and 35B are cross-sectional views illustrating a method for manufacturing a memory cell.

Next, the semiconductor 121 is formed along surfaces of the insulator 101, the conductor 103, the insulator 111, the conductor 112, the semiconductor 113, and the semiconductor 114 that are exposed by the formation of the region 132 (see FIG. 35A). After the formation of the semiconductor 121, oxygen adding treatment may be performed.

Then, the insulator 122 is formed along the surface of the semiconductor 121 (see FIG. 35A). After the formation of the insulator 122, oxygen adding treatment may be performed. The insulators 122 is formed using a material similar to that for the insulator 115.

The insulator 122 may have a stacked-layer structure including a plurality of insulators. In the case where an oxide semiconductor is used for the semiconductor 121, among the insulators included in the insulator 122, the insulator in contact with the semiconductor 121 is preferably the aforementioned insulator including a region containing oxygen released by heating. As the insulator in contact with the conductor 102, the aforementioned insulator having a function of inhibiting transmission of oxygen is preferably used. For example, as the insulator in contact with the semiconductor 121 among the insulators in the insulator 122, silicon oxide or silicon oxynitride may be used. As the insulator in contact with the conductor 102 among the insulators in the insulator 122, hafnium oxide may be used.

Alternatively, the insulator 122 may be a stack of silicon oxide or silicon oxynitride, aluminum oxide, and silicon nitride, for example. In the case where silicon nitride is used for the insulator 122, silicon nitride that contains a small amount of hydrogen is preferably used.

Figure 35B:
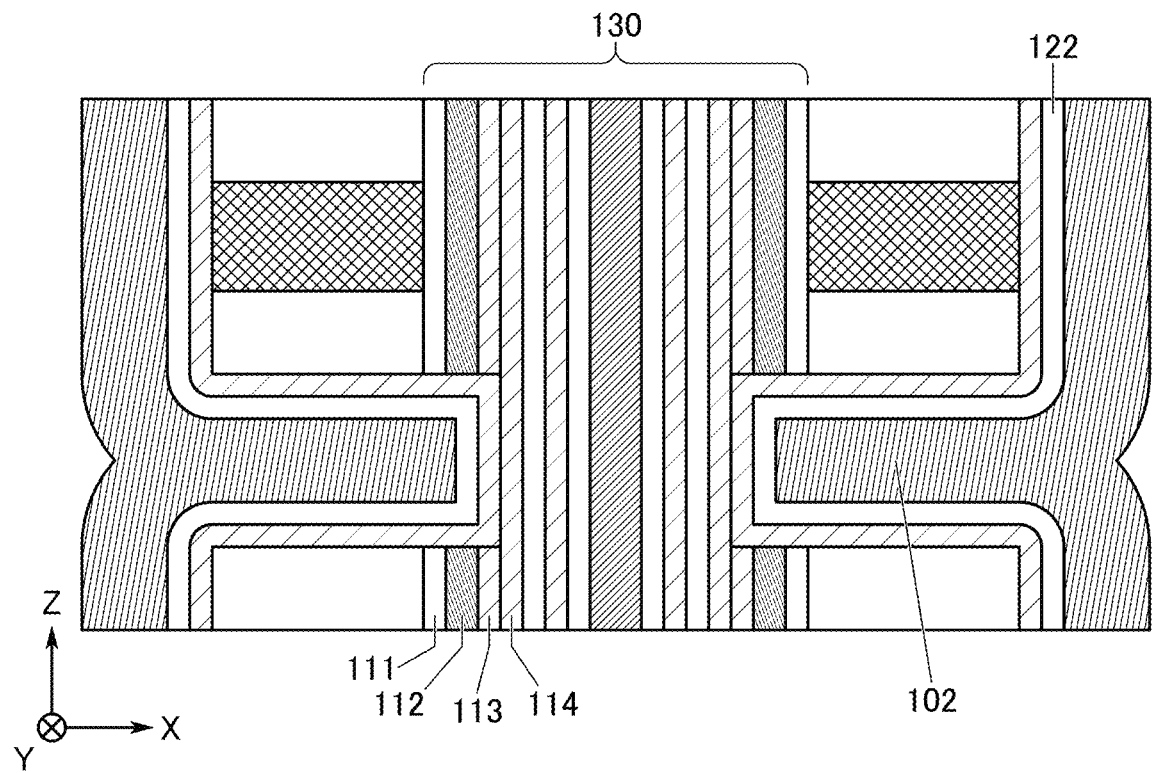

Next, the conductor 102 is formed along the surface of the insulator 122 (see FIG. 35B). Although the conductor 102 is shown as a single layer in this embodiment, the conductor 102 may be a stack of a plurality of layers.

For example, in the case where the conductor 102 is a stack of the conductor 102f and the conductor 102s as in the memory cell 100K illustrated in FIGS. 18A and 18B, a conductive material that is not easily oxidized is preferably used for the conductor 102f in contact with the insulator 122. For example, titanium nitride is used for the conductor 102f and tungsten is used for the conductor 102s.

Figure 36A:
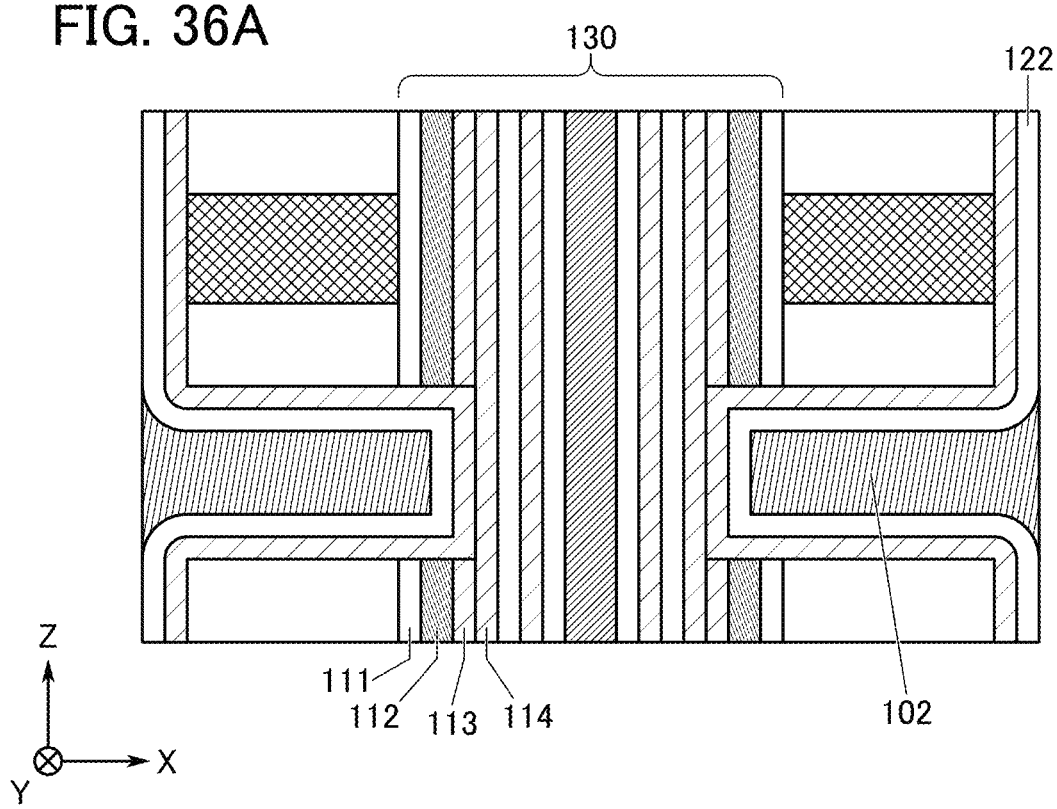
FIGS. 36A and 36B are cross-sectional views illustrating a method for manufacturing a memory cell.

Next, the conductor 102 is partly removed so that part of the insulator 122 is exposed (see FIG. 36A).

Figure 36B:
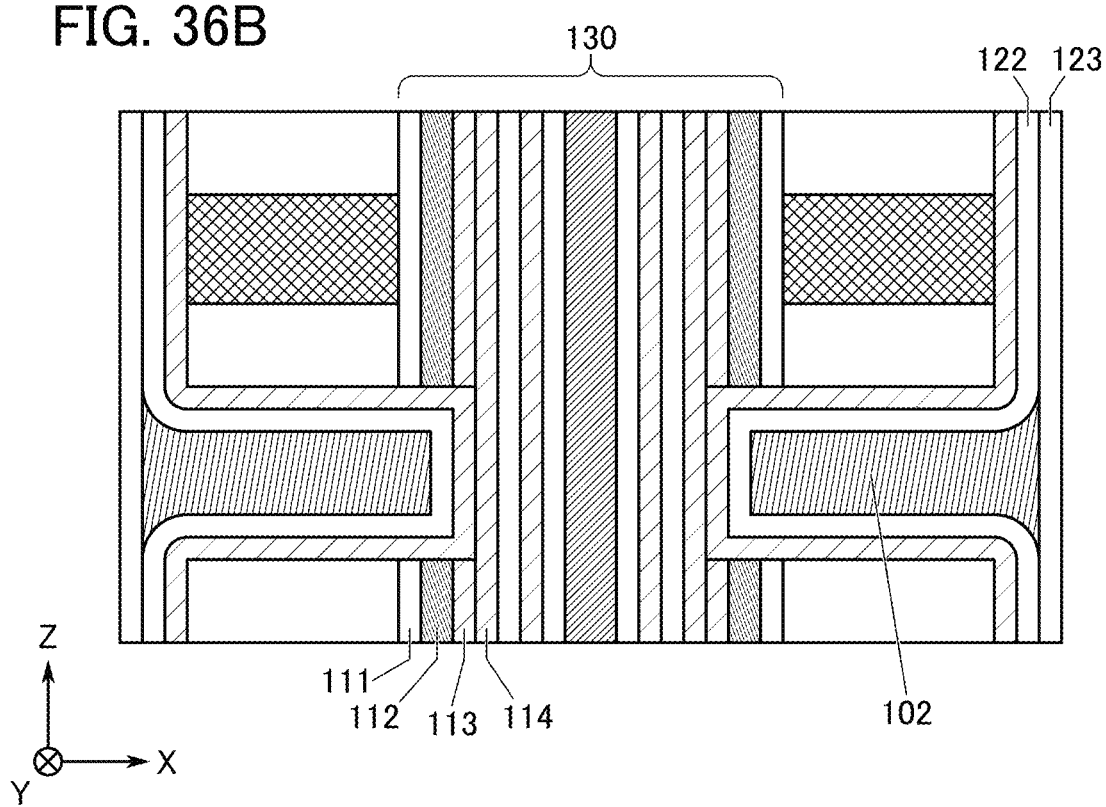

Then, the insulator 123 is formed along the exposed part of the insulator 122 and the surface of the conductor 102 (see FIG. 36B). For the insulator 123, an insulating material having a function of inhibiting transmission of impurities such as water and hydrogen and the like is preferably used, and aluminum oxide can be used, for example.

Note that the insulator 123 may have a stacked-layer structure of a plurality of insulators. For example, the insulator 123 may be a stack of hafnium oxide and silicon oxynitride. Among the insulators in the insulator 123, the aforementioned insulator that has a function of inhibiting transmission of oxygen is preferably used as the insulator in contact with the conductor 102.

In the above manner, the memory cell 100 can be manufactured.

Note that in the case where the memory cell 100 is divided into a plurality of parts like the memory cell 100P illustrated in FIG. 21 and FIGS. 22A and 22B, a slit (not illustrated) for dividing the memory cell 100 into a plurality of parts is formed in the subsequent step. After the formation of the slit, the insulator 124 may be provided in the slit. The insulator 124 is formed using a material similar to that for insulator 123.

This embodiment can be implemented in an appropriate combination with any of the structures described in the other embodiments and the like Embodiment 2

In this embodiment, examples of a circuit configuration and an operation method of a semiconductor device 300 including a plurality of memory strings 200 will be described with reference to drawings.

<Circuit Configuration Example>

A circuit configuration of the semiconductor device 300 is described with reference to FIG. 37. The semiconductor device 300 includes m memory strings 200. In this embodiment and the like, the first memory string 200 is denoted as a memory string 200[1] and the m-th memory string 200 is denoted as a memory string 200[$m$] (m is an integer of 1 or more). Moreover, the j-th memory string 200 is denoted as a memory string 200[$j$] (j is an integer of 1 to m).

Each of the memory strings 200 includes n memory cells 100. FIG. 37 illustrates the memory cell 100 having the circuit configuration illustrated in FIG. 4A; alternatively, the memory cell 100 may have the circuit configuration illustrated in any of FIGS. 4B and 4C and FIGS. 5A and 5B. In this embodiment and the like, the k-th memory cell 100 included in the j-th memory string 200 is denoted as a memory cell 100[$k,j$].

Figure 37:
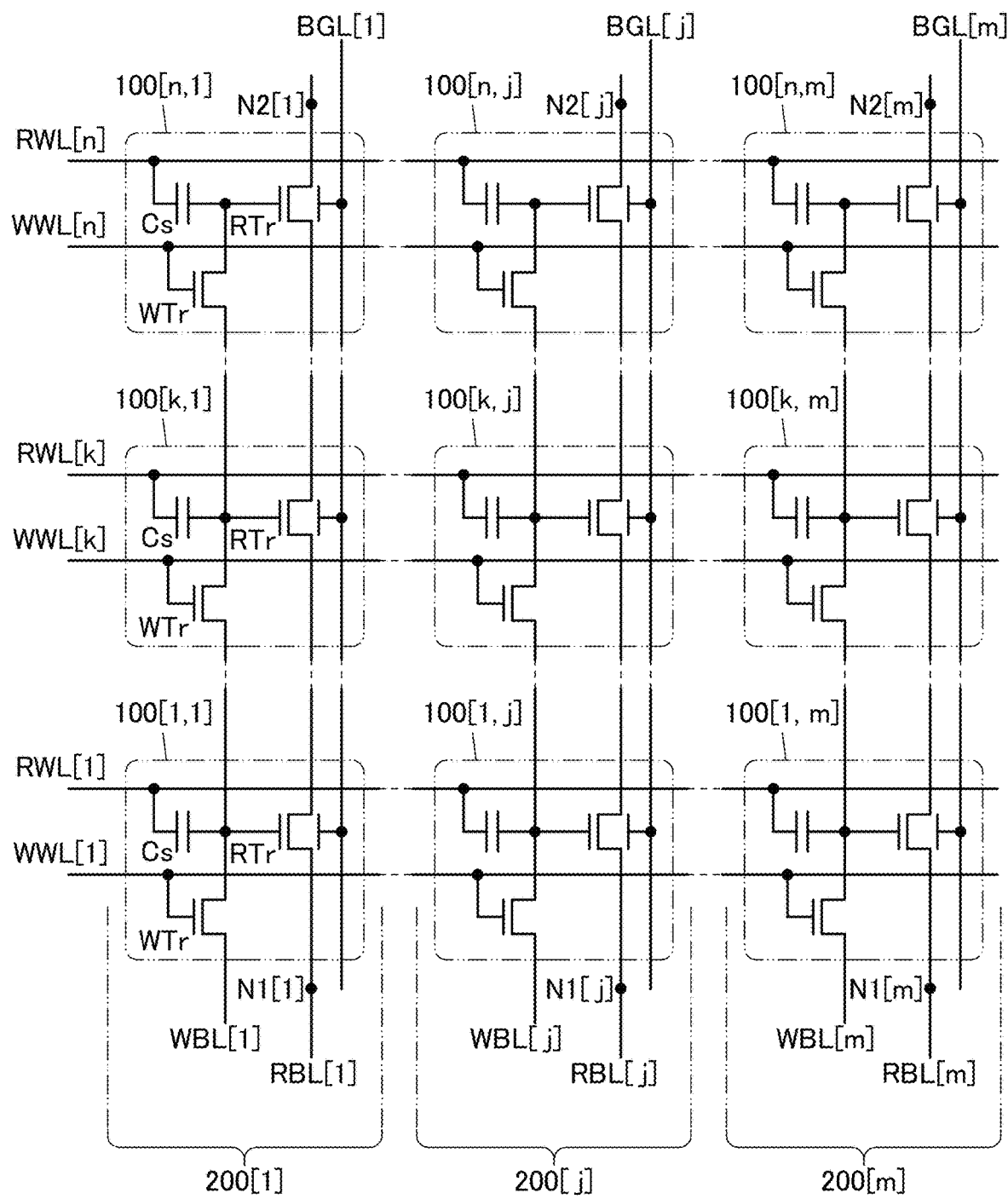
FIG. 37 is a circuit diagram of a semiconductor device.

The semiconductor device 300 illustrated in FIG. 37 includes n wirings WWL, n wirings RWL, m wirings WBL, m wirings RBL, and m wirings BGL. In this embodiment and the like, the k-th wiring WWL and the k-th wiring RWL are denoted as a wiring WWL[$k$] and a wiring RWL[$k$]. The j-th wiring WBL, the j-th wiring RBL, and the j-th wiring BGL are denoted as a wiring WBL[$j$], a wiring RBL[$j$], and a wiring BGL[$j$].

A wiring WWL[1] is electrically connected to the gate (the conductor 102) of the transistor WTr included in each of the memory cells 100[1,1] to 100[1,$m$]. The wiring WWL[$k$] is electrically connected to the gate (the conductor 102) of the transistor WTr included in each of the memory cells 100[$k$,1] to 100[$k,m$]. A wiring WWL[n] is electrically connected to the gate (the conductor 102) of the transistor WTr included in each of the memory cells 100[$n$,1] to 100[$n,m$].

A wiring RWL[1] is electrically connected to the capacitor Cs included in each of the memory cells 100[1,1] to 100[1,$m$]. The wiring RWL[$k$] is electrically connected to the capacitor Cs included in each of the memory cells 100[$k$,1] to 100[$k,m$]. A wiring RWL[n] is electrically connected to the capacitor Cs included in each of the memory cells 100[$n$,1] to 100[$n,m$]. The wiring RWL is connected to the gate (the conductor 112) of the transistor RTr through the capacitor Cs.

A wiring WBL[1] is electrically connected to one of the source and the drain (the conductor 112) of the transistor WTr in the memory cell 100[1,1]. The wiring WBL[$j$] is electrically connected to one of the source and the drain (the conductor 112) of the transistor WTr in the memory cell 100[1,$j$]. A wiring WBL[$m$] is electrically connected to one of the source and the drain (the conductor 112) of the transistor WTr in the memory cell 100[1,$m$].

A wiring RBL[1] is electrically connected to one of the source and the drain (the semiconductor 116) of the transistor RTr in the memory cell 100[1,1]. The wiring RBL[$j$] is electrically connected to one of the source and the drain (the semiconductor 116) of the transistor RTr in the memory cell 100[1,$j$]. A wiring RBL[$m$] is electrically connected to one of the source and the drain (the semiconductor 116) of the transistor RTr in the memory cell 100[1,$m$].

A wiring BGL[1] is electrically connected to the back gate (the conductor 118) of the transistor RTr included in each of the memory cells 100[1,1] to 100[$n$,1]. The wiring BGL[$j$] is electrically connected to the back gate (the conductor 118) of the transistor RTr included in each of the memory cells 100[11] to 100[$n,j$]. A wiring BGL[$m$] is electrically connected to the back gate (the conductor 118) of the transistor RTr included in each of the memory cells 100[1,m] to 100[n,m].

The wiring WWL functions as a write word line, the wiring RWL functions as a read word line, the wiring WBL functions as a write bit line, and the wiring RBL functions as a read bit line.

In the memory string 200[1] illustrated in FIG. 37, a region electrically connected to the other of the source and the drain of the transistor RTr in the memory cell 100[1,1] is denoted as a node N1[1], and a region electrically connected to the one of the source and the drain of the transistor RTr in the memory cell 100[n,1] is denoted as a node N2[1]. Similarly, the node N1 and the node N2 in the memory string 200[j] are denoted as a node N1[j] and a node N2[j]. The node N1 and the node N2 in the memory string 200[m] are denoted as a node N1[m] and a node N2[m].

<Operation Method Example>

Next, an example of the operation method for the semiconductor device 300 illustrated in FIG. 37 will be described. In this embodiment, an operation example of writing data to the memory cell 100 included in the memory string 200[1] and an operation example of reading data therefrom will be described.

Note that in the following description, a low-level potential (Low) and a high-level potential (High) do not represent any particular potentials, and specific potentials may vary depending on wirings. For example, a low-level potential and a high-level potential supplied to the wiring WWL may be different from a low-level potential and a high-level potential supplied to the wiring RWL.

In this operation method example, the wiring BGL has previously been supplied with a potential in a range where the transistor RTr and the transistor WTr operate normally.

Figure 38A:
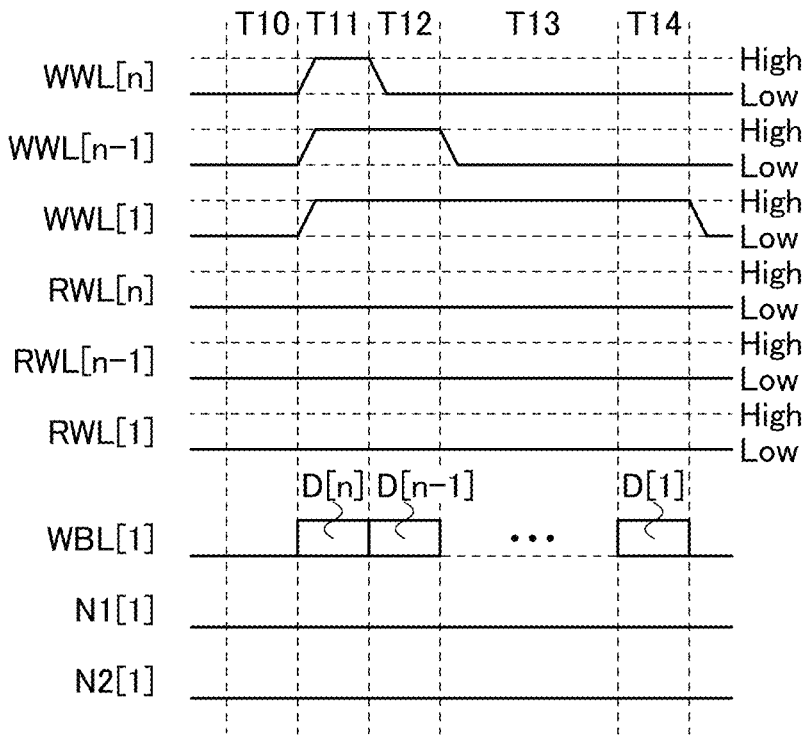
FIGS. 38A and 38B are timing charts illustrating an operation example of a semiconductor device.
Figure 38B:
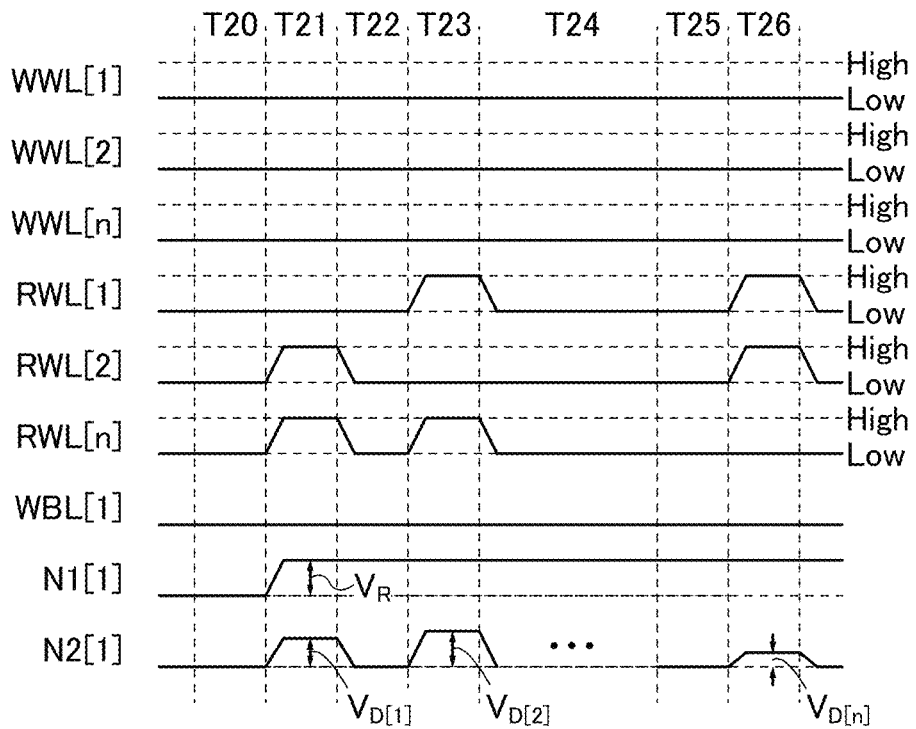

FIG. 38A is a timing chart showing an operation example of writing data to the memory string 200[1]. FIG. 38B is a timing chart showing an operation example of reading data from the memory string 200[1]. The timing charts in FIGS. 38A and 38B each show changes in potential level of the wiring WWL[1], the wiring WWL[2] or the wiring WWL[n−1], the wiring WWL[n], the wiring RWL[1], the wiring RWL[2] or the wiring RWL[n−1], the wiring RWL[n], the node N1[1], and the node N2[1]. As for the wiring WBL[1], data supplied to the wiring WBL[1] is shown.

FIG. 38A shows an example of writing data D[1] to data D[n] to the respective memory cells 100[1,1] to 100[n,1]. Note that the data D[1] to the data D[n] can be binary data or multilevel data. The data D[1] to the data D[n] are supplied from the wirings WBL[1].

To write data to the memory string 200[1], data writing is sequentially performed from the memory cell 100[n,1] to the memory cell 100[1,1]. Writing data to the memory cell 100[2,1] after writing data to the memory cell 100[1,1] would cause loss of data held in the memory cell 100[1,1]. For that reason, the operation of reading the data written to the memory cell 100[1,1] and saving the data at another place is required.

To write data to the memory cell 100[k,1] in the memory string 200, a low-level potential is supplied to the wirings WWL[n] to WWL[k+1] so that the transistors WTr in the memory cells 100[n,1] to 100[k+1,1] are turned off, in order to prevent rewriting of data held in the memory cells 100[n,1] to 100[k+1,1]. Thus, the data held in each of the memory cells 100[n,1] to 100[k+1,1] can be protected.

Moreover, when data is written to the memory cell 100[k,1], the data is supplied from the wiring WBL[1]; hence, a high-level potential is supplied to the wirings WWL[1] to WWL[k] so that the transistors WTr in the memory cells 100[1,1] to 100[k,1] are sufficiently turned on. Consequently, the data can be retained in the storage node of the memory cell 100[k,1].

When data is written to the memory cells 100[1,1] to 100[n,1], the wiring RBL[1] can be controlled independently and thus is not necessarily set to a particular potential. For example, the wiring RBL[1] may be set to a low-level potential. The node N1[1] and the node N2[1] are set to a low-level potential.

<<Write Operation>>

In view of the above, an example of the write operation is described with reference to the timing chart in FIG. 38A. In the period T10, the wirings WWL[1] to WWL[n], the wirings RWL[1] to RWL[n], the wiring WBL[1], the node N1[1], and the node N2[1] have a low-level potential.

In the period T11, a high-level potential is supplied to the wirings WWL[1] to WWL[n]. Thus, the transistors WTr in the memory cells 100[1,1] to 100[n,1] are sufficiently turned on. The data D[n] is supplied to the wiring WBL[1]. Since the transistors WTr in the memory cells 100[1,1] to 100[n,1] are sufficiently turned on, the data D[n] is supplied to the storage node of the memory cell 100[n,1].

In the period T12, a low-level potential is supplied to the wiring WWL[n], and the high-level potential is continuously supplied to the wirings WWL[n−1] to WWL[1]. Thus, the transistor WTr in the memory cell 100[n,1] is turned off and the transistors WTr in the memory cells 100[n−1,1] to 100[1,1] remain on. The data D[n−1] is supplied to the wiring WBL[1]. Since the transistors WTr in the memory cells 100[n−1,1] to 100[1,1] are sufficiently turned on, the data D[n−1] is supplied to the storage node of the memory cell 100[n−1,1]. Furthermore, since the transistor WTr in the memory cell 100[n,1] is off, the data D[n] written to the memory cell 100[n,1] in the period T11 is held.

In the period T13, as in the period T11 and the period T12, the data D[n−2] to the data D[2] are sequentially written to the memory cells 100[n−2,1] to 100[2,1].

Specifically, the transistors WTr in the memory cells 100[n,1] to 100[k+1,1] to which the data has been written are turned off, the transistors WTr in the memory cells 100[k,1] to 100[1,1] to which the data has not been written yet are sufficiently turned on, and the data D[k] is supplied from the wiring WBL and written to the storage node of the memory cell 100[k,1]. After writing of the data D[k] to the memory cell 100[k,1] ends, the transistor WTr in the memory cell 100[k,1] is turned off. Then, the data D[k−1] is supplied from the wiring WBL[1] and written to the storage node of the memory cell 100[k−1,1].

The write operation in the case where k is 1 is described in the period T14. In the period T14, a low-level potential is supplied to the wirings WWL[n] to WWL[2], and the high-level potential is continuously supplied to the wiring WWL[1]. Thus, the transistors WTr in the memory cells 100[n,1] to 100[2,1] are turned off and the transistor WTr in the memory cell 100[1,1] remains on. The data D[1] is supplied to the wiring WBL[1]. Since the transistor WTr in the memory cell 100[1,1] is sufficiently on, the data D[1] reaches and is written to the storage node of the memory cell 100[1,1]. Since the transistors WTr in the memory cells 100[n,1] to 100[2,1] are off, the data D[n] to the data D[2] stored in the respective memory cells 100[n,1] to 100[2,1] are held.

In this manner, data can be written to the memory cells 100[1,1] to 100[n,1].

This embodiment describes the write operation with the focus on the memory string 200[1]; in the semiconductor device 300, when a high-level potential is supplied to the wiring WWL[k], the transistors WTr electrically connected to the wiring WWL[k] are all turned on. Thus, data writing to the memory strings 200[2] to 200[m] is performed concurrently with data writing to the memory string 200[1].

The memory cell 100 described in this embodiment is an OS memory. Accordingly, the semiconductor device 300 including the memory cells 100 does not require erase operation before data rewriting and achieve fast write operation.

When data is written to (or rewritten in) the memory cell 100 that is close to the wiring WBL, it is possible to skip data write operation on the memory cells 100 farther from the wiring WBL than the targeted memory cell 100. For example, when data is written to (or rewritten in) the memory cell 100[1,1], it is possible to skip data write operation on the memory cells 100[2,1] to 100[n,1]. When data is written to the memory cell 100[2,1] it is possible to skip data write operation on the memory cells 100[3,1] to 100[n,1].

Data that is rewritten frequently is stored in the memory cell 100 close to the wiring WBL, so that the data can be written (rewritten) in a shorter time. That is, the speed of writing (rewriting) data can be increased.

With such operation, the OS NAND memory device (including the 3D OS NAND memory device) can operate like a RAM.

<<Read Operation>>

FIG. 38B shows an example in which the data D[1] to the data D[n] are read from the respective memory cells 100[1,1] to 100[n,1]. Here, the transistors WTr need to be off to maintain the data stored in the memory cells 100. For that reason, the wirings WWL[1] to WWL[n] are set to a low-level potential during the operation of reading the data from the memory cells 100[1,1] to 100[n,1].

To read data in a specific memory cell 100 in the semiconductor device 300 having the circuit configuration illustrated in FIG. 37, the transistor RTr in the memory cell 100 subjected to reading is made to operate in the saturation region after the transistors RTr in the other memory cells 100 are sufficiently turned on. That is, a current flowing between the source and the drain of the transistor RTr in the memory cell 100 subjected to reading is determined based on the source-drain voltage and data retained in the memory cell 100 subjected to reading.

For example, the case where the data retained in the memory 100[k,1] is read out is described. In the read operation, a high-level potential is supplied to the wirings RWL[1] to RWL[n] except the wiring RWL[k] so that the transistors RTr in the memory cells 100[1,1] to 100[n,1] except the memory cell 100[k,1] are sufficiently turned on.

Meanwhile, the on/off state of the transistor RTr in the memory cell 100[k,1] is switched in accordance with the data retained in the memory cell 100[k,1]; hence, the potential of the wiring RWL[k] needs to be the same as the one at the time of writing the data to the memory cell 100[k,1]. Here, the potential of the wiring RWL[k] in the write operation and the read operation is considered as a low-level potential.

For example, a potential of +3 V is supplied to the node N1[1], and a potential of 0 V is supplied to the node N2[1]. Then, the node N2[1] is made floating, and the potential of the node N2[1] is measured subsequently. When the wirings RWL[1] to RWL[n] except the wiring RWL[k] are set to a high-level potential, the transistors RTr in the memory cells 100[1,1] to 100[n,1] except the memory cell 100[k,1] are sufficiently turned on.

Meanwhile, the voltage between the source and the drain of the transistor RTr in the memory cell 100[k,1] depends on the gate potential of the transistor RTr and the potential of the node N1[1]; hence, the potential of the node N2[1] is determined based on the data retained in the storage node of the memory cell 100[k,1].

In the above manner, the data stored in the memory cell 100[k,1] can be read out.

In view of the above, an example of the read operation is described with reference to the timing chart in FIG. 38B. In the period T20, the wirings WWL[1] to WWL[n], the wirings RWL[1] to RWL[n], the wiring WBL, the node N1[1], and the node N2[1] have a low-level potential. Specifically, the node N2[1] is floating. The data D[1] to the data D[n] are retained in the storage nodes of the respective memory cells 100[1,1] to 100[n,1].

In the period T21, a low-level potential is supplied to the wiring RWL[1], and a high-level potential is supplied to the wirings RWL[2] to RWL[n]. Thus, the transistors RTr in the memory cells 100[2,1] to 100[n,1] are sufficiently turned on. The on/off state of the transistor RTr in the memory cell 100[1,1] is determined based on the data D[1] retained in the node of the memory cell 100[1,1].

Moreover, a potential $V_R$ is supplied to the wiring RBL[1]. Thus, the potential of the node N1[1] becomes $V_R$, and the potential of the node N2[1] is determined based on the potential $V_R$ of the node N1[1] and the data retained in the storage node of the memory cell 100[1,1]. Here, the potential of the node N2[1] is denoted by $V_{D[1]}$. By measurement of the potential $V_{D[1]}$ of the node N2[1], the data D[1] retained in the storage node of the memory cell 100[1,1] can be read out.

In the period T22, a low-level potential is supplied to the wirings RWL[1] to RWL[n]. A low-level potential is supplied to the node N2[1], and then the node N2[1] becomes floating. That is, the potentials of the wirings RWL[1] to RWL[n] and the node N2[1] in the period T22 are the same as those in the period T20. Note that the wiring RBL[1] may be continuously supplied with the potential $V_R$ or may be supplied with a low-level potential. In this operation example, the wiring RBL[1] is continuously supplied with the potential $V_R$ after the period T21; thus, the potential $V_R$ is continuously supplied to the node N1[1].

In the period T23, a low-level potential is supplied to the wiring RWL[2], and a high-level potential is supplied to the wirings RWL[1] and RWL[3] to RWL[n]. Thus, the transistors RTr in the memory cells 100[1,1] and 100[3,1] to 100[n,1] are sufficiently turned on. The on/off state of the transistor RTr in the memory cell 100[2,1] is determined based on the data D[2] retained in the storage node of the memory cell 100[2,1]. The potential $V_R$ is continuously supplied to the wiring RBL[1]. Thus, the potential of the node N2[1] is determined based on the potential $V_R$ of the node N1[1] and the data retained in the storage node of the memory cell 100[2,1]. Here, the potential of the node N2[1] is denoted by $V_{D[2]}$. By measurement of the potential $V_{D[2]}$ of the node N2[1], the data D[2] retained in the storage node of the memory cell 100[2,1] can be read out.

In the period T24, the data D[3] to the data D[n−1] are sequentially read from the respective memory cells 100[3,1] to 100[n−1,1] in the same manner as the read operation in the period T22 and the period T23.

Specifically, to read the data D[k] from the memory cell 100[k,1], the node N2[1] is set to a low-level potential and is made floating, and then a high-level potential is supplied to the wirings RWL[1] to RWL[n] except the wiring RWL[k] so that the transistors RTr in the memory cells 100[1,1] to 100[n,1] except the memory cell 100[k,1] are sufficiently turned on and the transistor RTr in the memory cell 100[k,1] is set to an on state corresponding to the data D[k]. Next, the potential of the node N1[1] is set to $V_R$, whereby the potential of the node N2[1] becomes a potential corresponding to the data D[k]; by measurement of this potential, the data D[k] can be read out. After the data D[k] stored in the memory cell 100[k,1] is read out, as preparation for the next read operation, a low-level potential is supplied to the wirings RWL[1] to RWL[n] to supply a low-level potential to the node N2[1], and then the node N2[1] is made floating.

In the period T25, a low-level potential is supplied to the wirings RWL[1] to RWL[n]. A low-level potential is supplied to the node N2[1], and then the node N2[1] is made floating. That is, the potentials of the wirings RWL[1] to RWL[n] and the node N2[1] in the period T25 are the same as those in the period T20.

In the period T26, a low-level potential is supplied to the wiring RWL[n], and a high-level potential is supplied to the wirings RWL[1] to RWL[n−1]. Thus, the transistors RTr in the memory cells 100[1,1] to 100[n−1,1] are sufficiently turned on. The transistor RTr in the memory cell 100[n,1] becomes an on state corresponding to the data D[n] retained in the storage node of the memory cell 100[n,1]. The potential $V_R$ is continuously supplied to the wiring RBL[1]. Accordingly, the potential of the node N2[1] is determined based on the potential $V_R$ of the node N1[1] and the data retained in the storage node of the memory cell 100[n,1]. Here, the potential of the node N2[1] is denoted by $V_{D[n]}$. By measurement of the potential $V_{D[n]}$ of the node N2[1], the data D[n] held in the storage node of the memory cell 100[n,1] can be read out.

In this manner, the data held in the memory cells 100[1,1] to 100[n,1] can be read out.

This embodiment describes the read operation with the focus on the memory string 200[1]; in the semiconductor device 300, data reading from the memory strings 200[2] to 200[m] can be performed concurrently with data reading from the memory string 200[1]. By turning off the transistor WTr, data held in the storage node is not corrupted during the data read operation. Thus, only data included in the targeted memory string 200 can be read out.

<Structure Examples of Semiconductor Device>

Next, structure examples of the semiconductor device 300 will be described.

Figure 39A:
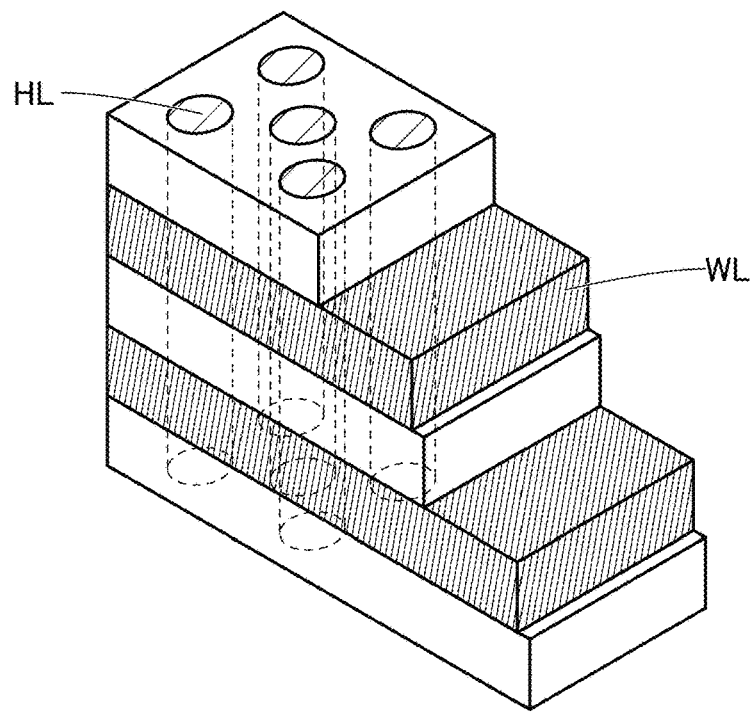
FIGS. 39A, 39B, and 39C are a perspective view, a top view, and a cross-sectional view illustrating a structure example of a semiconductor device.
Figure 39B:
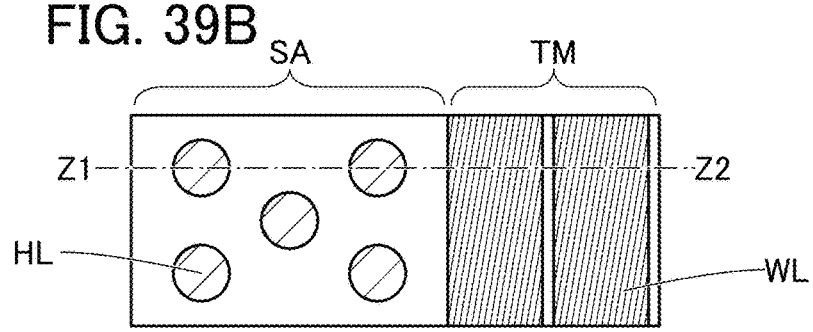
Figure 39C:
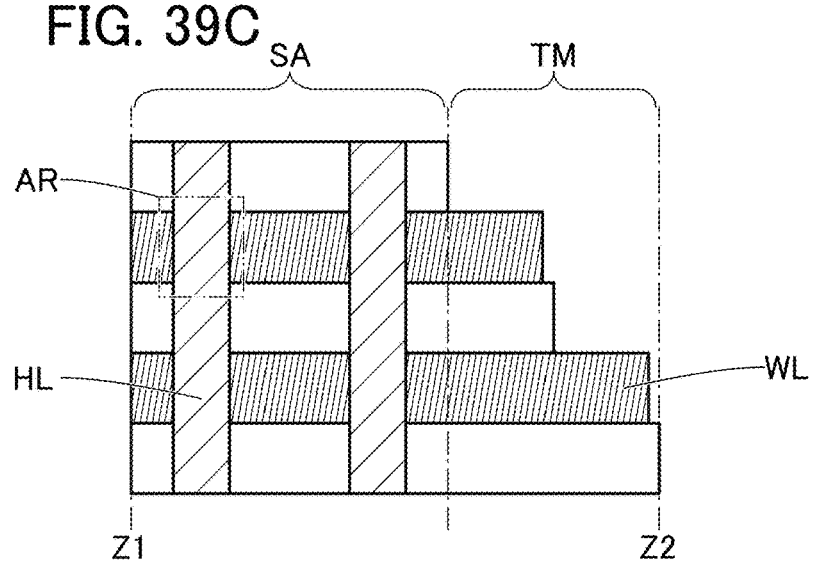

FIGS. 39A to 39C are examples of schematic views illustrating part of the semiconductor device 300. FIG. 39A is a perspective view of part of the semiconductor device, and FIG. 39B is a top view of part of the semiconductor device. FIG. 39C is a cross-sectional view along the dashed-dotted line Z1-Z2 in FIG. 39B.

The semiconductor device includes a component in which wirings WL (the wirings WWL or the wirings RWL) and insulators (regions without a hatching pattern in FIGS. 39A to 39C) are stacked.

An opening is formed in the component to penetrate the insulators and the wirings WL altogether. To provide the memory cell 100 in a region AR that penetrates the wiring WL, an insulator, a conductor, and a semiconductor are formed in the opening. The conductor functions as the source electrode or the drain electrode of the transistor in the memory cell 100. The semiconductor functions as a channel formation region of the transistor in the memory cell 100. Alternatively, without formation of the conductor, a channel formation region and low-resistance regions may be formed in the semiconductor and the low-resistance regions may be used as the source and the drain of the transistor.

The region where the insulator, the conductor, and the semiconductor are formed in the opening is shown as a region HL in FIGS. 39A to 39C. In FIG. 39A, the region HL placed inside the component is indicated by a dashed line. Note that when the transistor included in the memory cell 100 has a back gate, the conductor included in the region HL may also function as the wiring BGL electrically connected to the back gate. That is, the memory strings 200 are formed in the region HL. Moreover, the memory strings 200 are formed in a region SA.

A region TM where the wiring WL is exposed functions as a connection terminal for supplying a potential to the wiring WL. That is, by electrically connecting the wiring WL and a given wiring in the region TM, a potential can be supplied to the gate of the transistor in the memory cell 100. Note that the wiring WL corresponds to the conductor 102 or the conductor 103 in FIG. 1A.

Note that the shape of the region TM is not limited to that in the structure example shown in FIGS. 39A to 39C. The semiconductor device 300 according to one embodiment of the present invention may be configured, for example, such that an insulator is formed over the region TM, an opening is provided in the insulator, and a conductor PG is formed to fill the opening, as illustrated in FIGS. 40A to 40C.

Figure 40A:
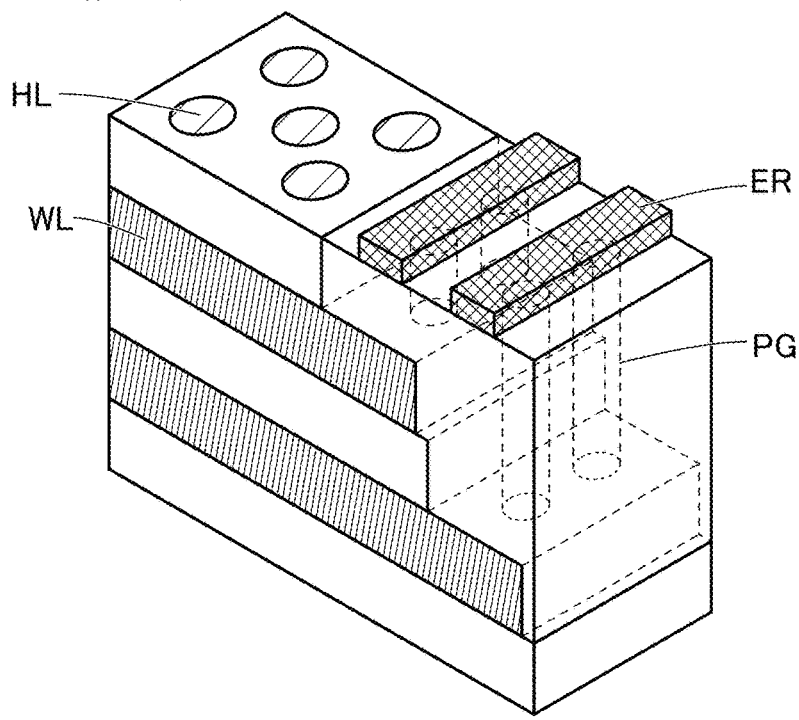
FIGS. 40A, 40B, and 40C are a perspective view, a top view, and a cross-sectional view illustrating a structure example of a semiconductor device.
Figure 40B:
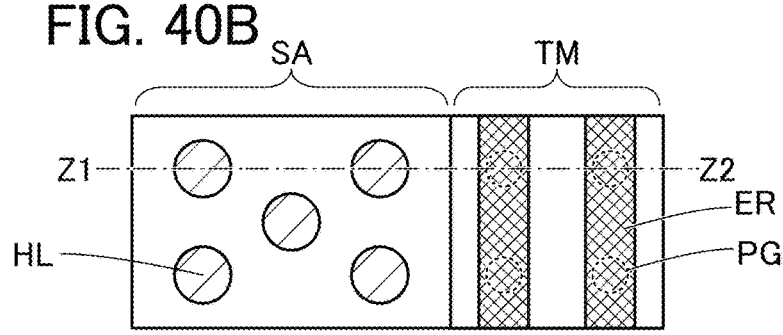
Figure 40C:
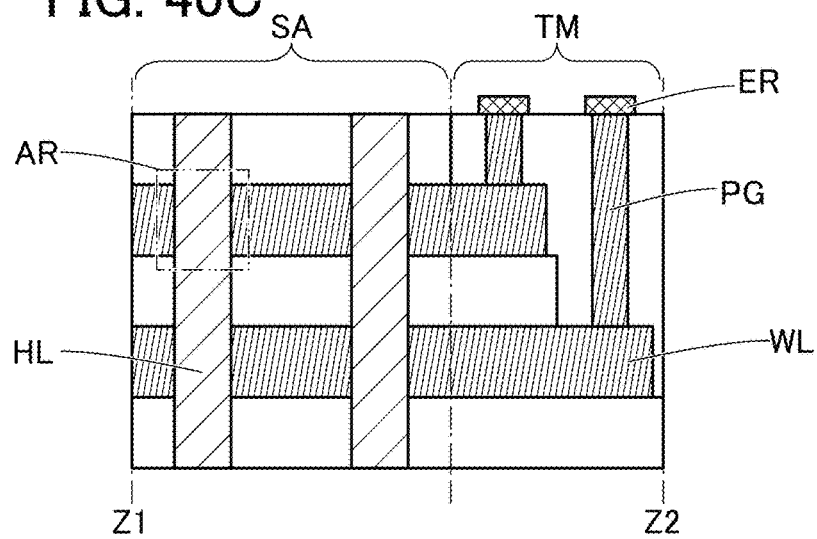

FIG. 40A is a perspective view of part of the semiconductor device, and FIG. 40B is a top view of part of the semiconductor device. FIG. 40C is a cross-sectional view along the dashed-dotted line Z1-Z2 in FIG. 40B. A wiring ER is formed over the conductor PG, whereby the wiring ER and the wiring WL are electrically connected to each other. In FIG. 40A, the conductor PG provided inside the component is indicated by a dashed line, and the dashed line representing the region HL is omitted.

<Example of Connection with Peripheral Circuit>

Figure 41A:
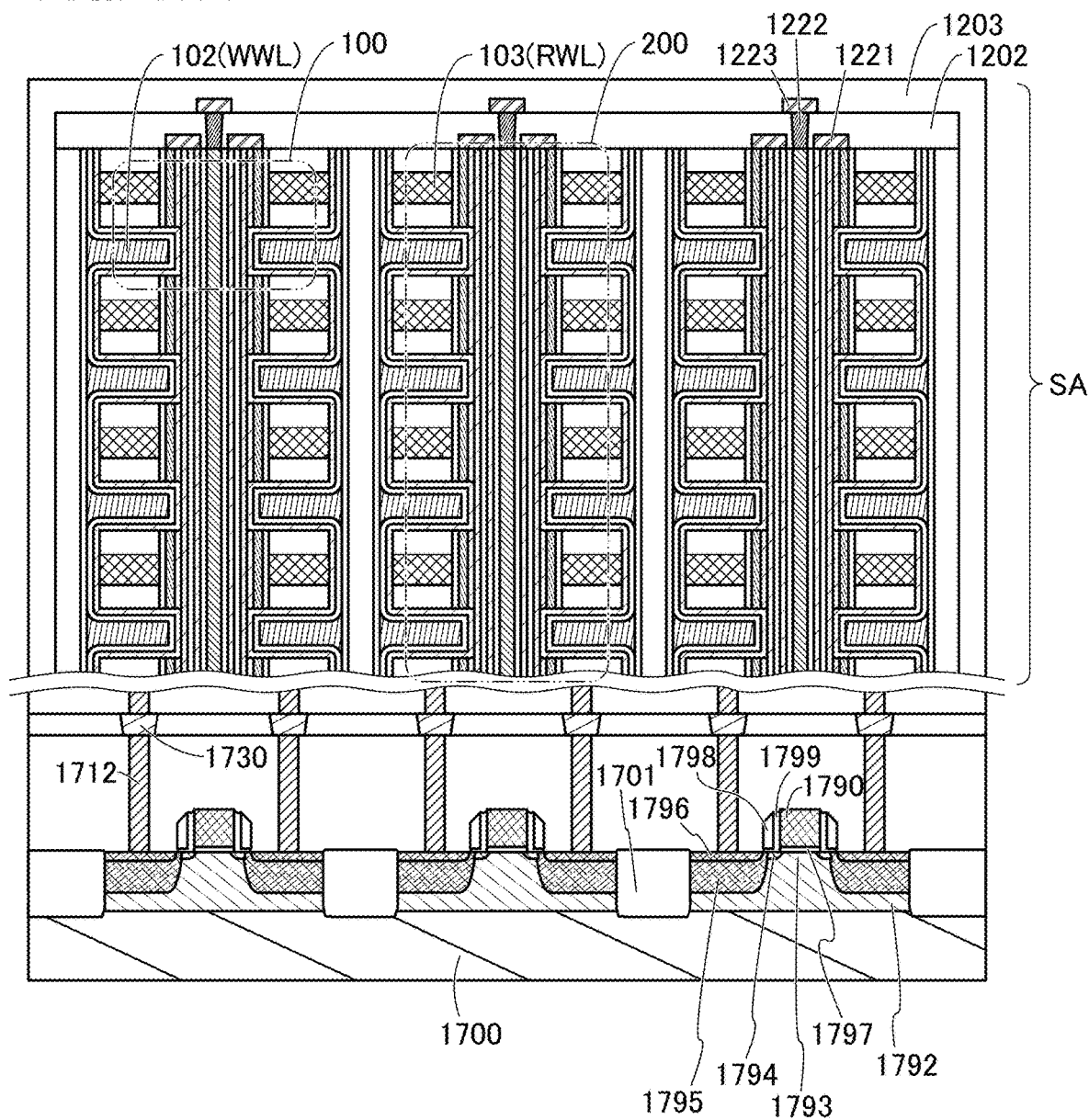
FIGS. 41A and 41B are cross-sectional views illustrating a semiconductor device.
Figure 42A:
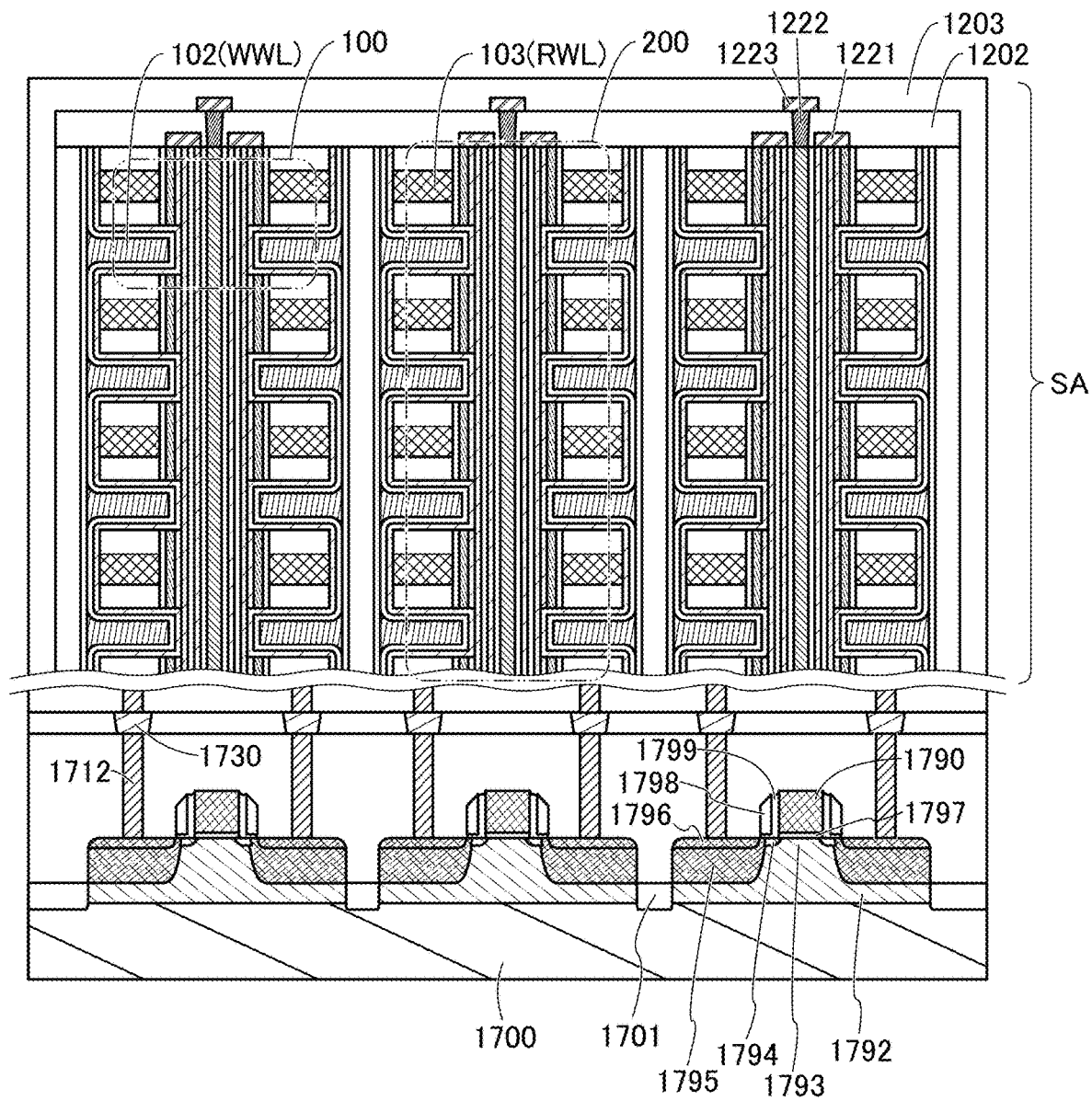
FIGS. 42A and 42B are cross-sectional views illustrating a semiconductor device.

A peripheral circuit for a memory cell array, such as a read circuit or a precharge circuit, may be provided below the semiconductor device 300 of one embodiment of the present invention. In this case, Si transistors are formed on a silicon substrate or the like to configure the peripheral circuit, and then the semiconductor device 300 of one embodiment of the present invention is formed over the peripheral circuit. FIG. 41A is a cross-sectional view in which the peripheral circuit is composed of planar Si transistors and the semiconductor device 300 of one embodiment of the present invention is formed over the peripheral circuit. FIG. 42A is a cross-sectional view in which the peripheral circuit is composed of FIN-type Si transistors and the semiconductor device 300 of one embodiment of the present invention is formed over the peripheral circuit.

In FIGS. 41A and 42A, the Si transistors configuring the peripheral circuit are formed on a substrate 1700. An element separation layer 1701 is provided between a plurality of Si transistors. Conductors 1712 are formed as a source and a drain of the Si transistor. Although not illustrated, a conductor 1730 extends in the channel width direction to be connected to another Si transistor or the conductor 1712.

As the substrate 1700, any of the substrates described in the above embodiment can be used. For example, a single crystal semiconductor substrate or a polycrystalline semiconductor substrate of silicon or silicon carbide, a compound semiconductor substrate of silicon germanium, an SOI substrate, or the like can be used.

Alternatively, a glass substrate, a quartz substrate, a plastic substrate, a metal substrate, a flexible substrate, an attachment film, paper including a fibrous material, or a base film, for example, may be used as the substrate 1700. A semiconductor element may be formed using one substrate and then transferred to another substrate. FIGS. 41A and 42A show examples where a single crystal silicon wafer is used as the substrate 1700.

In FIG. 41A and FIG. 42A, a conductor 1221, a conductor 1222, a conductor 1223, and an insulator 1202 are provided over the memory string 200 in the region SA. The conductor 1221 is electrically connected to, for example, the source or the drain of the transistor RTr that is positioned at an end portion of the memory string 200.

The insulator 1202 is provided to cover the conductor 1221. The conductor 1222 is provided to be embedded in the insulator 1202 in a region overlapping the conductor 118. The conductor 1223 is provided over the insulator 1202 and is electrically connected to the conductor 118 through the conductor 1222.

In FIG. 41A and FIG. 42A, an insulator 1203 is formed to cover the conductor 1223, the insulator 1202, the memory string 200, and the like. As the insulator 1203, an insulator having a function of inhibiting transmission of oxygen and impurities such hydrogen is preferably used. When an insulator having a function of inhibiting transmission of oxygen and impurities such as hydrogen is used as the insulator 1203, it is possible to inhibit diffusion of impurities from the outside (e.g., a water molecule, a hydrogen atom, a hydrogen molecule, an oxygen atom, an oxygen molecule, a nitrogen atom, a nitrogen molecule, and a nitrogen oxide molecule (such as $N_2O$, NO, and $NO_2$)) into the memory string 200.

Figure 41B:
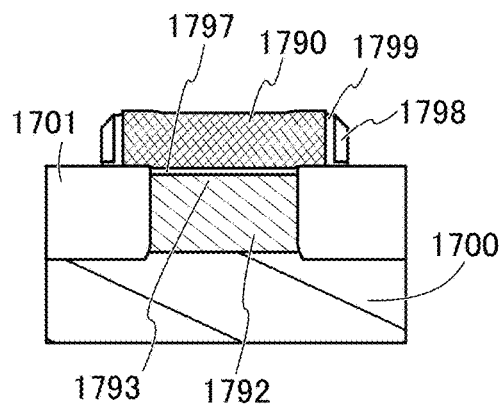

Here, the details of the Si transistor are described. FIG. 41A shows a cross section of the planar Si transistor in the channel length direction, and FIG. 41B shows its cross section in the channel width direction. The Si transistor includes a channel formation region 1793 in a well 1792, low-concentration impurity regions 1794 and high-concentration impurity regions 1795 (also collectively referred to simply as impurity regions), conductive regions 1796 in contact with the impurity regions, a gate insulating film 1797 over the channel formation region 1793, a gate electrode 1790 over the gate insulating film 1797, and sidewall insulating layers 1798 and 1799 on side surfaces of the gate electrode 1790. Note that the conductive region 1796 may be formed using metal silicide or the like.

Figure 42B:
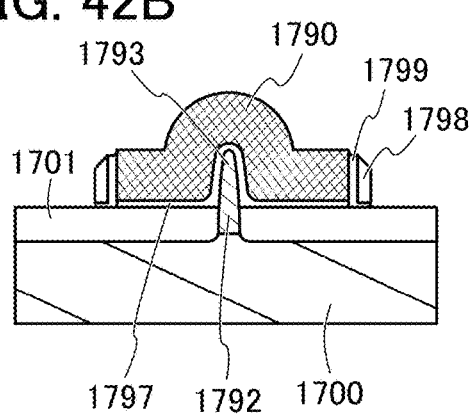

FIG. 42A shows a cross section of the FIN-type Si transistor in the channel length direction, and FIG. 42B shows its cross section in the channel width direction. In the Si transistor illustrated in FIGS. 42A and 42B, the channel formation region 1793 has a projecting portion, and the gate insulating film 1797 and the gate electrode 1790 are provided along the side and top surfaces of the channel formation region 1793. Although the projecting portion is formed by processing of part of the semiconductor substrate in this embodiment, a semiconductor layer having a projecting portion may be formed by processing of an SOI substrate. Note that the reference numerals in FIGS. 42A and 42B are the same as those in FIGS. 41A and 41B.

This embodiment can be implemented in an appropriate combination with any of the structures described in the other embodiments and the like.

Embodiment 3

In this embodiment, a semiconductor device 400 including a semiconductor device of one embodiment of the present invention will be described. The semiconductor device 400 can function as a memory device.

Figure 43:
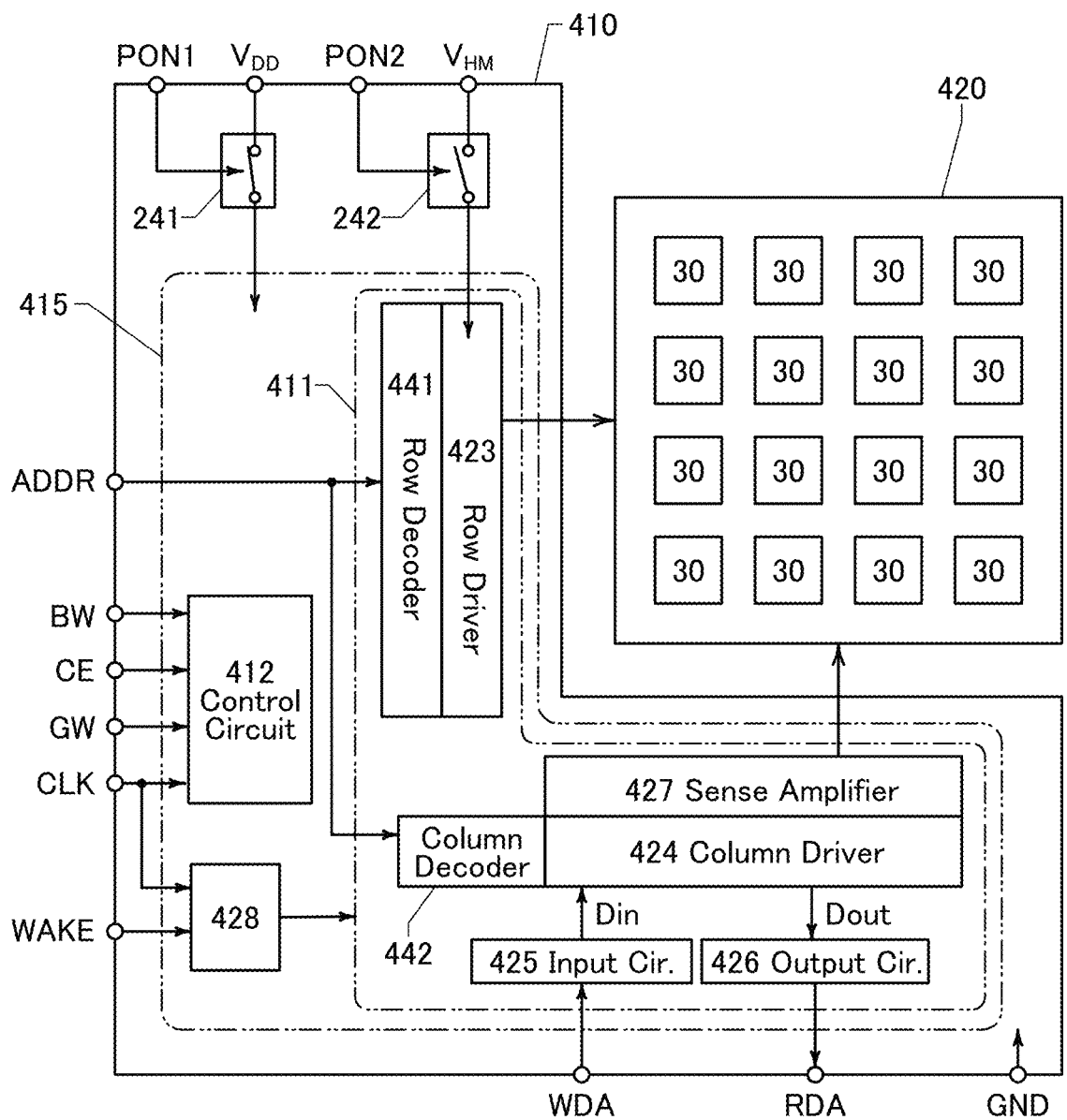
FIG. 43 is a block diagram illustrating a structure example of a semiconductor device.

FIG. 43 is a block diagram illustrating a structure example of the semiconductor device 400. The semiconductor device 400 illustrated in FIG. 43 includes a driver circuit 410 and a memory array 420. The memory array 420 includes at least one memory cell 30. FIG. 43 illustrates an example in which the memory array 420 includes a plurality of memory cells 30 arranged in a matrix.

The driver circuit 410 includes a power switch (PSW) 241, a PSW 242, and a peripheral circuit 415. The peripheral circuit 415 includes a peripheral circuit 411, a control circuit 412, and a voltage generator circuit 428.

In the semiconductor device 400, whether to provide or use each circuit, each signal, and each potential can be selected as appropriate. Another circuit or another signal may be added. Signals BW, CE, GW, CLK, WAKE, ADDR, WDA, PON1, and PON2 are signals input from the outside, and a signal RDA is a signal output to the outside. The signal CLK is a clock signal.

The signals BW, CE, and GW are control signals. The signal CE is a chip enable signal. The signal GW is a global write enable signal. The signal BW is a byte write enable signal. The signal ADDR is an address signal. The signal WDA is a write data signal, and the signal RDA is a read data signal. The signals PON1 and PON2 are power gating control signals. Note that the signals PON1 and PON2 may be generated in the control circuit 412.

The control circuit 412 is a logic circuit having a function of controlling the overall operation of the semiconductor device 400. For example, the control circuit 412 performs logical operation on the signals CE, GW, and BW to determine the operating mode (e.g., write operation or read operation) of the semiconductor device 400. The control circuit 412 generates a control signal for the peripheral circuit 411 so that the operating mode is executed.

The voltage generator circuit 428 has a function of generating a negative voltage. The signal WAKE has a function of controlling the input of the signal CLK to the voltage generator circuit 428. For example, when an H-level signal is applied as the signal WAKE, the signal CLK is input to the voltage generator circuit 428, and the voltage generator circuit 428 generates a negative voltage.

The peripheral circuit 411 is a circuit for writing and reading data to/from the memory cell 30. The peripheral circuit 411 includes a row decoder 441, a column decoder 442, a row driver 423, a column driver 424, an input circuit 425 (Input Cir.), an output circuit 426 (Output Cir.), and a sense amplifier 427.

The row decoder 441 and the column decoder 442 have a function of decoding the signal ADDR. The row decoder 441 is a circuit for specifying a row to be accessed. The column decoder 442 is a circuit for specifying a column to be accessed. The row driver 423 has a function of selecting the wiring WL specified by the row decoder 441. The column driver 424 has a function of writing data to the memory cell 30, reading data from the memory cell 30, and holding the read data, for example.

The input circuit 425 has a function of holding the signal WDA. Data retained in the input circuit 425 is output to the column driver 424. Data output from the input circuit 425 is data (Din) written to the memory cell 30. Data (Dout) read from the memory cell 30 by the column driver 424 is output to the output circuit 426. The output circuit 426 has a function of retaining Dout. Moreover, the output circuit 426 has a function of outputting Dout to the outside of the semiconductor device 400. The data output from the output circuit 426 is the signal RDA.

The PSW 241 has a function of controlling the supply of $V_{DD}$ to the peripheral circuit 415. The PSW 242 has a function of controlling the supply of $V_{HM}$ to the row driver 423. Here, in the semiconductor device 400, a high power supply voltage is $V_{DD}$ and a low power supply voltage is GND (ground potential). In addition, $V_{HM}$ is a high power supply voltage used for setting a word line to high level, and is higher than $V_{DD}$. The on/off state of the PSW 241 is controlled by the signal PON1, and the on/off state of the PSW 242 is controlled by the signal PON2. The number of power domains to which $V_{DD}$ is supplied is one in the peripheral circuit 415 in FIG. 43 but can be more than one. In that case, a power switch is provided for each power domain.

The memory string 200 can be used as the memory cells 30. Alternatively, a memory cell other than the memory string 200 may be used as the memory cell 30. FIGS. 44A to 44G and FIGS. 45A and 45B illustrate configuration examples of memory cells that can be used as the memory cell 30.

[DOSRAM]

Figure 44A:
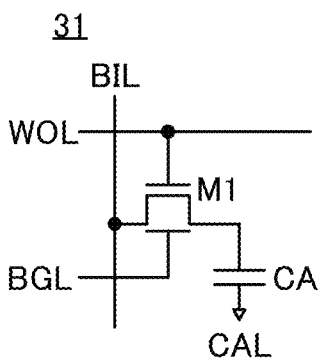
FIGS. 44A to 44G each illustrate a circuit configuration example of a memory cell.
Figure 44B:
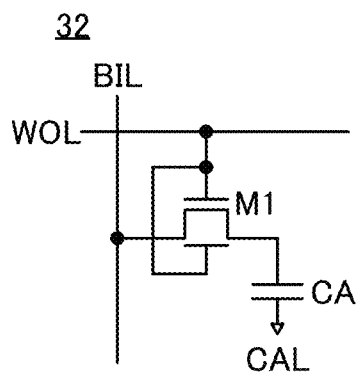

FIG. 44A illustrates a circuit configuration example of a memory cell for a DRAM. In this specification and the like, a DRAM using an OS transistor is referred to as a dynamic oxide semiconductor random access memory (DOSRAM). A memory cell 31 includes a transistor M1 and a capacitor CA. The transistor M1 includes a front gate (also simply referred to as a gate in some cases) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. At the time of data writing and reading, a low-level potential (also referred to as a reference potential in some cases) is preferably applied to the wiring CAL.

The wiring BGL functions as a wiring for applying a potential to the back gate of the transistor M1. The threshold voltage of the transistor M1 can be increased or decreased by supplying a given potential to the wiring BGL.

Data writing and data reading are performed in such a manner that a high-level potential is applied to the wiring WOL to turn on the transistor M1, and thus the wiring BIL is connected to the first terminal of the capacitor CA.

The memory cell that can be used as the memory cell 30 is not limited to the memory cell 31, and the circuit configuration can be changed. For example, the configuration of a memory cell 32 illustrated in FIG. 44B may be employed. In the memory cell 32, the back gate of the transistor M1 is connected to the wiring WOL instead of the wiring BGL. Such a configuration allows the back gate of the transistor M1 to be supplied with the same potential as the gate of the transistor M1, and thus can increase the amount of current flowing through the transistor M1 when the transistor M1 is on.

Figure 44C:
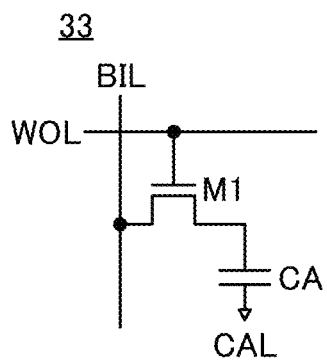

As another example of the memory cell that can be used as the memory cell 30, the transistor M1 may be a single-gate transistor, that is, a transistor without a back gate. A circuit configuration example of the memory cell is illustrated in FIG. 44C. A memory cell 33 illustrated in FIG. 44C has a configuration in which the back gate is omitted from the transistor M1 of the memory cell 31. When the memory cell 33 is used as the memory cell 30, the manufacturing process of the memory cell 30 can be shorter than those of the memory cells 31 and 32 because the transistor M1 does not have a back gate.

Note that an OS transistor is preferably used as the transistor M1. An OS transistor has a characteristic of an extremely low off-state current. The use of an OS transistor as the transistor M1 enables an extremely low leakage current of the transistor M1. That is, with the use of the transistor M1, written data can be retained for a long time, and thus the frequency of refresh operation for the memory cell can be decreased. Alternatively, refresh operation for the memory cell can be omitted. In addition, since the OS transistor has an extremely low leakage current, multilevel data or analog data can be held in the memory cells 31, 32, and 33.

[NOSRAM]

Figure 44D:
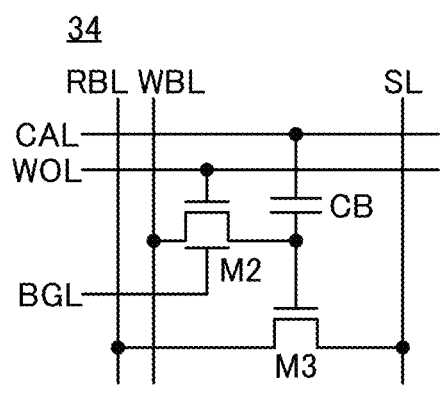

FIG. 44D illustrates a circuit configuration example of a gain-cell memory cell including two transistors and one capacitor. A memory cell 34 includes a transistor M2, a transistor M3, and a capacitor CB. The transistor M2 includes a front gate and a back gate. In this specification and the like, a memory device including a gain-cell memory cell using an OS transistor as the transistor M2 is referred to as a nonvolatile oxide semiconductor RAM (NOSRAM).

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retention, and data reading, a low-level potential (also referred to as reference potential in some cases) is preferably applied to the wiring CAL.

The wiring BGL functions as a wiring for applying a predetermined potential to the back gate of the transistor M2. The threshold voltage of the transistor M2 can be controlled by supplying a given potential to the wiring BGL.

Data writing is performed in such a manner that a high-level potential is applied to the wiring WOL to turn on the transistor M2, and thus the wiring WBL is connected to the first terminal of the capacitor CB. Specifically, when the transistor M2 is on, a potential corresponding to data to be stored is applied to the wiring WBL, and the potential is written to the first terminal of the capacitor CB and the gate of the transistor M3. Then, a low-level potential is applied to the wiring WOL to turn off the transistor M2, whereby the potential of the first terminal of the capacitor CB and the potential of the gate of the transistor M3 are retained.

Data reading is performed by applying a predetermined potential to the wiring SL. A current flowing between the source and the drain of the transistor M3 and the potential of the first terminal of the transistor M3 are determined by the potential of the gate of the transistor M3 and the potential of the second terminal of the transistor M3. Accordingly, by reading a potential of the wiring RBL connected to the first terminal of the transistor M3, a potential retained in the first terminal of the capacitor CB (or the gate of the transistor M3) can be read. That is, data written to the memory cell can be read on the basis of the potential retained in the first terminal of the capacitor CB (or the gate of the transistor M3).

The memory cell that can be used as the memory cell 30 is not limited to the memory cell 34, and the circuit configuration can be changed as appropriate.

Figure 44E:
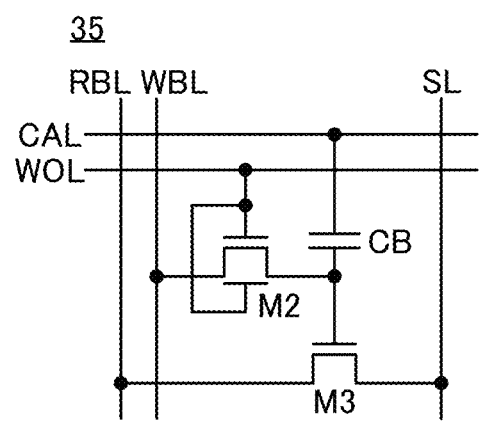

For example, the memory cell that can be used as the memory cell 30 may have a configuration of a memory cell 35 illustrated in FIG. 44E. In the memory cell 35, the back gate of the transistor M2 is connected to the wiring WOL instead of the wiring BGL in the same manner as the transistor M1 included in the memory cell 32 in FIG. 44B. Such a configuration allows the back gate of the transistor M2 to be supplied with the same potential as the gate of the transistor M2, and thus can increase the amount of current flowing through the transistor M2 when the transistor M2 is on.

Figure 44F:
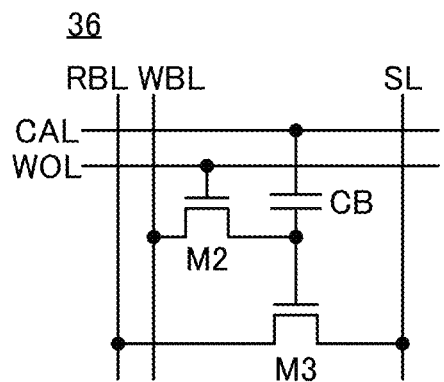

As another example, the memory cell that can be used as the memory cell 30 may include the transistor M2 without a back gate. A circuit configuration example of the memory cell is illustrated in FIG. 44F. A memory cell 36 has a configuration in which the back gate is omitted from the transistor M2 of the memory cell 34. When the memory cell 36 is used as the memory cell 30, the manufacturing process of the memory cell 30 can be shorter than those of the memory cells 34 and 35 because the transistor M2 does not have a back gate.

Figure 44G:
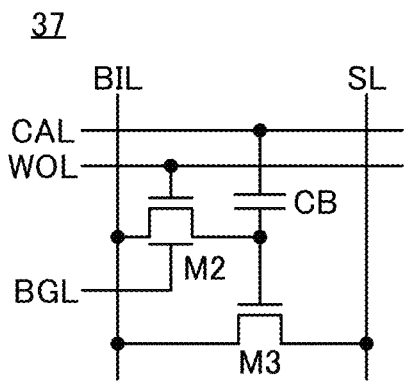

As another example, one wiring BIL may be provided instead of the wiring WBL and the wiring RBL. A circuit configuration example of the memory cell is illustrated in FIG. 44G. In a memory cell 37, one wiring BIL is provided instead of the wiring WBL and the wiring RBL in the memory cell 34, and the second terminal of the transistor M2 and the first terminal of the transistor M3 are electrically connected to the wiring BIL. In other words, one wiring BIL operates as the write bit line and the read bit line in the memory cell 37.

For a channel formation region of the transistor M2 and/or the transistor M3, an oxide semiconductor containing at least one of indium, an element M, and zinc can be used. That is, an OS transistor is preferably used as the transistor M2 and/or the transistor M3. In particular, the channel formation region of the transistor M2 and/or the transistor M3 preferably includes an oxide semiconductor containing indium, gallium, and zinc.

Since the OS transistor has a feature of extremely low off-state current, the use of the OS transistor as the transistor M2 and/or the transistor M3 can make the leakage current thereof extremely low. In particular, with the use of the transistor M2, written data can be retained for a long time, and thus the frequency of refresh operation for the memory cell can be decreased. Alternatively, refresh operation for the memory cell can be omitted. In addition, owing to extremely low leakage current, multilevel data or analog data can be held in the memory cells 34, 35, 36, and 37.

The memory cells 34, 35, 36, and 37 using the OS transistor as the transistor M2 are embodiments of a NOSRAM.

Note that a Si transistor may be used as the transistor M3. A Si transistor may have higher field-effect mobility than the OS transistor depending on the crystal state of silicon used in a semiconductor layer, for example.

When the OS transistor is used as the transistor M3, the memory cell can be configured with the transistors having the same conductivity type.

Figure 45A:
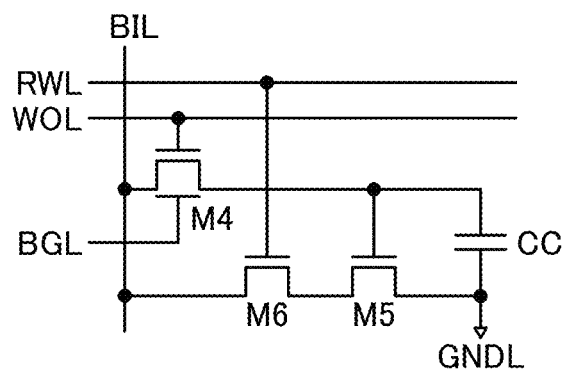
FIGS. 45A and 45B each illustrate a circuit configuration example of a memory cell.

FIG. 45A illustrates an example of a gain memory cell including three transistors and one capacitor. A memory cell 38 includes transistors M4 to M6 and a capacitor CC. The transistor M4 includes a front gate and a back gate.

A first terminal of the transistor M4 is connected to a first terminal of the capacitor CC. A second terminal of the transistor M4 is connected to the wiring BIL. The gate of the transistor M4 is connected to the wiring WWL. The back gate of the transistor M4 is electrically connected to the wiring BGL. A second terminal of the capacitor CC is electrically connected to a first terminal of the transistor M5 and a wiring GNDL. A second terminal of the transistor M5 is connected to a first terminal of the transistor M6. A gate of the transistor M5 is connected to the first terminal of the capacitor CC. A second terminal of the transistor M6 is electrically connected to the wiring BIL. A gate of the transistor M6 is connected to the wiring RWL.

The wiring BIL functions as a bit line. The wiring WWL functions as a write word line. The wiring RWL functions as a read word line.

The wiring BGL functions as a wiring for applying a potential to the back gate of the transistor M4. The threshold voltage of the transistor M4 can be increased or decreased by supplying a given potential to the wiring BGL.

The wiring GNDL is a wiring for supplying a low-level potential.

Data is written by applying a high-level potential to the wiring WWL to turn on the transistor M4 so that the wiring BIL is connected to the first terminal of the capacitor CC. Specifically, when the transistor M4 is on, a potential corresponding to data to be stored is applied to the wiring BIL, and the potential is written to the first terminal of the capacitor CC and the gate of the transistor M5. Then, a low-level potential is applied to the wiring WWL so that the transistor M4 is turned off. Accordingly, the potentials of the first terminal of the capacitor CC and the gate of the transistor M5 are held.

Data is read by precharging the wiring BIL to a predetermined potential, and then making the wiring BIL in an electrically floating state and applying a high-level potential to the wiring RWL. Since the wiring RWL has the high-level potential, the transistor M6 is turned on, so that the wiring BIL is electrically connected to the second terminal of the transistor M5. At this time, the potential of the wiring BIL is applied to the second terminal of the transistor M5; the potential of the second terminal of the transistor M5 and the potential of the wiring BIL change depending on the potential held in the first terminal of the capacitor CC (or the gate of the transistor M5). Here, the potential held in the first terminal of the capacitor CC (or the gate of the transistor M5) can be read by reading the potential of the wiring BIL. That is, data written to the memory cell can be read on the basis of the potential retained in the first terminal of the capacitor CC (or the gate of the transistor M5).

The circuit configuration of the memory cell that can be used as the memory cell 30 can be changed as appropriate. For example, in the memory cell 38, the back gate of the transistor M4 may be connected to the wiring WOL instead of wiring BGL (not illustrated) in the same manner as the transistor M1 of the memory cell 32 in FIG. 44B and the transistor M2 of the memory cell 35 in FIG. 44E. Such a configuration enables the same voltage to be applied to the gate and the back gate of the transistor M4, and thus can increase the amount of current flowing through the transistor M4 in the on state. As another example, like the transistor M1 of the memory cell 33 in FIG. 44C and the transistor M2 of the memory cell 36 in FIG. 44F, the transistor M4 of the memory cell 38 does not necessarily have a back gate. Such a configuration can shorten the manufacturing process of the memory cell because of the absence of the back gate of the transistor M4.

The transistors M4 to M6 are preferably OS transistors. Since the OS transistor has a feature of extremely low off-state current, the use of the OS transistors as the transistors M4 to M6 can make their leakage current extremely low. In particular, with the use of the transistor M4, written data can be retained for a long time, and thus the frequency of refresh operation for the memory cell can be decreased. Alternatively, refresh operation for the memory cell can be omitted.

Note that Si transistors may be used as the transistors M5 and M6 described in this embodiment. As described above, a Si transistor may have higher field-effect mobility than the OS transistor depending on the crystal state of silicon used in a semiconductor layer, for example.

When OS transistors are used as the transistors M5 and M6, the memory cell can be configured with the transistors having the same conductivity type.

[OS-SRAM]

Figure 45B:
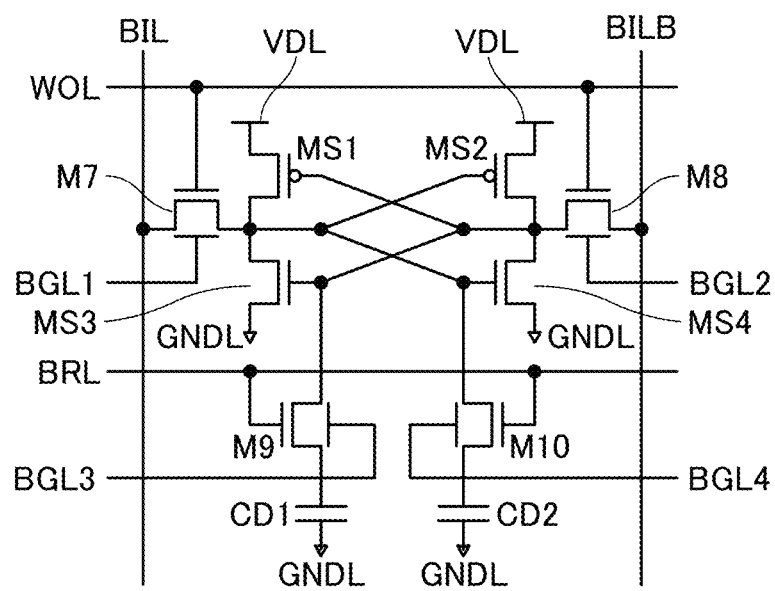

FIG. 45B illustrates an example of a static random access memory (SRAM) using an OS transistor. In this specification and the like, an SRAM using an OS transistor is referred to as an oxide semiconductor SRAM (OS-SRAM). A memory cell 39 illustrated in FIG. 45B is a memory cell of an SRAM capable of backup operation.

The memory cell 39 includes transistors M7 to M10, transistors MS1 to MS4, a capacitor CD1, and a capacitor CD2. The transistors M7 to M10 each include a front gate and a back gate. The transistors MS1 and MS2 are p-channel transistors, and the transistors MS3 and MS4 are n-channel transistors.

A first terminal of the transistor M7 is connected to the wiring BIL. A second terminal of the transistor M7 is connected to a first terminal of the transistor MS1, a first terminal of the transistor MS3, a gate of the transistor MS2, a gate of the transistor MS4, and a first terminal of the transistor M10. The gate of the transistor M7 is connected to the wiring WOL. The back gate of the transistor M7 is connected to a wiring BGL1. A first terminal of the transistor M8 is connected to a wiring BILB. A second terminal of the transistor M8 is connected to a first terminal of the transistor MS2, a first terminal of the transistor MS4, a gate of the transistor MS1, a gate of the transistor MS3, and a first terminal of the transistor M9. The gate of the transistor M8 is connected to the wiring WOL. The back gate of the transistor M8 is connected to a wiring BGL2.

A second terminal of the transistor MS1 is electrically connected to a wiring VDL. A second terminal of the transistor MS2 is electrically connected to the wiring VDL. A second terminal of the transistor MS3 is electrically connected to the wiring GNDL. A second terminal of the transistor MS4 is electrically connected to the wiring GNDL.

A second terminal of the transistor M9 is connected to a first terminal of the capacitor CD1. The gate of the transistor M9 is connected to a wiring BRL. The back gate of the transistor M9 is connected to a wiring BGL3. A second terminal of the transistor M10 is connected to a first terminal of the capacitor CD2. The gate of the transistor M10 is connected to the wiring BRL. The back gate of the transistor M10 is connected to a wiring BGL4.

A second terminal of the capacitor CD1 is connected to the wiring GNDL. A second terminal of the capacitor CD2 is connected to the wiring GNDL.

The wiring BIL and the wiring BILB function as bit lines. The wiring WOL functions as a word line. The wiring BRL controls the on/off states of the transistors M9 and M10.

The wirings BGL1 to BGL4 function as wirings for applying a predetermined potential to the back gates of the respective transistors M7 to M10. By applying a predetermined potential to the wirings BGL1 to BGL4, the threshold voltages of the transistors M7 to M10 can be increased or decreased.

The wiring VDL supplies a high-level potential. The wiring GNDL supplies a low-level potential.

Data writing is performed by applying a high-level potential to the wiring WOL and the wiring BRL. Specifically, when the transistor M10 is on, a potential corresponding to data to be stored is applied to the wiring BIL, and the potential is written to the second terminal side of the transistor M10.

In the memory cell 39, the transistors MS1 and MS2 form an inverter loop; hence, an inversion signal of a data signal corresponding to the potential is input to the second terminal side of the transistor M8. Since the transistor M8 is on, an inversion signal of the potential that has been applied to the wiring BIL (i.e., the signal that has been input to the wiring BIL) is output to the wiring BILB. Since the transistor M9 and the transistor M10 are on, the potential of the second terminal of the transistor M7 is held in the first terminal of the capacitor CD2, and the potential of the second terminal of the transistor M8 is held in the first terminal of the capacitor CD1. After that, a low-level potential is applied to the wiring WOL and the wiring BRL to turn off the transistors M7 to M10, whereby the potential of the first terminal of the capacitor CD1 and the potential of the first terminal of the capacitor CD2 are held.

Data reading is performed in such a manner that the wiring BIL and the wiring BILB are precharged to a predetermined potential, and then a high-level potential is applied to the wiring WOL and the wiring BRL, whereby the potential of the first terminal of the capacitor CD1 is refreshed by the inverter loop in the memory cell 39 and output to the wiring BILB. Furthermore, the potential of the first terminal of the capacitor CD2 is refreshed by the inverter loop in the memory cell 39 and output to the wiring BIL. Since the potentials of the wiring BIL and the wiring BILB are changed from the precharged potentials to the potentials of the first terminal of the capacitor CD2 and the first terminal of the capacitor CD1, the potential retained in the memory cell can be read on the basis of the potentials of the wiring BIL and the wiring BILB.

Note that the transistors M7 to M10 are preferably OS transistors. In particular, the channel formation regions of the transistors M7 to M10 preferably include an oxide semiconductor containing indium, gallium, and zinc. Since OS transistors using an oxide semiconductor containing indium, gallium, and zinc have a feature of extremely low off-state current, the use of the OS transistors as the e transistors M7 to M10 can make their leakage current extremely low. In particular, with the use of the transistors M7 to M10, written data can be retained for a long time, and thus the frequency of refresh operation for the memory cell can be decreased. Alternatively, refresh operation for the memory cell can be omitted.

Note that the transistors MS1 to MS4 may be Si transistors.

When the memory string 200 is used as the memory cells 30, the semiconductor device 400 can be used as a NAND memory device. When any of the memory cells 31 to 39 is used as the memory cell 30, the semiconductor device 400 can be used as a NOR memory device.

Figure 46A:
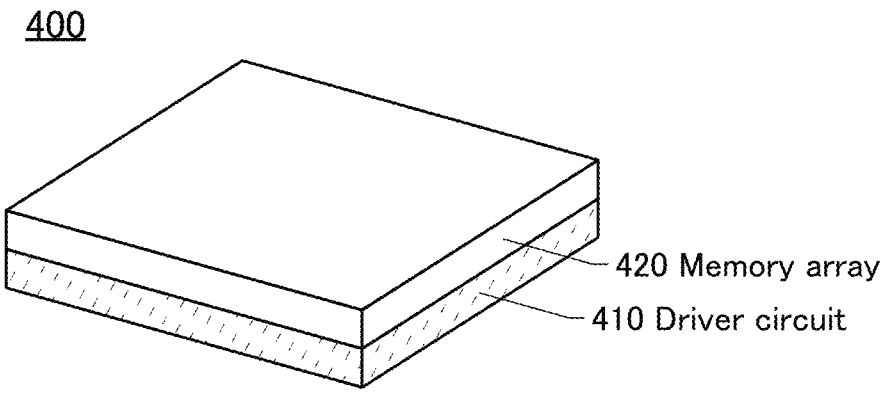
FIGS. 46A to 46C are perspective views each illustrating a structure example of a semiconductor device.
Figure 46B:
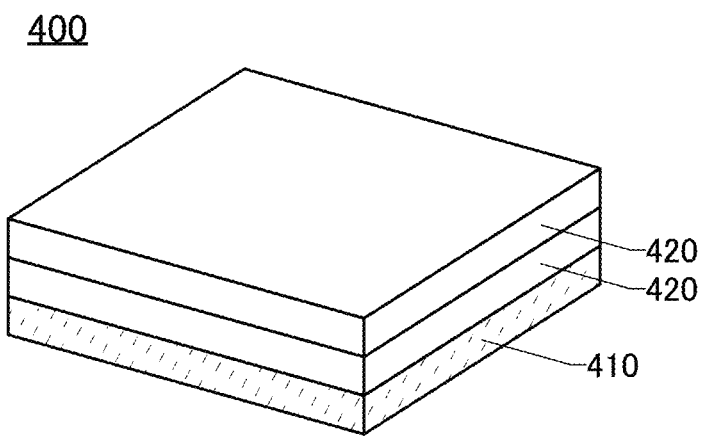

The driver circuit 410 and the memory array 420 included in the semiconductor device 400 may be provided on the same plane. Alternatively, as illustrated in FIG. 46A, the driver circuit 410 and the memory array 420 may be provided to overlap each other. Overlapping the driver circuit 410 and the memory array 420 can shorten a signal propagation distance. As illustrated in FIG. 46B, a plurality of memory arrays 420 may be stacked over the driver circuit 410.

Figure 46C:
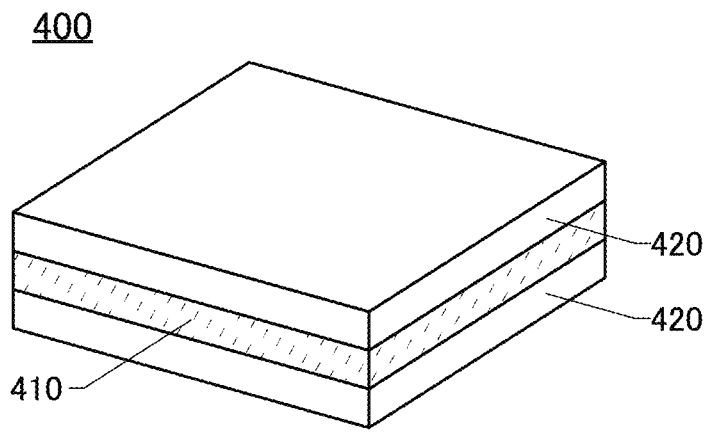

As illustrated in FIG. 46C, the memory array 420 may be provided over and under the driver circuit 410. FIG. 46C illustrates an example in which one memory array 420 is provided over and under the driver circuit 410. Providing a plurality of memory arrays 420 so that the driver circuit 410 is sandwiched therebetween can further shorten a signal propagation distance. Note that the number of memory arrays 420 stacked over the driver circuit 410 and the number of memory arrays 420 provided under the driver circuit 410 are each at least one. The number of memory arrays 420 stacked over the driver circuit 410 is preferably equal to the number of memory arrays 420 provided under the driver circuit 410.

This embodiment can be implemented in an appropriate combination with any of the structures described in the other embodiments and the like.

Embodiment 4

This embodiment will show examples of a semiconductor wafer provided with the semiconductor device or the like described in the foregoing embodiment and an electronic component including the semiconductor device.

<Semiconductor Wafer>

First, an example of a semiconductor wafer provided with a semiconductor device or the like is described with reference to FIG. 47A.

Figure 47A:
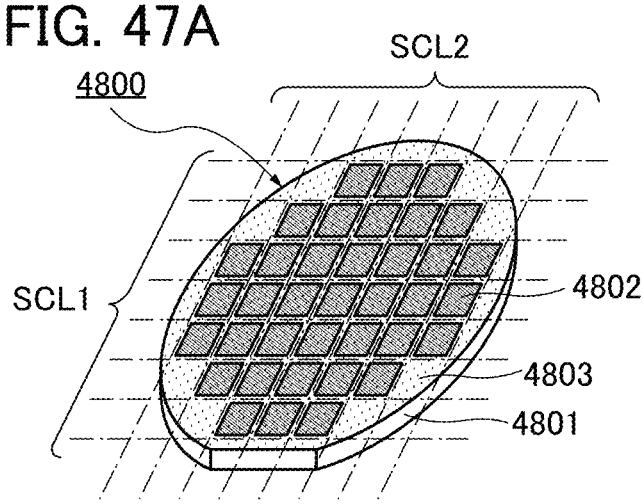
FIG. 47A is a perspective view illustrating an example of a semiconductor wafer.

A semiconductor wafer 4800 illustrated in FIG. 47A includes a wafer 4801 and a plurality of circuit portions 4802 provided on the top surface of the wafer 4801. A portion without the circuit portions 4802 on the top surface of the wafer 4801 is a spacing 4803 that is a region for dicing.

The semiconductor wafer 4800 can be formed by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

Next, a dicing step is performed. The dicing is carried out along scribe lines SCL1 and scribe lines SCL2 (sometimes referred to as dicing lines or cutting lines) indicated by dashed-dotted lines. To perform the dicing step easily, the spacing 4803 is preferably arranged such that a plurality of scribe lines SCL1 are parallel to each other, a plurality of scribe lines SCL2 are parallel to each other, and the scribe lines SCL1 and the scribe lines SCL2 intersect each other perpendicularly.

Figure 47B:
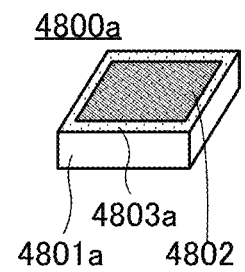
FIG. 47B is a perspective view illustrating an example of a chip.

With the dicing step, a chip 4800a illustrated in FIG. 47B can be cut out from the semiconductor wafer 4800. The chip 4800a includes a wafer 4801a, the circuit portion 4802, and a spacing 4803a. Note that it is preferable to make the spacing 4803a as small as possible. Here, it is preferred that the width of the spacing 4803 between adjacent circuit portions 4802 be substantially the same as the width of the scribe line SCL1 or the scribe line SCL2.

The shape of the element substrate of one embodiment of the present invention is not limited to the shape of the semiconductor wafer 4800 illustrated in FIG. 47A. The element substrate may be a rectangular semiconductor wafer, for example. The shape of the element substrate can be changed as appropriate, depending on a process for fabricating an element and an apparatus for fabricating the element.

<Electronic Component>

Figure 47C:
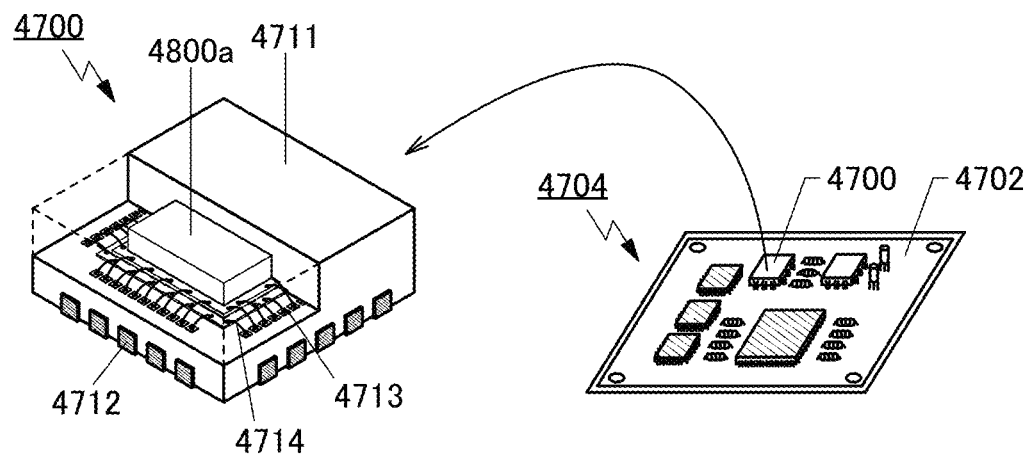
FIGS. 47C and 47D are perspective views illustrating examples of electronic components.

FIG. 47C is a perspective view of an electronic component 4700 and a substrate (a circuit board 4704) on which the electronic component 4700 is mounted. The electronic component 4700 in FIG. 47C includes the chip 4800a in a mold 4711. As the chip 4800a, the memory device of one embodiment of the present invention can be used, for example.

To illustrate the inside of the electronic component 4700, some portions are omitted in FIG. 47C. The electronic component 4700 includes a land 4712 outside the mold 4711. The land 4712 is electrically connected to an electrode pad 4713, and the electrode pad 4713 is electrically connected to the chip 4800a via a wire 4714. The electronic component 4700 is mounted on a printed circuit board 4702, for example. A plurality of such electronic components are combined and electrically connected to each other on the printed circuit board 4702; thus, the circuit substrate 4704 is completed.

Figure 47D:
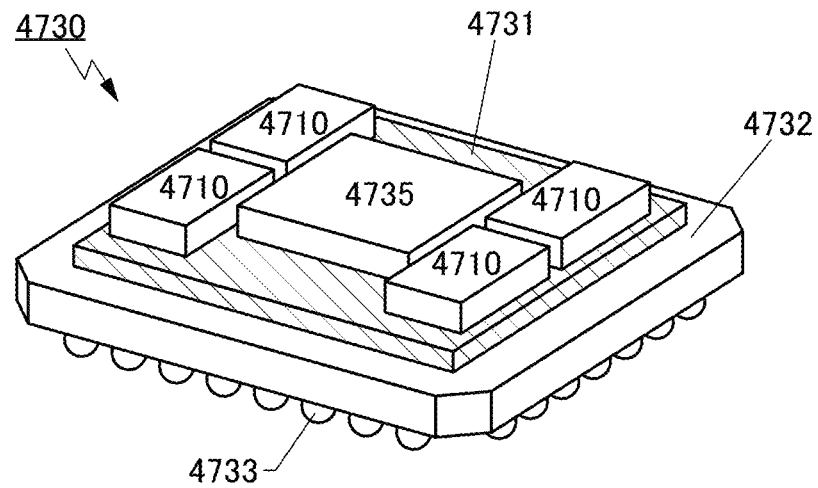

FIG. 47D is a perspective view of an electronic component 4730. The electronic component 4730 is an example of a system in package (SiP) or a multi-chip module (MCM). In the electronic component 4730, an interposer 4731 is provided over a package substrate 4732 (a printed circuit board), and a semiconductor device 4735 and a plurality of semiconductor devices 4710 are provided over the interposer 4731.

Examples of the semiconductor devices 4710 include the chip 4800a, the semiconductor device described in the foregoing embodiment, and a high bandwidth memory (HBM). Moreover, an integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings have a single-layer structure or a multi-layer structure. The interposer 4731 has a function of electrically connecting an integrated circuit provided on the interposer 4731 to an electrode provided on the package substrate 4732. Accordingly, the interposer is sometimes referred to as a redistribution substrate or an intermediate substrate. A through electrode may be provided in the interposer 4731 and used to electrically connect the integrated circuit and the package substrate 4732. In the case of using a silicon interposer, a through-silicon via (TSV) can also be used as the through electrode.

A silicon interposer is preferably used as the interposer 4731. The silicon interposer can be manufactured at lower cost than an integrated circuit because the silicon interposer is not necessarily provided with an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, minute wirings are required to be formed densely on an interposer on which an HBM is mounted. For this reason, a silicon interposer is preferably used as the interposer on which an HBM is mounted.

In an SiP, an MCM, and the like using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided thereon is less likely to occur. It is particularly preferable to use a silicon interposer for a 2.5D package (2.5D mounting) in which a plurality of integrated circuits are arranged side by side on an interposer.

A heat sink (radiator plate) may be provided to overlap with the electronic component 4730. When a heat sink is provided, the heights of integrated circuits provided on the interposer 4731 are preferably the same. For example, in the electronic component 4730 described in this embodiment, the heights of the semiconductor devices 4710 and the semiconductor device 4735 are preferably the same.

An electrode 4733 may be provided on the bottom of the package substrate 4732 to mount the electronic component 4730 on another substrate. FIG. 47D illustrates an example in which the electrode 4733 is formed of a solder ball. Solder balls are provided in a matrix on the bottom of the package substrate 4732, whereby a ball grid array (BGA) can be achieved. Alternatively, the electrode 4733 may be formed of a conductive pin. When conductive pins are provided in a matrix on the bottom of the package substrate 4732, a pin grid array (PGA) can be achieved.

The electronic component 4730 can be mounted on another substrate in a variety of manners other than a BGA and a PGA. For example, a staggered pin grid array (SPGA), a land grid array (LGA), a quad flat package (QFP), a quad flat J-leaded package (QFJ), or a quad flat non-leaded package (QFN) can be employed.

Note that this embodiment can be combined with any of the other embodiments in this specification as appropriate.

Embodiment 5

This embodiment will describe an example of an arithmetic processing device that can include the semiconductor device, such as the memory device described in any of the above embodiments.

Figure 48:
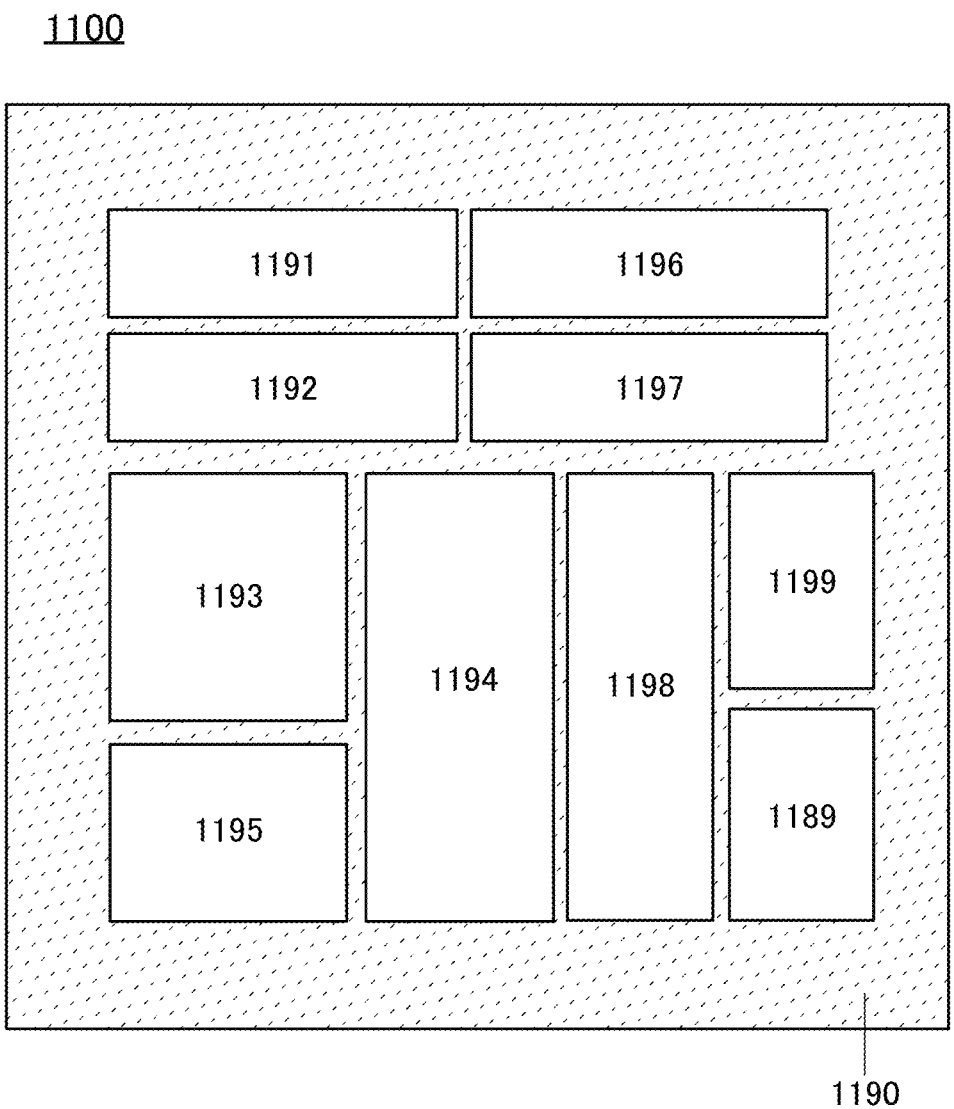
FIG. 48 is a block diagram illustrating a CPU.

FIG. 48 is a block diagram of a central processing unit 1100. FIG. 48 illustrates a configuration example of a CPU applicable to the central processing unit 1100.

The central processing unit 1100 illustrated in FIG. 48 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a cache 1199, and a cache interface 1189. A semiconductor substrate, an SOI substrate, a glass substrate, or the like is used as the substrate 1190. The central processing unit 1100 may also include a rewritable ROM and a ROM interface. The cache 1199 and the cache interface 1189 may be provided in a separate chip.

The cache 1199 is connected via the cache interface 1189 to a main memory provided in another chip. The cache interface 1189 has a function of supplying part of data held in the main memory to the cache 1199. The cache 1199 has a function of retaining the data.

The central processing unit 1100 illustrated in FIG. 48 is only an example with a simplified configuration, and the actual central processing unit 1100 has a variety of configurations depending on the application. For example, the central processing unit may have a GPU-like configuration in which a plurality of cores each including the central processing unit 1100 in FIG. 48 or an arithmetic circuit operate in parallel. The number of bits that the central processing unit 1100 can handle with an internal arithmetic circuit or a data bus can be 8, 16, 32, or 64, for example.

An instruction input to the central processing unit 1100 through the bus interface 1198 is input to the instruction decoder 1193 and decoded, and then input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. The interrupt controller 1194 judges and processes an interrupt request from an external input/output device or a peripheral circuit on the basis of its priority or a mask state while the central processing unit 1100 is executing a program. The register controller 1197 generates the address of the register 1196, and reads/writes data from/to the register 1196 in accordance with the state of the central processing unit 1100.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the central processing unit 1100 in FIG. 48, a memory device is provided in the register 1196 and the cache 1199. As the memory device, the memory device described in any of the above embodiments can be used, for example.

In the central processing unit 1100 in FIG. 48, the register controller 1197 selects operation of retaining data in the register 1196 in accordance with an instruction from the ALU 1191. That is, the register controller 1197 selects whether data is held by a flip-flop or by a capacitor in a memory cell included in the register 1196. When data retention by the flip-flop is selected, power supply voltage is supplied to the memory cell in the register 1196. When data retention by the capacitor is selected, the data is rewritten into the capacitor, and supply of power supply voltage to the memory cell in the register 1196 can be stopped.

Figure 49A:
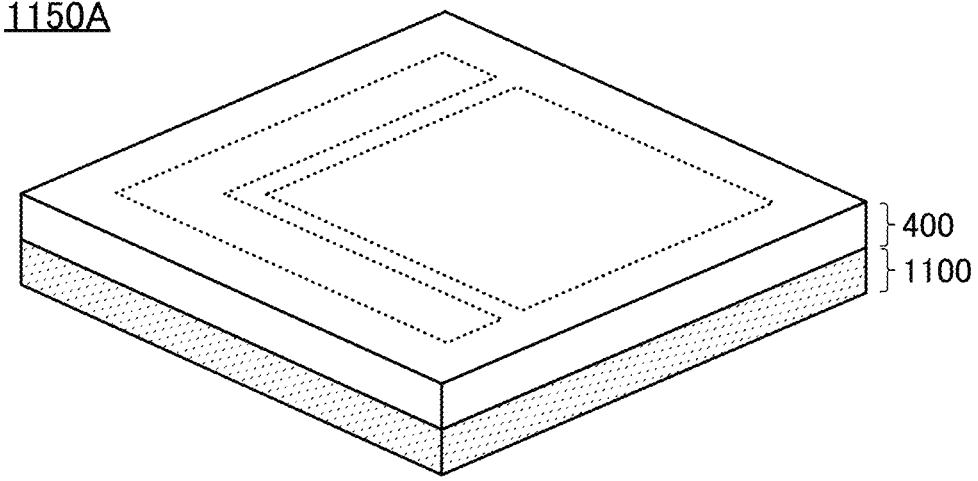
FIGS. 49A and 49B are perspective views of a semiconductor device.
Figure 49B:
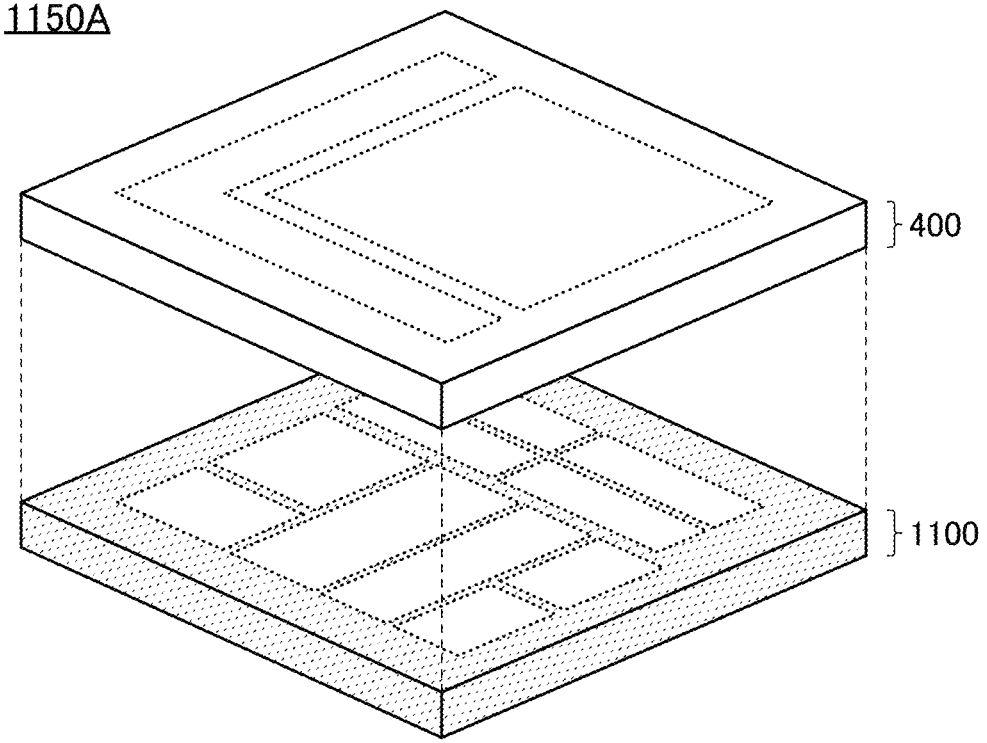

The semiconductor device 400 described in the above embodiment and the central processing unit 1100 can be provided to overlap each other. FIGS. 49A and 49B are perspective views of a semiconductor device 1150A. The semiconductor device 1150A includes the semiconductor device 400 functioning as a memory device over the central processing unit 1100. The central processing unit 1100 and the semiconductor device 400 have an overlap region. For easy understanding of the structure of the semiconductor device 1150A, the central processing unit 1100 and the semiconductor device 400 are separated from each other in FIG. 49B.

Overlapping the semiconductor device 400 and the central processing unit 1100 can shorten the physical distance therebetween. Accordingly, the communication speed therebetween can be increased. Moreover, a short physical distance leads to lower power consumption.

As described in the above embodiment, when an OS NAND memory device is used as the semiconductor device 400, some or all of the memory cells 30 included in the semiconductor device 400 can function as RAM. Thus, the semiconductor device 400 can function as a main memory. The semiconductor device 400 functioning as the main memory is connected to the cache 1199 through the cache interface 1189.

Whether the semiconductor device 400 functions as the main memory (RAM) or storage is determined by the control circuit 412 illustrated in FIG. 43. The control circuit 412 can make some of the memory cells 30 in the semiconductor device 400 function as RAM in accordance with a signal supplied from the central processing unit 1100.

In the semiconductor device 400, some of the memory cells 30 can function as the RAM and the other memory cells 30 as the storage. When an OS NAND memory device is used as the semiconductor device 400, the semiconductor device 400 has both the function of the main memory and the function of the storage. The semiconductor device 400 of one embodiment of the present invention can function as a universal memory, for example.

In the case where the semiconductor device 400 is used as the main memory, the memory capacity can be increased or decreased as needed. In the case where the semiconductor device 400 is used as a cache, the memory capacity can be increased or decreased as needed.

The control circuit 412 illustrated in FIG. 43 may have a function of performing error checking and correction (ECC) when data is transferred or duplicated between the region functioning as the storage and the region functioning as the main memory in the semiconductor device 400. The control circuit 412 may have a function of performing ECC when data is transferred or duplicated between the cache 1199 and the region of the semiconductor device 400 functioning as the main memory.

Figure 50A:
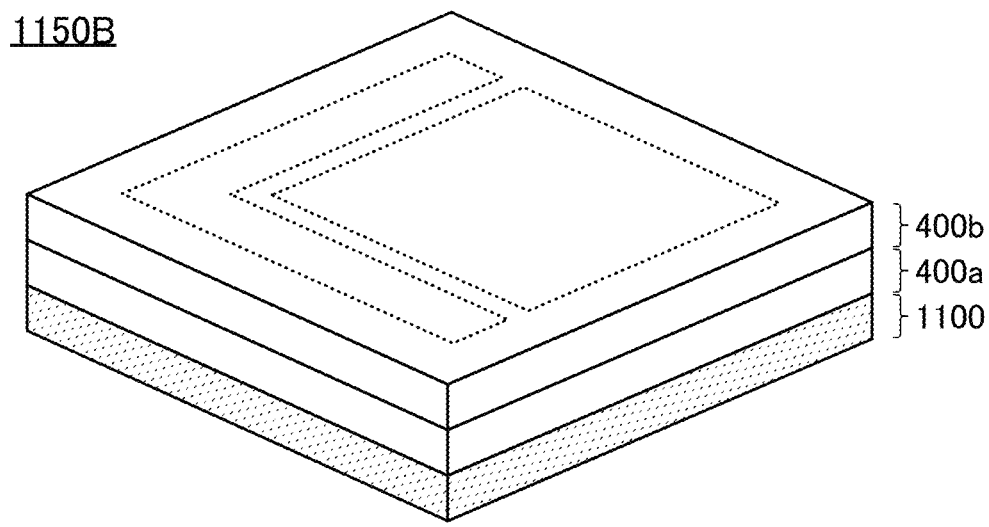
FIGS. 50A and 50B are perspective views of a semiconductor device.
Figure 50B:
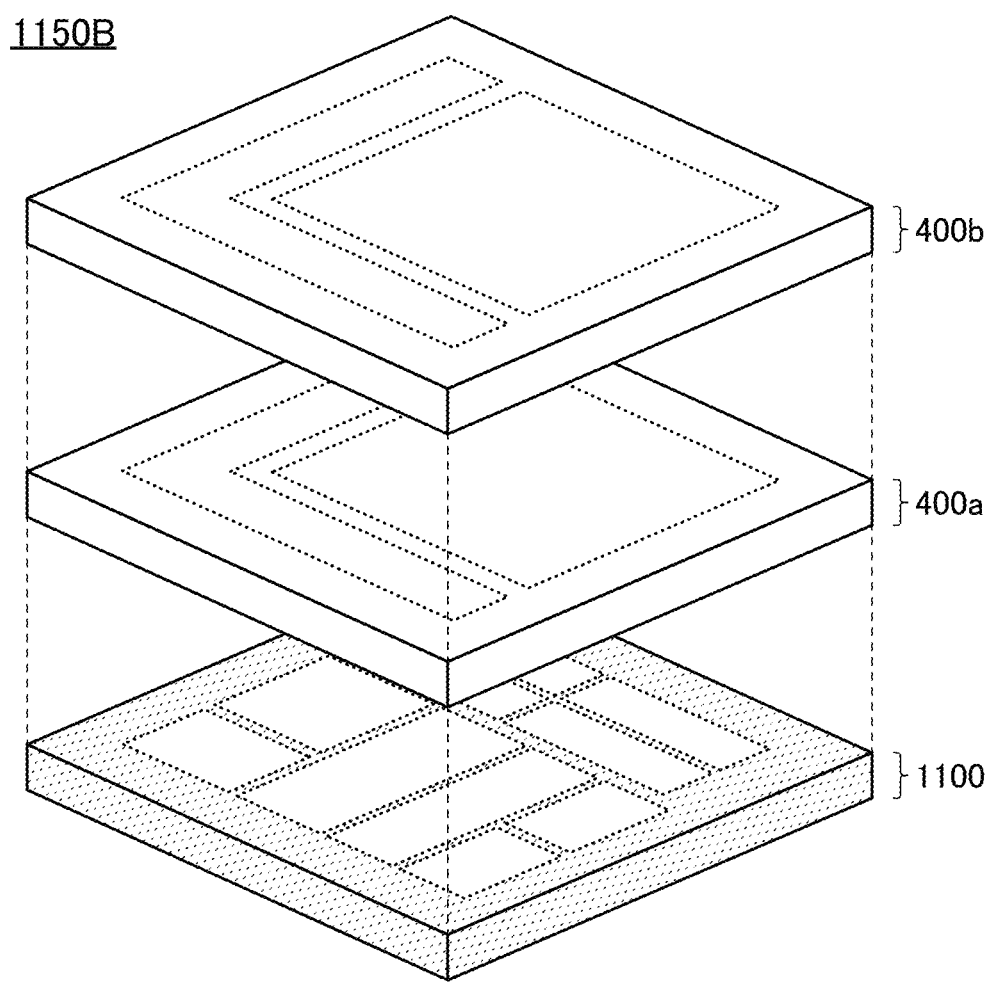

A plurality of semiconductor devices 400 may be provided to overlap the central processing unit 1100. FIGS. 50A and 50B are perspective views of a semiconductor device 1150B. The semiconductor device 1150B includes a semiconductor device 400*a* and a semiconductor device 400*b* over the central processing unit 1100. The central processing unit 1100, the semiconductor device 400*a*, and the semiconductor device 400*b* have an overlap region. For easy understanding of the structure of the semiconductor device 1150B, the central processing unit 1100, the semiconductor device 400*a*, and the semiconductor device 400*b* are separated from each other in FIG. 50B.

The semiconductor devices 400*a* and 400*b* function as memory devices. For example, a NOR memory device may be used as the semiconductor device 400*a*. A NAND memory device may be used as the semiconductor device 400*b*. A NOR memory device can operate at higher speed than a NAND memory device; hence, for example, part of the semiconductor device 400*a* can be used as the main memory and/or the cache 1199. Note that the stacking order of the semiconductor device 400*a* and the semiconductor device 400*b* may be reverse.

Figure 51A:
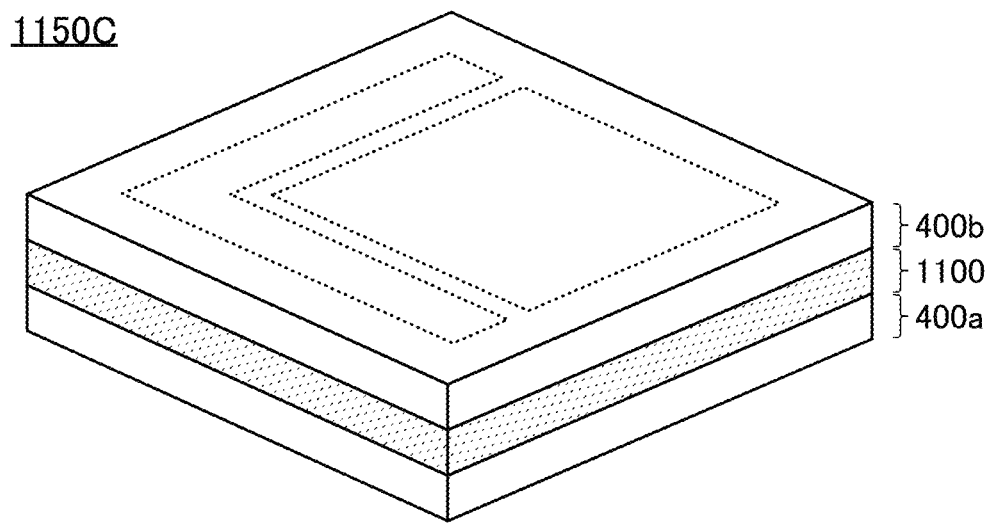
FIGS. 51A and 51B are perspective views of a semiconductor device.
Figure 51B:
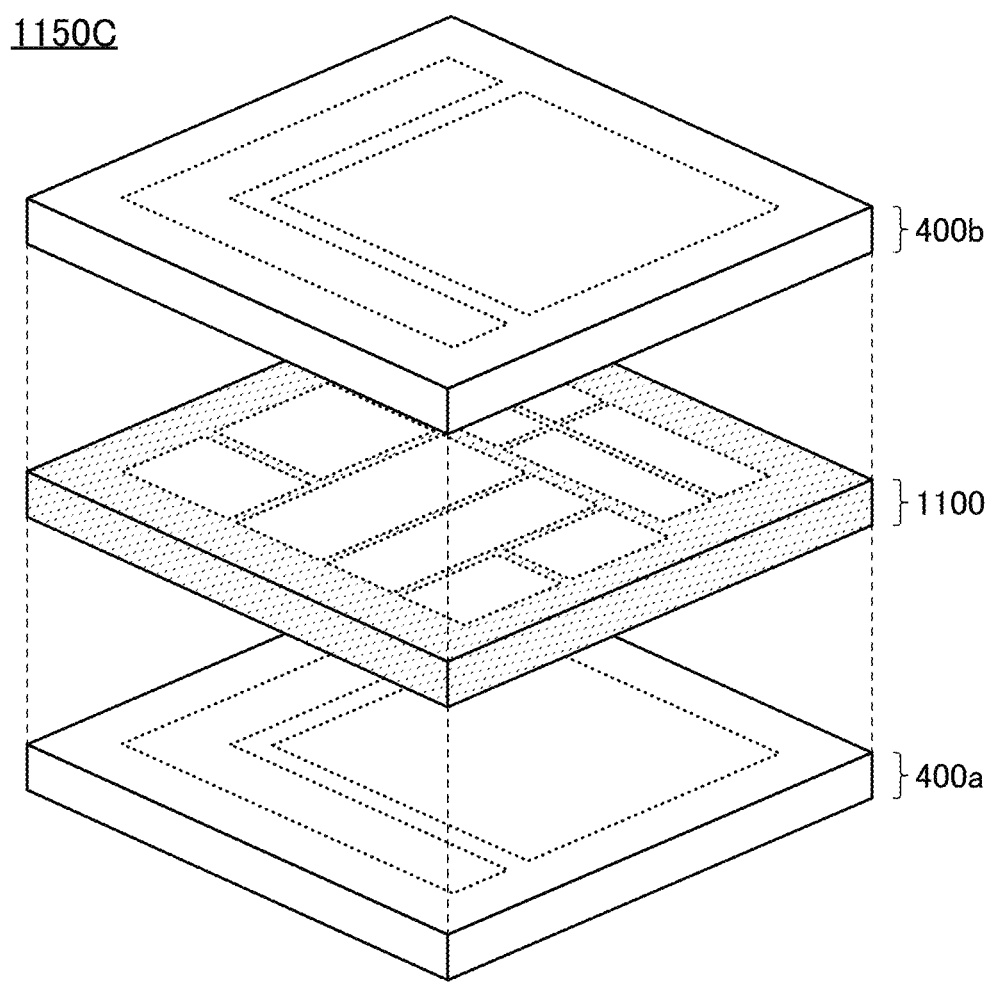

FIGS. 51A and 51B are perspective views of a semiconductor device 1150C. In the semiconductor device 1150C, the central processing unit 1100 is provided between the semiconductor device 400*a* and the semiconductor device 400*b*. Thus, the central processing unit 1100, the semiconductor device 400*a*, and the semiconductor device 400*b* have an overlap region. For easy understanding of the structure of the semiconductor device 1150C, the central processing unit 1100, the semiconductor device 400*a*, and the semiconductor device 400*b* are separated from each other in FIG. 51B.

With the structure of the semiconductor device 1150C, the communication speed between the semiconductor device 400*a* and the central processing unit 1100 and the communication speed between the semiconductor device 400*b* and the central processing unit 1100 can be both increased. Moreover, power consumption can be reduced, compared to the semiconductor device 1150B.

Note that this embodiment can be combined with any of the other embodiments in this specification as appropriate.

Embodiment 6

In this embodiment, application examples of the memory device of one embodiment of the present invention will be described.

Figure 52A:
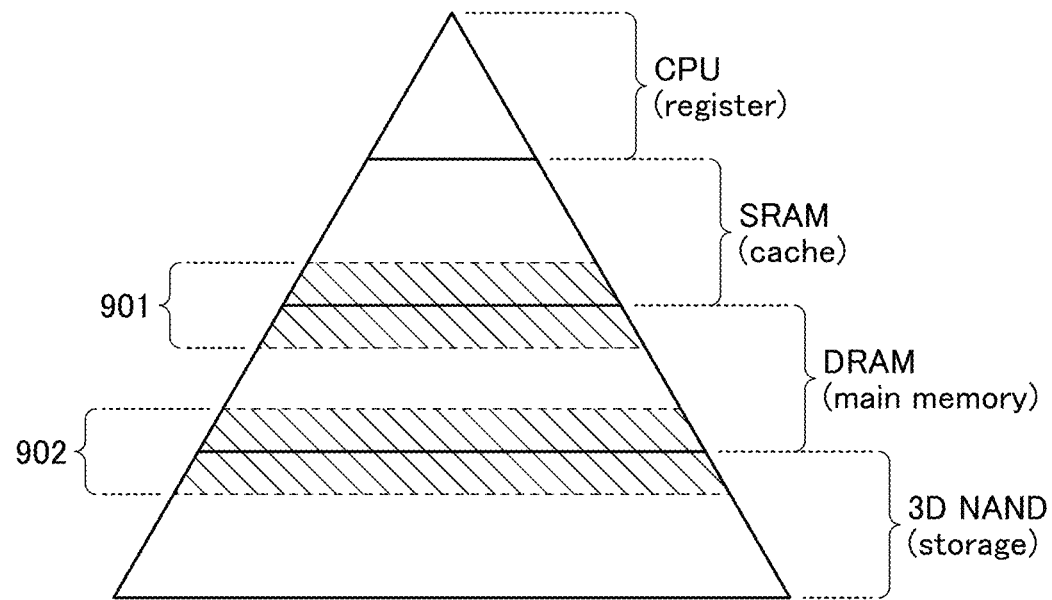
FIGS. 52A and 52B each illustrate a hierarchy of various kinds of memory devices.

In general, a variety of memory devices are used in semiconductor devices such as computers in accordance with the intended use. FIG. 52A illustrates the hierarchy of various memory devices used in a semiconductor device. The memory devices at the upper levels require a higher operating speed, whereas the memory devices at the lower levels require a larger memory capacity and a higher memory density. FIG. 52A shows, sequentially from the top level, a memory included as a register in an arithmetic processing device such as a CPU, a static random access memory (SRAM), a dynamic random access memory (DRAM), and a 3D NAND memory.

A memory included as a register in an arithmetic processing device such as a CPU is used for temporary storage of arithmetic operation results, for example, and thus is very frequently accessed by the arithmetic processing device. Accordingly, rapid operation is more important than the memory capacity of the memory. The register also has a function of retaining settings of the arithmetic processing device, for example.

An SRAM is used for a cache, for example. The cache has a function of duplicating and retaining part of data held in a main memory. Duplicating frequently used data and holding the duplicated data in the cache facilitates rapid data access. The cache requires a smaller memory capacity than the main memory but a higher operating speed than the main memory. Data that is rewritten in the cache is duplicated, and the duplicated data is supplied to the main memory.

A DRAM is used for the main memory, for example. The main memory has a function of holding a program and data that are read from the storage. The memory density of a DRAM is approximately greater than or equal to 0.1 Gbit/$mm^2$ and less than or equal to 0.3 Gbit/$mm^2$.

A 3D NAND memory is used for the storage, for example. The storage has a function of holding data that needs to be stored for a long time and programs used in an arithmetic processing device, for example. Therefore, the storage needs to have a high memory capacity and a high memory density rather than operating speed. The memory density of the memory device used as the storage is approximately greater than or equal to 0.6 Gbit/$mm^2$ and less than or equal to 6.0 Gbit/$mm^2$.

The memory device of one embodiment of the present invention operates fast and can hold data for a long time. The memory device of one embodiment of the present invention can be favorably used as a memory device in a boundary region 901 that includes both the level including the cache and the level including the main memory. The memory device of one embodiment of the present invention can be favorably used as a memory device in a boundary region 902 that includes both the level including the main memory and the level including the storage.

Figure 52B:
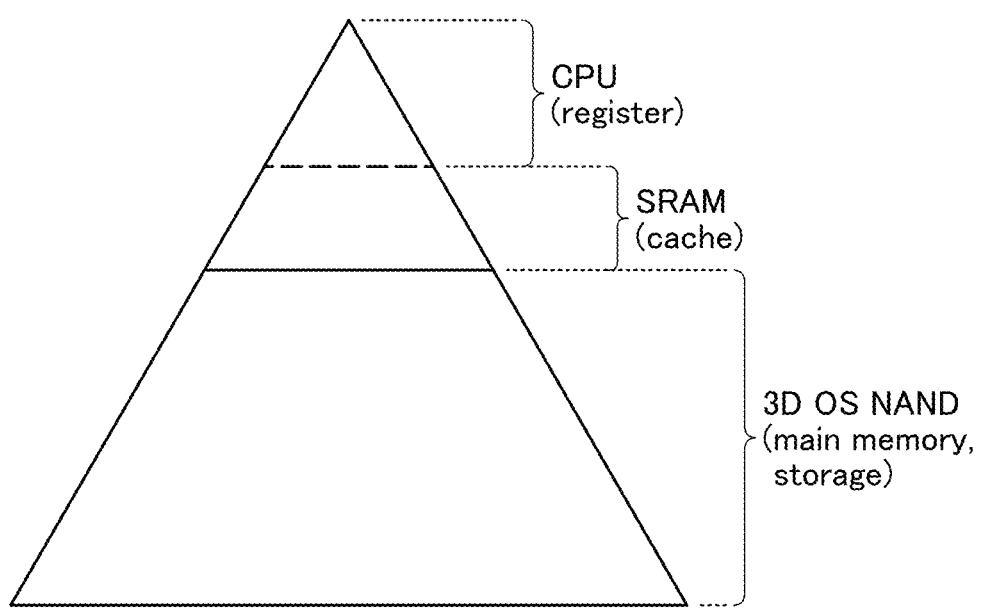

The memory device of one embodiment of the present invention can be favorably used at both the level including the main memory and the level including the storage. The memory device of one embodiment of the present invention can be favorably used at the level including the cache. FIG. 52B illustrates the hierarchy of various memory devices different from that in FIG. 52A.

FIG. 52B shows, sequentially from the top level, a memory included as a register in an arithmetic processing device such as a CPU, an SRAM used as a cache, and a 3D OS NAND memory. The memory device of one embodiment of the present invention can be used for the cache, main memory, and storage. When a high-speed memory of 1 GHz or higher is required as the cache, the cache is included in an arithmetic processing device such as a CPU.

The memory device of one embodiment of the present invention is not limited to a NAND type, and may alternatively be a NOR type or a combination of a NAND type and a NOR type.

The memory device of one embodiment of the present invention can be used, for example, as memory devices of a variety of electronic devices (e.g., information terminals, computers, smartphones, e-book readers, digital still cameras, video cameras, video recording/reproducing devices, navigation systems, and game machines). The memory device of one embodiment of the present invention can also be used for image sensors, Internet of Things (IoT) devices, healthcare devices, and the like. Here, the computers refer not only to tablet computers, notebook computers, and desktop computers, but also to large computers such as server systems.

Examples of electronic device including the memory device of one embodiment of the present invention will be described. FIGS. 53A to 53J and FIGS. 54A to 54E each show that the electronic component 4700 or the electronic component 4730, each of which includes the memory device, is included in an electronic device.

[Mobile Phone]

Figure 53A:
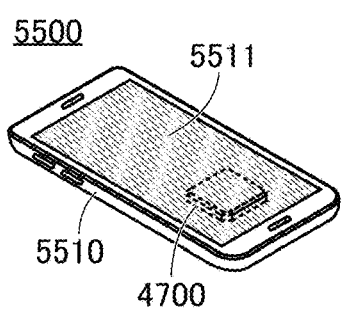
FIGS. 53A to 53J are perspective views and schematic views illustrating examples of electronic devices.

An information terminal 5500 illustrated in FIG. 53A is a mobile phone (a smartphone), which is a type of information terminal. The information terminal 5500 includes a housing 5510 and a display portion 5511. As input interfaces, a touch panel and a button are provided in the display portion 5511 and the housing 5510, respectively.

By using the memory device of one embodiment of the present invention, the information terminal 5500 can hold a temporary file generated at the time of executing an application (e.g., a web browser's cache).

[Wearable Terminal]

Figure 53B:
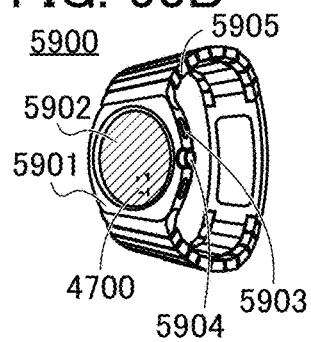

FIG. 53B illustrates an information terminal 5900 as an example of a wearable terminal. The information terminal 5900 includes a housing 5901, a display portion 5902, an operation switch 5903, an operation switch 5904, a band 5905, and the like.

Like the information terminal 5500, the wearable terminal can hold a temporary file generated at the time of executing an application, by using the memory device of one embodiment of the present invention.

[Information Terminal]

Figure 53C:
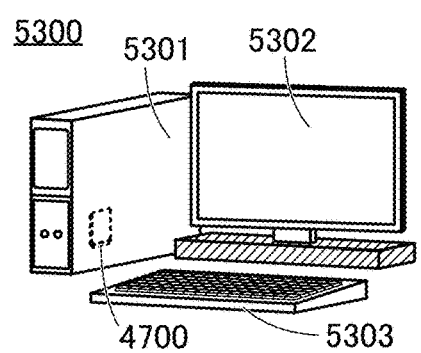

FIG. 53C illustrates a desktop information terminal 5300. The desktop information terminal 5300 includes a main body 5301 of the information terminal, a display portion 5302, and a keyboard 5303.

Like the information terminal 5500, the desktop information terminal 5300 can hold a temporary file generated at the time of executing an application, by using the memory device of one embodiment of the present invention.

Note that although FIGS. 53A to 53C illustrate a smartphone, a wearable terminal, and a desktop information terminal as examples of electronic device, one embodiment of the present invention can also be applied to an information terminal other than a smartphone, a wearable terminal, and a desktop information terminal. Examples of information terminals other than a smartphone, a wearable terminal, and a desktop information terminal include a personal digital assistant (PDA), a laptop information terminal, and a workstation.

[Household Appliance]

Figure 53D:
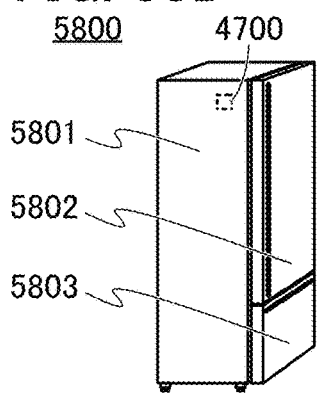

FIG. 53D illustrates an electric refrigerator-freezer 5800 as an example of a household appliance. The electric refrigerator-freezer 5800 includes a housing 5801, a refrigerator door 5802, a freezer door 5803, and the like. For example, the electric refrigerator-freezer 5800 is compatible with the Internet of Things (IoT).

The memory device of one embodiment of the present invention can be used in the electric refrigerator-freezer 5800. The electric refrigerator-freezer 5800 can transmit and receive data on food stored in the electric refrigerator-freezer 5800 and food expiration dates, for example, to/from an information terminal and the like via the Internet. In the electric refrigerator-freezer 5800, the memory device can hold a temporary file generated at the time of transmitting the data.

Here, an electric refrigerator-freezer is described as an example of a household appliance; other examples of household appliances include a vacuum, a microwave oven, an electric oven, a rice cooker, a water heater, an IH cooker, a water server, a heating-cooling combination appliance such as an air conditioner, a washing machine, a drying machine, and an audio visual appliance.

[Game Machines]

Figure 53E:
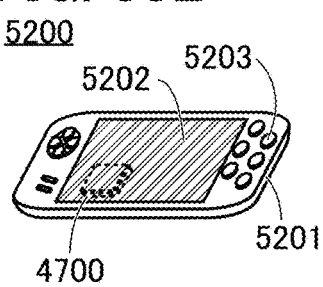

FIG. 53E illustrates a portable game machine 5200 as an example of a game machine. The portable game machine 5200 includes a housing 5201, a display portion 5202, a button 5203, and the like.

Figure 53F:
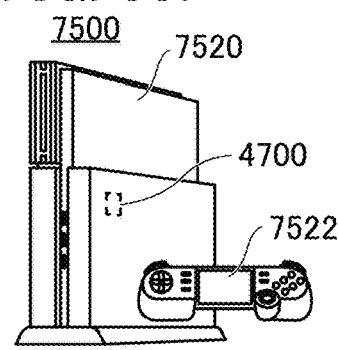

FIG. 53F illustrates a stationary game machine 7500 as another example of a game machine. The stationary game machine 7500 includes a main body 7520 and a controller 7522. The controller 7522 can be connected to the main body 7520 with or without a wire. Although not illustrated in FIG. 53F, the controller 7522 can include a display portion that displays a game image, and an input interface besides a button, such as a touch panel, a stick, a rotating knob, and a sliding knob, for example. The shape of the controller 7522 is not limited to that in FIG. 53F and may be changed variously in accordance with the genres of games. For example, in a shooting game such as a first person shooter (FPS) game, a gun-shaped controller having a trigger button can be used. As another example, in a music game or the like, a controller having a shape of a music instrument, audio equipment, or the like can be used. Furthermore, the stationary game machine may include a camera, a depth sensor, a microphone, and the like so that the game player can play a game using a gesture and/or a voice instead of a controller.

Videos displayed on the game machine can be output with a display device such as a television device, a personal computer display, a game display, and a head-mounted display.

By using the memory device described in the above embodiment in the portable game machine 5200 and the stationary game machine 7500, low power consumption can be achieved in the portable game machine 5200 and the stationary game machine 7500. Moreover, heat generation from a circuit can be reduced owing to low power consumption; thus, the influence of heat generation on the circuit, the peripheral circuit, and the module can be reduced.

Moreover, with the use of the memory device described in the above embodiment, the portable game machine 5200 and the stationary game machine 7500 can hold a temporary file necessary for arithmetic operation that occurs during game play.

As examples of game machines, FIG. 53E illustrates a portable game machine and FIG. 53F illustrates a home-use stationary game machine; however, the electronic device of one embodiment of the present invention is not limited thereto. Other examples of the electronic device of one embodiment of the present invention include an arcade game machine installed in an entertainment facility (e.g., a game center and an amusement park) and a throwing machine for batting practice, installed in sports facilities.

[Moving Vehicle]

The memory device described in the foregoing embodiment can be used in an automobile, which is a moving vehicle, and around the driver's seat in an automobile.

Figure 53G:
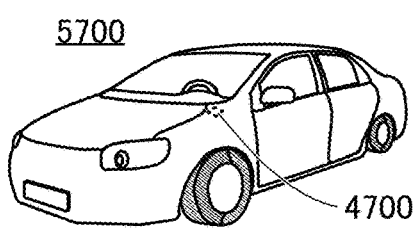

FIG. 53G illustrates an automobile 5700 as an example of a moving vehicle.

An instrument panel that provides various kinds of information by displaying a speedometer, a tachometer, a mileage, a fuel meter, a gearshift indicator, air-conditioning settings, and the like is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an imaging device (not illustrated) provided for the automobile 5700, thereby providing a high level of safety. That is, displaying an image taken by the imaging device provided on the exterior of the automobile 5700 eliminates blind areas and enhances safety.

The memory device described in the above embodiments can temporarily hold data, and thus can be used to hold temporary data necessary in an automatic driving system for the automobile 5700 and a system for navigation and risk prediction, for example. The display device may be configured to display temporary information for navigation, risk prediction, and the like. Moreover, the memory device may be configured to hold a video taken by a driving recorder provided on the automobile 5700.

Although an automobile is described above as an example of a moving vehicle, moving vehicles are not limited to an automobile. Other examples of moving vehicles include a train, a monorail train, a ship, and a flying object (a helicopter, an unmanned aircraft (a drone), an airplane, and a rocket).

[Camera]

The memory device described in the foregoing embodiment can be used in a camera.

Figure 53H:
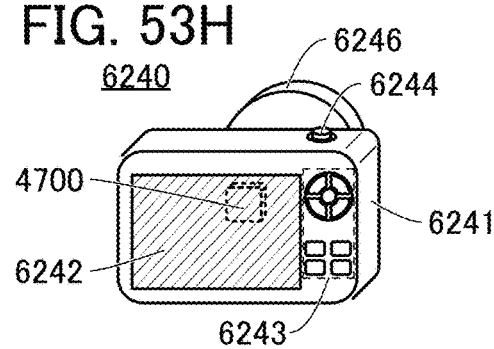

FIG. 53H illustrates a digital camera 6240 as an example of an imaging device. The digital camera 6240 includes a housing 6241, a display portion 6242, operation switches 6243, a shutter button 6244, and the like. An attachable lens 6246 is attached to the digital camera 6240. Here, the lens 6246 of the digital camera 6240 is detachable from the housing 6241 for replacement; alternatively, the lens 6246 may be incorporated into the housing 6241. Moreover, the digital camera 6240 may be configured to be equipped with a stroboscope, a viewfinder, or the like.

The digital camera 6240 including the memory device described in the foregoing embodiment can have low power consumption. Moreover, heat generation from a circuit can be reduced owing to low power consumption; thus, the influence of heat generation on the circuit, the peripheral circuit, and the module can be reduced.

[Video Camera]

The memory device described in the foregoing embodiment can be used in a video camera.

Figure 53I:
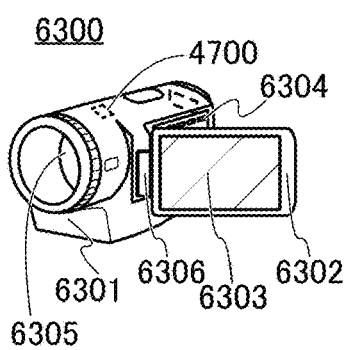

FIG. 53I illustrates a video camera 6300 as an example of an imaging device. The video camera 6300 includes a first housing 6301, a second housing 6302, a display portion 6303, an operation switch 6304, a lens 6305, a joint 6306, and the like. The operation switch 6304 and the lens 6305 are provided for the first housing 6301, and the display portion 6303 is provided for the second housing 6302. The first housing 6301 and the second housing 6302 are connected to each other with the joint 6306, and the angle between the first housing 6301 and the second housing 6302 can be changed with the joint 6306. Videos displayed on the display portion 6303 may be switched in accordance with the angle at the joint 6306 between the first housing 6301 and the second housing 6302.

When a video taken by the video camera 6300 is recorded, the video needs to be encoded based on a data recording format. With the use of the above memory device, the video camera 6300 can hold a temporary file generated in encoding.

[ICD]

The memory device described in the above embodiment can be used in an implantable cardioverter-defibrillator (ICD).

Figure 53J:
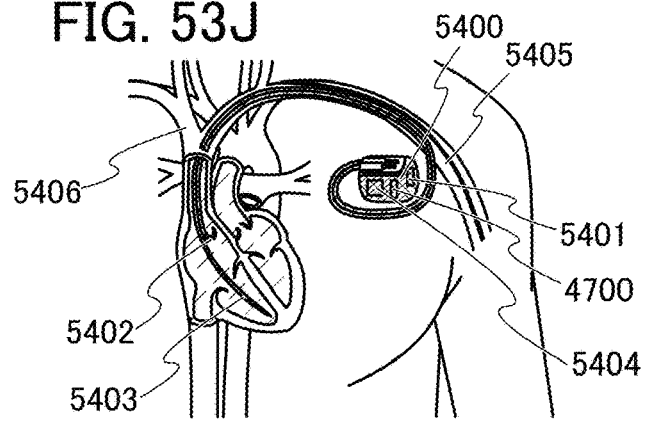

FIG. 53J is a schematic cross-sectional view illustrating an example of an ICD. An ICD main unit 5400 includes at least a battery 5401, the electronic component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with the end of one of them placed in the right ventricle and the end of the other placed in the right atrium.

The ICD main unit 5400 functions as a pacemaker and paces the heart when the heart rate is not within a predetermined range. When the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In the ICD main unit 5400, data on the heart rate obtained by the sensor, the number of times the treatment with pacing is performed, and the time taken for the treatment, for example, can be stored in the electronic component 4700.

The antenna 5404 can receive power, and the power is charged into the battery 5401. When the ICD main unit 5400 includes a plurality of batteries, the safety can be improved. Specifically, even if one of the batteries in the ICD main unit 5400 is dead, the other batteries can work properly; hence, the batteries also function as an auxiliary power source.

In addition to the antenna 5404 that can receive power, an antenna that can transmit a physiological signal may be provided. For example, a system that monitors the cardiac activity and is capable of monitoring physiological signals such as pulses, respiratory rate, heart rate, and body temperature with an external monitoring device may be constructed.

[Expansion Device for Personal Computer]

The memory device described in the foregoing embodiment can be used in a calculator such as a personal computer (PC) and an expansion device for an information terminal.

Figure 54A:
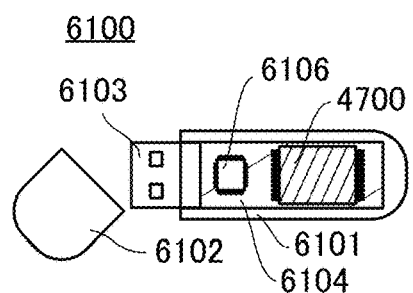
FIGS. 54A to 54E are perspective views and schematic views illustrating examples of electronic devices.

FIG. 54A illustrates, as an example of the expansion device, a portable expansion device 6100 that is externally attached to a PC and includes a chip capable of storing data. When the expansion device 6100 is connected to a PC with a universal serial bus (USB), for example, data can be stored in the chip. FIG. 54A illustrates the portable expansion device 6100; however, the expansion device of one embodiment of the present invention is not limited to this and may be a relatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the memory device or the like described in the foregoing embodiment. For example, the substrate 6104 is provided with the electronic component 4700 and a controller chip 6106. The USB connector 6103 functions as an interface for connection to an external device.

[SD Card]

The memory device described in the above embodiment can be used in an SD card that can be attached to electronic devices such as an information terminal and a digital camera.

Figure 54B:
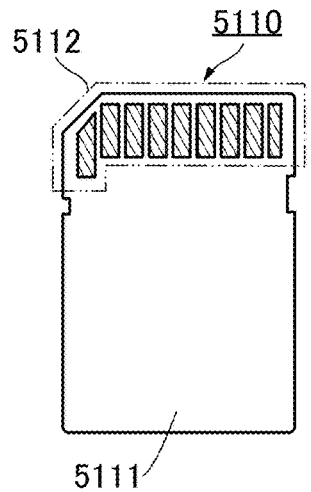
Figure 54C:
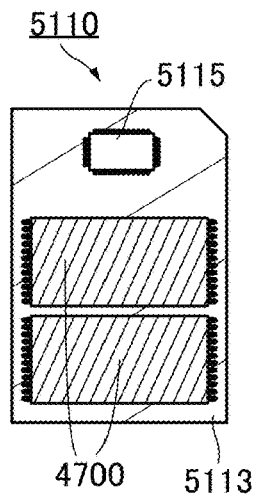

FIG. 54B is a schematic external diagram of an SD card, and FIG. 54C is a schematic diagram illustrating the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, the substrate 5113 is provided with the electronic component 4700 and a controller chip 5115. Note that the circuit configurations of the electronic component 4700 and the controller chip 5115 are not limited to those described above and can be changed as appropriate depending on circumstances. For example, a write circuit, a row driver, a read circuit, and the like that are provided in an electronic component may be incorporated into the controller chip 5115 instead of the electronic component 4700.

When the electronic component 4700 is also provided on the back side of the substrate 5113, the capacity of the SD card 5110 can be increased. In addition, a wireless chip with a radio communication function may be provided on the substrate 5113. This enables wireless communication between an external device and the SD card 5110, making it possible to write/read data to/from the electronic component 4700.

The memory device described in the above embodiment can be used in a solid state drive (SSD) that can be attached to electronic devices such as information terminals.

Figure 54D:
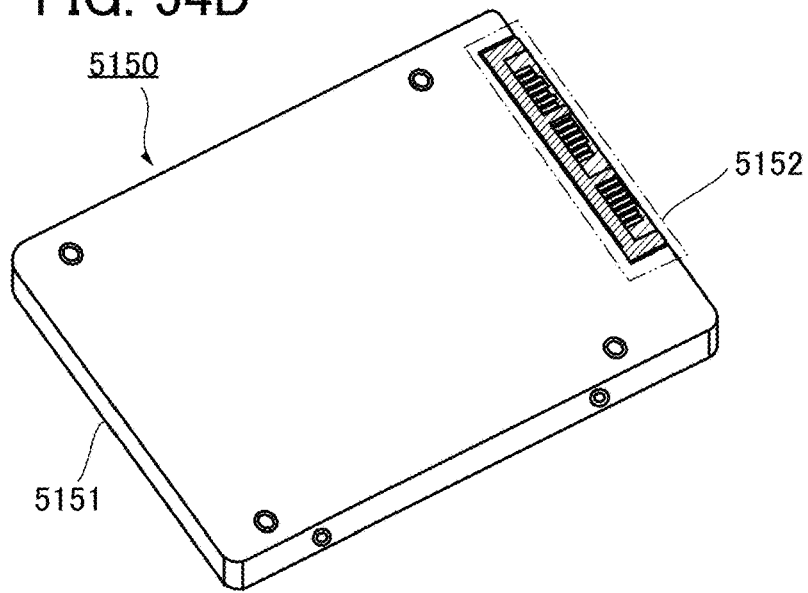
Figure 54E:
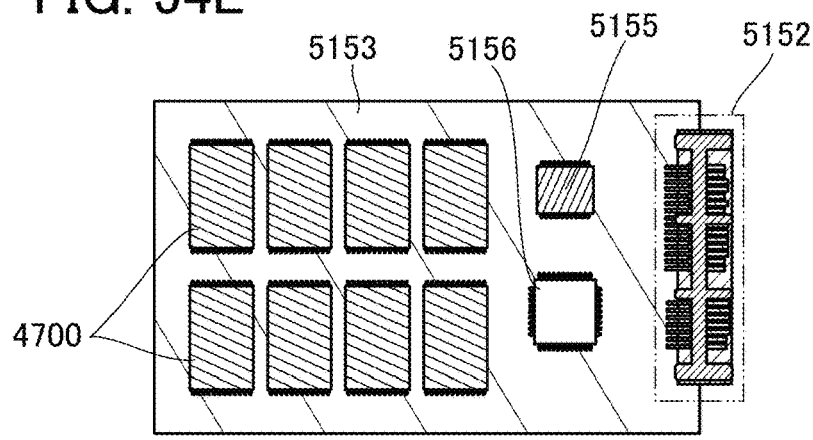

FIG. 54D is a schematic external diagram of an SSD, and FIG. 54E is a schematic diagram of the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the substrate 5153 is provided with the electronic component 4700, a memory chip 5155, and a controller chip 5156. When the electronic component 4700 is also provided on the back side of the substrate 5153, the capacity of the SSD 5150 can be increased. A work memory is incorporated into the memory chip 5155. For example, a DRAM chip can be used as the memory chip 5155. A processor, an ECC circuit, and the like are incorporated into the controller chip 5156. Note that the circuit configurations of the electronic component 4700, the memory chip 5155, and the controller chip 5156 are not limited to those described above and can be changed as appropriate depending on circumstances. For example, a memory functioning as a work memory may also be provided in the controller chip 5156.

[Computer]

Figure 55A:
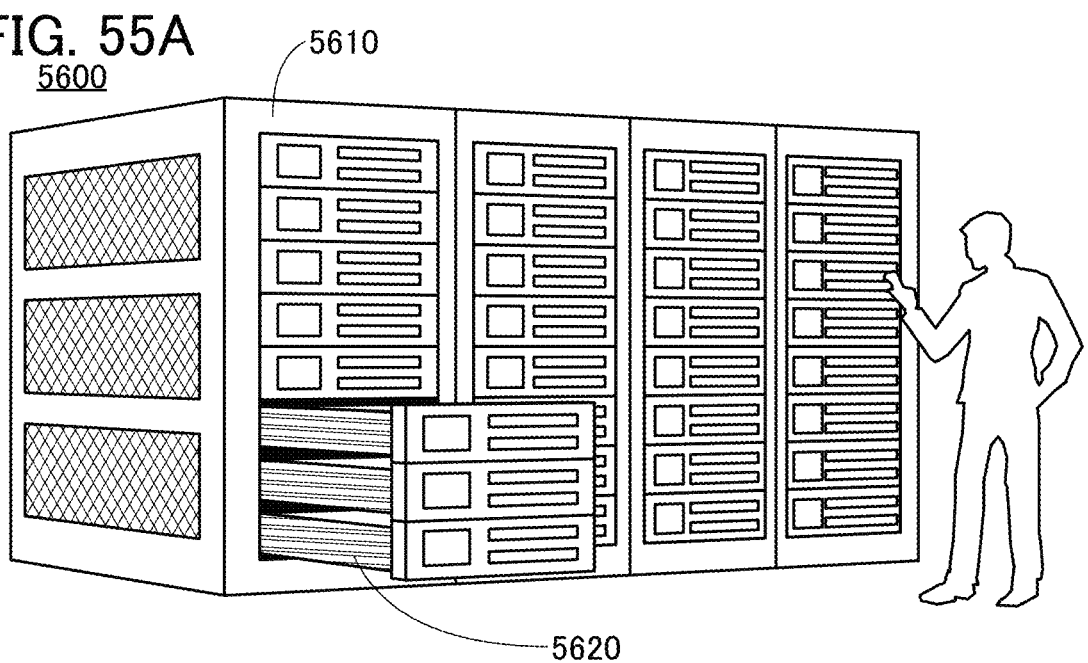
FIGS. 55A to 55C illustrate examples of electronic devices.

A computer 5600 illustrated in FIG. 55A is an example of a large computer. In the computer 5600, a plurality of rack mount computers 5620 are stored in a rack 5610.

Figure 55B:
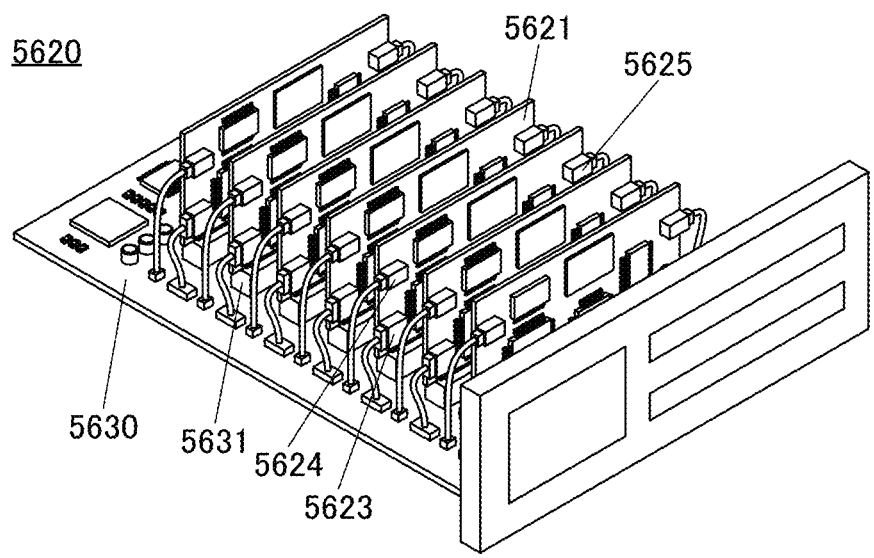

The computer 5620 can have a configuration in a perspective view of FIG. 55B, for example. In FIG. 55B, the computer 5620 includes a motherboard 5630, and the motherboard includes a plurality of slots 5631 and a plurality of connection terminals. A PC card 5621 is inserted in the slot 5631. In addition, the PC card 5621 includes a connection terminal 5623, a connection terminal 5624, and a connection terminal 5625, each of which is connected to the motherboard 5630.

Figure 55C:
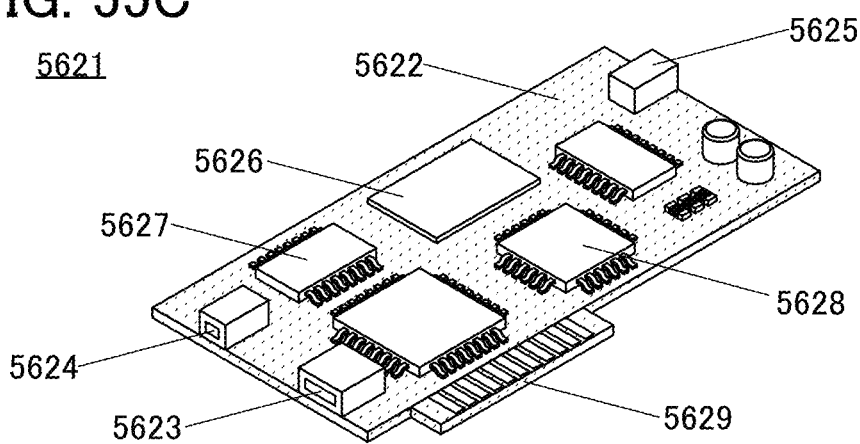

The PC card 5621 illustrated in FIG. 55C is an example of a processing board provided with a CPU, a GPU, a memory device, and the like. The PC card 5621 includes a board 5622. The board 5622 includes the connection terminal 5623, the connection terminal 5624, the connection terminal 5625, a semiconductor device 5626, a semiconductor device 5627, a semiconductor device 5628, and a connection terminal 5629. FIG. 55C also illustrates semiconductor devices other than the semiconductor devices 5626 to 5628; the following description of the semiconductor devices 5626 to 5628 can be referred to for these semiconductor devices.

The connection terminal 5629 has a shape with which the connection terminal 5629 can be inserted in the slot 5631 of the motherboard 5630, and the connection terminal 5629 functions as an interface for connecting the PC card 5621 and the motherboard 5630. An example of the standard for the connection terminal 5629 is PCIe.

The connection terminals 5623 to 5625 can serve, for example, as an interface for performing power supply, signal input, or the like to the PC card 5621. As another example, they can serve as an interface for outputting a signal calculated by the PC card 5621. Examples of the standard for each of the connection terminals 5623 to 5625 include Universal Serial Bus (USB), Serial ATA (SATA), and Small Computer System Interface (SCSI). In the case where video signals are output from the connection terminals 5623 to 5625, an example of the standard therefor is HDMI (registered trademark).

The semiconductor device 5626 includes a terminal (not illustrated) for inputting and outputting signals. When the terminal is inserted in a socket (not illustrated) of the board 5622, the semiconductor device 5626 and the board 5622 can be electrically connected to each other.

The semiconductor device 5627 includes a plurality of terminals. When the terminals are reflow-soldered, for example, to wirings of the board 5622, the semiconductor device 5627 and the board 5622 can be electrically connected to each other. Examples of the semiconductor device 5627 include a field programmable gate array (FPGA), a GPU, and a CPU. As the semiconductor device 5627, the electronic component 4730 can be used, for example.

The semiconductor device 5628 includes a plurality of terminals. When the terminals are reflow-soldered, for example, to wirings of the board 5622, the semiconductor device 5628 and the board 5622 can be electrically connected to each other. An example of the semiconductor device 5628 is a memory device. As the semiconductor device 5628, the electronic component 4700 can be used, for example.

The computer 5600 can also function as a parallel computer. When the computer 5600 is used as a parallel computer, large-scale computation necessary for artificial intelligence learning and inference can be performed, for example.

The semiconductor device of one embodiment of the present invention is used in a variety of electronic devices described above, whereby a smaller size, higher speed, or lower power consumption of the electronic devices can be achieved. In addition, since the semiconductor device of one embodiment of the present invention has low power consumption, heat generation from a circuit can be reduced. Accordingly, it is possible to reduce adverse effects of the heat generation on the circuit itself, the peripheral circuit, and the module. Furthermore, the use of the semiconductor device of one embodiment of the present invention can achieve an electronic device that operates stably even in a high temperature environment. Thus, the reliability of the electronic device can be improved.

Figure 56:
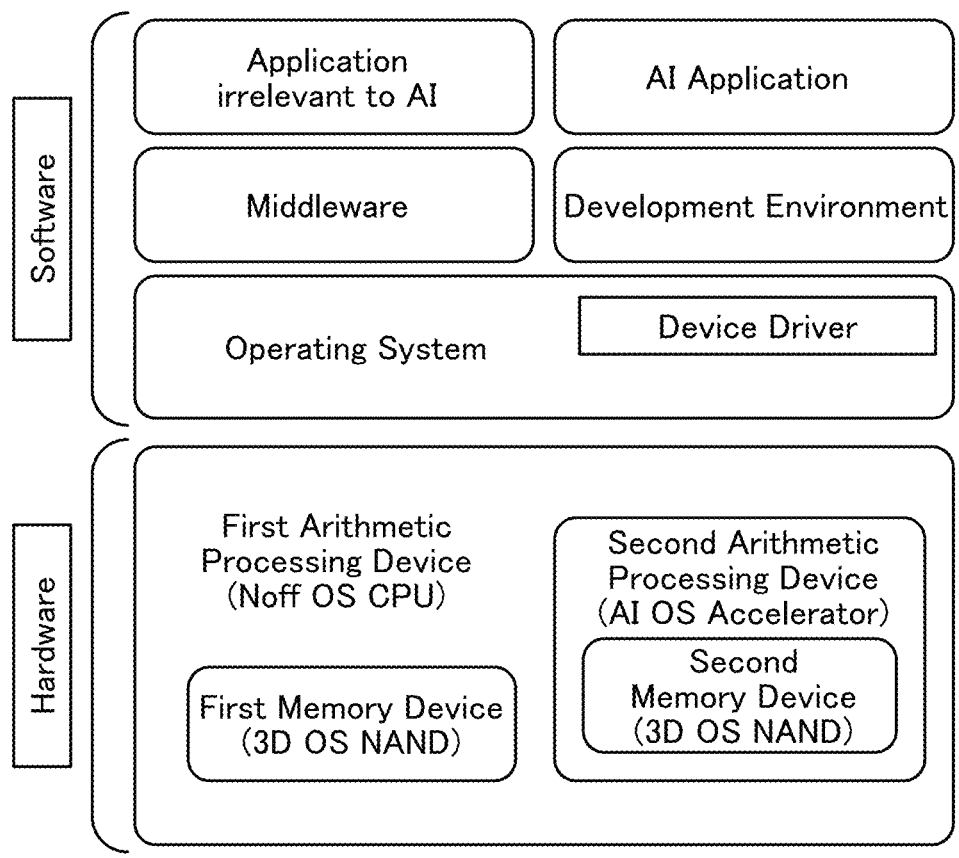
FIG. 56 illustrates a configuration example of a computer system.

Next, a configuration example of a computer system that can be used in the computer 5600 is described. FIG. 56 illustrates a configuration example of a computer system 700. The computer system 700 is made of software and hardware. Note that the hardware included in the computer system is sometimes referred to as an information processing device.

Examples of the software in the computer system 700 include operating systems including device drivers, middleware, a variety of development environments, application programs related to AI (AI Application), and application programs irrelevant to AI.

The device drivers include, for example, application programs for controlling externally connected devices such as an auxiliary memory device, a display device, and a printer.

The hardware in the computer system 700 includes a first arithmetic processing device, a second arithmetic processing device, a first memory device, and the like. The second arithmetic processing device includes a second memory device.

As the first arithmetic processing device, a central processing unit such as an Noff OS CPU is preferably used, for example. The Noff OS CPU includes a memory unit using OS transistors (e.g., a nonvolatile memory), and has a function of storing necessary data into the memory unit and stopping power supply to the CPU when it does not need to operate. The use of the Noff OS CPU as the first arithmetic processing device can reduce the power consumption of the computer system 700.

As the second arithmetic processing device, a GPU or an FPGA can be used, for example. Note that as the second arithmetic processing device, an AI OS accelerator is preferably used. The AI OS accelerator is composed of OS transistors and includes an arithmetic unit such as a product-sum operation circuit. The power consumption of the AI OS accelerator is lower than that of a common GPU and the like. The use of the AI OS accelerator as the second arithmetic processing device can reduce the power consumption of the computer system 700.

As the first memory device and the second memory device, the memory device of one embodiment of the present invention is preferably used. For example, the 3D OS NAND memory device is preferably used. The 3D OS NAND memory device can function as a cache, a main memory, and storage. The use of the 3D OS NAND memory device facilitates fabrication of a non-von Neumann computer system.

The power consumption of the 3D OS NAND memory device is lower than that of a 3D NAND memory device using Si transistors. The use of the 3D OS NAND memory device as the memory devices can reduce the power consumption of the computer system 700. In addition, the 3D OS NAND memory device can function as a universal memory, thereby reducing the number of components of the memory devices included in the computer system 700.

When the semiconductor device constituting the hardware is configured with the semiconductor device including OS transistors, the hardware including the central processing unit, the arithmetic processing device, and the memory device can be easily monolithic. Making the hardware monolithic facilitates a further reduction in power consumption as well as a reduction in size, weight, and thickness.

Note that this embodiment can be combined with any of the other embodiments in this specification as appropriate.

Embodiment 7

A normally-off CPU (also referred to as an Noff CPU) can be achieved using the memory device of one embodiment of the present invention, for example. Note that the Noff CPU is an integrated circuit including a normally-off transistor, which is in a non-conduction state (also referred to as an off state) even when a gate voltage is 0 V.

In the Noff CPU, power supply to a circuit that does not need to operate can be stopped so that the circuit can be brought into a standby state. The circuit brought into the standby state because of the stop of power supply does not consume power. Thus, the power usage of the Noff CPU can be minimized. Moreover, the Noff CPU can retain data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the power consumption of the Noff CPU can be reduced without a significant decrease in operating speed.

The memory device of one embodiment of the present invention can be used as a memory device for storing data such as setting conditions while power supply to the Noff CPU is stopped. The memory device of one embodiment of the present invention can also be used in a cache of the Noff CPU or the main memory of the Noff CPU.

The Noff CPU can be suitably used for a small-scale system such as an IoT end device (also referred to as an endpoint microcomputer) 803 in the Internet of Things (IoT) field, for example.

Figure 57:
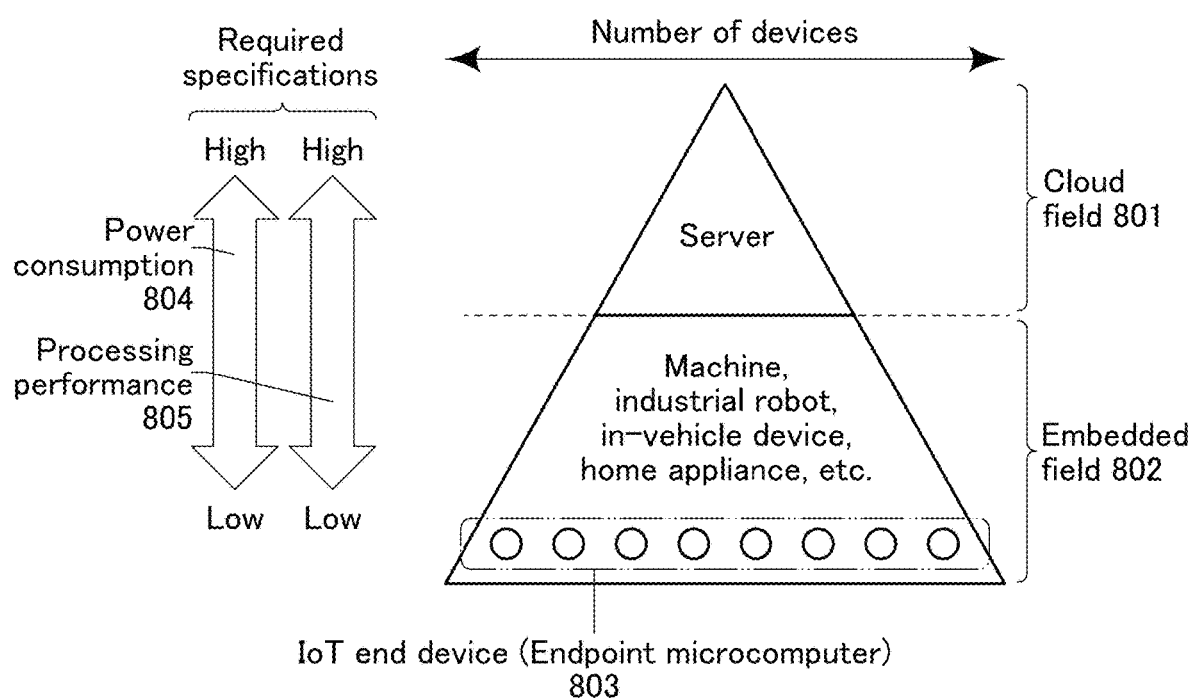
FIG. 57 illustrates a hierarchical structure of an IoT network and tendencies of required specifications.

FIG. 57 illustrates a hierarchical structure of an IoT network and tendencies of required specifications. FIG. 57 shows power consumption 804 and processing performance 805 as the required specifications. The hierarchical structure of the IoT network is roughly divided into a cloud field 801 at the upper level and an embedded field 802 at the lower level. The cloud field 801 includes a server, for example. The embedded field 802 includes a machine, an industrial robot, an in-vehicle device, and a home appliance, for example.

Higher processing performance is required rather than lower power consumption towards the top of the hierarchical structure. Thus, a high-performance CPU, a high-performance GPU, a large-scale system on chip (SoC), and the like are used in the cloud field 801. Meanwhile, lower power consumption is required rather than higher processing performance towards the bottom of the hierarchical structure, and the number of devices is explosively increased. The semiconductor device of one embodiment of the present invention can be suitably used for a communication device in the IoT end device that needs to have low power consumption.

Note that an endpoint refers to an end region of the embedded field 802. Examples of devices used in the endpoint include microcomputers used in a factory, a home appliance, infrastructure, agriculture, and the like.

Figure 58:
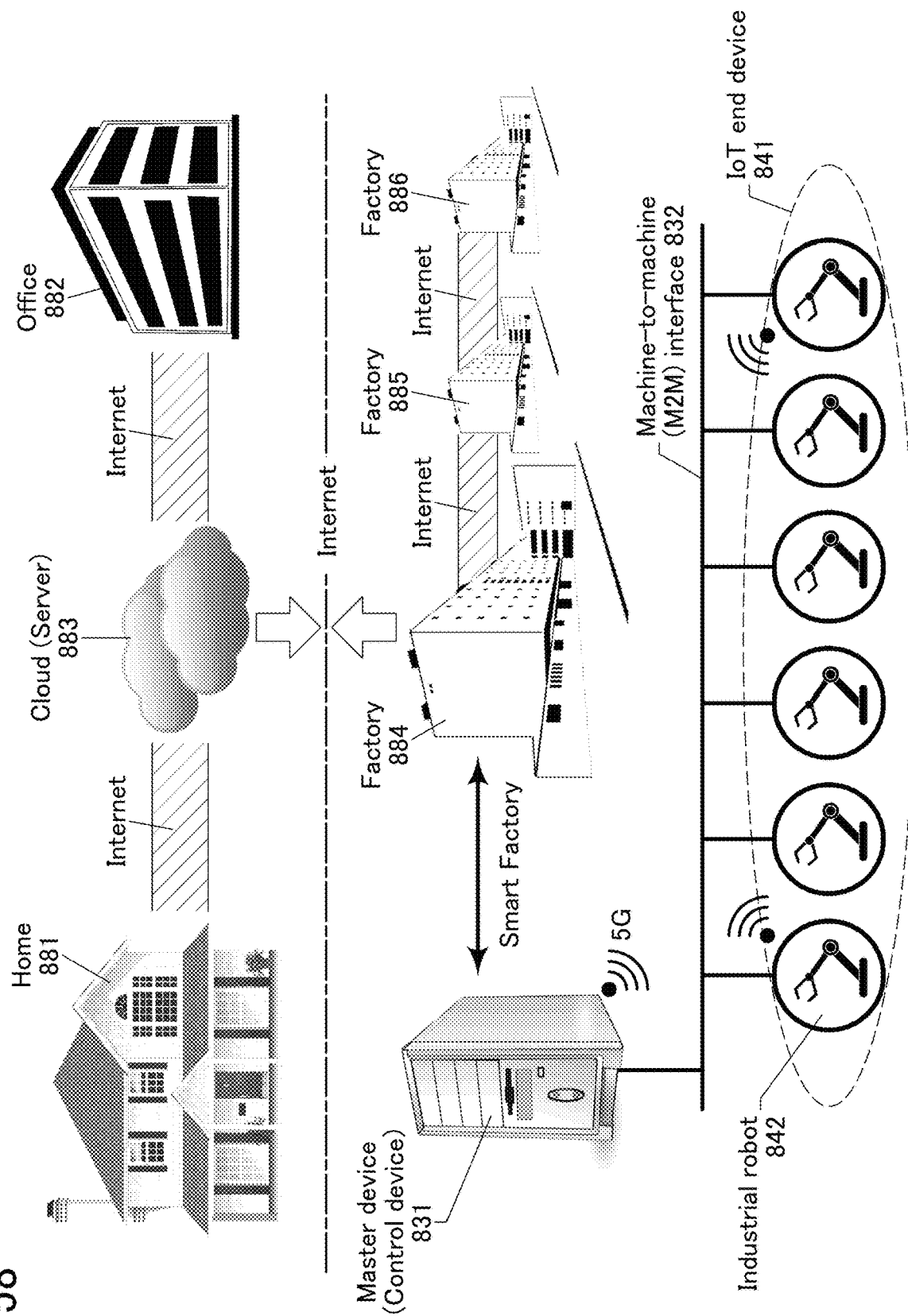
FIG. 58 is a conceptual diagram of factory automation.

FIG. 58 is a conceptual diagram showing factory automation as an application example of the endpoint microcomputer. A factory 884 is connected to a cloud (server) 883 through the Internet. The cloud 883 is connected to a home 881 and an office 882 through the Internet. The Internet connection may be wired communication or wireless communication. In the case of wireless communication, for example, wireless communication based on a communication standard such as the fourth-generation mobile communications system (4G) or the fifth-generation mobile communications system (5G) is performed using the semiconductor device of one embodiment of the present invention for a communication device. The factory 884 may be connected to a factory 885 and a factory 886 through the Internet.

The factory 884 includes a master device (control device) 831. The master device 831 is connected to the cloud 883 and has a function of transmitting and receiving data. The master device 831 is connected to a plurality of industrial robots 842 included in an IoT end device 841 through a machine-to-machine (M2M) interface 832. As the M2M interface 832, for example, industrial Ethernet (Ethernet is a registered trademark), which is a kind of wired communication, or local 5G, which is a kind of wireless communication, may be used.

A factory manager can check the operational status or the like from the home 881 or the office 882 connected to the factory 884 through the cloud 883. In addition, the manager can check wrong items and part shortage, instruct a storage space, and measure takt time, for example.

In recent years, IoT has been globally introduced into factories; this situation is called Smart Factory. Smart Factory has been reported to enable not only simple examination and inspection by an endpoint microcomputer but also detection of failures and prediction of abnormality, for example.

The total power consumption of a small-scale system such as an endpoint microcomputer during operation is often small; thus, the proportion of the power consumption of the CPU tends to be large. For that reason, for a small-scale system such as an endpoint microcomputer, the power reduction effect due to the standby operation by the Noff CPU is large. Meanwhile, the embedded field of IoT sometimes requires quick response; the use of the Noff CPU achieves high-speed return from a standby state.

The configurations, structures, methods, and the like described in this embodiment can be used in an appropriate combination with any of the configurations, structures, methods, and the like described in the other embodiments and the like.

This application is based on Japanese Patent Application Serial No. 2019-199005 filed with Japan Patent Office on Oct. 31, 2019; Japanese Patent Application Serial No. 2019-203738 filed with Japan Patent Office on Nov. 11, 2019; Japanese Patent Application Serial No. 2019-208041 filed with Japan Patent Office on Nov. 18, 2019; Japanese Patent Application Serial No. 2019-216249 filed with Japan Patent Office on Nov. 29, 2019; and Japanese Patent Application Serial No. 2019-230250 filed with Japan Patent Office on Dec. 20, 2019, the entire contents of which are hereby incorporated by reference.

What is claimed is:

1. A semiconductor device comprising:
a component extending in a first direction;
a first conductor extending in a second direction; and
a second conductor extending in the second direction,
wherein the component comprises:
   a third conductor extending in the first direction;
   a first insulator adjacent to the third conductor;
   a first semiconductor adjacent to the first insulator; and
   a second insulator adjacent to the first semiconductor,
wherein in a first intersection portion where the component and the first conductor cross each other, the semiconductor device comprises, between the component and the first conductor:
   a second semiconductor adjacent to the second insulator; and
   a third insulator adjacent to the second semiconductor,
wherein in a second intersection portion where the component and the second conductor cross each other, the component comprises:
   a fourth conductor adjacent to the second insulator; and
   a fourth insulator adjacent to the fourth conductor,
wherein in the first intersection portion, the first insulator, the first semiconductor, the second insulator, the second semiconductor, and the third insulator are provided concentrically around the third conductor, and
wherein in the second intersection portion, the first insulator, the first semiconductor, the second insulator, the fourth conductor, and the fourth insulator are provided concentrically around the third conductor.

2. The semiconductor device according to claim 1, wherein the first direction is orthogonal to the second direction.

3. The semiconductor device according to claim 1, wherein the first intersection portion functions as a first transistor, and
wherein the second intersection portion functions as a second transistor and a capacitor.

4. The semiconductor device according to claim 1, wherein the first semiconductor is an oxide semiconductor.

5. The semiconductor device according to claim 4, wherein the oxide semiconductor comprises at least one of indium and zinc.

6. The semiconductor device according to claim 1, wherein the second semiconductor is an oxide semiconductor.

7. The semiconductor device according to claim 6, wherein the oxide semiconductor comprises at least one of indium and zinc.

8. The semiconductor device according to claim 1, functioning as a NAND memory device.

9. An electronic device comprising:
the semiconductor device according to claim 1; and
at least one of an operation switch, a battery, and a display portion.

* * * * *